(12) United States Patent
Shinohara et al.

(10) Patent No.: US 9,859,922 B2
(45) Date of Patent: *Jan. 2, 2018

(54) DATA PROCESSING DEVICE AND DATA PROCESSING METHOD

(71) Applicant: SONY CORPORATION, Tokyo (JP)

(72) Inventors: Yuji Shinohara, Kanagawa (JP); Nabil Sven Loghin Muhammad, Tokyo (JP); Lachlan Michael, Saitama (JP); Yuichi Hirayama, Chiba (JP); Makiko Yamamoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/784,185

(22) PCT Filed: Apr. 21, 2014

(86) PCT No.: PCT/JP2014/061152
§ 371 (c)(1),
(2) Date: Oct. 13, 2015

(87) PCT Pub. No.: WO2014/178296
PCT Pub. Date: Nov. 6, 2014

(65) Prior Publication Data
US 2016/0079998 A1    Mar. 17, 2016

(30) Foreign Application Priority Data
May 2, 2013  (JP) .................................. 2013-096992

(51) Int. Cl.
*H03M 13/11*    (2006.01)
*H03M 13/00*    (2006.01)
(Continued)

(52) U.S. Cl.
CPC .... *H03M 13/1177* (2013.01); *H03M 13/1137* (2013.01); *H03M 13/1165* (2013.01);
(Continued)

(58) Field of Classification Search
CPC ............. H03M 13/255; H03M 13/271; H03M 13/1137; H03M 13/2906; H03M 13/2792;
(Continued)

(56) References Cited

U.S. PATENT DOCUMENTS

| 2013/0216001 A1 | 8/2013 | Petrov |
| 2016/0049960 A1* | 2/2016 | Shinohara ......... H03M 13/6555 714/776 |

(Continued)

FOREIGN PATENT DOCUMENTS

| EP | 2 993 792 A1 | 3/2016 |
| JP | 2011-524680 A | 9/2011 |

(Continued)

OTHER PUBLICATIONS

International Preliminary Report on Patentability issued Nov. 25, 2014 in PCT/JP2014/061152 (submitting English translation only).

(Continued)

*Primary Examiner* — Phung M Chung
(74) *Attorney, Agent, or Firm* — Oblon, McClelland, Maier & Neustadt, L.L.P.

(57) ABSTRACT

A code bit of an LDPC code in which a code length is 16200 bits and an encoding rate is 7/15 is interchanged with a symbol bit of a symbol corresponding to any of 8 signal points defined by 8PSK. In the interchanging, when 3 bits of code bits stored in three units of storages having a storage capacity of 16200/3 bits and read bit by bit from the units of storages are allocated to one symbol, a (#i +1)-th bit from a most significant bit of the 3 bits of code bits is set to a bit b#i, a (#i +1)-th bit from a most significant bit of 3 bits of (Continued)

symbol bits of the one symbol is set to a bit y#i, and a bit b0, a bit b1, and a bit b2 are interchanged with a bit y1, a bit y0, and a bit y2.

6 Claims, 79 Drawing Sheets

(51) Int. Cl.
  *H03M 13/27* (2006.01)
  *H04L 1/00* (2006.01)
  *H03M 13/25* (2006.01)
  *H03M 13/35* (2006.01)
  *H03M 13/15* (2006.01)
  *H03M 13/29* (2006.01)

(52) U.S. Cl.
  CPC ....... *H03M 13/255* (2013.01); *H03M 13/271* (2013.01); *H03M 13/2707* (2013.01); *H03M 13/356* (2013.01); *H03M 13/616* (2013.01); *H04L 1/0041* (2013.01); *H04L 1/0057* (2013.01); *H03M 13/152* (2013.01); *H03M 13/2906* (2013.01)

(58) Field of Classification Search
  CPC .......... H03M 13/2707; H03M 13/616; H03M 13/611; H03M 13/1148; H03M 13/118; H04L 1/0057; H04L 1/0071; H04L 1/00; H04L 27/2626
  See application file for complete search history.

(56) References Cited

U.S. PATENT DOCUMENTS

| | | | |
|---|---|---|---|
| 2016/0065244 A1* | 3/2016 | Shinohara | H04L 1/0057 714/752 |
| 2016/0134304 A1* | 5/2016 | Shinohara | H04L 1/0057 714/758 |

FOREIGN PATENT DOCUMENTS

| | | |
|---|---|---|
| JP | 2012-49734 A | 3/2012 |
| JP | 2013-5124 A | 1/2013 |
| WO | WO 2012/165161 A1 | 12/2012 |
| WO | WO 2013/024584 A1 | 2/2013 |

OTHER PUBLICATIONS

International Search Report issued Jun. 24, 2014 in PCT/JP2014/061152 (submitting English translation only).

"Second generation framing structure, channel coding and modulation systems for Broadcasting, Interactive Services, News Gathering and other broadband satellite applications (DVB-S2)", ETSI EN 302 307, V1.3.1, Digital Video Broadcasting (DVB), Mar. 2013, pp. 1, 25-29, 48-50.

"Next Generation broadcasting system to Handheld, physical layer specification (DVB-NGH)", DVB Document A160, Digital Video Broadcasting (DVB), Nov. 2012, pp. 1, 53-55, 222 and 223.

Partial Supplementary European Search Report issued Dec. 7, 2016 in Patent Application No. 14791666.2.

"Digital Video Broadcasting (DVB);Second generation framing structure, Channel coding and modulation systems for Broadcasting, Interactive Services, News Gathering and other broadband satellite applications (DVB-S2)" Digital Video Broadcasting (DVB), ETSI EN 302 307, V1.3.1, XP008175198, Mar. 2013, 84 Pages.

Partial Supplementary European Search Report dated Dec. 7, 2016 in Patent Application No. 14791666.2.

"TM-520319 EN302307-Part-II_rev3-superframe-revised_ESAIIS.docx" Digital Video Broadcasting (DVB), XP017845104, Dec. 12, 2013, 103 Pages.

"Digital Video Broadcasting (DVB);Second generation framing structure, Channel coding and modulation systems for Broadcasting, Interactive Services, News Gathering and other broadband satellite applications (DVB-S2)" Digital Video Broadcasting (DVB), ETSI EN 302 307, V1.3.1, XP008175198, Mar. 2013, 84 Pages. (reference previously filed, submitting complete copy).

"Evolutionary DVB-S2 Proposal; Hughes Network Systems" Digital Video Broadcasting (DVB), XP017840327, Feb. 13, 2013, 91 Pages.

Extended European Seardi Report dated Mar. 13, 2017 in European Patent Application No. 14791666.2.

Typiutiortary DVB-S2 Propose? I-Whes Network Systems, XP 17840327, Feb. 11, 2013.

"Digital Video Broadcasting (DVB); Second generation framing structure, channel coding and modulation systems for Broadcasting, Interactive Services, News Gathering and other broadband satellite applications; Part 1: DVB-S2," Digital Video Broadcasting (DVB), ETSI EN 302 307-1 V1.4.1 (Nov. 2014); European Standard, 80 pp.

* cited by examiner

FIG. 1

$$H = \begin{bmatrix} & & \vdots & & & \\ \cdots 1 \cdots 1 \cdot & 1 & \cdots \cdots 1 \cdots 1 \cdots 1 \\ & & 1 & & & \\ & & \vdots & & & \\ & & 1 & & & \end{bmatrix}$$

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 11

$$H_T = \begin{pmatrix} 1 & & & & & 0 \\ 1\,1 & & & & & \\ & 1\,1 & & & & \\ & & \ddots & & & \\ & & & 1\,1 & & \\ 0 & & & & 1\,1 & \\ & & & & & 1\,1 \end{pmatrix}$$

PARITY MATRIX $H_T$

FIG. 13

| NOMINAL ENCODING RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

NUMBER OF COLUMNS OF EACH COLUMN WEIGHT

FIG.29

| NECESSARY MEMORY COLUMN NUMBER mb | b=1 (FIRST TO THIRD INTERCHANGE METHODS) | b=2 (FOURTH INTERCHANGE METHOD) | WRITE START POSITION OF EACH OF mb COLUMNS | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG.30

Table: WRITE START POSITION OF EACH OF mb COLUMNS

| NECESSARY MEMORY COLUMN NUMBER mb | b=1 (FIRST TO THIRD INTERCHANGE METHODS) | b=2 (FOURTH INTERCHANGE METHOD) | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|---|
| 2 | QPSK | | 0 | 0 | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 5 | 6 | 7 | 7 | | | | | | | | | | | | |
| 20 | | 1024QAM | 0 | 0 | 0 | 0 | 2 | 2 | 2 | 2 | 3 | 5 | 5 | 5 | 5 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

DISPLAY ROW NUMBER OF PARITY CHECK MATRIX (INFORMATION MATRIX $H_A$) FOR EVERY 360 FROM FIRST ROW NUMBER OF PARITY CHECK MATRIX

1ST ROW OF $H_A$
361ST ROW OF $H_A$
721ST ROW OF $H_A$
1081ST ROW OF $H_A$

```
0  2084 1613 1548 1286 1460 3196 4297 2481 3369 3451 4620 2622
1  122 1516 3448 2880 1407 1847 3799 3529 373 971 4358 3108
2  259 3399 929 2650 864 3996 3833 107 5287 164 3125 2350
3  342 3529
4  4198 2147
5  1880 4836
6  3864 4910
7  243 1542
8  3011 1436
9  2167 2512
10 4606 1003
11 2835 705
12 3426 2365
13 3848 2474
14 1360 1743
0  163 2536
1  2583 1180
2  1542 509
3  4418 1005
4  5212 5117
5  2155 2922
6  347 2696
7  226 4296
8  1560 487
9  3926 1640
10 149 2928
11 2364 563
12 635 688
13 231 1684
14 1129 3894
```

$h_{3,5}$

PARITY CHECK MATRIX INITIAL VALUE TABLE

FIG. 39

PARITY CHECK MATRIX INITIAL VALUE TABLE OF N = 16200 AND r = 7/15

PARITY CHECK MATRIX INITIAL VALUE TABLE OF N = 16200 AND r = 8/15

| ENCODING RATE | MINIMUM CYCLE LENGTH | PERFORMANCE THRESHOLD (Eb/No) |
|---|---|---|
| 7/15 | 6 | 0.36 |
| 8/15 | 6 | 0.64 |

FIG. 45

| rate | X | KX | Y1 | KY1 | Y2 | KY2 | M |
|---|---|---|---|---|---|---|---|
| 7/15 | 24 | 1440 | 4 | 2880 | 3 | 3240 | 8640 |
| 8/15 | 21 | 1800 | 4 | 1800 | 3 | 5040 | 7560 |

| Code rate | Modulation/coding spectral efficiency | $\gamma$ |
|---|---|---|
| 7/15 | 1.83 (WHEN ROLL-OFF RATE IS 10%, 1.66) | 3.32 |
| 8/15 | 2.10 (WHEN ROLL-OFF RATE IS 10%, 1.91) | 3.50 |

DATA PROCESSING DEVICE AND DATA PROCESSING METHOD

TECHNICAL FIELD

The present technology relates to a data processing device and a data processing method, and, for example, especially relates to a data processing device and data processing method that are capable of ensuring good communication quality in data transmission using an LDPC code.

BACKGROUND ART

An LDPC (Low Density Parity Check) code has the high error correction capability and has been recently adopted widely to a transmission system including satellite digital broadcasting such as DVB (Digital Video Broadcasting)-S.2 performed in Europe (for example, refer to Non-Patent Literature 1). In addition, adopting of the LDPC code to next-generation terrestrial digital broadcasting such as DVB-T.2 has been examined.

From a recent study, it is known that performance near a Shannon limit is obtained from the LDPC code when a code length increases, similar to a turbo code. Because the LDPC code has a property that a shortest distance is proportional to the code length, the LDPC code has advantages of a block error probability characteristic being superior and a so-called error floor phenomenon observed in a decoding characteristic of the turbo code being rarely generated, as characteristics thereof.

CITATION LIST

Non-Patent Literature

Non-Patent Literature 1: DVB-S.2: ETSI EN 302 307 V1.2.1 (2009-08)

SUMMARY OF INVENTION

Technical Problem

A DVB standard such as the DVB-S.2, DVB-T.2, and DVB-C.2 which adopt the LDPC code makes the LDPC code as a symbol (symbolized) of orthogonal modulation (digital modulation) such as QPSK (Quadrature Phase Shift Keying) and the symbol is mapped to a signal point of the orthogonal modulation and is transmitted.

In data transmission using an LDPC code, such as DVB-S.2 described above, good communication quality is necessarily ensured.

In view of such circumstances, according to an embodiment of the present technology, it is desirable to ensure good communication quality in data transmission using an LDPC code.

Solution to Problem

A first data processing device or data processing method of the present technology is a data processing device or data processing method including: an encoding unit/step to perform LDPC encoding based on a parity check matrix of an LDPC code in which a code length is 16200 bits and an encoding rate is 7/15; and an interchanging unit/step to interchange a code bit of an LDPC code in which a code length is 16200 bits and an encoding rate is 7/15 with a symbol bit of a symbol corresponding to any of 8 signal points defined by 8PSK. When 3 bits of code bits stored in three units of storages having a storage capacity of 16200/3 bits and read bit by bit from the units of storages are allocated to one symbol, a (#i+1)-th bit from a most significant bit of the 3 bits of code bits is set to a bit b#i, a (#i+1)-th bit from a most significant bit of 3 bits of symbol bits of the one symbol is set to a bit y#i, and the interchanging unit/step interchanges a bit b0 with a bit y1, a bit b1 with a bit y0, and a bit b2 with a bit y2. The LDPC code includes an information bit and a parity bit. The parity check matrix includes an information matrix part corresponding to the information bit and a parity matrix part corresponding to the parity bit. The information matrix part is shown by a parity check matrix initial value table. The parity check matrix initial value table is a table showing positions of elements of 1 of the information matrix part for every 360 columns and is expressed as follows 3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195

6324 6378 6686 6829 7558 7745 8042 8382 8587 8602

18 187 1115 1417 1463 2300 2328 3502 3805 4677 4827 5551 5968 6394

6412 6753 7169 7524 7695 7976 8069 8118 8522 8582

714 2713 2726 2964 3055 3220 3334 3459 5557 5765 5841 6290 6419 6573

6856 7786 7937 8156 8286 8327 8384 8448 8539 8559 3452 7935 8092 8623

56 1955 3000 8242

1809 4094 7991 8489

2220 6455 7849 8548

1006 2576 3247 6976

2177 6048 7795 8295

1413 2595 7446 8594

2101 3714 7541 8531

10 5961 7484

3144 4636 5282

5708 5875 8390

3322 5223 7975

197 4653 8283

598 5393 8624

906 7249 7542

1223 2148 8195

976 2001 5005.

In the first data processing device and data processing method of the present technology, LDPC encoding is performed based on a parity check matrix of an LDPC code in which a code length is 16200 bits and an encoding rate is 7/15, and a code bit of an LDPC code in which a code length is 16200 bits and an encoding rate is 7/15 is interchanged with a symbol bit of a symbol corresponding to any of 8 signal points defined by 8PSK. In the interchanging, when 3 bits of code bits stored in three units of storages having a storage capacity of 16200/3 bits and read bit by bit from the units of storages are allocated to one symbol, a (#i+1)-th bit from a most significant bit of the 3 bits of code bits is set to a bit b#i, a (#i+1)-th bit from a most significant bit of 3 bits of symbol bits of the one symbol is set to a bit y#i, a bit b0 is interchanged with a bit y1, a bit b1 is interchanged with a bit y0, and a bit b2 is interchanged with a bit y2. The LDPC code includes an information bit and a parity bit. The parity check matrix includes an information matrix part corresponding to the information bit and a parity matrix part corresponding to the parity bit. The information matrix part is shown by a parity check matrix initial value table. The parity check matrix initial value table is a table showing positions of elements of 1 of the information matrix part for every 360 columns and is expressed as follows 3 137 314 327 983 1597 2028 3043 3217 4109 6020 6178 6535 6560 7146
  7180 7408 7790 7893 8123 8313 8526 8616 8638
  356 1197 1208 1839 1903 2712 3088 3537 4091 4301 4919 5068 6025 6195
  6324 6378 6686 6829 7558 7745 8042 8382 8587 8602
  18 187 1115 1417 1463 2300 2328 3502 3805 4677 4827 5551 5968 6394 6
  412 6753 7169 7524 7695 7976 8069 8118 8522 8582
  714 2713 2726 2964 3055 3220 3334 3459 5557 5765 5841 6290 6419 6573
  6856 7786 7937 8156 8286 8327 8384 8448 8539 8559
  3452 7935 8092 8623
  56 1955 3000 8242
  1809 4094 7991 8489
  2220 6455 7849 8548
  1006 2576 3247 6976
  2177 6048 7795 8295
  1413 2595 7446 8594
  2101 3714 7541 8531
  10 5961 7484
  3144 4636 5282
  5708 5875 8390
  3322 5223 7975
  197 4653 8283
  598 5393 8624
  906 7249 7542
  1223 2148 8195
  976 2001 5005.

A second data processing device or data processing method of the present technology is a data processing device or data processing method including: an encoding unit/step to perform LDPC encoding based on a parity check matrix of an LDPC code in which a code length is 16200 bits and an encoding rate is 7/15; and an interchanging unit/step to interchange a code bit of an LDPC code in which a code length is 16200 bits and an encoding rate is 7/15 with a symbol bit of a symbol corresponding to any of 16 signal points defined by 16APSK. When 4 bits of code bits stored in four units of storages having a storage capacity of 16200/4 bits and read bit by bit from the units of storages are allocated to one symbol, a (#i +1)-th bit from a most significant bit of the 4 bits of code bits is set to a bit b#i, a (#i+1)-th bit from a most significant bit of 4 bits of symbol bits of the one symbol is set to a bit y#i, and the interchanging unit/step interchanges a bit b0 with a bit y2, a bit b1 with a bit y1, a bit b2 with a bit y0, and a bit b3 with a bit y3. The LDPC code includes an information bit and a parity bit. The parity check matrix includes an information matrix part corresponding to the information bit and a parity matrix part corresponding to the parity bit. The information matrix part is shown by a parity check matrix initial value table. The parity check matrix initial value table is a table showing positions of elements of 1 of the information matrix part for every 360 columns and is expressed as follows 3 137 314 327 983 1597 2028 3043 3217 4109 6020 6178 6535 6560 7146 7
  180 7408 7790 7893 8123 8313 8526 8616 8638
  356 1197 1208 1839 1903 2712 3088 3537 4091 4301 4919 5068 6025 6195
  6324 6378 6686 6829 7558 7745 8042 8382 8587 8602
  18 187 1115 1417 1463 2300 2328 3502 3805 4677 4827 5551 5968 6394 64
  12 6753 7169 7524 7695 7976 8069 8118 8522 8582
  714 2713 2726 2964 3055 3220 3334 3459 5557 5765 5841 6290 6419 6573
  6856 7786 7937 8156 8286 8327 8384 8448 8539 8559
  3452 7935 8092 8623
  56 1955 3000 8242
  1809 4094 7991 8489
  2220 6455 7849 8548
  1006 2576 3247 6976
  2177 6048 7795 8295
  1413 2595 7446 8594
  2101 3714 7541 8531
  10 5961 7484
  3144 4636 5282
  5708 5875 8390
  3322 5223 7975
  197 4653 8283
  598 5393 8624
  906 7249 7542
  1223 2148 8195
  976 2001 5005.

In the second data processing device and data processing method of the present technology, LDPC encoding is performed based on a parity check matrix of an LDPC code in which a code length is 16200 bits and an encoding rate is 7/15, and a code bit of an LDPC code in which a code length is 16200 bits and an encoding rate is 7/15 is interchanged with a symbol bit of a symbol corresponding to any of 16 signal points defined by 16APSK. In the interchanging, when 4 bits of code bits stored in four units of storages having a storage capacity of 16200/4 bits and read bit by bit from the units of storages are allocated to one symbol, a (#i+1)-th bit from a most significant bit of the 4 bits of code bits is set to a bit b#i, a (#i+1)-th bit from a most significant bit of 4 bits of symbol bits of the one symbol is set to a bit y#i, a bit b0 is interchanged with a bit y2, a bit b1 is interchanged with a bit y1, a bit b2 is interchanged with a bit y0, and a bit b3 is interchanged with a bit y3. The LDPC code includes an information bit and a parity bit. The parity check matrix includes an information matrix part corresponding to the information bit and a parity matrix part corresponding to the parity bit. The information matrix part is shown by a parity check matrix initial value table.

The parity check matrix initial value table is a table showing positions of elements of 1 of the information matrix part for every 360 columns and is expressed as follows 3 137 314 327 983 1597 2028 3043 3217 4109 6020 6178 6535 6560 7146 7
  180 7408 7790 7893 8123 8313 8526 8616 8638
  356 1197 1208 1839 1903 2712 3088 3537 4091 4301 4919 5068 6025 6195
  6324 6378 6686 6829 7558 7745 8042 8382 8587 8602
  18 187 1115 1417 1463 2300 2328 3502 3805 4677 4827 5551 5968 6394 64
  12 6753 7169 7524 7695 7976 8069 8118 8522 8582
  714 2713 2726 2964 3055 3220 3334 3459 5557 5765 5841 6290 6419 6573
  6856 7786 7937 8156 8286 8327 8384 8448 8539 8559
  3452 7935 8092 8623
  56 1955 3000 8242
  1809 4094 7991 8489
  2220 6455 7849 8548
  1006 2576 3247 6976
  2177 6048 7795 8295
  1413 2595 7446 8594
  2101 3714 7541 8531
  10 5961 7484
  3144 4636 5282

5708 5875 8390
3322 5223 7975
197 4653 8283
598 5393 8624
906 7249 7542
1223 2148 8195
976 2001 5005.

The data processing device may be an independent device and may be an internal block constituting one device.

Advantageous Effects of Invention

According to an embodiment of the present technology, it is possible to ensure good communication quality in data transmission using an LDPC code.

The advantageous effects described in the present specification are merely exemplary and the advantageous effects of an embodiment of the present technology not limited to the advantageous effects described in the present specification and there may be additional advantageous effects.

BRIEF DESCRIPTION OF DRAWINGS

FIG. 1 is an illustration of a parity check matrix H of an LDPC code.

FIG. 3 is an illustration of an example of a parity check matrix of an LDPC code.

FIG. 11 is an illustration of a parity matrix.

FIG. 13 is an illustration of a parity check matrix of an LDPC code defined in a standard of DVB-S.2.

FIG. 29 is an illustration of a column number of a memory 31 necessary for a column twist interleave and an address of a write start position.

FIG. 30 is an illustration of a column number of a memory 31 necessary for a column twist interleave and an address of a write start position.

FIG. 37 is an illustration of an example of a parity check matrix initial value table in which an encoding rate is 1/4 and a code length is 16200.

FIG. 38 is an illustration of a method of calculating a parity check matrix H from a parity check matrix initial value table.

FIG. 39 is an illustration of an example of a parity check matrix initial value table of a 16 k code for Sx of r=7/15.

FIG. 40 is an illustration of an example of a parity check matrix initial value table of a 16 k code for Sx of r=8/15.

FIG. 43 is an illustration of a minimum cycle length and a performance threshold of the parity check matrix of the 16 k code for Sx.

FIG. 45 is an illustration of a parity check matrix of a 16 k code for Sx.

DESCRIPTION OF EMBODIMENTS

Hereinafter, an LPDC code will be described before embodiments of the present technology are described.

[LDPC Code]

The LDPC code is a linear code and it is not necessary for the LDPC code to be a binary code. However, in this case, it is assumed that the LDPC code is the binary code.

A maximum characteristic of the LDPC code is that a parity check matrix defining the LDPC code is sparse. In this case, the sparse matrix is a matrix in which the number of "1" of elements of the matrix is very small (a matrix in which most elements are 0).

FIG. 1 is an illustration of an example of a parity check matrix H of the LDPC code.

In the parity check matrix H of FIG. 1, a weight of each column (the column weight) (the number of "1") becomes "3" and a weight of each row (the row weight) becomes "6".

In encoding using the LDPC code (LDPC encoding), for example, a generation matrix G is generated on the basis of the parity check matrix H and the generation matrix G is multiplied by binary information bits, so that a code word (LDPC code) is generated.

Specifically, an encoding device that performs the LDPC encoding first calculates the generation matrix G in which an expression $GH^T=0$ is realized, between a transposed matrix $H^T$ of the parity check matrix H and the generation matrix G. In this case, when the generation matrix G is a K×N matrix, the encoding device multiplies the generation matrix G with a bit string (vector u) of information bits including K bits and generates a code word c (=uG) including N bits. The code word (LDPC code) that is generated by the encoding device is received at a reception side through a predetermined communication path.

The LDPC code can be decoded by an algorithm called probabilistic decoding suggested by Gallager, that is, a message passing algorithm using belief propagation on a so-called Tanner graph, including a variable node (also referred to as a message node) and a check node. Hereinafter, the variable node and the check node are appropriately referred to as nodes simply.

Figure 2:
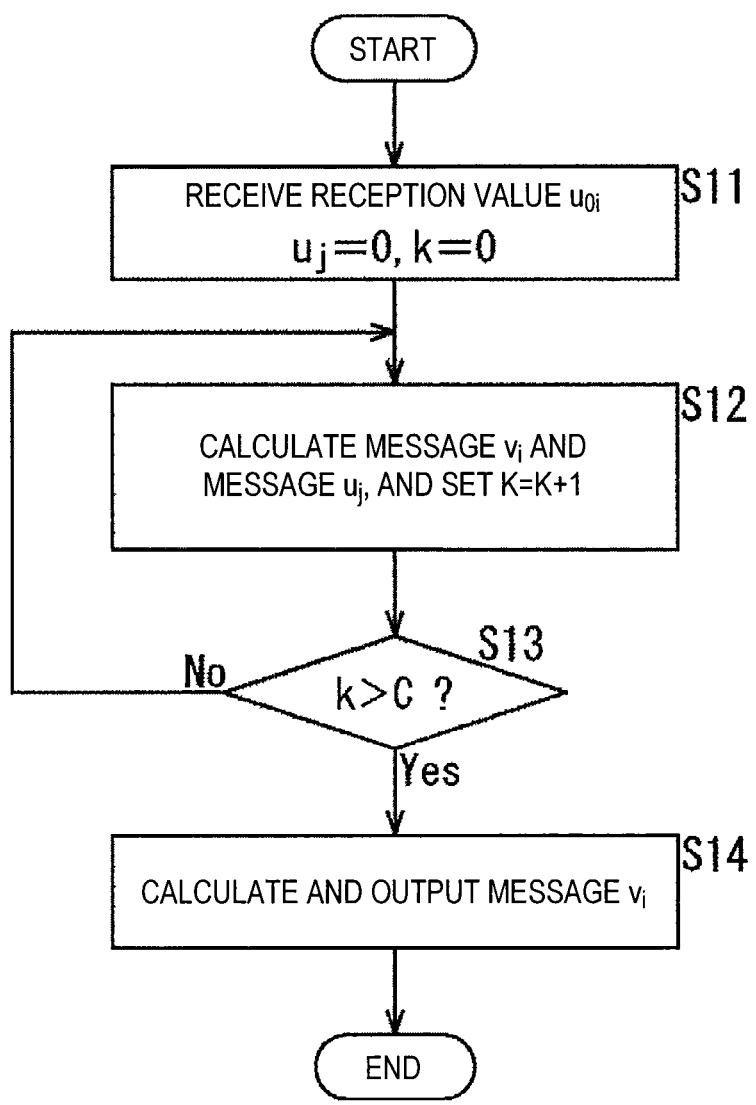
FIG. 2 is a flowchart illustrating a decoding sequence of an LDPC code.

FIG. 2 is a flowchart illustrating a sequence of decoding of the LDPC code.

Hereinafter, a real value (a reception LLR) that is obtained by representing the likelihood of "0" of a value of an i-th code bit of the LDPC code (one code word) received by the reception side by a log likelihood ratio is appropriately referred to as a reception value $u_{0i}$. In addition, a message output from the check node is referred to as $u_j$ and a message output from the variable node is referred to as $v_i$.

First, in decoding of the LDPC code, as illustrated in FIG. 2, in step S11, the LDPC code is received, the message (check node message) $u_j$ is initialized to "0", and a variable k taking an integer as a counter of repetition processing is initialized to "0", and the processing proceeds to step S12. In step S12, the message (variable node message) $v_i$ is calculated by performing an operation (variable node operation) represented by an expression (1), on the basis of the reception value $u_{0i}$ obtained by receiving the LDPC code, and the message $u_j$ is calculated by performing an operation (check node operation) represented by an expression (2), on the basis of the message $v_i$.

[Math. 1]

$$v_i = u_{0i} + \sum_{j=1}^{d_v-1} u_j \qquad (1)$$

[Math. 2]

$$\tanh\left(\frac{u_j}{2}\right) = \prod_{i=1}^{d_c-1} \tanh\left(\frac{v_i}{2}\right) \qquad (2)$$

Here, $d_v$ and $d_c$ in an expression (1) and expression (2) are respectively parameters which can be arbitrarily selected and illustrates the number of "1" in the longitudinal direction (column) and transverse direction (row) of the parity check matrix H. For example, in the case of an LDPC code ((3, 6) LDPC code) with respect to the parity check matrix H with a column weight of 3 and a row weight of 6 as illustrated in FIG. 1, $d_v$=3 and $d_c$=6 are established.

In the variable node operation of the expression (1) and the check node operation of the expression (2), because a message input from an edge (line coupling the variable node and the check node) for outputting the message is not an operation target, an operation range becomes 1 to $d_v$–1 or 1 to $d_c$–1. The check node operation of the expression (2) is performed actually by previously making a table of a function R ($v_1$, $v_2$) represented by an expression (3) defined by one output with respect to two inputs $v_1$ and $v_2$ and using the table consecutively (recursively), as represented by an expression (4).

[Math. 3]

$$x = 2 \tan h^{-1}\{\tan h(v_1/2)\tan h(v_2/2)\} = R(v_1,v_2) \qquad (3)$$

[Math. 4]

$$u_j = R(v_1, R(v_2, R(v_3, \ldots R(v_{d_c}-2, v_{d_c}-1)))) \qquad (4)$$

In step S12, the variable k is incremented by "1" and the processing proceeds to step S13. In step S13, it is determined whether the variable k is more than the predetermined repetition decoding number of times C. When it is determined in step S13 that the variable k is not more than C, the processing returns to step S12 and the same processing is repeated hereinafter.

When it is determined in step S13 that the variable k is more than C, the processing proceeds to step S14, the message $v_i$ that corresponds to a decoding result to be finally output is calculated by performing an operation represented by an expression (5) and is output, and the decoding processing of the LDPC code ends.

[Math. 5]

$$v_i = u_{0i} + \sum_{j=1}^{d_v} u_j \qquad (5)$$

In this case, the operation of the expression (5) is performed using messages $u_j$ from all edges connected to the variable node, different from the variable node operation of the expression (1).

FIG. 3 is an illustration of an example of the parity check matrix H of the (3, 6) LDPC code (an encoding rate of 1/2 and a code length of 12).

In the parity check matrix H of FIG. 3, a weight of a column is set to 3 and a weight of a row is set to 6, similar to FIG. 1.

Figure 4:
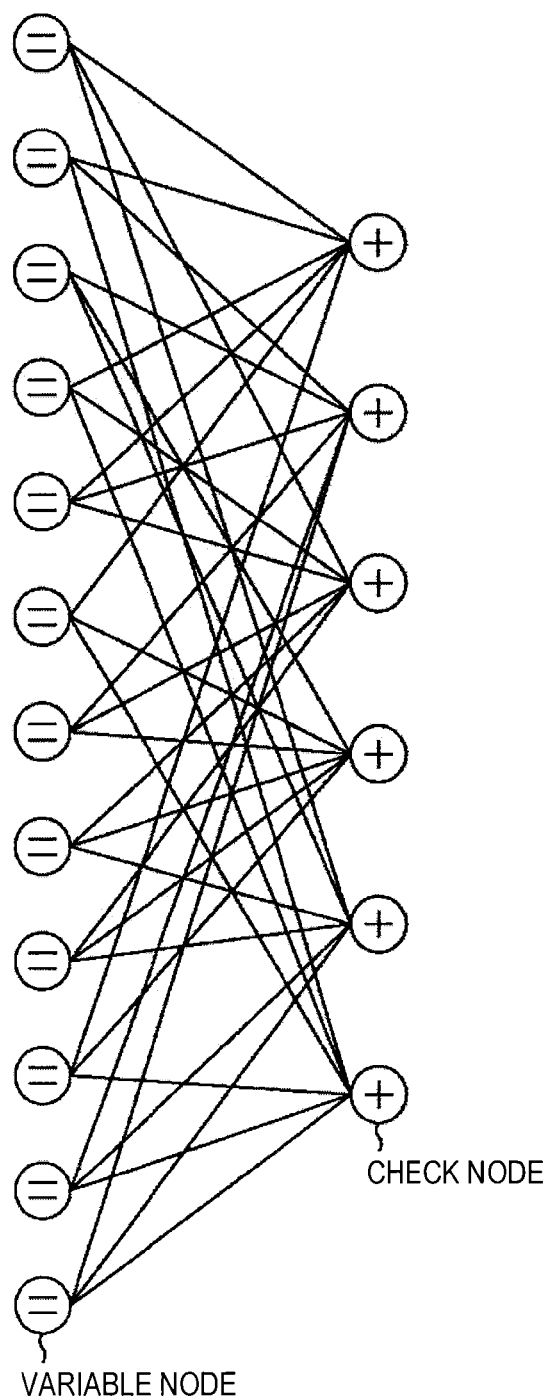
FIG. 4 is an illustration of a Tanner graph of a parity check matrix.

FIG. 4 is an illustration of a Tanner graph of the parity check matrix H of FIG. 3.

In FIG. 4, the check node is represented by "+" (plus) and the variable node is represented by "=" (equal). The check node and the variable node correspond to the row and the column of the parity check matrix H. A line that couples the check node and the variable node is the edge and corresponds to "1" of elements of the parity check matrix.

That is, when an element of a j-th row and an i-th column of the parity check matrix is 1, in FIG. 4, an i-th variable node (node of "=") from the upper side and a j-th check node (node of "+") from the upper side are connected by the edge. The edge shows that a code bit corresponding to the variable node has a restriction condition corresponding to the check node.

In a sum product algorithm that is a decoding method of the LDPC code, the variable node operation and the check node operation are repetitively performed.

Figure 5:
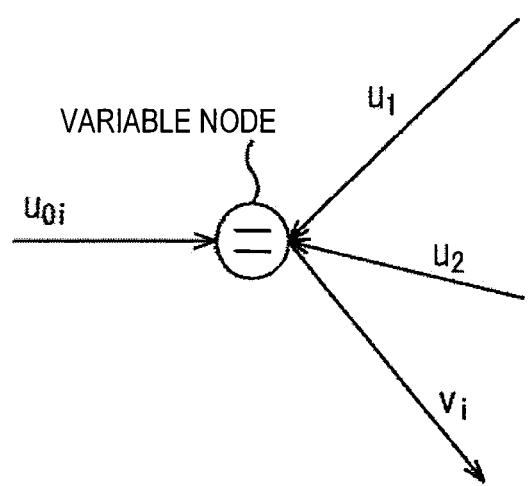
FIG. 5 is an illustration of a variable node.

FIG. 5 is an illustration of the variable node operation that is performed by the variable node.

In the variable node, the message $v_i$ that corresponds to the edge for calculation is calculated by the variable node operation of the expression (1) using messages $u_1$ and $u_2$ from the remaining edges connected to the variable node and the reception value $u_{0i}$. The messages that correspond to the other edges are also calculated by the same method.

Figure 6:
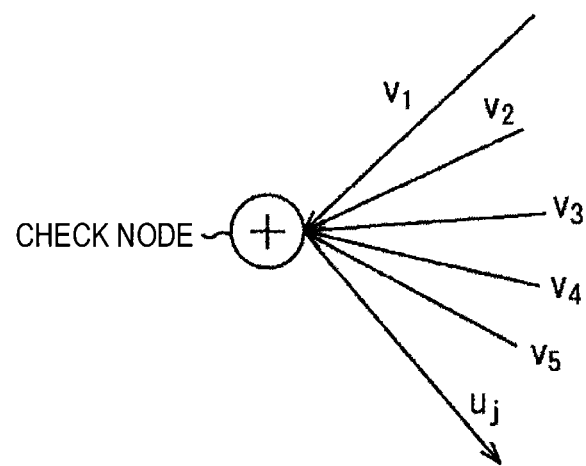
FIG. 6 is an illustration of a check node.

FIG. 6 is an illustration of the check node operation that is performed by the check node.

In this case, the check node operation of the expression (2) can be rewritten by an expression (6) using a relation of an expression a×b=exp{ ln(|a|)+ln(|b|)}×sign(a)×sign(b). However, sign(x) is 1 in the case of x≥0 and is –1 in the case of x<0.

[Math. 6]

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

In x≥0, if a function φ(x) is defined as an expression φ(x)=ln(tan h(x/2)), an expression φ$^{-1}$(x)=2 tan h$^{-1}$(e$^{-x}$) is realized. For this reason, the expression (6) can be changed to an expression (7).

[Math. 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

In the check node, the check node operation of the expression (2) is performed according to the expression (7).

That is, in the check node, as illustrated in FIG. 6, the message $u_j$ that corresponds to the edge for calculation is calculated by the check node operation of the expression (7) using messages $v_1$, $v_2$, $V_3$, $V_4$, and $v_5$ from the remaining edges connected to the check node. The messages that correspond to the other edges are also calculated by the same method.

The function φ(x) of the expression (7) can be represented as φ(x)=ln((e$^x$+1)/(e$^x$−1)) and φ(x)=φ$^{-1}$(x) is satisfied in x>0. When the functions φ(x) and φ$^{-1}$(x) are mounted to hardware, the functions φ(x) and φ$^{-1}$(x) may be mounted using an LUT (Look Up Table). However, both the functions φ(x) and φ$^{-1}$(x) become the same LUT.

<Configuration Example of Transmission System to which Present Technology is Applied>

Figure 7:
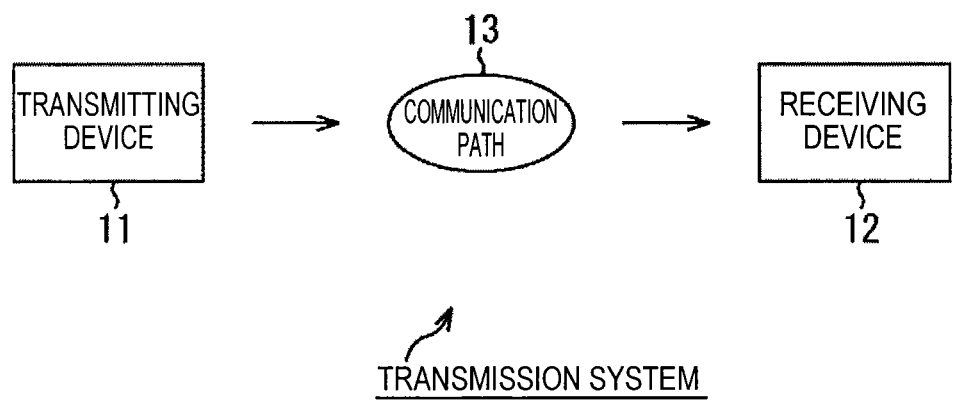
FIG. 7 is an illustration of a configuration example of an embodiment of a transmission system to which the present invention is applied.

FIG. 7 is an illustration of a configuration example of an embodiment of a transmission system (a system means a logical gathering of a plurality of devices and a device of each configuration may be arranged or may not be arranged in the same casing) to which the present invention is applied.

In FIG. 7, the transmission system includes a transmitting device 11 and a receiving device 12.

For example, the transmitting device 11 transmits (broadcasts) (transfers) a program of television broadcasting, and so on. That is, for example, the transmitting device 11 encodes target data that is a transmission target such as image data and audio data as a program into LDPC codes, and, for example, transmits them through a communication path 13 such as a satellite circuit, a ground wave and a cable (wire circuit).

The receiving device 12 receives the LDPC code transmitted from the transmitting device 11 through the communication path 13, decodes the LDPC code to obtain the target data, and outputs the target data.

In this case, it is known that the LDPC code used by the transmission system of FIG. 7 shows the very high capability in an AWGN (Additive White Gaussian Noise) communication path.

Meanwhile, in the communication path 13, burst error or erasure may be generated. Especially in the case where the communication path 13 is the ground wave, for example, in an OFDM (Orthogonal Frequency Division Multiplexing) system, power of a specific symbol may become 0 (erasure) according to delay of an echo (paths other than a main path), under a multi-path environment in which D/U (Desired to Undesired Ratio) is 0 dB (power of Undesired=echo is equal to power of Desired=main path).

In the flutter (communication path in which delay is 0 and an echo having a Doppler frequency is added), when D/U is 0 dB, entire power of an OFDM symbol at a specific time may become 0 (erasure) by the Doppler frequency.

In addition, the burst error may be generated due to a situation of a wiring line from a receiving unit (not illustrated in the drawings) of the side of the receiving device 12 such as an antenna receiving a signal from the transmitting device 11 to the receiving device 12 or instability of a power supply of the receiving device 12.

Meanwhile, in decoding of the LDPC code, in the variable node corresponding to the column of the parity check matrix H and the code bit of the LDPC code, as illustrated in FIG. 5 described above, the variable node operation of the expression (1) with the addition of (the reception value u0i of) the code bit of the LDPC code is performed. For this reason, if error is generated in the code bits used for the variable node operation, precision of the calculated message is deteriorated.

In the decoding of the LDPC code, in the check node, the check node operation of the expression (7) is performed using the message calculated by the variable node connected to the check node. For this reason, if the number of check nodes in which error (including erasure) is generated simultaneously in (the code bits of the LDPC codes corresponding to) the plurality of connected variable nodes increases, decoding performance is deteriorated.

That is, if the two or more variable nodes of the variable nodes connected to the check node become simultaneously erasure, the check node returns a message in which the probability of a value being 0 and the probability of a value being 1 are equal to each other, to all the variable nodes. In this case, the check node that returns the message of the equal probabilities does not contribute to one decoding processing (one set of the variable node operation and the check node operation). As a result, it is necessary to increase the repetition number of times of the decoding processing, the decoding performance is deteriorated, and consumption power of the receiving device 12 that performs decoding of the LDPC code increases.

Therefore, in the transmission system of FIG. 7, tolerance against the burst error or the erasure can be improved while performance in the AWGN communication path (AWGN channel) is maintained.

<Configuration Example of Transmitting Device 11>

Figure 8:
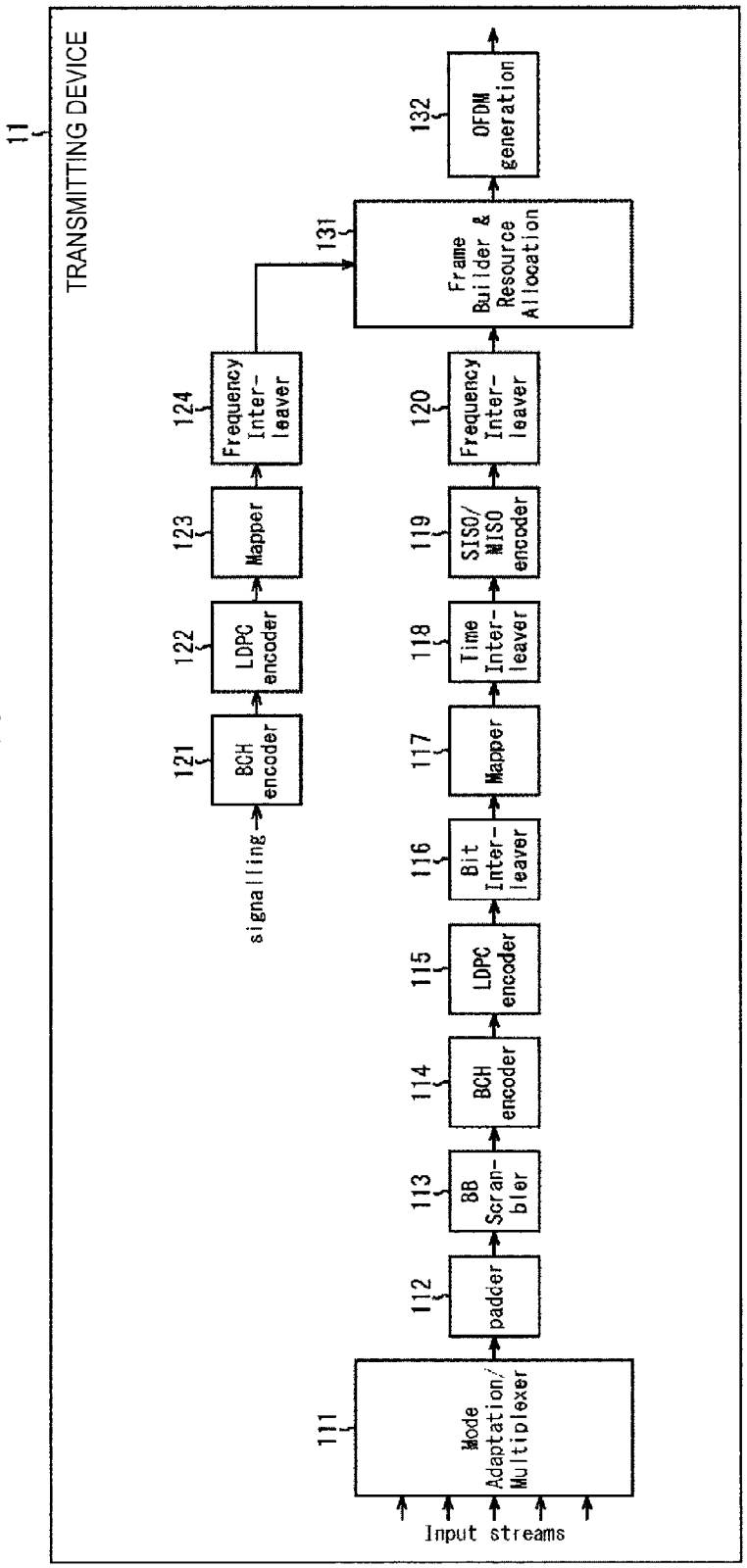
FIG. 8 is a block diagram illustrating a configuration example of a transmitting device 11.

FIG. 8 is a block diagram illustrating a configuration example of the transmitting device 11 of FIG. 7.

In the transmitting device 11, one or more input streams corresponding to target data are supplied to a mode adaptation/multiplexer 111.

The mode adaptation/multiplexer 111 performs mode selection and processes such as multiplexing of one or more input streams supplied thereto, as needed, and supplies data obtained as a result to a padder 112.

The padder 112 performs necessary zero padding (insertion of Null) with respect to the data supplied from the mode adaptation/multiplexer 111 and supplies data obtained as a result to a BB scrambler 113.

The BB scrambler 113 performs base-band scrambling (BB scrambling) with respect to the data supplied from the padder 112 and supplies data obtained as a result to a BCH encoder 114.

The BCH encoder 114 performs BCH encoding with respect to the data supplied from the BB scrambler 113 and supplies data obtained as a result as LDPC target data to be an LDPC encoding target to an LDPC encoder 115.

The LDPC encoder 115 performs LDPC encoding according to a parity check matrix in which a parity matrix to be a portion corresponding to a parity bit of an LDPC code becomes a staircase structure with respect to the LDPC target data supplied from the BCH encoder 114, and outputs an LDPC code in which the LDPC target data is information bits.

That is, the LDPC encoder 115 performs the LDPC encoding to encode the LDPC target data with an LDPC such as the LDPC code (corresponding to the parity check matrix) defined in the predetermined standard of the DVB-S.2, the DVB-T.2, the DVB-C.2 or the like and outputs the predetermined LDPC code (corresponding to the parity check matrix) or the like obtained as a result.

The LDPC code defined in the standard of the DVB-S.2, the DVB-T.2, and the DVB-C.2 is an IRA (Irregular Repeat Accumulate) code and a parity matrix of the parity check matrix of the LDPC code becomes a staircase structure. The parity matrix and the staircase structure will be described later. The IRA code is described in "Irregular Repeat-Accumulate Codes", H. Jin, A. Khandekar, and R. J. McEliece, in Proceedings of 2nd International Symposium on Turbo codes and Related Topics, pp. 1-8, September 2000, for example.

The LDPC code that is output by the LDPC encoder 115 is supplied to the bit interleaver 116.

The bit interleaver 116 performs bit interleave to be described later with respect to the LDPC code supplied from the LDPC encoder 115 and supplies the LDPC code after the bit interleave to a Mapper 117.

The Mapper 117 maps the LDPC code supplied from the bit interleaver 116 to a signal point representing one symbol of orthogonal modulation in a unit (symbol unit) of code bits of one or more bits of the LDPC code and performs the orthogonal modulation (multilevel modulation).

That is, the Mapper 117 performs maps the LDPC code supplied from the bit interleaver 116 to a signal point determined by a modulation method performing the orthogonal modulation of the LDPC code, on an IQ plane (IQ constellation) defined by an I axis representing an I component of the same phase as a carrier and a Q axis representing a Q component orthogonal to the carrier, and performs the orthogonal modulation.

In this case, as the modulation method of the orthogonal modulation performed by the Mapper 117, there are modulation methods including the modulation method defined in the standard of the DVB-S.2, the DVB-T.2, the DVB-C.2 or the like, and other modulation method, that is, BPSK (Binary Phase Shift Keying), QPSK (Quadrature Phase Shift Keying), 8PSK (Phase-Shift Keying), 16APSK (Amplitude Phase-Shift Keying), 32APSK, 16QAM (Quadrature Amplitude Modulation), 64QAM, 256QAM, 1024QAM, 4096QAM, 4PAM (Pulse Amplitude Modulation), or the like. In the Mapper 117, to perform the orthogonal modulation based on which modulation method is previously set according to an operation of an operator of the transmitting device 11.

Data (mapping result where symbol is mapped to the signal point) that is obtained by processing in the Mapper 117 is supplied to the time interleaver 118.

The time interleaver 118 performs time interleave (interleave in a time direction) in a unit of symbol with respect to the data supplied from the Mapper 117 and supplies data obtained as a result to an SISO/MISO encoder (SISO/MISO (Single Input Single Output/Multiple Input Single Output) encoder) 119.

The SISO/MISO encoder 119 performs spatiotemporal encoding with respect to the data supplied from the time interleaver 118 and supplies the data to the frequency interleaver 120.

The frequency interleaver 120 performs frequency interleave (interleave in a frequency direction) in a unit of symbol with respect to the data supplied from the SISO/MISO encoder 119 and supplies the data to a frame builder/resource allocation unit 131.

On the other hand, for example, control data (signalling) for transfer control such as BB signaling (Base Band Signalling) (BB Header) is supplied to the BCH encoder 121.

The BCH encoder 121 performs the BCH encoding with respect to the signaling supplied thereto and supplies data obtained as a result to an LDPC encoder 122, similar to the BCH encoder 114.

The LDPC encoder 122 sets the data supplied from the BCH encoder 121 as LDPC target data, performs the LDPC encoding with respect to the data, and supplies an LDPC code obtained as a result to a Mapper 123, similar to the LDPC encoder 115.

The Mapper 123 maps the LDPC code supplied from the LDPC encoder 122 to a signal point representing one symbol of orthogonal modulation in a unit (symbol unit) of code bits of one or more bits of the LDPC code, performs the orthogonal modulation, and supplies data obtained as a result to the frequency interleaver 124, similar to the Mapper 117.

The frequency interleaver 124 performs the frequency interleave in a unit of symbol with respect to the data supplied from the QAM encoder 123 and supplies the data to the frame builder/resource allocation unit 131, similar to the frequency interleaver 120.

The frame builder/resource allocation unit 131 inserts symbols of pilots into necessary positions of the data (symbols) supplied from the frequency interleavers 120 and 124, configures a frame (for example, a physical layer (PL) frame, a T2 frame, a C2 frame, and so on) including symbols of a predetermined number from data (symbols) obtained as a result, and supplies the frame to an OFDM generating unit 132.

The OFDM generating unit 132 generates an OFDM signal corresponding to the frame from the frame supplied from the frame builder/resource allocation unit 131 and transmits the OFDM signal through the communication path 13 (FIG. 7).

Here, for example, the transmitting device 11 can be configured without including part of the blocks illustrated in FIG. 8 such as the time interleaver 118, the SISO/MISO encoder 119, the frequency interleaver 120 and the frequency interleaver 124.

Figure 9:
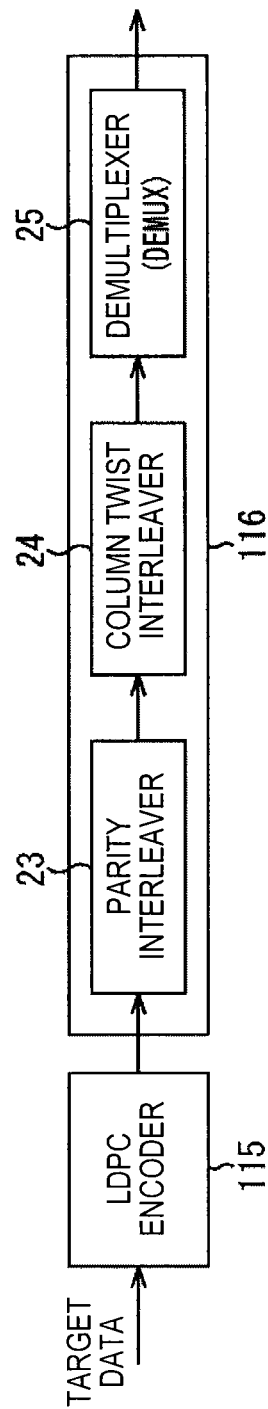
FIG. 9 is a block diagram illustrating a configuration example of a bit interleaver 116.

FIG. 9 illustrates a configuration example of the bit interleaver 116 of FIG. 8.

The bit interleaver 116 includes a function to interleave data and includes the parity interleaver 23, the column twist interleaver 24, and a demultiplexer (DEMUX) 25. Here, the bit interleaver 116 can be configured without including one or both of the parity interleaver 23 and the column twist interleaver 24.

The parity interleaver 23 performs parity interleave for interleaving the parity bits of the LDPC code supplied from the LDPC encoder 115 into positions of other parity bits and supplies the LDPC code after the parity interleave to the column twist interleaver 24.

The column twist interleaver 24 performs the column twist interleave with respect to the LDPC code supplied from the parity interleaver 23 and supplies the LDPC code after the column twist interleave to the demultiplexer 25.

That is, in the Mapper 117 of FIG. 8, the code bits of one or more bits of the LDPC code are mapped to the signal point representing one symbol of the orthogonal modulation and are transmitted.

In the column twist interleaver 24, the column twist interleave to be described later is performed as rearrangement processing for rearranging the code bits of the LDPC code supplied from the parity interleaver 23, such that a plurality of code bits of the LDPC code corresponding to 1 in any one row of the parity check matrix used by the LDPC encoder 115 are not included in one symbol.

The demultiplexer 25 executes interchange processing for interchanging positions of two or more code bits of the LDPC code becoming the symbol, with respect to the LDPC code supplied from the column twist interleaver 24, and obtains an LDPC code in which tolerance against the AWGN or the like is reinforced. In addition, the demultiplexer 25 supplies two or more code bits of the LDPC code obtained by the interchange processing as the symbol to the Mapper 117 (FIG. 8).

Figure 10:
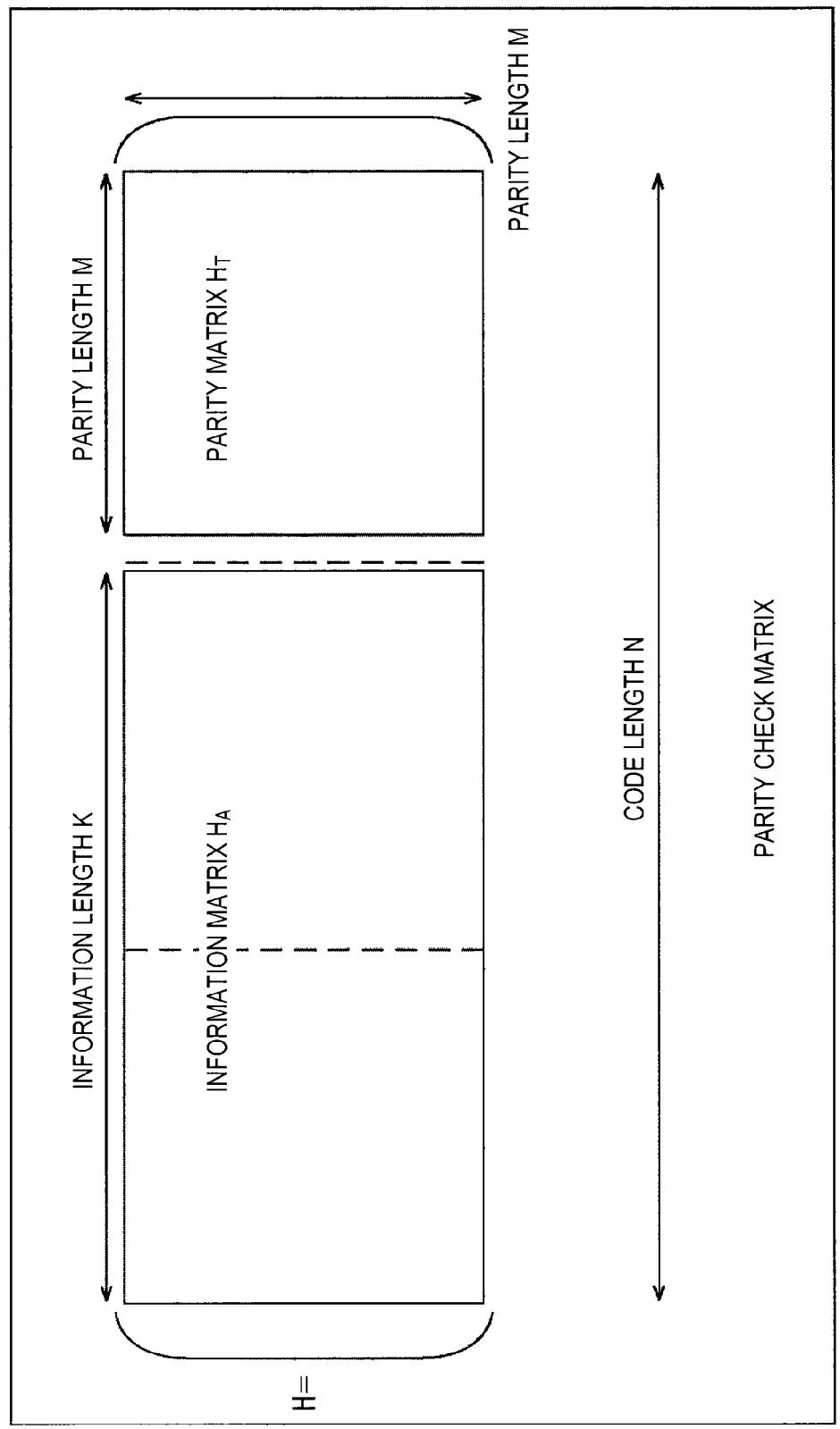
FIG. 10 is an illustration of a parity check matrix.

FIG. 10 illustrates the parity check matrix H that is used for LDPC encoding by the LDPC encoder 115 of FIG. 8.

The parity check matrix H becomes an LDGM (Low-Density Generation Matrix) structure and can be represented by an expression $H=[H_A|H_T]$ (a matrix in which elements of the information matrix $H_A$ are set to left elements and elements of the parity matrix $H_T$ are set to right elements), using an information matrix $H_A$ of a portion corresponding to information bits among the code bits of the LDPC code and a parity matrix $H_T$ corresponding to the parity bits.

In this case, a bit number of the information bits among the code bits of one LDPC code (one code word) and a bit number of the parity bits are referred to as an information length K and a parity length M, respectively, and a bit number of the code bits of one LDPC code is referred to as a code length N (=K+M).

The information length K and the parity length M of the LDPC code having the certain code length N are determined by an encoding rate. The parity check matrix H becomes a matrix in which row×column is M×N. The information matrix $H_A$ becomes a matrix of M×K and the parity matrix $H_T$ becomes a matrix of M×M.

FIG. 11 illustrates the parity matrix $H_T$ of the parity check matrix H of the LDPC code that is defined in the standard of the DVB-S.2, the DVB-T.2, and the DVB-C.2.

The parity matrix $H_T$ of the parity check matrix H of the LDPC code that is defined in the standard of the DVB-T.2 or the like becomes a staircase structure matrix (lower bidagonal matrix) in which elements of 1 are arranged in a staircase shape, as illustrated in FIG. 11. The row weight of the parity matrix $H_T$ becomes 1 with respect to the first row and becomes 2 with respect to the remaining rows. The column weight becomes 1 with respect to the final column and becomes 2 with respect to the remaining columns.

As described above, the LDPC code of the parity check matrix H in which the parity matrix $H_T$ becomes the staircase structure can be easily generated using the parity check matrix H.

That is, the LDPC code (one code word) is represented by a row vector c and a column vector obtained by transposing the row vector is represented by $C^T$. In addition, a portion of information bits of the row vector c to be the LDPC code is represented by a row vector A and a portion of the parity bits is represented by a row vector T.

The row vector c can be represented by an expression c=[A|T] (a row vector in which elements of the row vector A are set to left elements and elements of the row vector T are set to right elements), using the row vector A corresponding to the information bits and the row vector T corresponding to the parity bits.

In the parity check matrix H and the row vector c=[A|T] corresponding to the LDPC code, it is necessary to satisfy an expression $Hc^T=0$. The row vector T that corresponds to the parity bits constituting the row vector c=[A|T] satisfying the expression $Hc^T=0$ can be sequentially calculated by setting elements of each row to 0, sequentially (in order) from elements of a first row of the column vector $Hc^T$ in the expression $Hc^T=0$, when the parity matrix $H_T$ of the parity check matrix $H=[H_A|H_T]$ becomes the staircase structure illustrated in FIG. 11.

Figure 12:
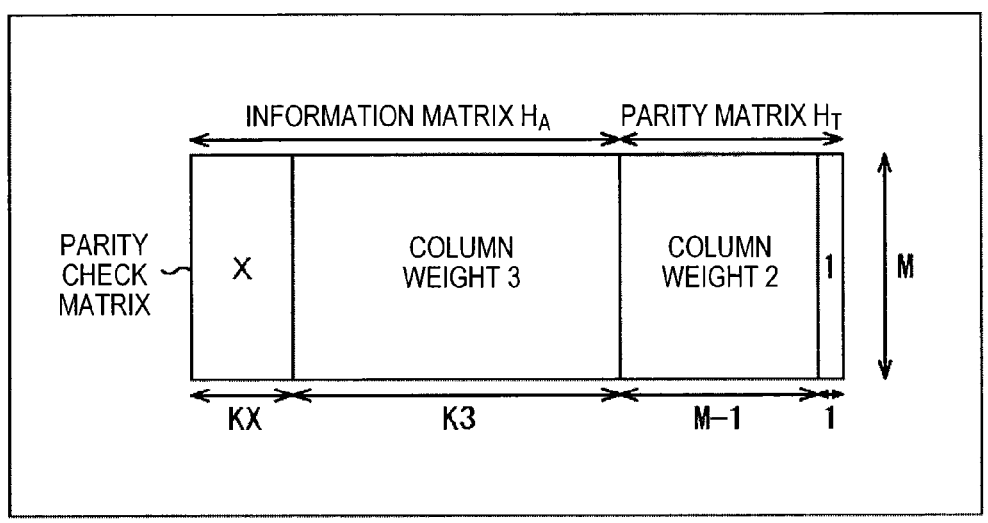
FIG. 12 is an illustration of a parity check matrix of an LDPC code defined in a standard of DVB-S.2.

FIG. 12 is an illustration of the parity check matrix H of the LDPC code that is defined in the standard of the DVB-T.2 or the like.

The column weight becomes X with respect KX columns from a first column of the parity check matrix H of the LDPC code defined in the standard of the DVB-T.2 or the like, becomes 3 with respect to the following K3 columns, becomes 2 with respect to the following (M−1) columns, and becomes 1 with respect to a final column.

In this case, KX+K3+M−1+1 is equal to the code length N.

FIG. 13 is an illustration of column numbers KX, K3, and M and a column weight X, with respect to each encoding rate r of the LDPC code defined in the standard of the DVB-T.2 or the like.

In the standard of the DVB-T.2 or the like, LDPC codes that have code lengths N of 64800 bits and 16200 bits are defined.

With respect to the LDPC code having the code length N of 64800 bits, 11 encoding rates (nominal rates) of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined.

Hereinafter, the code length N of the 64800 bits is referred to as 64 kbits and the code length N of the 16200 is referred to as 16 kbits.

With respect to the LDPC code, an error rate tends to be low in a code bit corresponding to a column of which a column weight of the parity check matrix H is large.

In the parity check matrix H that is illustrated in FIGS. 12 and 13 and is defined in the standard of the DVB-T.2 or the like, a column weight of a column of a head side (left side) tends to be large. Therefore, with respect to the LDPC code corresponding to the parity check matrix H, a code bit of a head side tends to be strong for error (there is tolerance against the error) and a code bit of an ending side tends to be weak for the error.

Figure 14:
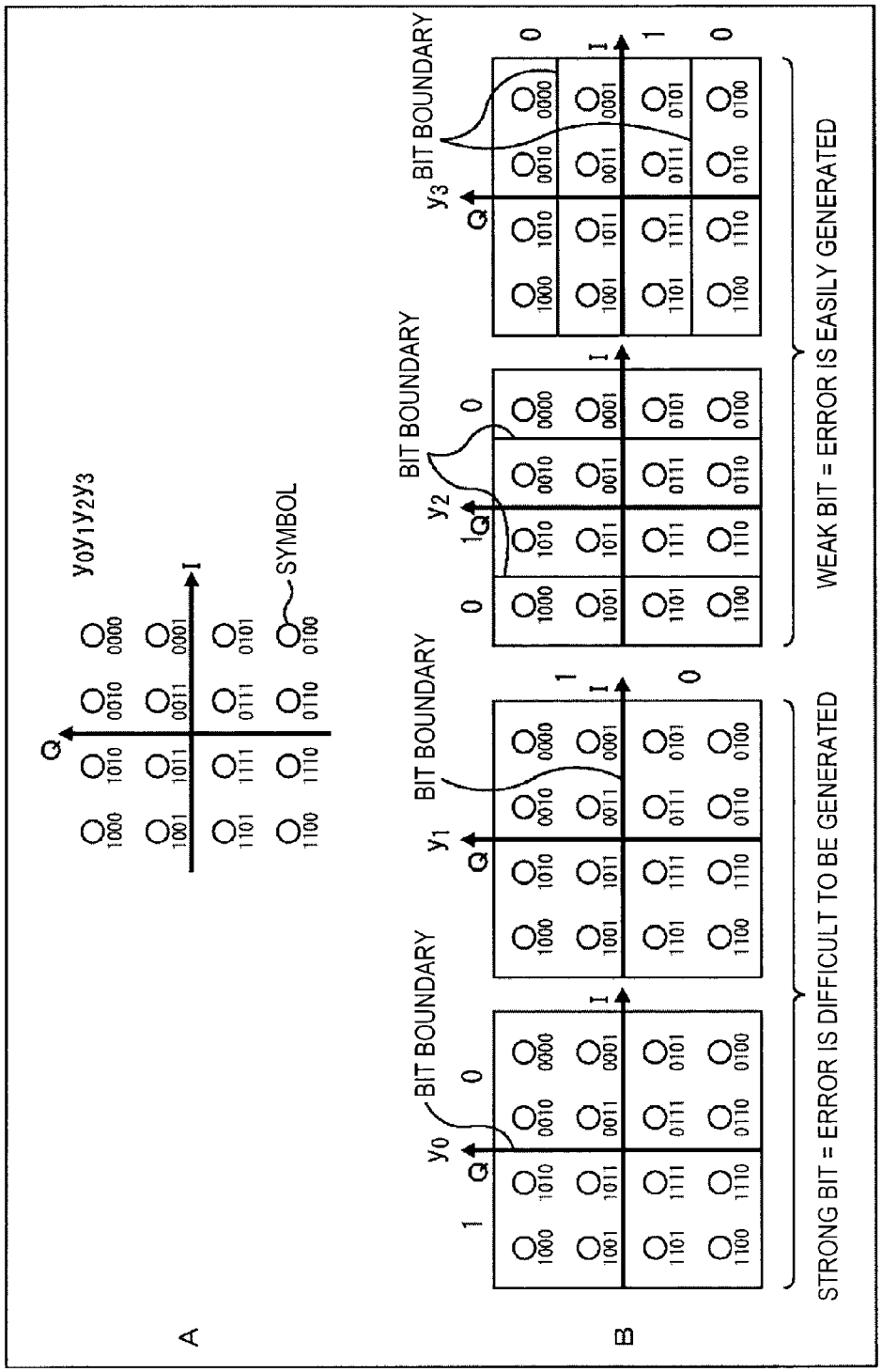
FIG. 14 is an illustration of signal point arrangement of 16QAM.

FIG. 14 illustrates an arrangement example of (signal points corresponding to) 16 symbols on an IQ plane, when 16QAM is performed by the Mapper 117 of FIG. 8.

That is, A of FIG. 14 illustrates symbols of the 16QAM of the DVB-T.2 (a signal point corresponding to the symbol).

In the 16QAM, one symbol is represented by 4 bits and 16 symbols (=2⁴) exist. The 16 symbols are arranged such that an I direction×a Q direction becomes a 4×4 square shape, on the basis of an original point of the IQ plane.

If an (i+1)-th bit from a most significant bit of a bit string represented by one symbol is represented as a bit $y_i$, the 4 bits represented by one symbol of the 16QAM are can be represented as bits $y_0$, $y_1$, $y_2$, and $y_3$, respectively, sequentially from the most significant bit. When a modulation method is the 16QAM, 4 bits of code bits of the LDPC code become a symbol (symbol value) of 4 bits $y_0$ to $y_3$ (symbolized).

B of FIG. 14 illustrates a bit boundary with respect to each of the 4 bits (hereinafter, referred to as symbol bits) $y_0$ to $y_3$ represented by the symbol of the 16QAM.

In this case, a bit boundary with respect to the symbol bit $y_i$ (in FIG. 14, i=0, 1, 2, and 3) means a boundary of a symbol of which a symbol bit $y_i$ becomes 0 and a symbol of which a symbol bit $y_i$ becomes 1.

As illustrated by B of FIG. 14, only one place of the Q axis of the IQ plane becomes a bit boundary with respect to the most significant symbol bit $y_0$ of the 4 bits of symbol bits $y_0$ to $y_3$ represented by the symbol of the 16QAM and only one place of the I axis of the IQ plane becomes a bit boundary with respect to the second (second from the most significant bit) symbol bit $y_1$.

With respect to the third symbol bit $y_2$, two places of a place between first and second columns from the left side and a place between third and four columns, among the 4×4 symbols, become bit boundaries.

With respect to the fourth symbol bit $y_3$, two places of a place between first and second rows from the upper side and a place between third and four rows, among the 4×4 symbols, become bit boundaries.

In the symbol bits $y_i$ that are represented by the symbols, when the number of symbols apart from the bit boundaries is large, the error is difficult to be generated (the error probability is low) and when the number of symbols close to the bit boundaries is large, the error is easily generated (the error probability is high).

If the bits (strong for the error) in which the error is difficult to be generated are referred to as "strong bits" and the bits (weak for the error) in which the error is easily generated are referred to as "weak bits", with respect to the 4 bits of symbol bits $y_0$ to $y_3$ of the symbol of the 16QAM, the most significant symbol bit $y_0$ and the second symbol bit $y_1$ become the strong bits and the third symbol bit $y_2$ and the fourth symbol bit $y_3$ become the weak bits.

Figure 15:
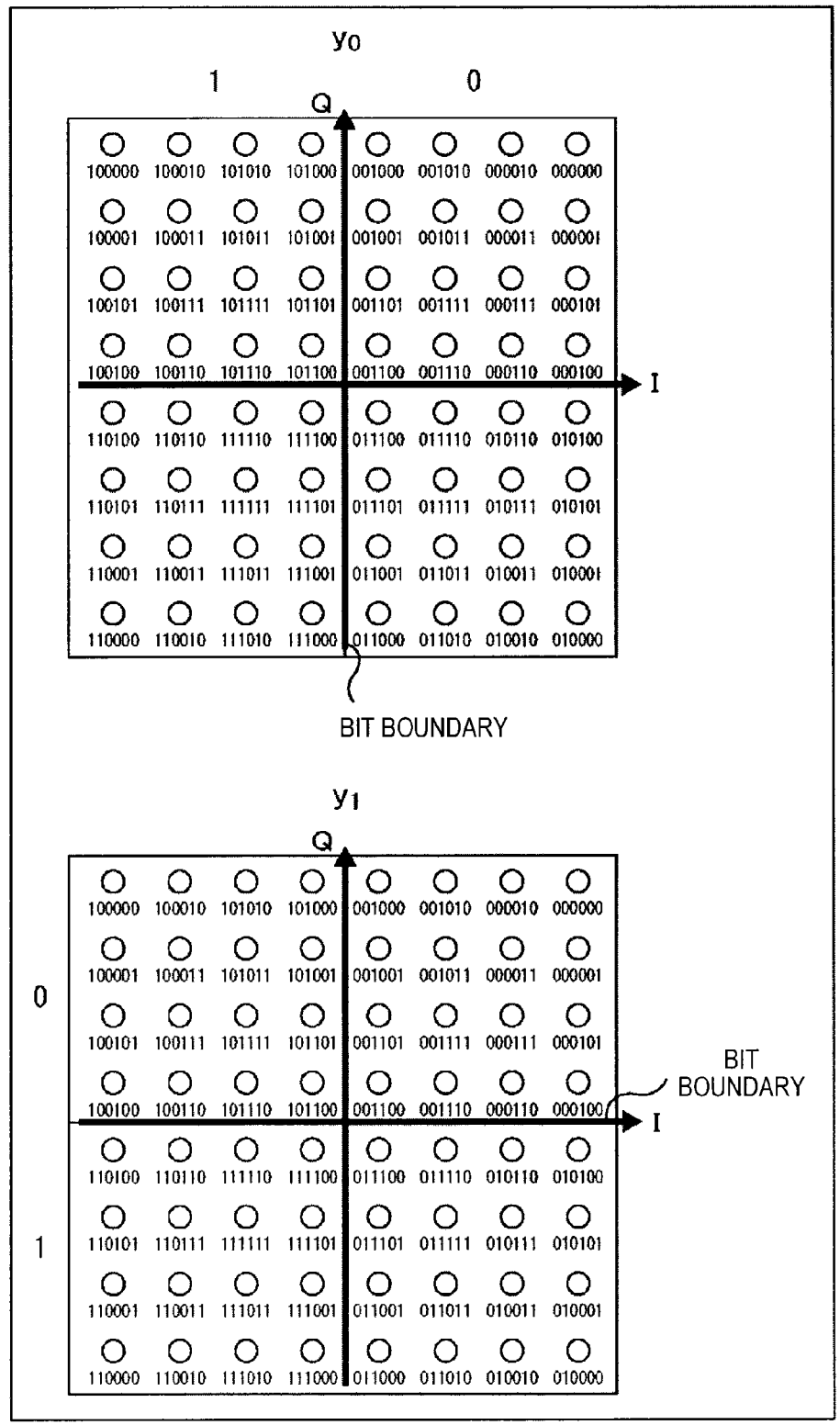
FIG. 15 is an illustration of signal point arrangement of 64QAM.
Figure 16:
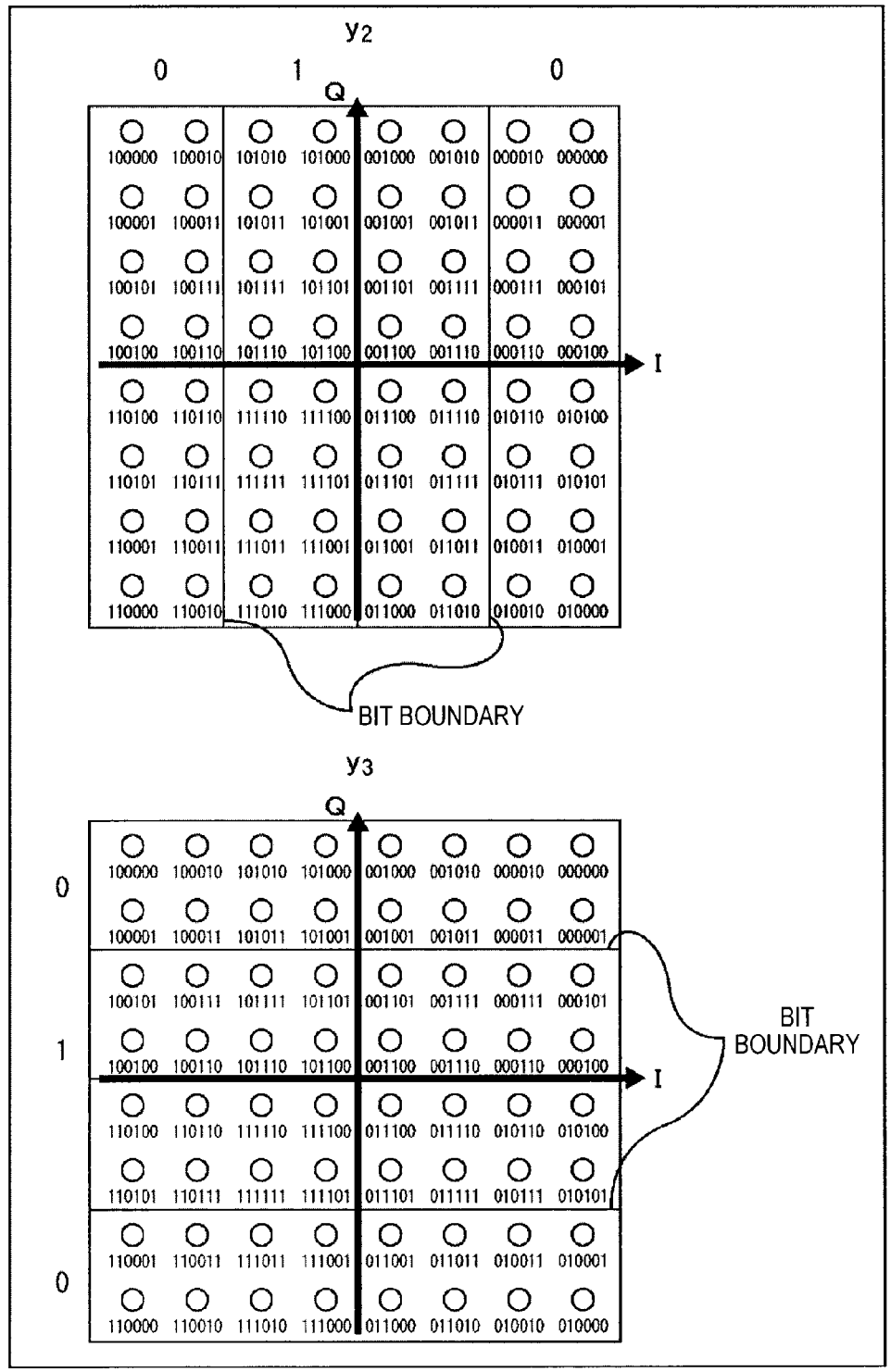
FIG. 16 is an illustration of signal point arrangement of 64QAM.
Figure 17:
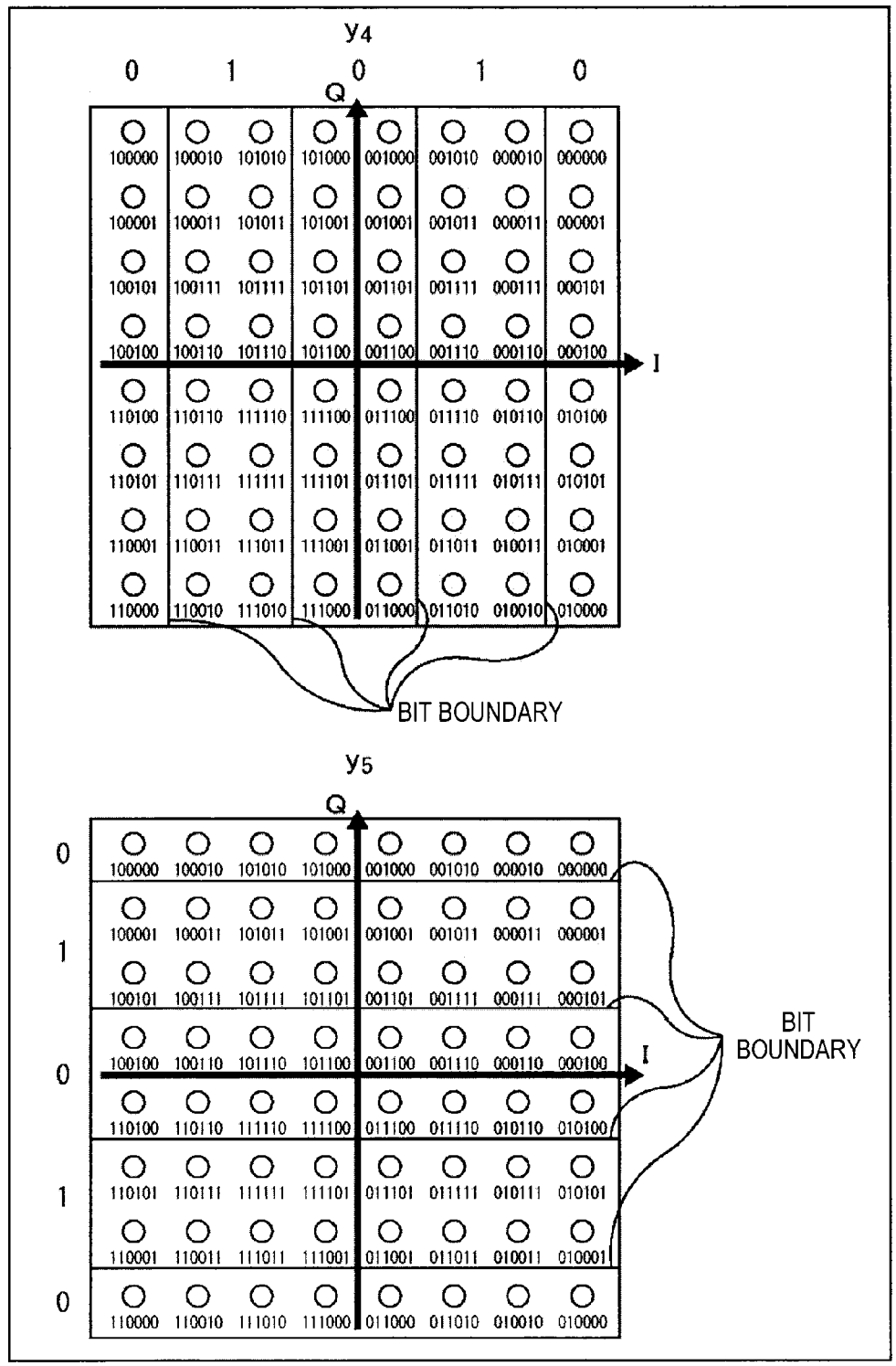
FIG. 17 is an illustration of signal point arrangement of 64QAM.

FIGS. 15 to 17 illustrate an arrangement example of (signal points corresponding to) 64 symbols on an IQ plane, that is, symbols of the 16QAM of the DVB-T.2, when the 64QAM is performed by the Mapper 117 of FIG. 8.

In the 64QAM, one symbol represents 6 bits and 64 symbols (=2⁶) exist. The 64 symbols are arranged such that an I direction×a Q direction becomes an 8×8 square shape, on the basis of an original point of the IQ plane.

The symbol bits of one symbol of the 64QAM can be represented as $y_0$, $y_1$, $y_2$, $y_3$, $y_4$, and $y_5$, sequentially from the most significant bit. When the modulation method is the 64QAM, 6 bits of code bits of the LDPC code become a symbol of symbol bits $y_0$ to $y_5$ of 6 bits.

In this case, FIG. 15 illustrates a bit boundary with respect to each of the most significant symbol bit $y_0$ and the second symbol bit $y_1$ among the symbol bits $y_0$ to $y_5$ of the symbol of the 64QAM, FIG. 16 illustrates a bit boundary with respect to each of the third symbol bit $y_2$ and the fourth symbol bit $y_3$, and FIG. 17 illustrates a bit boundary with respect to each of the fifth symbol bit $y_4$ and the sixth symbol bit $y_5$.

As illustrated in FIG. 15, the bit boundary with respect to each of the most significant symbol bit $y_0$ and the second symbol bit $y_1$ becomes one place. As illustrated in FIG. 16, the bit boundaries with respect to each of the third symbol bit $y_2$ and the fourth symbol bit $y_3$ become two places. As illustrated in FIG. 17, the bit boundaries with respect to each of the fifth symbol bit $y_4$ and the sixth symbol bit $y_5$ become four places.

Therefore, with respect to the symbol bits $y_0$ to $y_5$ of the symbol of the 64QAM, the most significant symbol bit $y_0$ and the second symbol bit $y_i$ become strong bits and the third symbol bit $y_2$ and the fourth symbol bit $y_3$ become next strong bits. In addition, the fifth symbol bit $y_4$ and the sixth symbol bit $y_5$ become weak bits.

From FIGS. 14 and 15 to 17, it can be known that, with respect to the symbol bits of the symbol of the orthogonal modulation, the upper bits tend to become the strong bits and the lower bits tend to become the weak bits.

Figure 18:
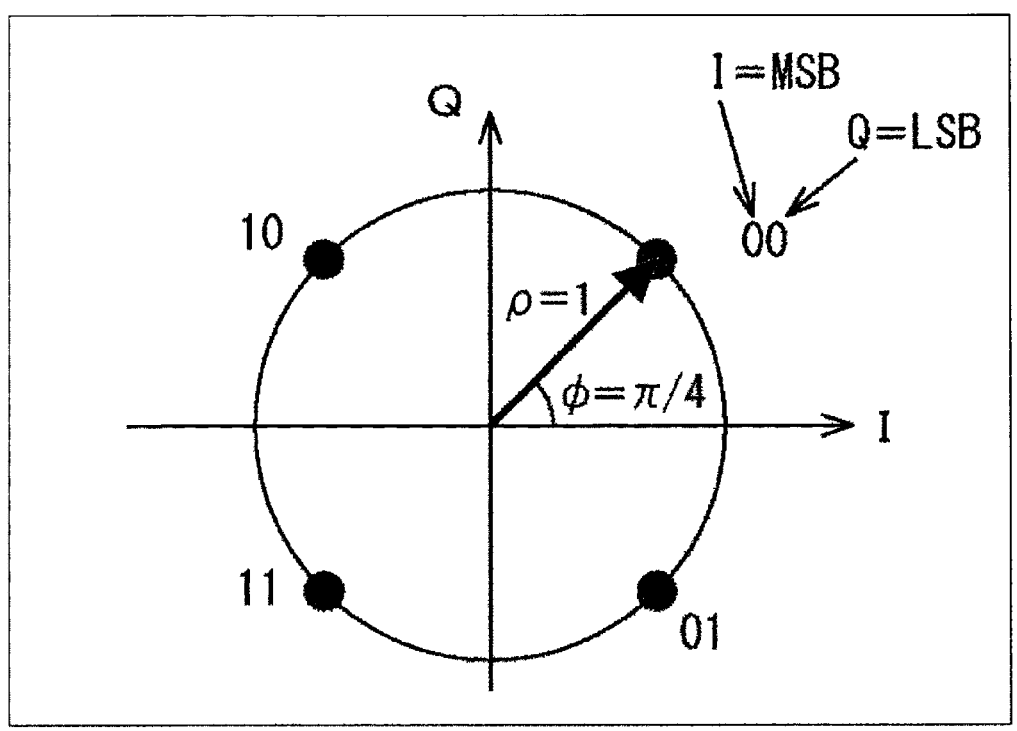
FIG. 18 is an illustration of signal point arrangement defined in the standard of DVB-S.2.

FIG. 18 is an illustration of an example of arrangement on the IQ plane of (signal points corresponding to) 4 symbols in a case where a satellite circuit is adopted as the communication path 13 (FIG. 7) and QPSK is performed in the Mapper 117 of FIG. 8, that is, for example, an illustration of a signal point arrangement of QPSK of DVB-S.2.

In QPSK of DVB-S.2, a symbol is mapped on any of 4 signal points on the circumference of a circle whose radius centering on the origin of the IQ plane is ρ.

Figure 19:
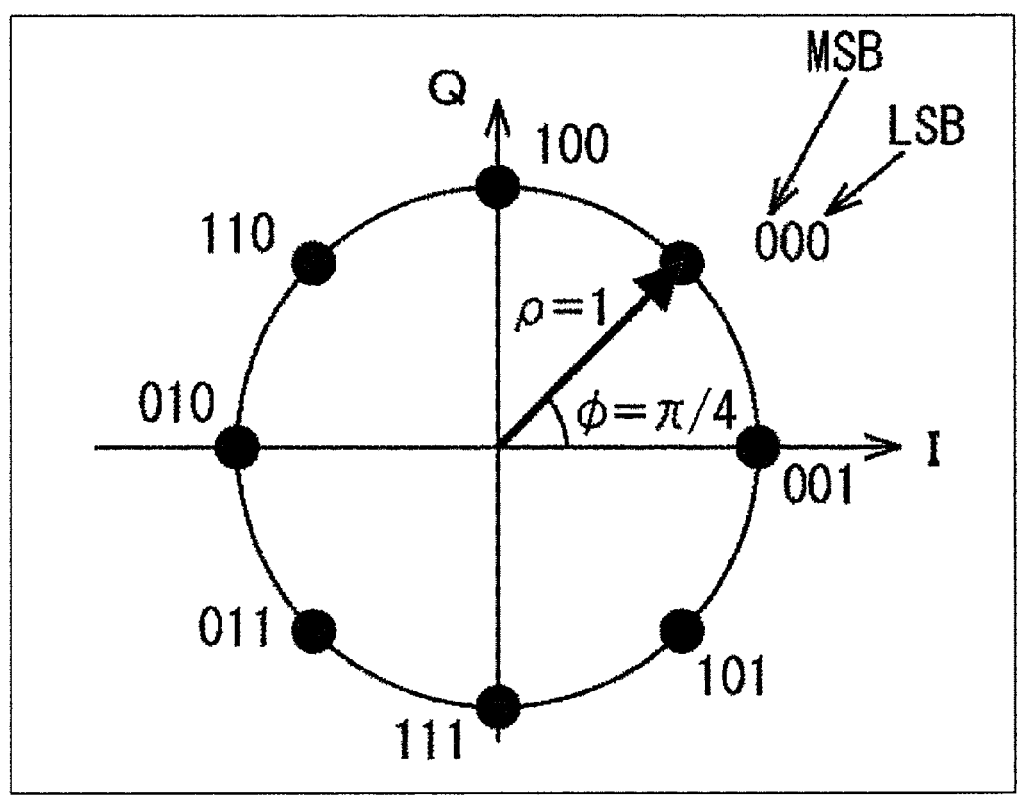
FIG. 19 is an illustration of signal point arrangement defined in the standard of DVB-S.2.

FIG. 19 is an illustration of an example of arrangement on the IQ plane of 8 symbols in a case where a satellite circuit is adopted as the communication path 13 (FIG. 7) and 8PSK is performed in the Mapper 117 of FIG. 8, that is, for example, an illustration of the signal point arrangement of 8PSK of DVB-S.2.

In 8PSK of DVB-S.2, a symbol is mapped on any of 8 signal points on the circumference of a circle whose radius centering on the origin of the IQ plane is ρ.

Figure 20:
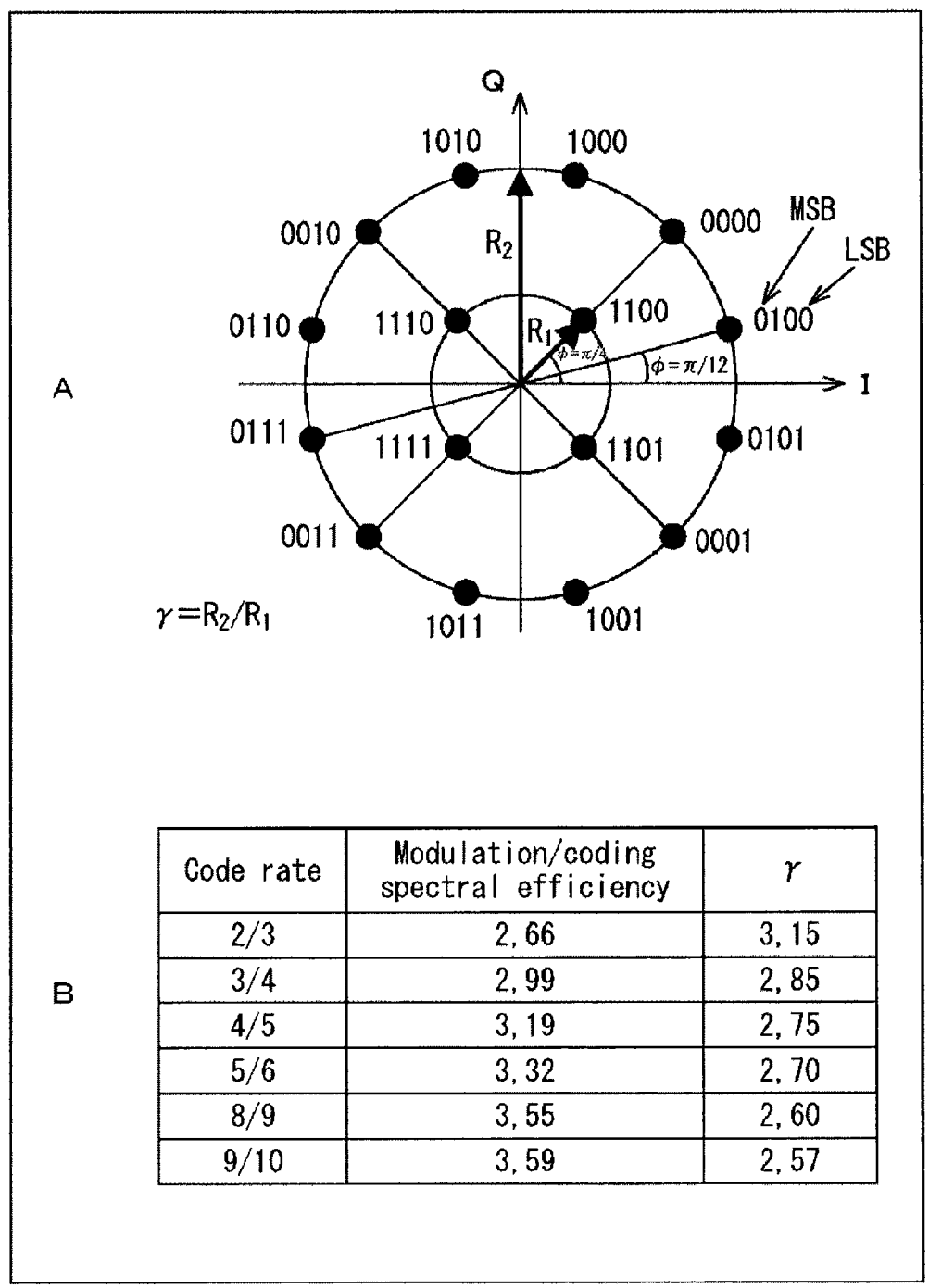
FIG. 20 is an illustration of signal point arrangement defined in the standard of DVB-S.2.

FIG. 20 is an example of arrangement on the IQ plane of 16 symbols in a case where a satellite circuit is adopted as the communication path 13 (FIG. 7) and 16APSK is performed in the Mapper 117 of FIG. 8, that is, for example, an illustration of the signal point arrangement of 16APSK of DVB-S.2.

A of FIG. 20 illustrates the constellation of 16APSK of DVB-S.2.

In 16APSK of DVB-S.2, a symbol is mapped on any of totally 16 signal points of 4 signal points on the circumference of a circle whose radius centering on the origin of the IQ plane is $R_1$ and 12 signal points on the circumference of a circle whose radius is $R_2(>R_1)$.

B of FIG. 20 illustrates $\gamma=R_2/R_1$ which is the ratio of radiuses $R_2$ and $R_1$ in the constellation of 16APSK of DVB-S.2.

In the constellation of 16APSK of DVB-S.2, ratio γ of radiuses $R_2$ and $R_1$ varies depending on each encoding rate.

Figure 21:
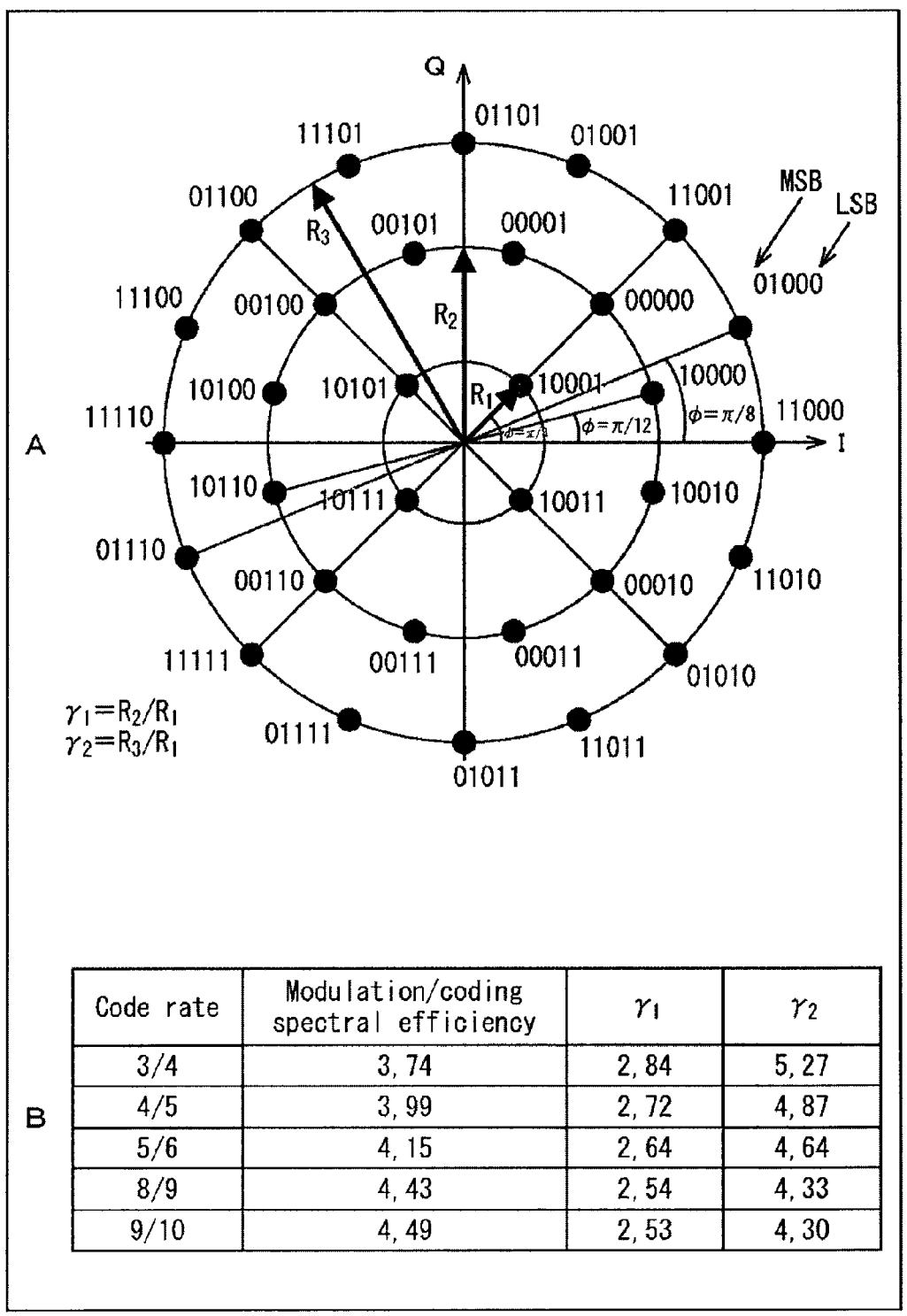
FIG. 21 is an illustration of signal point arrangement defined in the standard of DVB-S.2.

FIG. 21 is an example of arrangement on the IQ plane of 32 symbols in a case where a satellite circuit is adopted as the communication path 13 (FIG. 7) and 32APSK is performed in the Mapper 117 of FIG. 8, that is, for example, an illustration of the signal point arrangement of 32APSK of DVB-S.2.

A of FIG. 21 illustrates the constellation of 32APSK of DVB-S.2.

In 32APSK of DVB-S.2, a symbol is mapped on any of totally 32 signal points of 4 signal points on the circumference of a circle whose radius centering on the origin of the IQ plane is $R_1$, 12 signal points on the circumference of a circle whose radius is $R_2$ ($>R_1$) and 16 signal points on the circumference of a circle whose radius is $R_3$ ($>R_2$).

B of FIG. 21 illustrates $\gamma_1=R_2/R_1$ which is the ratio of radiuses $R_2$ and $R_1$ in the constellation of 32APSK of DVB-S.2 and $72=R_3/R_1$ which is the ratio of radiuses $R_3$ and $R_1$.

In the constellation of 32APSK of DVB-S.2, ratio $\gamma_1$ of radiuses $R_2$ and $R_1$ and ratio $\gamma_2$ of radiuses $R_3$ and $R_1$ vary depending on each encoding rate.

Even for symbol bits of the symbols of each quadrature modulation (QPSK, 8PSK, 16APSK and 32APSK) of DVB-S.2 illustrating the constellation in FIG. 18 to FIG. 21, similar to the cases of FIG. 14 to FIG. 17, there are strong bits and weak bits.

As described in FIG. 12 and FIG. 13, with respect to the LDPC code output by the LDPC encoder 115 (FIG. 8), code bits strong for the error and code bits weak for the error exist.

As described in FIGS. 14 to 21, with respect to the symbol bits of the symbol of the orthogonal modulation performed by the Mapper 117, the strong bits and the weak bits exist.

Therefore, if the code bits of the LDPC code strong for the error are allocated to the weak symbol bits of the symbol of the orthogonal modulation, tolerance against the error may be lowered as a whole.

Therefore, an interleaver that interleaves the code bits of the LDPC code in such a manner that the code bits of the LDPC code weak for the error are allocated to the strong bits (symbol bits) of the symbol of the orthogonal modulation is suggested.

The demultiplexer 25 of FIG. 9 can execute processing of the interleaver.

Figure 22:
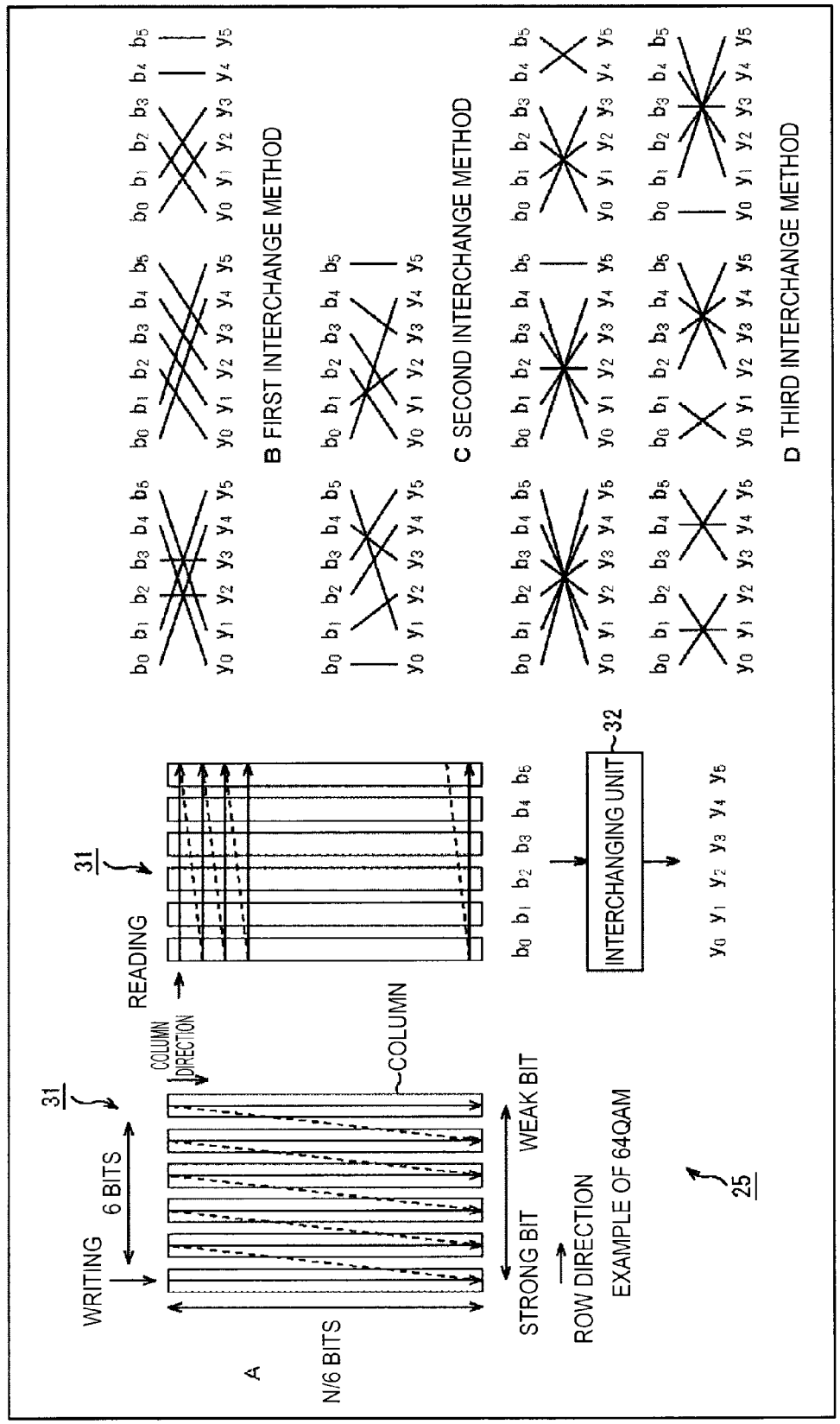
FIG. 22 is an illustration of processing of a demultiplexer 25.

FIG. 22 is an illustration of processing of the demultiplexer 25 of FIG. 9.

That is, A of FIG. 18 illustrates a functional configuration example of the demultiplexer 25.

The demultiplexer 25 includes a memory 31 and an interchanging unit 32.

An LDPC code is supplied from the LDPC encoder 115 to the memory 31.

The memory 31 has a storage capacity to store mb bits in a row (transverse) direction and store N/(mb) bits in a column (longitudinal) direction. The memory 31 writes code bits of the LDPC code supplied thereto in the column direction, reads the code bits in the row direction, and supplies the code bits to the interchanging unit 32.

In this case, N (=information length K+parity length M) represents a code length of the LDPC code, as described above.

In addition, m represents a bit number of the code bits of the LDPC code that becomes one symbol and b represents a multiple that is a predetermined positive integer and is used to perform integral multiplication of m. The demultiplexer 25 symbolizes the code bits of the LDPC code in a unit of predetermined bits m.

However, the multiple b represents the number of symbols obtained by one-time symbolization of the demultiplexer 25.

A of FIG. 22 illustrates a configuration example of the demultiplexer 25 in a case where a modulation method is 64QAM or the like in which mapping is performed on any of 64 signal points, and therefore bit number m of the code bits of the LDPC code becoming one symbol is 6 bits.

In A of FIG. 22, the multiple b becomes 1. Therefore, the memory 31 has a storage capacity in which a column direction×a row direction is N/(6×1)×(6×1) bits.

In this case, a storage region of the memory 31 in which the row direction is 1 bit and which extends in the column direction is appropriately referred to as a column hereinafter. In A of FIG. 22, the memory 31 includes 6 (=6×1) columns.

In the demultiplexer 25, writing of the code bits of the LDPC code in a downward direction (column direction) from the upper side of the columns constituting the memory 31 is performed toward the columns of a rightward direction from the left side.

If writing of the code bits ends to the bottom of the rightmost column, the code bits are read in a unit of 6 bits (mb bits) in the row direction from a first row of all the columns constituting the memory 31 and are supplied to the interchanging unit 32.

The interchanging unit 32 executes interchange processing for interchanging positions of the code bits of the 6 bits from the memory 31 and outputs 6 bits obtained as a result as 6 symbol bits $y_0$, $y_1$, $y_2$, $y_3$, $y_4$, and $y_5$ representing one symbol of the 64QAM.

That is, the code bits of the mb bits (in this case, 6 bits) are read from the memory 31 in the row direction. However, if the i-th (i=0, 1, . . . , and mb−1) bit from the most significant bit, of the code bits of the mb bits read from the memory 31, is represented as a bit $b_i$, the code bits of the 6 bits that are read from the memory 31 in the row direction can be represented as bits $b_0$, $b_1$, $b_2$, $b_3$, $b_4$, and $b_5$, sequentially from the most significant bit.

With the relation of the column weights described in FIGS. 12 and 13, the code bit in a direction of the bit $b_0$ becomes a code bit strong for the error and the code bit in a direction of the bit $b_5$ becomes a code bit weak for the error.

In the interchanging unit 32, interchange processing for interchanging the positions of the code bits $b_0$ to $b_5$ of the 6 bits from the memory 31, such that the code bits weak for the error among the code bits $b_0$ to $b_5$ of the 6 bits from the memory 31 are allocated to the strong bits among the symbol bits $y_0$ to $y_5$ of one symbol of the 64QAM, can be executed.

In this case, as interchange methods for interchanging the code bits $b_0$ to $b_5$ of the 6 bits from the memory 31 and allocating the code bits $b_0$ to $b_5$ of the 6 bits to the 6 symbol bits $y_0$ to $y_5$ representing one symbol of the 64QAM, various methods are suggested from individual companies.

B of FIG. 22 illustrates a first interchange method, C of FIG. 22 illustrates a second interchange method, and D of FIG. 22 illustrates a third interchange method.

In B of FIG. 22 to D of FIG. 22 (same as FIG. 23 to be described later), a line segment coupling the bits $b_i$ and $y_j$ means that the code bit $b_i$ is allocated to the symbol bit $y_j$ of the symbol (interchanged with a position of the symbol bit $y_j$).

As the first interchange method of B of FIG. 22, to adopt any one of three kinds of interchange methods is suggested. As the second interchange method of C of FIG. 22, to adopt any one of two kinds of interchange methods is suggested.

As the third interchange method of D of FIG. 22, to sequentially select six kinds of interchange methods and use the interchange method is suggested.

Figure 23:
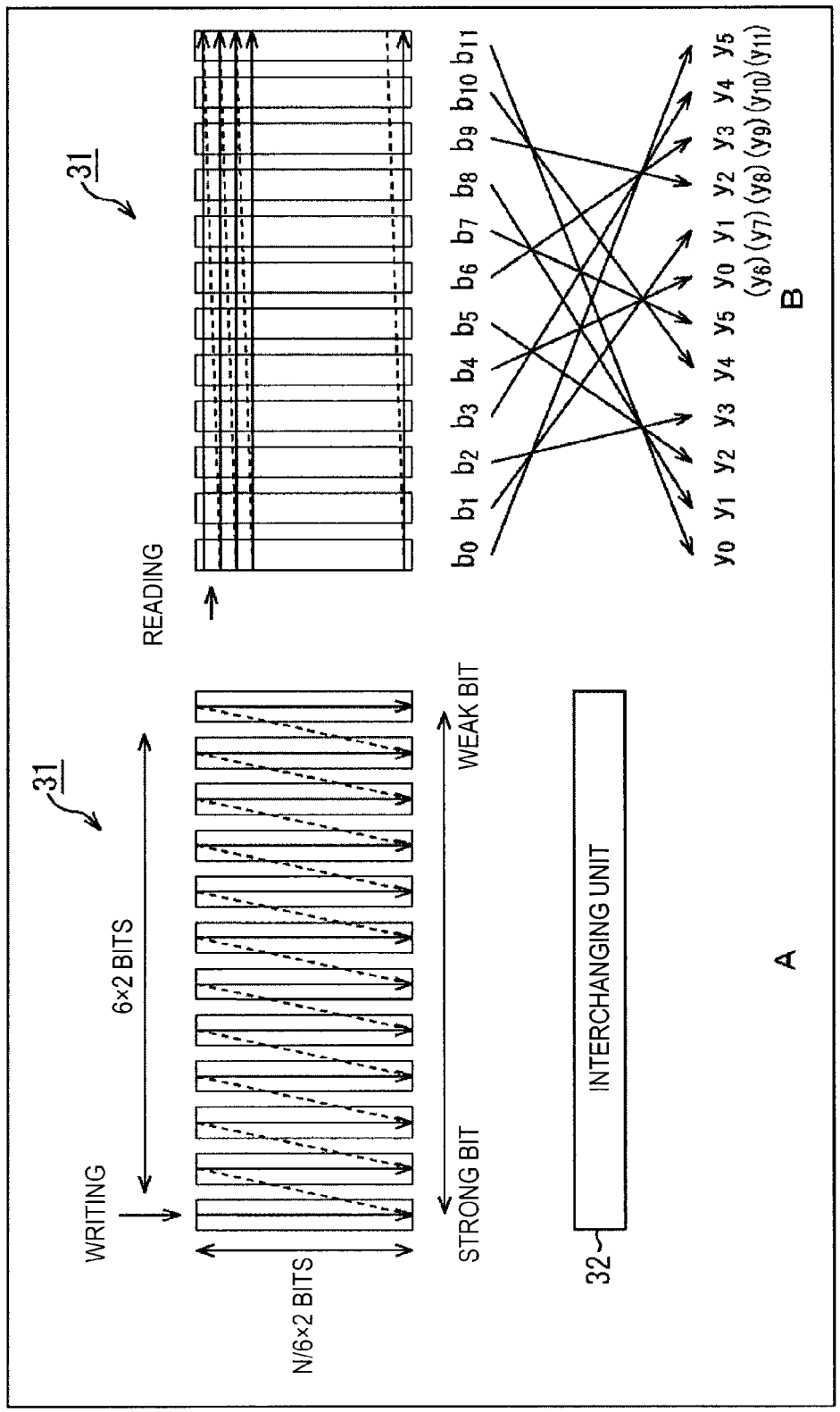
FIG. 23 is an illustration of processing of a demultiplexer 25.

FIG. 23 illustrates a configuration example of the demultiplexer 25 in a case where a modulation method is 64QAM or the like in which mapping is performed on any of 64 signal points (therefore, bit number m of the code bits of the LDPC code mapped on one symbol is 6 bits as well as FIG. 22) and multiple b is 2, and the fourth interchange method.

When the multiple b is 2, the memory 31 has a storage capacity in which a column direction×a row direction is N/(6×2)×(6×2) bits and includes 12 (=6×2) columns.

A of FIG. 23 illustrates a sequence of writing the LDPC code to the memory 31.

In the demultiplexer 25, as described in FIG. 22, writing of the code bits of the LDPC code in a downward direction (column direction) from the upper side of the columns constituting the memory 31 is performed toward the columns of a rightward direction from the left side.

If writing of the code bits ends to the bottom of the rightmost column (if writing a code word has been finished), the code bits are read in a unit of 12 bits (mb bits) in the row direction from a first row of all the columns constituting the memory 31 and are supplied to the interchanging unit 32.

The interchanging unit 32 executes interchange processing for interchanging positions of the code bits of the 12 bits from the memory 31 using the fourth interchange method and outputs 12 bits obtained as a result as 12 bits representing two symbols (b symbols) of the 64QAM, that is, six symbol bits y0, $y_1$, $y_2$, $y_3$, $y_4$, and $y_5$ representing one symbol of the 64QAM and six symbol bits $y_0$, $y_1$, $y_2$, $y_3$, $y_4$, and $y_5$ representing a next one symbol.

In this case, B of FIG. 23 illustrates the fourth interchange method of the interchange processing by the interchanging unit 32 of A of FIG. 23.

When the multiple b is 2 (or 3 or more), in the interchange processing, the code bits of the mb bits are allocated to the symbol bits of the mb bits of the b consecutive symbols. In the following explanation including the explanation of FIG. 23, the (i+1)-th bit from the most significant bit of the symbol bits of the mb bits of the b consecutive symbols is represented as a bit (symbol bit) $y_i$, for the convenience of explanation.

What kind of code bits are appropriate to be interchanged, that is, the improvement of the error rate in the AWGN communication path or the like is different according to the encoding rate or the code length of the LDPC code and the modulation method.

<Parity Interleave>

Next, the parity interleave by the parity interleaver 23 of FIG. 9 will be described with reference to FIGS. 24 to 26.

Figure 24:
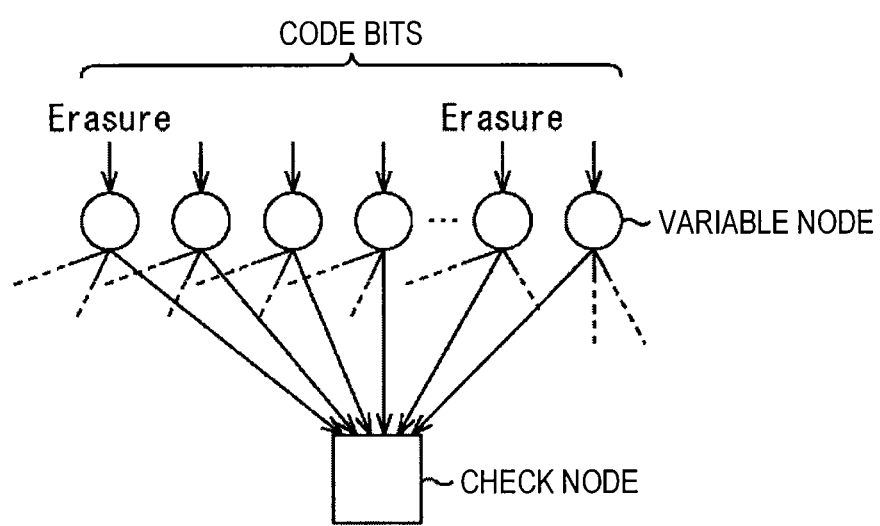
FIG. 24 is an illustration of a Tanner graph for decoding of an LDPC code.

FIG. 24 illustrates (a part of) a Tanner graph of the parity check matrix of the LDPC code.

As illustrated in FIG. 24, if a plurality of, for example, two variable nodes among (the code bits corresponding to) the variable nodes connected to the check node simultaneously become the error such as the erasure, the check node returns a message in which the probability of a value being 0 and the probability of a value being 1 are equal to each other, to all the variable nodes connected to the check node. For this reason, if the plurality of variable nodes connected to the same check node simultaneously become the erasure, decoding performance is deteriorated.

Meanwhile, the LDPC code that is output by the LDPC encoder 115 of FIG. 8 and is defined in the standard of the DVB-S.2 or the like is an IRA code and the parity matrix $H_T$ of the parity check matrix H becomes a staircase structure, as illustrated in FIG. 11.

Figure 25:
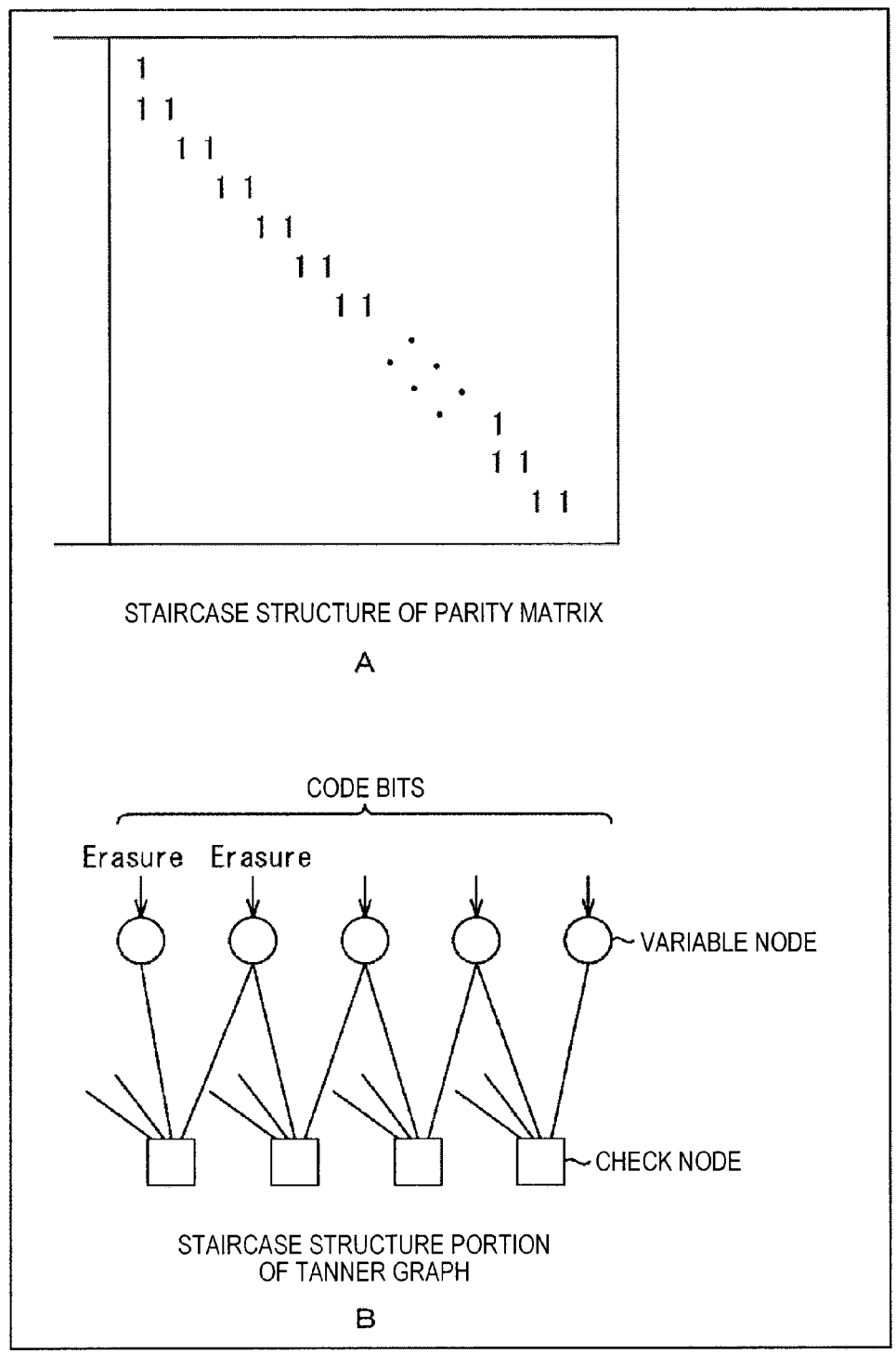
FIG. 25 is an illustration of a parity matrix $H_T$ becoming a staircase structure and a Tanner graph corresponding to the parity matrix $H_T$.

FIG. 25 illustrates the parity matrix $H_T$ becoming the staircase structure and a Tanner graph corresponding to the parity matrix $H_T$.

That is, A of FIG. 25 illustrates the parity matrix HT becoming the staircase structure and B of FIG. 25 illustrates the Tanner graph corresponding to the parity matrix HT of A of FIG. 25.

In the parity matrix $H_T$ with a staircase structure, elements of 1 are adjacent in each row (excluding the first row). Therefore, in the Tanner graph of the parity matrix $H_T$, two adjacent variable nodes corresponding to a column of two adjacent elements in which the value of the parity matrix $H_T$ is 1 are connected with the same check node.

Therefore, when parity bits corresponding to two above-mentioned adjacent variable nodes become errors at the same time by burst error and erasure, and so on, the check node connected with two variable nodes (variable nodes to find a message by the use of parity bits) corresponding to those two parity bits that became errors returns message that the probability with a value of 0 and the probability with a value of 1 are equal probability, to the variable nodes connected with the check node, and therefore the performance of decoding is deteriorated. Further, when the burst length (bit number of parity bits that continuously become errors) becomes large, the number of check nodes that return the message of equal probability increases and the performance of decoding is further deteriorated.

Therefore, the parity interleaver 23 (FIG. 9) performs the parity interleave for interleaving the parity bits of the LDPC code from the LDPC encoder 115 into positions of other parity bits, to prevent the decoding performance from being deteriorated.

Figure 26:
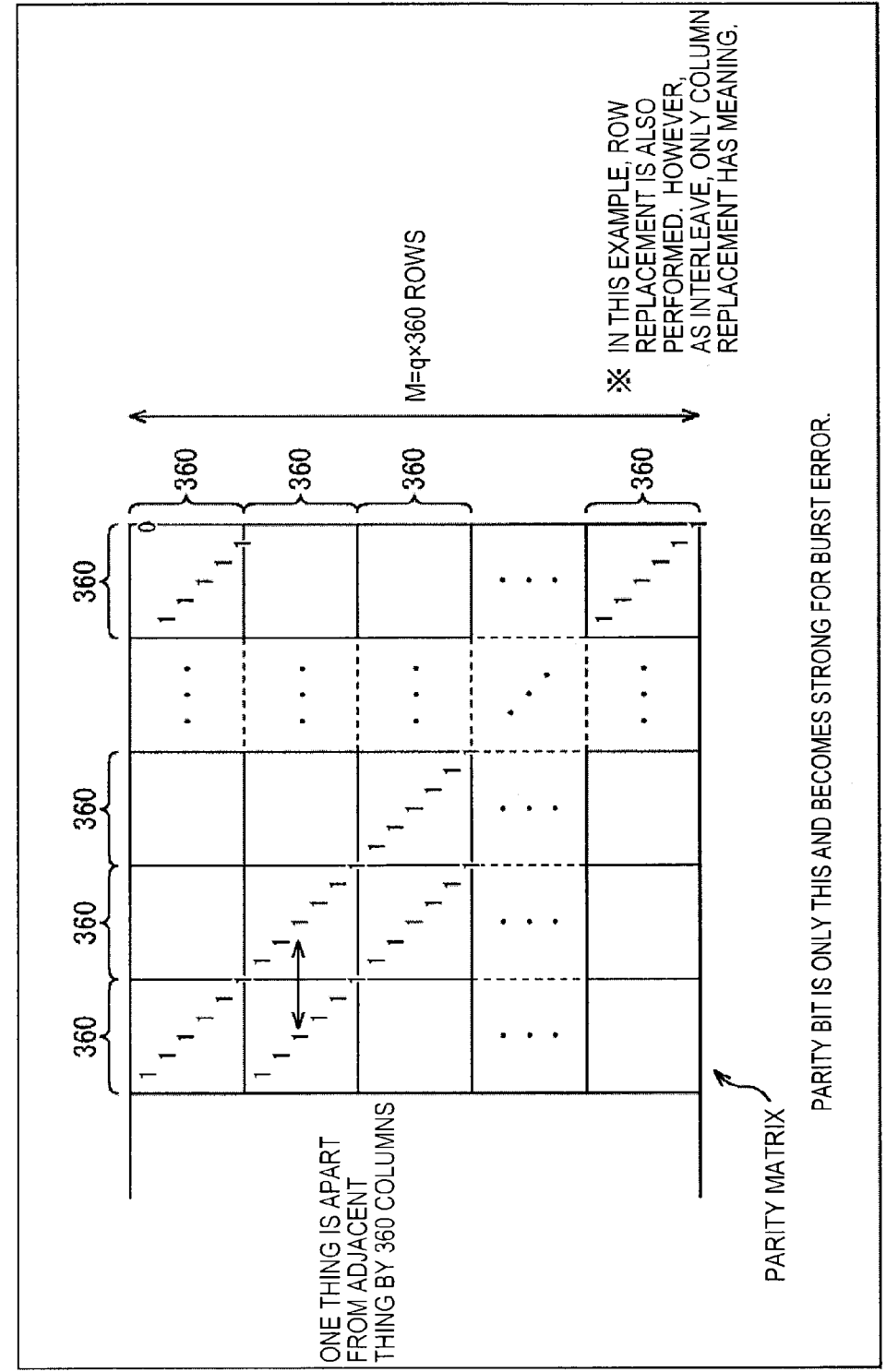
FIG. 26 is an illustration of a parity matrix $H_T$ of a parity check matrix H corresponding to an LDPC code after parity interleave.

FIG. 26 illustrates the parity matrix $H_T$ of the parity check matrix H corresponding to the LDPC code after the parity interleave performed by the parity interleaver 23 of FIG. 9.

In this case, the information matrix $H_A$ of the parity check matrix H corresponding to the LDPC code that is output by the LDPC encoder 115 and is defined in the standard of the DVB-S.2 or the like becomes a cyclic structure.

The cyclic structure means a structure in which a certain column is matched with a column obtained by cyclically shifting another column. For example, the cyclic structure includes a structure in which a position of 1 of each row of P columns becomes a position obtained by cyclically shifting a first column of the P columns in a column direction by a value proportional to a value q obtained by dividing a parity length M, for every P columns. Hereinafter, the P columns in the cyclic structure are appropriately referred to as a column number of a unit of the cyclic structure.

As an LDPC code defined in a standard such as DVB-S.2, as described in FIG. 12 and FIG. 13, there are two kinds of LDPC codes whose code length N is 64800 bits and 16200 bits, and, for both of those two kinds of LDPC codes, the column number P which is a unit of a cyclic structure is defined as 360 which is one of divisors excluding 1 and M among the divisors of the parity length M.

The parity length M becomes a value other than primes represented by an expression M=q×P=q×360, using a value q different according to the encoding rate. Therefore, similar to the column number P of the unit of the cyclic structure, the value q is one other than 1 and M among the divisors of the parity length M and is obtained by dividing the parity length M by the column number P of the unit of the cyclic structure (the product of P and q to be the divisors of the parity length M becomes the parity length M).

As described above, when information length is assumed to be K, an integer equal to or greater than 0 and less than P is assumed to be x and an integer equal to or greater than 0 and less than q is assumed to be y, the parity interleaver 23 interleaves the K+qx+y+1-th code bit among code bits of an LDPC code of N bits to the position of the K+Py+x+1-th code bit as parity interleave.

Since both of the K+qx+y+1-th code bit and the K+Py+x+1-th code bit are code bits after the K+1-th one, they are parity bits, and therefore the positions of the parity bits of the LDPC code are moved according to the parity interleave.

According to the parity interleave, (the parity bits corresponding to) the variable nodes connected to the same check node are separated by the column number P of the unit of the cyclic structure, that is, 360 bits in this case. For this reason, when the burst length is less than 360 bits, the plurality of variable nodes connected to the same check node can be prevented from simultaneously becoming the error. As a result, tolerance against the burst error can be improved.

The LDPC code after the interleave for interleaving the (K+qx+y+1)-th code bit into the position of the (K+Py+x+1)-th code bit is matched with an LDPC code of a parity check matrix (hereinafter, referred to as a transformed parity check matrix) obtained by performing column replacement for replacing the (K+qx+y+1)-th column of the original parity check matrix H with the (K+Py+x+1)-th column.

In the parity matrix of the transformed parity check matrix, as illustrated in FIG. 26, a pseudo cyclic structure that uses the P columns (in FIG. 26, 360 columns) as a unit appears.

In this case, the pseudo cyclic structure means a structure in which a cyclic structure is formed except for a part thereof. The transformed parity check matrix that is obtained by performing the column replacement corresponding to the parity interleave with respect to the parity check matrix of the LDPC code defined in the standard of the DVB-S.2 or the like becomes the pseudo cyclic structure, not the (perfect) cyclic structure, because the number of elements of 1 is less than 1 (elements of 0 exist) in a portion (shifted matrix to be described later) of 360 rows ×360 columns of a right corner portion thereof.

The transformed parity check matrix of FIG. 26 becomes a matrix that is obtained by performing the column replacement corresponding to the parity interleave and replacement (row replacement) of a row to configure the transformed parity check matrix with a constitutive matrix to be described later, with respect to the original parity check matrix H.

<Column Twist Interleave>

Next, column twist interleave corresponding to rearrangement processing by the column twist interleaver 24 of FIG. 9 will be described with reference to FIGS. 27 to 30.

In the transmitting device 11 of FIG. 8, one or more bits of the code bits of the LDPC code are transmitted as one symbol. That is, when two bits of the code bits are set as one symbol, the QPSK is used as the modulation method and when four bits of the code bits are set as one symbol, the APSK or the 16QAM is used as the modulation method.

As such, when the two or more bits of the code bits are transmitted as one symbol, if the erasure is generated in a certain symbol, all of the code bits of the symbol become the error (erasure).

Therefore, it is necessary to prevent the variable nodes corresponding to the code bits of one symbol from being connected to the same check node, in order to decrease the probability of (the code bits corresponding to) the plurality of variable nodes connected to the same check node simultaneously becoming the erasure to improve the decoding performance.

Meanwhile, as described above, in the parity check matrix H of the LDPC code that is output by the LDPC encoder 115 and is defined in the standard of the DVB-S.2 or the like, the information matrix $H_A$ has the cyclic structure and the parity matrix $H_T$ has the staircase structure. As described in FIG. 26, in the transformed parity check matrix to be the parity check matrix of the LDPC code after the parity interleave, the cyclic structure (in fact, the pseudo cyclic structure as described above) appears in the parity matrix.

Figure 27:
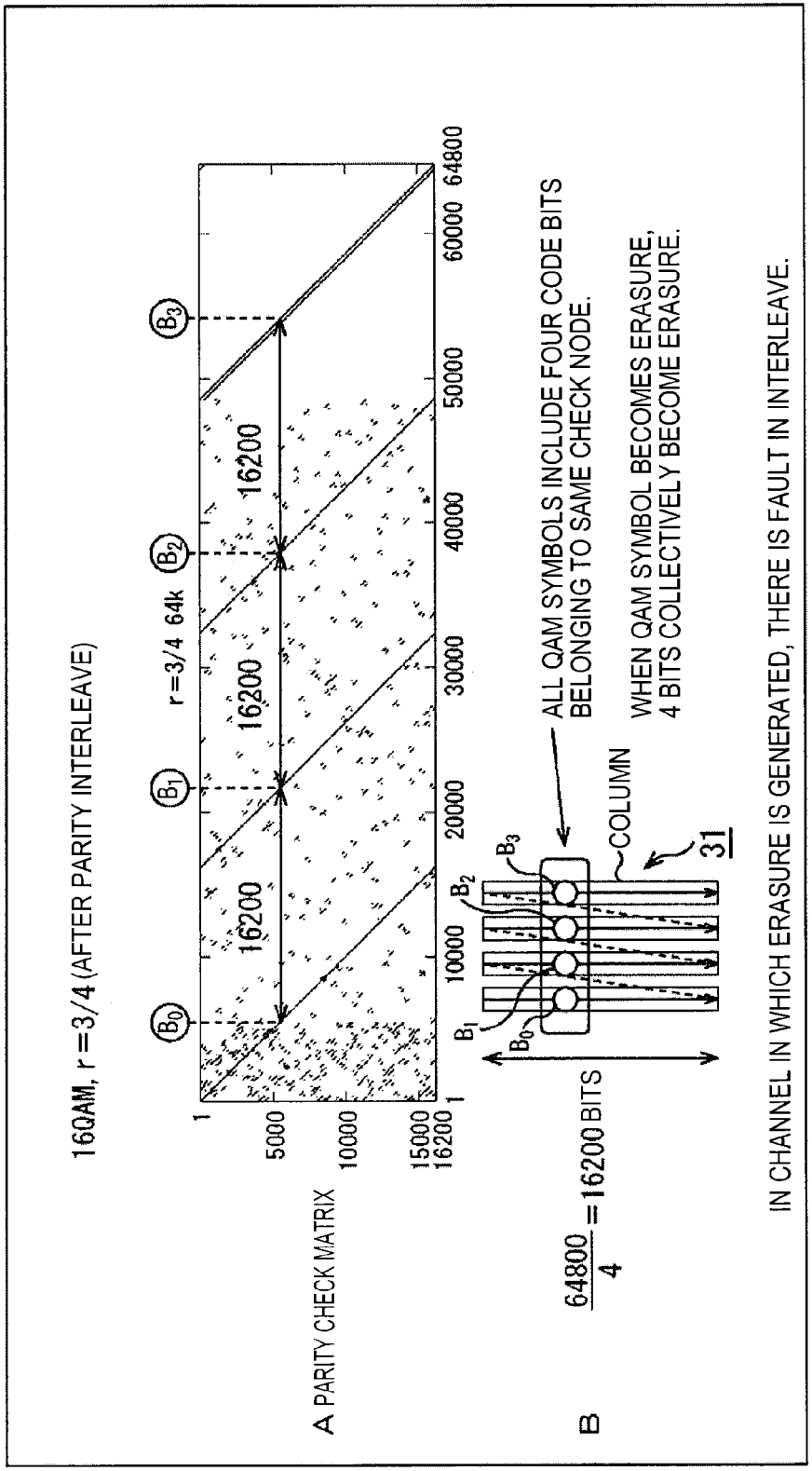
FIG. 27 is an illustration of a transformed parity check matrix.

FIG. 27 illustrates a transformed parity check matrix.

That is, A of FIG. 27 illustrates a transformed parity check matrix of a parity check matrix H of an LDPC code in which a code length N is 64800 bits and an encoding rate (r) is 3/4.

In A of FIG. 27, in the transformed parity check matrix, a position of an element of which a value becomes 1 is shown by a point (•).

B of FIG. 27 illustrates processing executed by the demultiplexer 25 (FIG. 9), with respect to the LDPC code of the transformed parity check matrix of A of FIG. 27, that is, the LDPC code after the parity interleave.

In B of FIG. 27, with an assumption that a modulation method is a method in which a symbol is mapped on any of 16 signal points such as 16APSK and 16QAM, the code bits of the LDPC code after the parity interleave are written in four columns forming the memory 31 of the demultiplexer 25 in the column direction.

The code bits that are written in the column direction in the four columns constituting the memory 31 are read in a unit of four bits in the row direction and become one symbol.

In this case, code bits $B_0$, $B_1$, $B_2$, and $B_3$ of the four bits that become one symbol may become code bits corresponding to 1 in any one row of the transformed parity check matrix of A of FIG. 27. In this case, the variable nodes that correspond to the code bits $B_0$, $B_1$, $B_2$, and $B_3$ are connected to the same check node.

Therefore, when the code bits $B_0$, $B_1$, $B_2$, and $B_3$ of the four bits of one symbol become the code bits corresponding to 1 in any one row of the transformed parity check matrix, if the erasure is generated in the symbol, an appropriate message may not be calculated in the same check node to which the variable nodes corresponding to the code bits $B_0$, $B_1$, $B_2$, and $B_3$ are connected. As a result, the decoding performance is deteriorated.

With respect to the encoding rates other than 3/4, the plurality of code bits corresponding to the plurality of variable nodes connected to the same check node may become one symbol of the APSK or the 16QAM, similar to the above case.

Therefore, the column twist interleaver 24 performs the column twist interleave for interleaving the code bits of the LDPC code after the parity interleave from the parity interleaver 23, such that the plurality of code bits corresponding to I in any one row of the transformed parity check matrix are not included in one symbol.

Figure 28:
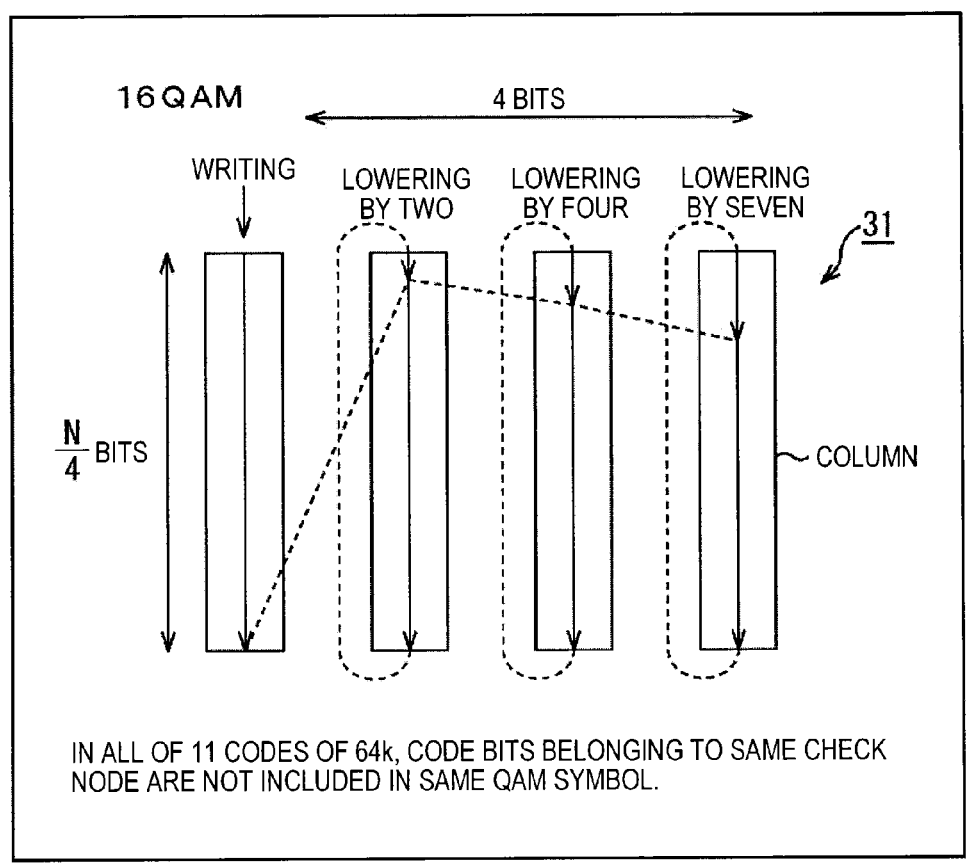
FIG. 28 is an illustration of processing of a column twist interleaver 24.

FIG. 28 is an illustration of the column twist interleave.

That is, FIG. 28 illustrates the memory 31 (FIGS. 22 and 23) of the demultiplexer 25.

As described in FIG. 22, the memory 31 has a storage capacity to store mb bits in the column (longitudinal) direction and store N/(mb) bits in the row (transverse) direction and includes mb columns. The column twist interleaver 24 writes the code bits of the LDPC code in the column direction with respect to the memory 31, controls a write start position when the code bits are read in the row direction, and performs the column twist interleave.

That is, in the column twist interleaver 24, the write start position to start writing of the code bits is appropriately changed with respect to each of the plurality of columns, such that the plurality of code bits read in the row direction and becoming one symbol do not become the code bits corresponding to 1 in any one row of the transformed parity check matrix (the code bits of the LDPC code are rearranged such that the plurality of code bits corresponding to I in any one row of the parity check matrix are not included in the same symbol).

In this case, FIG. 28 illustrates a configuration example of the memory 31 when the modulation method is the 16 APSK or the 16QAM and the multiple b described in FIG. 22 is 1. Therefore, the bit number m of the code bits of the LDPC code becoming one symbol is 4 bits and the memory 31 includes 4 (=mb) columns.

The column twist interleaver 24 performs writing of the code bits of the LDPC code (instead of the demultiplexer 25 of FIG. 22) in the downward direction (column direction) from the upper side of the four columns constituting the memory 31, toward the columns of the rightward direction from the left side.

If writing of the code bits ends to the rightmost column, the column twist interleaver 24 reads the code bits in a unit of four bits (mb bits) in the row direction from the first row of all the columns constituting the memory 31 and outputs the code bits as the LDPC code after the column twist interleave to the interchanging unit 32 (FIGS. 22 and 23) of the demultiplexer 25.

However, in the column twist interleaver 24, if an address of a position of a head (top) of each column is set to 0 and an address of each position of the column direction is represented by an ascending integer, a write start position is set to a position of which an address is 0, with respect to a leftmost column. A write start position is set to a position of which an address is 2, with respect to a second (from the left side) column. A write start position is set to a position of which an address is 4, with respect to a third column. A write start position is set to a position of which an address is 7, with respect to a fourth column.

With respect to the columns in which the write start positions are the positions other than the position of which the address is 0, after the code bits are written to a lowermost position, the position returns to the head (the position of which the address is 0) and writing is performed to the position immediately before the write start position. Then, writing with respect to a next (right) column is performed.

By performing the column twist interleave described above, with respect to the LDPC codes that are defined in the standard of the DVB-T.2 or the like, the plurality of code bits corresponding to the plurality of variable nodes connected to the same check node can be prevented from becoming one symbol of the APSK or the 16QAM (being included in the same symbol). As a result, decoding performance in a communication path in which the erasure exists can be improved.

FIG. 29 illustrates a column number of the memory 31 necessary for the column twist interleave and an address of a write start position for each modulation method, with respect to LDPC codes of 11 encoding rates defined in the standard of the DVB-T.2 and having a code length N of 64800.

When the multiple b is 1, the QPSK is adopted as the modulation method, and a bit number m of one symbol is 2 bits, according to FIG. 29, the memory 31 has two columns to store 2×1 (=mb) bits in the row direction and stores 64800/(2×1) bits in the column direction.

A write start position of a first column of the two columns of the memory 31 becomes a position of which an address is 0 and a write start position of a second column becomes a position of which an address is 2.

For example, when any one of the first to third interchange methods of FIG. 22 is adopted as the interchange method of the interchange processing of the demultiplexer 25 (FIG. 9), the multiple b becomes 1.

When the multiple b is 2, the QPSK is adopted as the modulation method, and a bit number m of one symbol is 2 bits, according to FIG. 29, the memory 31 has four columns to store 2×2 bits in the row direction and stores 64800/(2×2) bits in the column direction.

A write start position of a first column of the four columns of the memory 31 becomes a position of which an address is 0, a write start position of a second column becomes a position of which an address is 2, a write start position of a third column becomes a position of which an address is 4, and a write start position of a fourth column becomes a position of which an address is 7.

For example, when the fourth interchange method of FIG. 23 is adopted as the interchange method of the interchange processing of the demultiplexer 25 (FIG. 9), the multiple b becomes 2.

When the multiple b is 1, the 16QAM is adopted as the modulation method, and a bit number m of one symbol is 4 bits, according to FIG. 29, the memory 31 has four columns to store 4×1 bits in the row direction and stores 64800/(4×1) bits in the column direction.

A write start position of a first column of the four columns of the memory 31 becomes a position of which an address is 0, a write start position of a second column becomes a position of which an address is 2, a write start position of a third column becomes a position of which an address is 4, and a write start position of a fourth column becomes a position of which an address is 7.

When the multiple b is 2, the 16QAM is adopted as the modulation method, and a bit number m of one symbol is 4 bits, according to FIG. 29, the memory 31 has eight columns to store 4×2 bits in the row direction and stores 64800/(4×2) bits in the column direction.

A write start position of a first column of the eight columns of the memory 31 becomes a position of which an address is 0, a write start position of a second column becomes a position of which an address is 0, a write start position of a third column becomes a position of which an address is 2, a write start position of a fourth column becomes a position of which an address is 4, a write start position of a fifth column becomes a position of which an address is 4, a write start position of a sixth column becomes a position of which an address is 5, a write start position of a seventh column becomes a position of which an address is 7, and a write start position of a eighth column becomes a position of which an address is 7.

When the multiple b is 1, the 64QAM is adopted as the modulation method, and a bit number m of one symbol is 6 bits, according to FIG. 29, the memory 31 has six columns to store 6×1 bits in the row direction and stores 64800/(6×1) bits in the column direction.

A write start position of a first column of the six columns of the memory 31 becomes a position of which an address is 0, a write start position of a second column becomes a position of which an address is 2, a write start position of a third column becomes a position of which an address is 5, a write start position of a fourth column becomes a position of which an address is 9, a write start position of a fifth column becomes a position of which an address is 10, and a write start position of a sixth column becomes a position of which an address is 13.

When the multiple b is 2, the 64QAM is adopted as the modulation method, and a bit number m of one symbol is 6 bits, according to FIG. 29, the memory 31 has twelve columns to store 6×2 bits in the row direction and stores 64800/(6×2) bits in the column direction.

A write start position of a first column of the twelve columns of the memory 31 becomes a position of which an address is 0, a write start position of a second column becomes a position of which an address is 0, a write start position of a third column becomes a position of which an address is 2, a write start position of a fourth column becomes a position of which an address is 2, a write start position of a fifth column becomes a position of which an address is 3, a write start position of a sixth column becomes a position of which an address is 4, a write start position of a seventh column becomes a position of which an address is 4, a write start position of a eighth column becomes a position of which an address is 5, a write start position of a ninth column becomes a position of which an address is 5 a write start position of a tenth column becomes a position of which an address is 7, a write start position of a eleventh column becomes a position of which an address is 8, and a write start position of a twelfth column becomes a position of which an address is 9.

When the multiple b is 1, the 256QAM is adopted as the modulation method, and a bit number m of one symbol is 8 bits, according to FIG. 29, the memory 31 has eight columns to store 8×1 bits in the row direction and stores 64800/(8×2) bits in the column direction.

A write start position of a first column of the eight columns of the memory 31 becomes a position of which an address is 0, a write start position of a second column becomes a position of which an address is 0, a write start position of a third column becomes a position of which an address is 2, a write start position of a fourth column becomes a position of which an address is 4, a write start position of a fifth column becomes a position of which an address is 4, a write start position of a sixth column becomes a position of which an address is 5, a write start position of a seventh column becomes a position of which an address is 7, and a write start position of a eighth column becomes a position of which an address is 7.

When the multiple b is 2, the 256QAM is adopted as the modulation method, and a bit number m of one symbol is 8 bits, according to FIG. 29, the memory 31 has sixteen columns to store 8×2 bits in the row direction and stores 64800/(8×2) bits in the column direction.

A write start position of a first column of the sixteen columns of the memory 31 becomes a position of which an address is 0, a write start position of a second column becomes a position of which an address is 2, a write start position of a third column becomes a position of which an address is 2, a write start position of a fourth column becomes a position of which an address is 2, a write start position of a fifth column becomes a position of which an address is 2, a write start position of a sixth column becomes a position of which an address is 3, a write start position of a seventh column becomes a position of which an address is 7, a write start position of a eighth column becomes a position of which an address is 15, a write start position of a ninth column becomes a position of which an address is 16 a write start position of a tenth column becomes a position of which an address is 20, a write start position of a eleventh column becomes a position of which an address is 22, a write start position of a twelfth column becomes a position of which an address is 22, a write start position of a thirteenth column becomes a position of which an address is 27, a write start position of a fourteenth column becomes a position of which an address is 27, a write start position of a fifteenth column becomes a position of which an address is 28, and a write start position of a sixteenth column becomes a position of which an address is 32.

When the multiple b is 1, the 1024QAM is adopted as the modulation method, and a bit number m of one symbol is 10 bits, according to FIG. 29, the memory 31 has ten columns to store 10×1 bits in the row direction and stores 64800/(10×1) bits in the column direction.

A write start position of a first column of the ten columns of the memory 31 becomes a position of which an address is 0, a write start position of a second column becomes a position of which an address is 3, a write start position of a third column becomes a position of which an address is 6, a write start position of a fourth column becomes a position of which an address is 8, a write start position of a fifth column becomes a position of which an address is 11, a write start position of a sixth column becomes a position of which an address is 13, a write start position of a seventh column becomes a position of which an address is 15, a write start position of a eighth column becomes a position of which an address is 17, a write start position of a ninth column becomes a position of which an address is 18 and a write start position of a tenth column becomes a position of which an address is 20.

When the multiple b is 2, the 1024QAM is adopted as the modulation method, and a bit number m of one symbol is 10 bits, according to FIG. 29, the memory 31 has twemty columns to store 10×2 bits in the row direction and stores 64800/(10×2) bits in the column direction.

A write start position of a first column of the twenty columns of the memory 31 becomes a position of which an address is 0, a write start position of a second column becomes a position of which an address is 1, a write start position of a third column becomes a position of which an address is 3, a write start position of a fourth column becomes a position of which an address is 4, a write start position of a fifth column becomes a position of which an address is 5, a write start position of a sixth column becomes a position of which an address is 6, a write start position of a seventh column becomes a position of which an address is 6, a write start position of a eighth column becomes a position of which an address is 9, a write start position of a ninth column becomes a position of which an address is 13 a write start position of a tenth column becomes a position of which an address is 14, a write start position of a eleventh column becomes a position of which an address is 14, a write start position of a twelfth column becomes a position of which an address is 16, a write start position of a thirteenth column becomes a position of which an address is 21, a write start position of a fourteenth column becomes a position of which an address is 21, a write start position of a fifteenth column becomes a position of which an address is 23, a write start position of a sixteenth column becomes a position of which an address is 25, a write start position of a seventeenth column becomes a position of which an address is 25, a write start position of a eighteenth column becomes a position of which an address is 26, a write start position of a nineteenth column becomes a position of which an address is 28, and a write start position of a twentieth column becomes a position of which an address is 30.

When the multiple b is 1, the 4096QAM is adopted as the modulation method, and a bit number m of one symbol is 12 bits, according to FIG. 29, the memory 31 has twelve columns to store 12×1 bits in the row direction and stores 64800/(12×1) bits in the column direction.

A write start position of a first column of the twelve columns of the memory 31 becomes a position of which an address is 0, a write start position of a second column becomes a position of which an address is 0, a write start position of a third column becomes a position of which an address is 2, a write start position of a fourth column becomes a position of which an address is 2, a write start position of a fifth column becomes a position of which an address is 3, a write start position of a sixth column becomes a position of which an address is 4, a write start position of a seventh column becomes a position of which an address is 4, a write start position of a eighth column becomes a position of which an address is 5, a write start position of a ninth column becomes a position of which an address is 5 a write start position of a tenth column becomes a position of which an address is 7, a write start position of a eleventh column becomes a position of which an address is 8, and a write start position of a twelfth column becomes a position of which an address is 9.

When the multiple b is 2, the 4096QAM is adopted as the modulation method, and a bit number m of one symbol is 12 bits, according to FIG. 29, the memory 31 has twenty four columns to store 12×2 bits in the row direction and stores 64800/(12×2) bits in the column direction.

A write start position of a first column of the twenty four columns of the memory 31 becomes a position of which an address is 0, a write start position of a second column becomes a position of which an address is 5, a write start position of a third column becomes a position of which an address is 8, a write start position of a fourth column becomes a position of which an address is 8, a write start position of a fifth column becomes a position of which an address is 8, a write start position of a sixth column becomes a position of which an address is 8, a write start position of a seventh column becomes a position of which an address is 10, a write start position of a eighth column becomes a position of which an address is 10, a write start position of a ninth column becomes a position of which an address is 10 a write start position of a tenth column becomes a position of which an address is 12, a write start position of a eleventh column becomes a position of which an address is 13, a write start position of a twelfth column becomes a position of which an address is 16, a write start position of a thirteenth column becomes a position of which an address is 17, a write start position of a fourteenth column becomes a position of which an address is 19, a write start position of a fifteenth column becomes a position of which an address is 21, a write start position of a sixteenth column becomes a position of which an address is 22, a write start position of a seventeenth column becomes a position of which an address is 23, a write start position of a eighteenth column becomes a position of which an address is 26, a write start position of a nineteenth column becomes a position of which an address is 37, a write start position of a twentieth column becomes a position of which an address is 39, a write start position of a twenty first column becomes a position of which an address is 40, a write start position of a twenty second column becomes a position of which an address is 41, a write start position of a twenty third column becomes a position of which an address is 41, and a write start position of a twenty fourth column becomes a position of which an address is 41.

FIG. 30 illustrates a column number of the memory 31 necessary for the column twist interleave and an address of a write start position for each modulation method, with respect to LDPC codes of 10 encoding rates defined in the standard of the DVB-T.2 and having a code length N of 16200.

When the multiple b is 1, the QPSK is adopted as the modulation method, and a bit number m of one symbol is 2 bits, according to FIG. 30, the memory 31 has two columns to store 2×1 bits in the row direction and stores 16200/(2×1) bits in the column direction.

A write start position of a first column of the two columns of the memory 31 becomes a position of which an address is 0 and a write start position of a second column becomes a position of which an address is 0.

When the multiple b is 2, the QPSK is adopted as the modulation method, and a bit number m of one symbol is 2 bits, according to FIG. 30, the memory 31 has four columns to store 2×2 (=mb) bits in the row direction and stores 16200/(2×2) bits in the column direction.

A write start position of a first column of the four columns of the memory 31 becomes a position of which an address is 0, a write start position of a second column becomes a position of which an address is 2, a write start position of a third column becomes a position of which an address is 3, and a write start position of a fourth column becomes a position of which an address is 3.

When the multiple b is 1, the 16QAM is adopted as the modulation method, and a bit number m of one symbol is 4 bits, according to FIG. 30, the memory 31 has four columns to store 4×1 bits in the row direction and stores 16200/(4×1) bits in the column direction.

A write start position of a first column of the four columns of the memory 31 becomes a position of which an address is 0, a write start position of a second column becomes a position of which an address is 2, a write start position of a third column becomes a position of which an address is 3, and a write start position of a fourth column becomes a position of which an address is 3.

When the multiple b is 2, the 16QAM is adopted as the modulation method, and a bit number m of one symbol is 4 bits, according to FIG. 30, the memory 31 has eight columns to store 4×2 bits in the row direction and stores 16200/(4×2) bits in the column direction.

A write start position of a first column of the eight columns of the memory 31 becomes a position of which an address is 0, a write start position of a second column becomes a position of which an address is 0, a write start position of a third column becomes a position of which an address is 0, a write start position of a fourth column becomes a position of which an address is 1, a write start position of a fifth column becomes a position of which an address is 7, a write start position of a sixth column becomes a position of which an address is 20, a write start position of a seventh column becomes a position of which an address is 20, and a write start position of a eighth column becomes a position of which an address is 21.

When the multiple b is 1, the 64QAM is adopted as the modulation method, and a bit number m of one symbol is 6 bits, according to FIG. 30, the memory 31 has six columns to store 6×1 bits in the row direction and stores 16200/(6×1) bits in the column direction.

A write start position of a first column of the six columns of the memory 31 becomes a position of which an address is 0, a write start position of a second column becomes a position of which an address is 0, a write start position of a third column becomes a position of which an address is 2, a write start position of a fourth column becomes a position of which an address is 3, a write start position of a fifth column becomes a position of which an address is 7, and a write start position of a sixth column becomes a position of which an address is 7.

When the multiple b is 2, the 64QAM is adopted as the modulation method, and a bit number m of one symbol is 6 bits, according to FIG. 30, the memory 31 has twelve columns to store 6×2 bits in the row direction and stores 16200/(6×2) bits in the column direction.

A write start position of a first column of the twelve columns of the memory 31 becomes a position of which an address is 0, a write start position of a second column becomes a position of which an address is 0, a write start position of a third column becomes a position of which an address is 0, a write start position of a fourth column becomes a position of which an address is 2, a write start position of a fifth column becomes a position of which an address is 2, a write start position of a sixth column becomes a position of which an address is 2, a write start position of a seventh column becomes a position of which an address is 3, a write start position of a eighth column becomes a position of which an address is 3, a write start position of a ninth column becomes a position of which an address is 3 a write start position of a tenth column becomes a position of which an address is 6, a write start position of a eleventh column becomes a position of which an address is 7, and a write start position of a twelfth column becomes a position of which an address is 7.

When the multiple b is 1, the 256QAM is adopted as the modulation method, and a bit number m of one symbol is 8 bits, according to FIG. 30, the memory 31 has eight columns to store 8×1 bits in the row direction and stores 16200/(8×1) bits in the column direction.

A write start position of a first column of the eight columns of the memory 31 becomes a position of which an address is 0, a write start position of a second column becomes a position of which an address is 0, a write start position of a third column becomes a position of which an address is 0, a write start position of a fourth column becomes a position of which an address is 1, a write start position of a fifth column becomes a position of which an address is 7, a write start position of a sixth column becomes a position of which an address is 20, a write start position of a seventh column becomes a position of which an address is 20, and a write start position of a eighth column becomes a position of which an address is 21.

When the multiple b is 1, the 1024QAM is adopted as the modulation method, and a bit number m of one symbol is 10 bits, according to FIG. 30, the memory 31 has ten columns to store 10×1 bits in the row direction and stores 16200/(10×1) bits in the column direction.

A write start position of a first column of the ten columns of the memory 31 becomes a position of which an address is 0, a write start position of a second column becomes a position of which an address is 1, a write start position of a third column becomes a position of which an address is 2, a write start position of a fourth column becomes a position of which an address is 2, a write start position of a fifth column becomes a position of which an address is 3, a write start position of a sixth column becomes a position of which an address is 3, a write start position of a seventh column becomes a position of which an address is 4, a write start position of a eighth column becomes a position of which an address is 4, a write start position of a ninth column becomes a position of which an address is 5, and a write start position of a tenth column becomes a position of which an address is 7.

When the multiple b is 2, the 1024QAM is adopted as the modulation method, and a bit number m of one symbol is 10 bits, according to FIG. 30, the memory 31 has twenty columns to store 10×2 bits in the row direction and stores 16200/(10×2) bits in the column direction.

A write start position of a first column of the twenty columns of the memory 31 becomes a position of which an address is 0, a write start position of a second column becomes a position of which an address is 0, a write start position of a third column becomes a position of which an address is 0, a write start position of a fourth column becomes a position of which an address is 2, a write start position of a fifth column becomes a position of which an address is 2, a write start position of a sixth column becomes a position of which an address is 2, a write start position of a seventh column becomes a position of which an address is 2, a write start position of a eighth column becomes a position of which an address is 2, a write start position of a ninth column becomes a position of which an address is 5 a write start position of a tenth column becomes a position of which an address is 5, a write start position of a eleventh column becomes a position of which an address is 5, a write start position of a twelfth column becomes a position of which an address is 5, a write start position of a thirteenth column becomes a position of which an address is 5, a write start position of a fourteenth column becomes a position of which an address is 7, a write start position of a fifteenth column becomes a position of which an address is 7, a write start position of a sixteenth column becomes a position of which an address is 7, a write start position of a seventeenth column becomes a position of which an address is 7, a write start position of a eighteenth column becomes a position of which an address is 8, a write start position of a nineteenth column becomes a position of which an address is 8, and a write start position of a twentieth column becomes a position of which an address is 10.

When the multiple b is 1, the 4096QAM is adopted as the modulation method, and a bit number m of one symbol is 12 bits, according to FIG. 30, the memory 31 has twelve columns to store 12×1 bits in the row direction and stores 16200/(12×1) bits in the column direction.

A write start position of a first column of the twelve columns of the memory 31 becomes a position of which an address is 0, a write start position of a second column becomes a position of which an address is 0, a write start position of a third column becomes a position of which an address is 0, a write start position of a fourth column becomes a position of which an address is 2, a write start position of a fifth column becomes a position of which an address is 2, a write start position of a sixth column becomes a position of which an address is 2, a write start position of a seventh column becomes a position of which an address is 3, a write start position of a eighth column becomes a position of which an address is 3, a write start position of a ninth column becomes a position of which an address is 3 a write start position of a tenth column becomes a position of which an address is 6, a write start position of a eleventh column becomes a position of which an address is 7, and a write start position of a twelfth column becomes a position of which an address is 7.

When the multiple b is 2, the 4096QAM is adopted as the modulation method, and a bit number m of one symbol is 12 bits, according to FIG. 30, the memory 31 has twenty four columns to store 12×2 bits in the row direction and stores 16200/(12×2) bits in the column direction.

A write start position of a first column of the twenty four columns of the memory 31 becomes a position of which an address is 0, a write start position of a second column becomes a position of which an address is 0, a write start position of a third column becomes a position of which an address is 0, a write start position of a fourth column becomes a position of which an address is 0, a write start position of a fifth column becomes a position of which an address is 0, a write start position of a sixth column becomes a position of which an address is 0, a write start position of a seventh column becomes a position of which an address is 0, a write start position of a eighth column becomes a position of which an address is 1, a write start position of a ninth column becomes a position of which an address is 1 a write start position of a tenth column becomes a position of which an address is 1, a write start position of a eleventh column becomes a position of which an address is 2, a write start position of a twelfth column becomes a position of which an address is 2, a write start position of a thirteenth column becomes a position of which an address is 2, a write start position of a fourteenth column becomes a position of which an address is 3, a write start position of a fifteenth column becomes a position of which an address is 7, a write start position of a sixteenth column becomes a position of which an address is 9, a write start position of a seventeenth column becomes a position of which an address is 9, a write start position of a eighteenth column becomes a position of which an address is 9, a write start position of a nineteenth column becomes a position of which an address is 10, a write start position of a twentieth column becomes a position of which an address is 10, a write start position of a twenty first column becomes a position of which an address is 10, a write start position of a twenty second column becomes a position of which an address is 10, a write start position of a twenty third column becomes a position of which an address is 10, and a write start position of a twenty fourth column becomes a position of which an address is 11.

Figure 31:
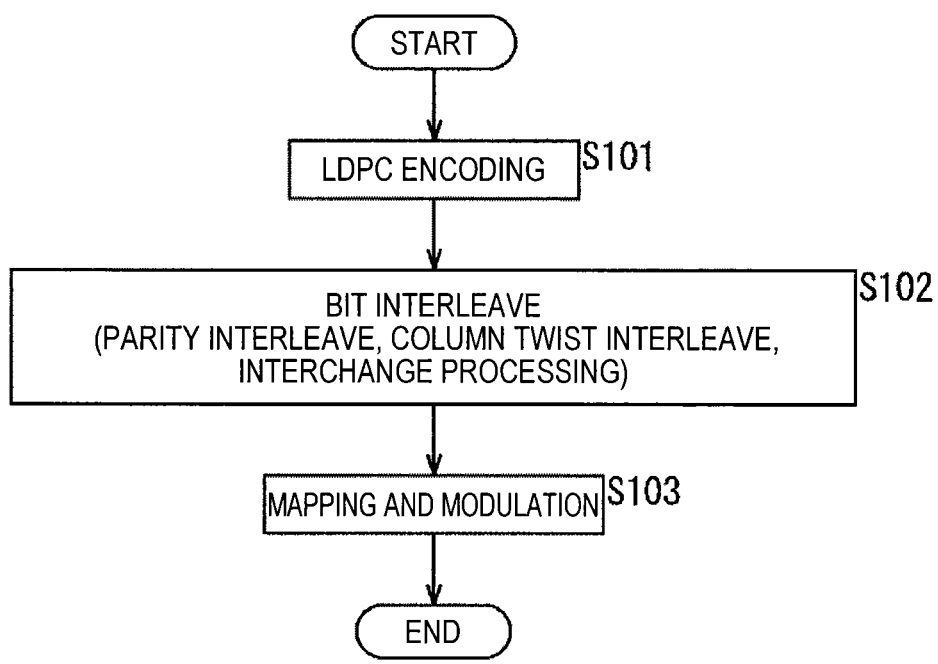
FIG. 31 is a flowchart illustrating processing executed by a bit interleaver 116 and a Mapper 117.

FIG. 31 is a flowchart illustrating processing executed by the LDPC encoder 115, the bit interleaver 116, and the Mapper 117 of FIG. 8.

The LDPC encoder 115 awaits supply of the LDPC target data from the BCH encoder 114. In step S101, the LDPC encoder 115 encodes the LDPC target data with the LDPC code and supplies the LDPC code to the bit interleaver 116. The processing proceeds to step S102.

In step S102, the bit interleaver 116 performs bit interleave with respect to the LDPC code supplied from the LDPC encoder 115 and supplies a symbol obtained by symbolizing the LDPC code after the bit interleave to the Mapper 117. The processing proceeds to step S103.

That is, in step S102, in the bit interleaver 116 (FIG. 9), the parity interleaver 23 performs parity interleave with respect to the LDPC code supplied from the LDPC encoder 115 and supplies the LDPC code after the parity interleave to the column twist interleaver 24.

The column twist interleaver 24 performs column twist interleave with respect to the LDPC code supplied from the parity interleaver 23 and supplies the LDPC code to the demultiplexer 25.

The demultiplexer 25 executes interchange processing for interchanging the code bits of the LDPC code after the column twist interleave by the column twist interleaver 24 and making the code bits after the interchange become symbol bits (bits representing a symbol) of the symbol.

Here, the interchange processing by the demultiplexer 25 can be performed according to the first or fourth interchange methods illustrated in FIG. 22 and FIG. 23, and, moreover, can be performed according to other interchange methods.

The symbol that is obtained by the interchange processing by the demultiplexer 25 is supplied from the demultiplexer 25 to the Mapper 117.

In step S103, the Mapper 117 maps the symbol supplied from the demultiplexer 25 to a signal point determined by the modulation method of the orthogonal modulation performed by the Mapper 117, performs the orthogonal modulation, and supplies data obtained as a result to the time interleaver 118.

As described above, the parity interleave or the column twist interleave is performed, so that tolerance against the erasure or the burst error when the plurality of code bits of the LDPC code are transmitted as one symbol can be improved.

In FIG. 9, the parity interleaver 23 to be a block to perform the parity interleave and the column twist interleaver 24 to be a block to perform the column twist interleave are individually configured for the convenience of explanation. However, the parity interleaver 23 and the column twist interleaver 24 can be integrally configured.

That is, both the parity interleave and the column twist interleave can be performed by writing and reading of the code bits with respect to the memory and can be represented by a matrix to convert an address (write address) to perform writing of the code bits into an address (read address) to perform reading of the code bits.

Therefore, if a matrix obtained by multiplying a matrix representing the parity interleave and a matrix representing the column twist interleave is calculated, the code bits are converted by the matrix, the parity interleave is performed, and a column twist interleave result of the LDPC code after the parity interleave can be obtained.

In addition to the parity interleaver 23 and the column twist interleaver 24, the demultiplexer 25 can be integrally configured.

That is, the interchange processing executed by the demultiplexer 25 can be represented by the matrix to convert the write address of the memory 31 storing the LDPC code into the read address.

Therefore, if a matrix obtained by multiplying the matrix representing the parity interleave, the matrix representing the column twist interleave, and the matrix representing the interchange processing is calculated, the parity interleave, the column twist interleave, and the interchange processing can be collectively executed by the matrix.

Only one of the parity interleave and the column twist interleave may be performed or both the parity interleave and the column twist interleave may not be performed. For example, like DVB-S.2, in a case where the communication path 13 (FIG. 7) is a satellite circuit or the like which is different from AWGN and for which burst error and flutter, and so on, do not have to be considered so much, it is possible to cause the parity interleave and the column twist interleave not to be performed.

Next, simulation to measure an error rate (bit error rate) that is performed with respect to the transmitting device 11 of FIG. 8 will be described with reference to FIGS. 32 to 34.

The simulation is performed by adopting a communication path in which a flutter having D/U of 0 dB exists.

Figure 32:
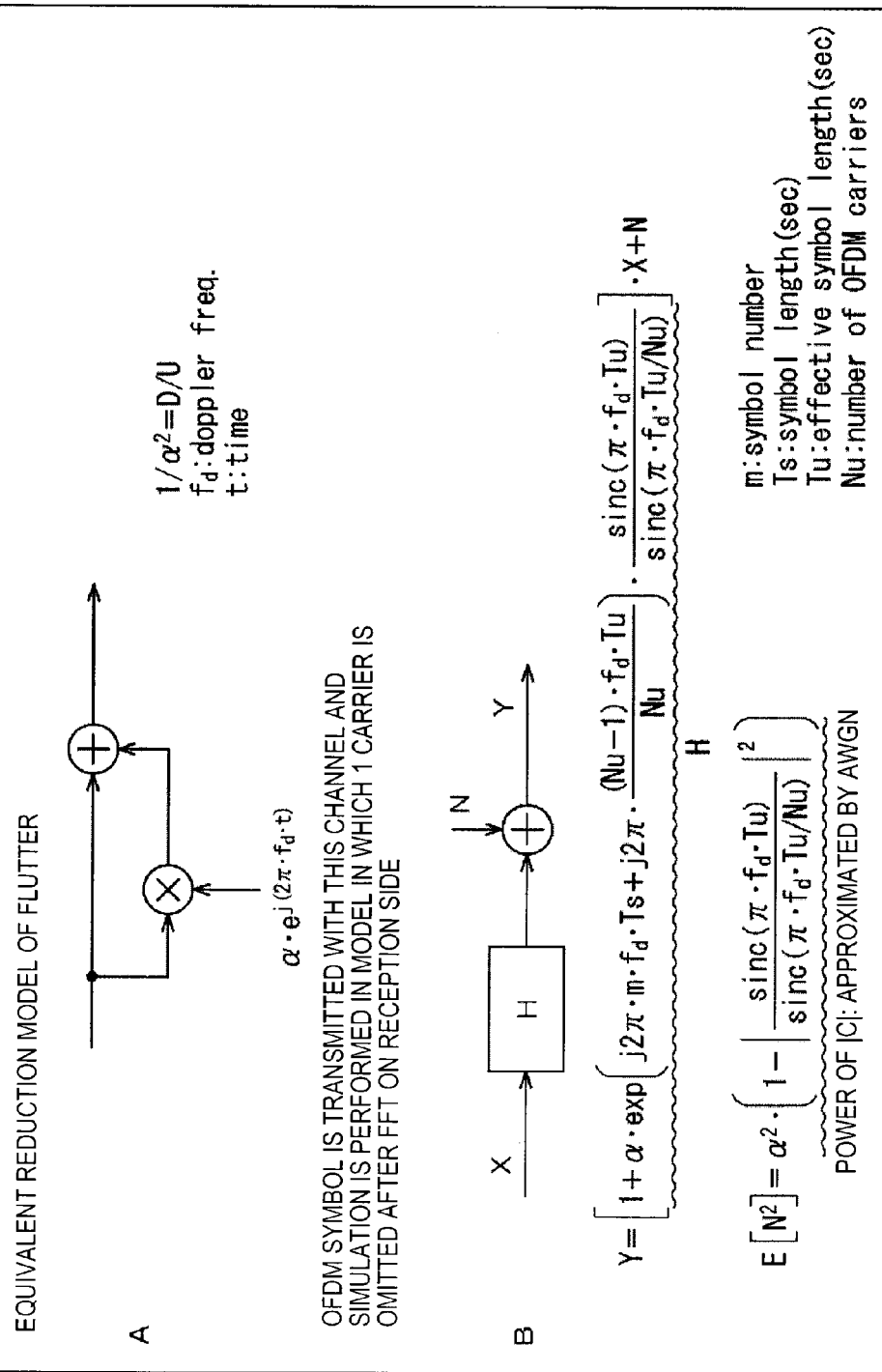
FIG. 32 is an illustration of a model of a communication path adopted by simulation.

FIG. 32 illustrates a model of a communication path that is adopted by the simulation.

That is, A of FIG. 32 illustrates a model of a flutter that is adopted by the simulation.

In addition, B of FIG. 32 illustrates a model of a communication path in which the flutter represented by the model of A of FIG. 32 exists.

In B of FIG. 32, H represents the model of the flutter of A of FIG. 32. In B of FIG. 32, N represents ICI (Inter Carrier Interference). In the simulation, an expectation value $E[N^2]$ of power is approximated by the AWGN.

Figure 33:
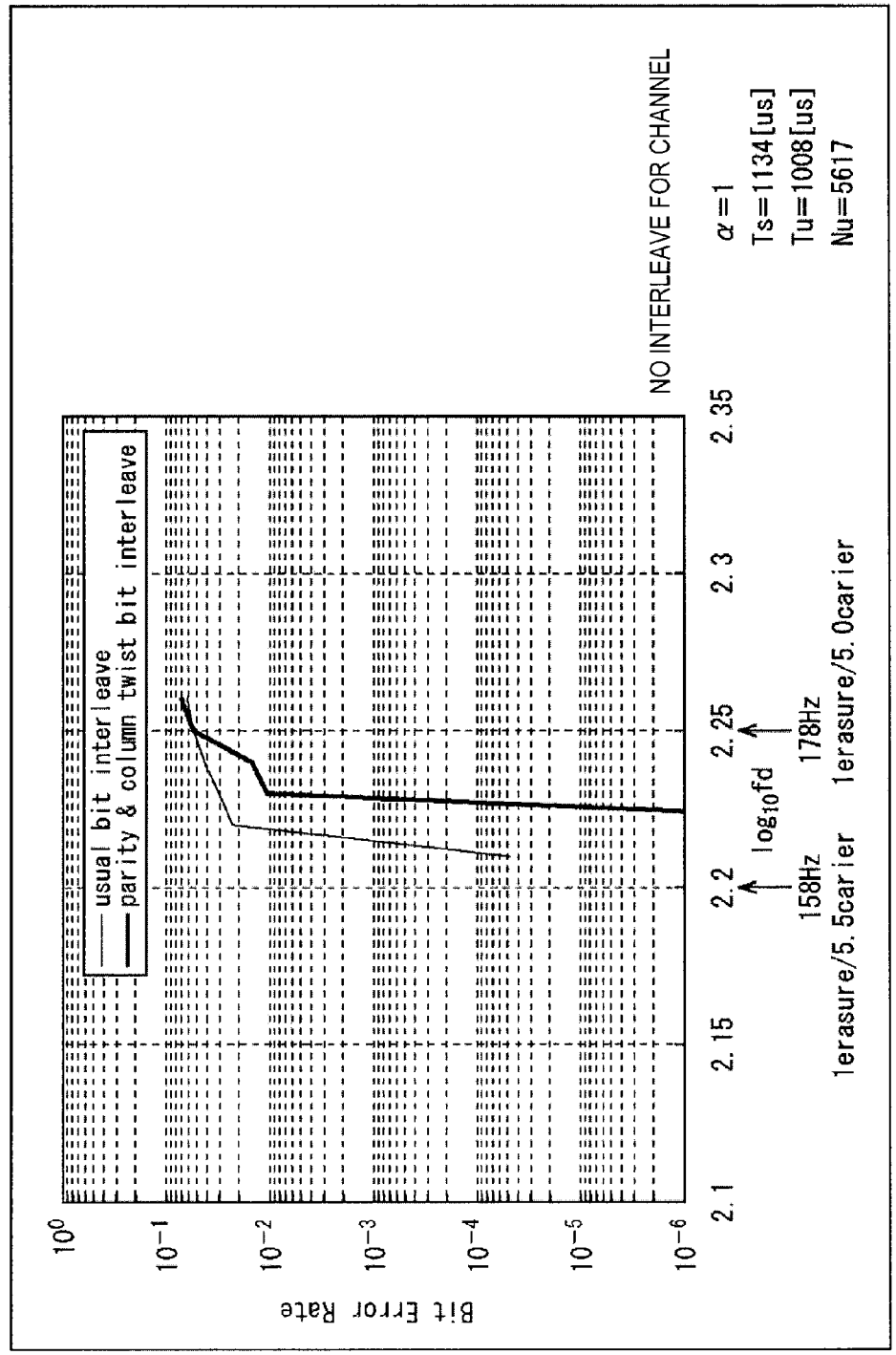
FIG. 33 is an illustration of a relation of an error rate obtained by simulation and a Doppler frequency $f_d$ of a flutter.
Figure 34:
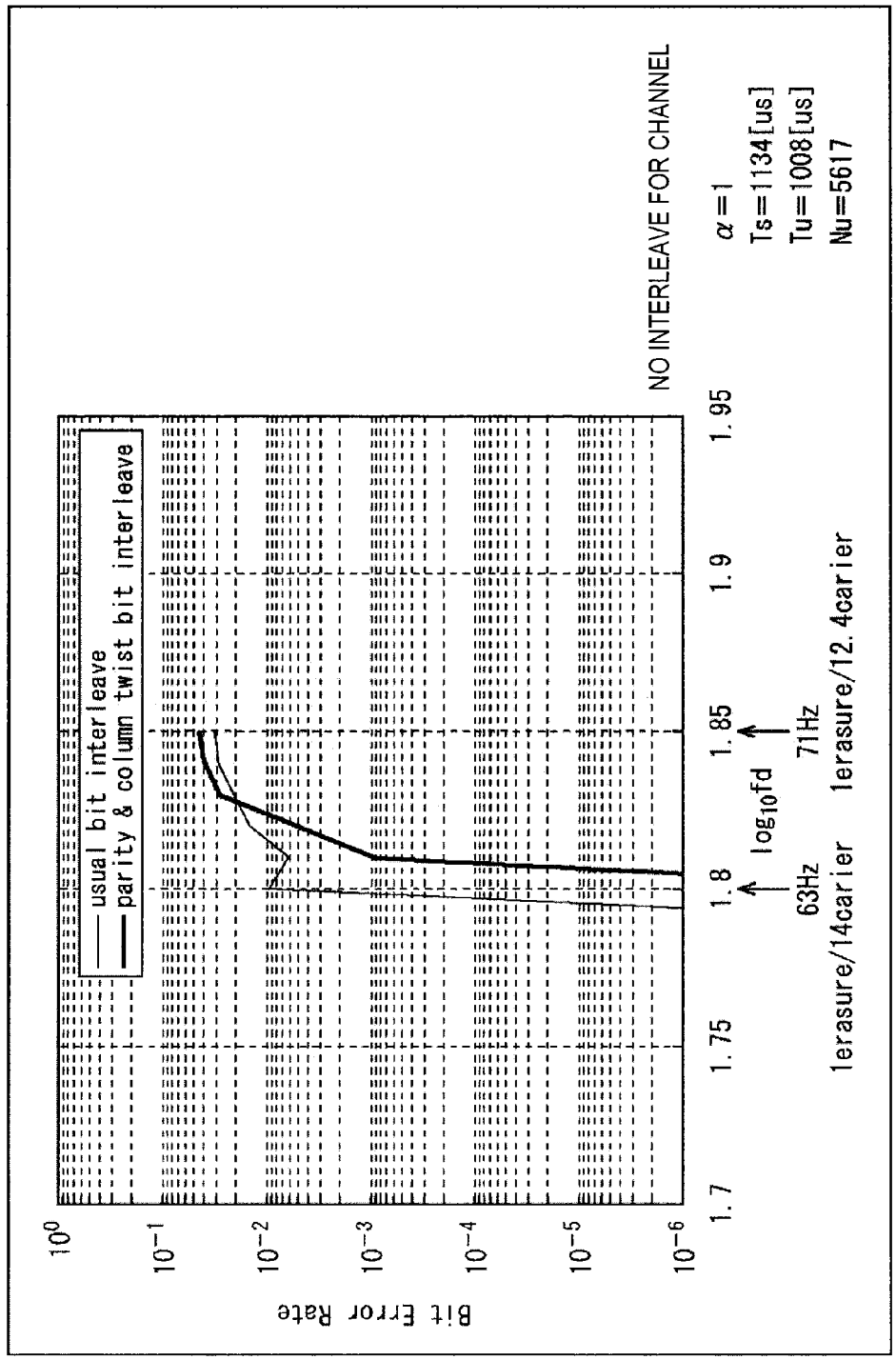
FIG. 34 is an illustration of a relation of an error rate obtained by simulation and a Doppler frequency $f_d$ of a flutter.

FIGS. 33 and 34 illustrate a relation of an error rate obtained by the simulation and a Doppler frequency $f_d$ of the flutter.

FIG. 33 illustrates a relation of the error rate and the Doppler frequency $f_d$ when a modulation method is the 16QAM, an encoding rate (r) is (3/4), and an interchange method is the first interchange method. FIG. 34 illustrates a relation of the error rate and the Doppler frequency $f_d$ when the modulation method is the 64QAM, the encoding rate (r) is (5/6), and the interchange method is the first interchange method.

In FIGS. 33 and 34, a thick line shows a relation of the error rate and the Doppler frequency $f_d$ when all of the parity interleave, the column twist interleave, and the interchange processing are performed and a thin line shows a relation of the error rate and the Doppler frequency $f_d$ when only the interchange processing among the parity interleave, the column twist interleave, and the interchange processing is performed.

In both FIGS. 33 and 34, it can be known that the error rate is further improved (decreased) when all of the parity interleave, the column twist interleave, and the interchange processing are performed, as compared with when only the interchange processing is executed.

<Configuration Example of LDPC Encoder 115>

Figure 35:
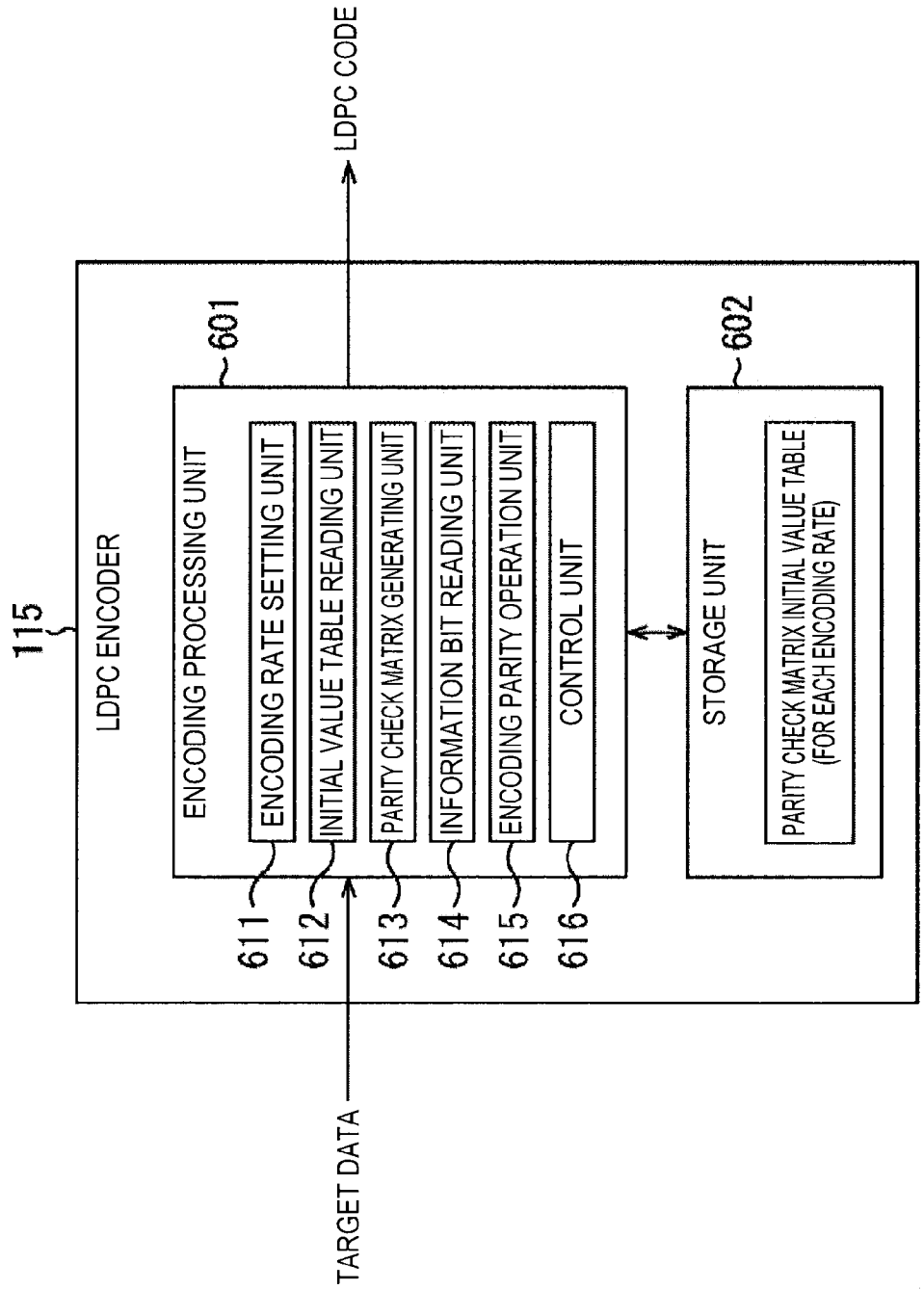
FIG. 35 is a block diagram illustrating a configuration example of an LDPC encoder 115.

FIG. 35 is a block diagram illustrating a configuration example of the LDPC encoder 115 of FIG. 8.

The LDPC encoder 122 of FIG. 8 is also configured in the same manner.

As described in FIGS. 12 and 13, in the standard of the DVB-S.2 or the like, the LDPC codes that have the two code lengths N of 64800 bits and 16200 bits are defined.

With respect to the LDPC code having the code length N of 64800 bits, 11 encoding rates of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined (FIGS. 12 and 13).

For example, the LDPC encoder 115 can perform encoding (error correction encoding) using the LDPC code of each encoding rate having the code length N of 64800 bits or 16200 bits, according to the parity check matrix H prepared for each code length N and each encoding rate.

The LDPC encoder 115 includes an encoding processing unit 601 and a storage unit 602.

The encoding processing unit 601 includes an encoding rate setting unit 611, an initial value table reading unit 612, a parity check matrix generating unit 613, an information bit reading unit 614, an encoding parity operation unit 615, an a control unit 616. The encoding processing unit 601 performs the LDPC encoding of LDPC target data supplied to the LDPC encoder 115 and supplies an LDPC code obtained as a result to the bit interleaver 116 (FIG. 8).

That is, the encoding rate setting unit 611 sets the code length N and the encoding rate of the LDPC code, according to an operation of an operator.

The initial value table reading unit 612 reads a parity check matrix initial value table to be described later, which corresponds to the code length N and the encoding rate set by the encoding rate setting unit 611, from the storage unit 602.

The parity check matrix generating unit 613 generates a parity check matrix H by arranging elements of 1 of an information matrix $H_A$ corresponding to an information length K (=information length N−parity length M) according to the code length N and the encoding rate set by the encoding rate setting unit 611 in the column direction with a period of 360 columns (column number P of a unit of the cyclic structure), on the basis of the parity check matrix initial value table read by the initial value table reading unit 612, and stores the parity check matrix H in the storage unit 602.

The information bit reading unit 614 reads (extracts) information bits corresponding to the information length K, from the LDPC target data supplied to the LDPC encoder 115.

The encoding parity operation unit 615 reads the parity check matrix H generated by the parity check matrix generating unit 613 from the storage unit 602, and generates a code word (LDPC code) by calculating parity bits for the information bits read by the information bit reading unit 614 on the basis of a predetermined expression using the parity check matrix H.

The control unit 616 controls each block constituting the encoding processing unit 601.

In the storage unit 602, a plurality of parity check matrix initial value tables that correspond to the plurality of encoding rates illustrated in FIGS. 12 and 13, with respect to the code lengths N such as the 64800 bits and 16200 bits, are stored. In addition, the storage unit 602 temporarily stores data that is necessary for processing of the encoding processing unit 601.

Figure 36:
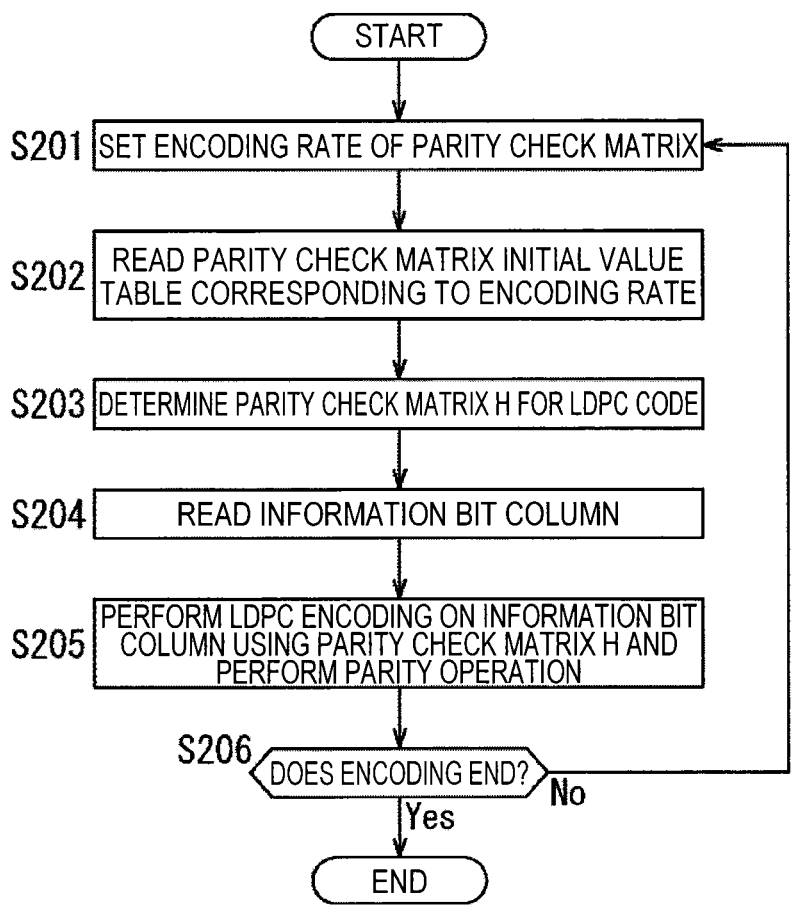
FIG. 36 is a flowchart illustrating processing of an LDPC encoder 115.

FIG. 36 is a flowchart illustrating processing of the LDPC encoder 115 of FIG. 35.

In step S201, the encoding rate setting unit 611 determines (sets) the code length N and the encoding rate r to perform the LDPC encoding.

In step S202, the initial value table reading unit 612 reads the previously determined parity check matrix initial value table corresponding to the code length N and the encoding rate r determined by the encoding rate setting unit 611, from the storage unit 602.

In step S203, the parity check matrix generating unit 613 calculates (generates) the parity check matrix H of the LDPC code of the code length N and the encoding rate r determined by the encoding rate setting unit 611, using the parity check matrix initial value table read from the storage unit 602 by the initial value table reading unit 612, supplies the parity check matrix to the storage unit 602, and stores the parity check matrix in the storage unit.

In step S204, the information bit reading unit 614 reads the information bits of the information length K (=N×r) corresponding to the code length N and the encoding rate r determined by the encoding rate setting unit 611, from the LDPC target data supplied to the LDPC encoder 115, reads the parity check matrix H calculated by the parity check matrix generating unit 613 from the storage unit 602, and supplies the information bits and the parity check matrix to the encoding parity operation unit 615.

In step S205, the encoding parity operation unit 615 sequentially operates parity bits of a code word c that satisfies an expression (8) using the information bits and the parity check matrix H that have been read from the information bit reading unit 614.

$$Hc^T = 0 \qquad (8)$$

In the expression (8), c represents a row vector as the code word (LDPC code) and $c^T$ represents transposition of the row vector c.

As described above, when a portion of the information bits of the row vector c as the LDPC code (one code word) is represented by a row vector A and a portion of the parity bits is represented by a row vector T, the row vector c can be represented by an expression c=[A/T], using the row vector A as the information bits and the row vector T as the parity bits.

In the parity check matrix H and the row vector c=[A|T] corresponding to the LDPC code, it is necessary to satisfy an expression $Hc^T=0$. The row vector T that corresponds to the parity bits constituting the row vector c=[A|T] satisfying the expression $HC^T=0$ can be sequentially calculated by setting elements of each row to 0, sequentially from elements of a first row of the column vector $Hc^T$ in the expression $Hc^T=0$, when the parity matrix $H_T$ of the parity check matrix $H=[H_A|H_T]$ becomes the staircase structure illustrated in FIG. 11.

If the encoding parity operation unit 615 calculates the parity bits T with respect to the information bits A from the information bit reading unit 614, the encoding parity operation unit 615 outputs the code word c=[A/T] represented by the information bits A and the parity bits T as an LDPC encoding result of the information bits A.

Then, in step S206, the control unit 616 determines whether the LDPC encoding ends. When it is determined in step S206 that the LDPC encoding does not end, that is, when there is LDPC target data to perform the LDPC encoding, the processing returns to step S201 (or step S204). Hereinafter, the processing of steps S201 (or step S204) to S206 is repeated.

When it is determined in step S206 that the LDPC encoding ends, that is, there is no LDPC target data to perform the LDPC encoding, the LDPC encoder 115 ends the processing.

As described above, the parity check matrix initial value table corresponding to each code length N and each encoding rate r is prepared and the LDPC encoder 115 performs the LDPC encoding of the predetermined code length N and the predetermined encoding rate r, using the parity check matrix H generated from the parity check matrix initial value table corresponding to the predetermined code length N and the predetermined encoding rate r.

<Example of the Parity Check Matrix Initial Value Table>

The parity check matrix initial value table is a table that represents positions of elements of 1 of the information matrix $H_A$ (FIG. 10) of the parity check matrix H corresponding to the information length K according to the code length N and the encoding rate r of the LDPC code (LDPC code defined by the parity check matrix H) for every 360 columns (column number P of a unit of the cyclic structure) and is previously made for each parity check matrix H of each code length N and each encoding rate r.

Figure 37:
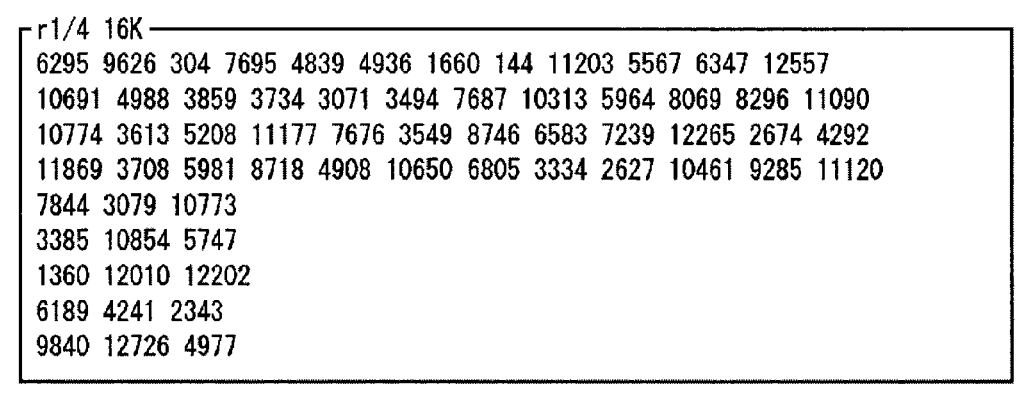

FIG. 37 is an illustration of an example of the parity check matrix initial value table.

That is, FIG. 37 illustrates a parity check matrix initial value table with respect to the parity check matrix H that is defined in the standard of the DVB-T.2 and has the code length N of 16200 bits and the encoding rate (an encoding rate of notation of the DVB-T.2) r of 1/4.

The parity check matrix generating unit 613 (FIG. 35) calculates the parity check matrix H using the parity check matrix initial value table, as follows.

FIG. 38 is an illustration of a method of calculating the parity check matrix H from the parity check matrix initial value table.

That is, FIG. 38 illustrates a parity check matrix initial value table with respect to the parity check matrix H that is defined in the standard of the DVB-T.2 and has the code length N of 16200 bits and the encoding rate r of 2/3.

As described above, the parity check matrix initial value table is the table that represents the positions of the elements of 1 of the information matrix $H_A$ (FIG. 10) corresponding to the information length K according to the code length N and the encoding rate r of the LDPC code for every 360 columns (column number P of a unit of the cyclic structure). In the i-th row thereof, row numbers (row numbers when a row number of a first row of the parity check matrix H is set to 0) of elements of 1 of a (1+360×(i−1)-th column of the parity check matrix H are arranged by a number of column weights of the (1+360×(i−1)-th column.

In this case, because the parity matrix $H_T$ (FIG. 10) of the parity check matrix H corresponding to the parity length M is determined as illustrated in FIG. 25, according to the parity check matrix initial value table, the information matrix $H_A$ (FIG. 10) of the parity check matrix H corresponding to the information length K is calculated.

A row number k+1 of the parity check matrix initial value table is different according to the information length K.

A relation of an expression (9) is realized between the information length K and the row number k+1 of the parity check matrix initial value table.

$$K=(k+1)\times 360 \qquad (9)$$

In this case, 360 of the expression (9) is the column umber P of the unit of the cyclic structure described in FIG. 26.

In the parity check matrix initial value table of FIG. 38, 13 numerical values are arranged from the first row to the third row and 3 numerical values are arranged from the fourth row to the (k+1)-th row (in FIG. 38, the 30th row).

Therefore, the column weights of the parity check matrix H that are calculated from the parity check matrix initial value table of FIG. 38 are 13 from the first column to the (1+360×(3−1)−1)-th column and are 3 from the (1+360×(3−1))-th column to the K-th column.

The first row of the parity check matrix initial value table of FIG. 38 becomes 0, 2084, 1613, 1548, 1286, 1460, 3196, 4297, 2481, 3369, 3451, 4620, and 2622, which shows that elements of rows having row numbers of 0, 2084, 1613, 1548, 1286, 1460, 3196, 4297, 2481, 3369, 3451, 4620, and 2622 are 1 (and the other elements are 0), in the first column of the parity check matrix H.

The second row of the parity check matrix initial value table of FIG. 38 becomes 1, 122, 1516, 3448, 2880, 1407, 1847, 3799, 3529, 373, 971, 4358, and 3108, which shows that elements of rows having row numbers of 1, 122, 1516, 3448, 2880, 1407, 1847, 3799, 3529, 373, 971, 4358, and 3108 are 1, in the 361 (=1+360×(2−1))-th column of the parity check matrix H.

As described above, the parity check matrix initial value table represents positions of elements of 1 of the information matrix $H_A$ of the parity check matrix H for every 360 columns.

The columns other than the (1+360×(i−1))-th column of the parity check matrix H, that is, the individual columns from the (2+360×(i−1))-th column to the (360×i)-th column are arranged by cyclically shifting elements of 1 of the (1+360×(i−1))-th column determined by the parity check matrix initial value table periodically in a downward direction (downward direction of the columns) according to the parity length M.

That is, the (2+360×(i−1))-th column is obtained by cyclically shifting (1+360×(i−1))-th column in the downward direction by M/360 (=q) and the next (3+360×(i−1))-th column is obtained by cyclically shifting (1+360×(i−1))-th column in the downward direction by 2×M/360 (=2×q) (obtained by cyclically shifting (2+360×(i−1))-th column in the downward direction by M/360 (=q)).

If a numerical value of a j-th column (j-th column from the left side) of an i-th row (i-th row from the upper side) of the parity check matrix initial value table is represented as $h_{i,j}$ and a row number of the j-th element of 1 of the w-th column of the parity check matrix H is represented as $H_{w-j}$, the row number $H_{w-j}$ of the element of 1 of the w-th column to be a column other than the (1+360×(i−1))-th column of the parity check matrix H can be calculated by an expression (10).

$$H_{w-j} = \mod \{h_{i,j} + \mod((w-1), P) \times q, M\} \qquad (10)$$

In this case, mod(x, y) means a remainder that is obtained by dividing x by y.

In addition, P is a column number of a unit of the cyclic structure described above. For example, in the standard of the DVB-S.2, the DVB-T.2, and the DVB-C.2, P is 360 as described above. In addition, q is a value M/360 that is obtained by dividing the parity length M by the column number P (=360) of the unit of the cyclic structure.

The parity check matrix generating unit 613 (FIG. 35) specifies the row numbers of the elements of 1 of the (1+360×(i−1))-th column of the parity check matrix H by the parity check matrix initial value table.

The parity check matrix generating unit 613 (FIG. 35) calculates the row number $H_{w-j}$ of the element of 1 of the w-th column to be the column other than the (1+360×(i−1))-th column of the parity check matrix H, according to the expression (10), and generates the parity check matrix H in which the element of the obtained row number is set to 1.

<LDPC Code of DVB-Sx>

Meanwhile, a standard improved from DVB-S.2 called DVB-Sx or DVB-S.2 evo is being developed.

Thus, an LDPC code (hereinafter also referred to as a 16 k code for Sx) in which the code length N is 16 k bits and which can be used in data transmission other than DVB-Sx will be described.

Here, as for the 16 k code for Sx, from the viewpoint that the affinity (compatibility) with DVB-S.2 is maintained as much as possible, similar to an LDPC code defined in DVB-S.2, parity matrix $H_T$ of the parity check matrix H is assumed to have a staircase structure (FIG. 11).

In addition, as for the 16 k code for Sx, similar to the LDPC code defined in DVB-S.2, the information matrix $H_A$ of the parity check matrix H is assumed to be a cyclic structure and column number P which is the unit of the cyclic structure is assumed to be 360.

Figure 40:
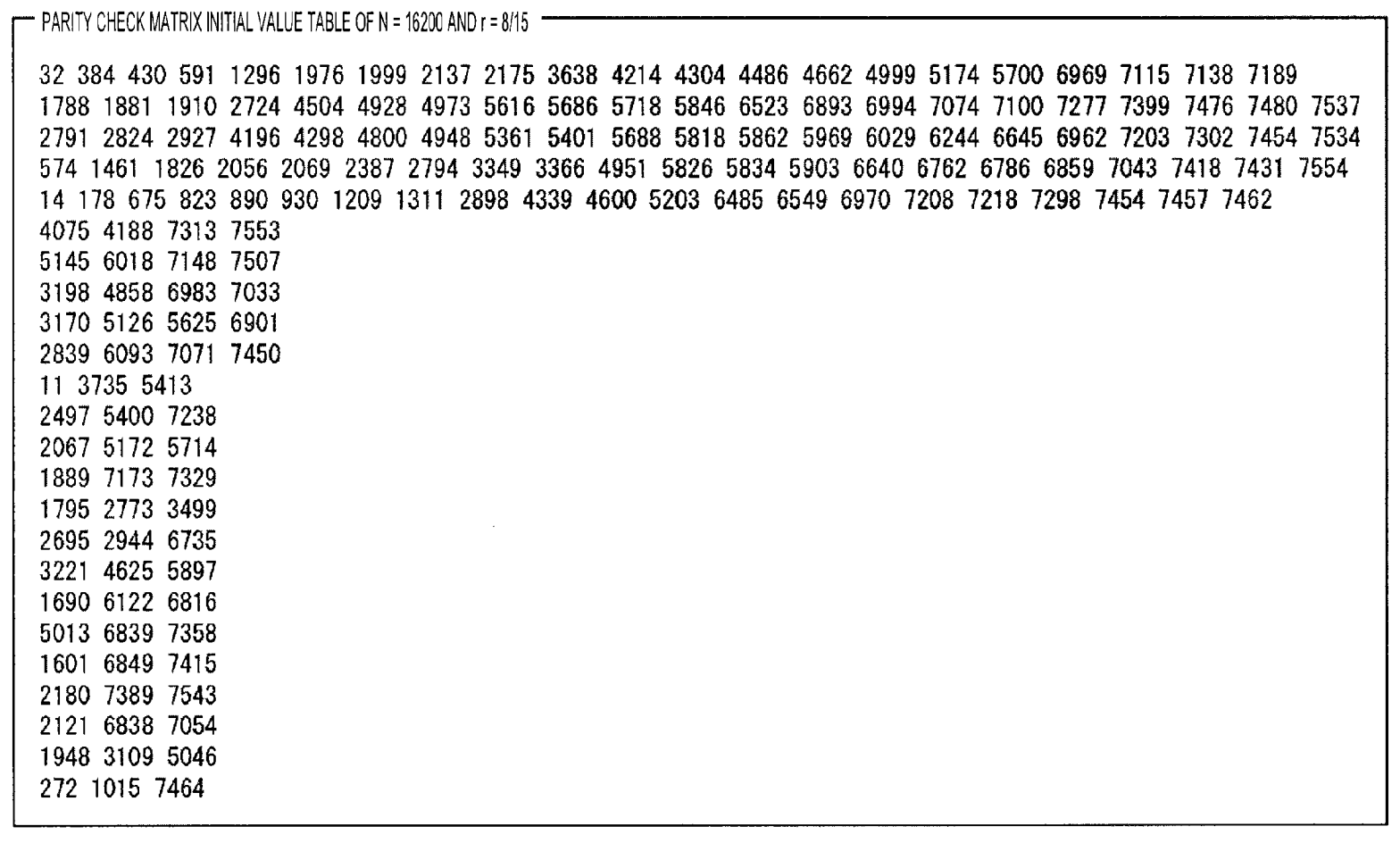

FIGS. 39 and 40 are illustrations of an example of a parity check matrix initial value table of a 16 k code for Sx.

FIG. 39 is an illustration of the parity check matrix initial value table of a parity check matrix H of a 16 k code for Sx in which an encoding rate r is 7/15 (hereinafter also referred to as a 16 k code for Sx of r=7/15).

FIG. 40 is an illustration of the parity check matrix initial value table of a parity check matrix H of a 16 k code for Sx in which an encoding rate r is 8/15 (hereinafter also referred to as a 16 k code for Sx of r=8/15).

The LDPC encoder 115 (FIG. 8 and FIG. 35) can perform LDPC encoding into any 16 k code for Sx with a code length N of 16 k among 2 kinds of encoding rates r of 7/15 or 8/15, by the use of the parity check matrix H found from the parity check matrix initial value tables illustrated in FIGS. 39 and 40.

In this case, the parity check matrix initial value tables illustrated in FIG. 39 and FIG. 40 are stored in the storage unit 602 of the LDPC encoder 115 (FIG. 8).

A 16 k code for Sx obtained by the use of the parity check matrix H found from the parity check matrix initial value tables in FIG. 39 and FIG. 40 is an LDPC code of good performance.

Here, the LDPC code of good performance is an LDPC code obtained from an appropriate parity check matrix H.

Moreover, the appropriate parity check matrix H is a parity check matrix that satisfies a predetermined condition to make BER (and FER) smaller when an LDPC code obtained from the parity check matrix H is transmitted at low $E_s/N_0$ or $E_b/N_o$ (signal-to-noise power ratio per bit).

For example, the appropriate parity check matrix H can be found by performing simulation to measure BER when LDPC codes obtained from various parity check matrices that satisfy a predetermined condition are transmitted at low $E_s/N_o$.

As a predetermined condition to be satisfied by the appropriate parity check matrix H, for example, an analysis result obtained by a code performance analysis method called density evolution (Density Evolution) is excellent, and a loop of elements of 1 does not exist, which is called cycle 4, and so on.

Here, in the information matrix $H_A$, it is known that the decoding performance of LDPC code is deteriorated when elements of 1 are dense like cycle 4, and therefore it is requested that cycle 4 does not exist, as a predetermined condition to be satisfied by the appropriate parity check matrix H.

Here, the predetermined condition to be satisfied by the appropriate parity check matrix H can be arbitrarily determined from the viewpoint of the improvement in the decoding performance of LDPC code and the facilitation (simplification) of decoding processing of LDPC code, and so on.

Figure 41:
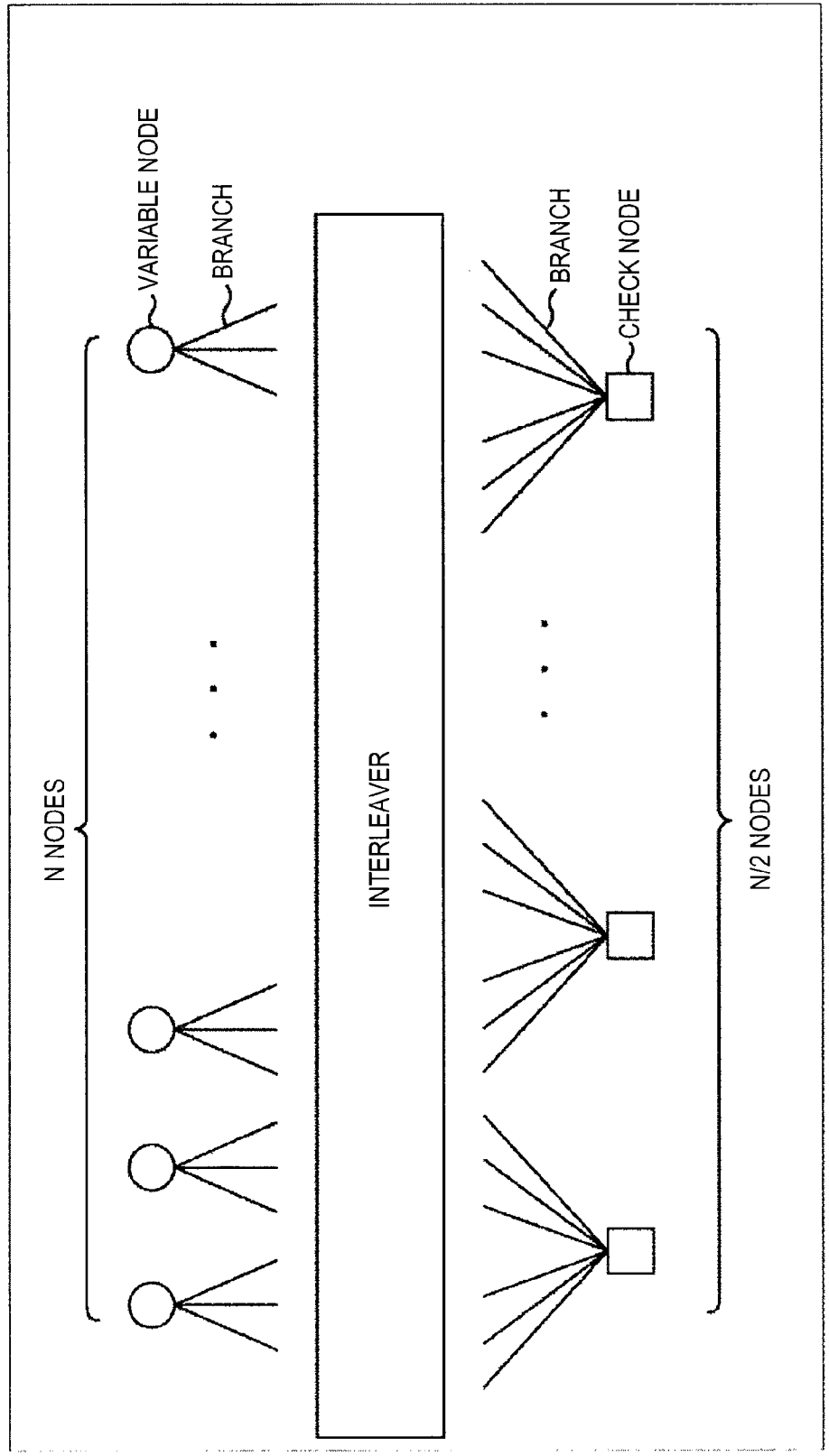
FIG. 41 is an illustration of an example of a Tanner graph of such an ensemble of a degree sequence in which a column weight is 3 and a row weight is 6.
Figure 42:
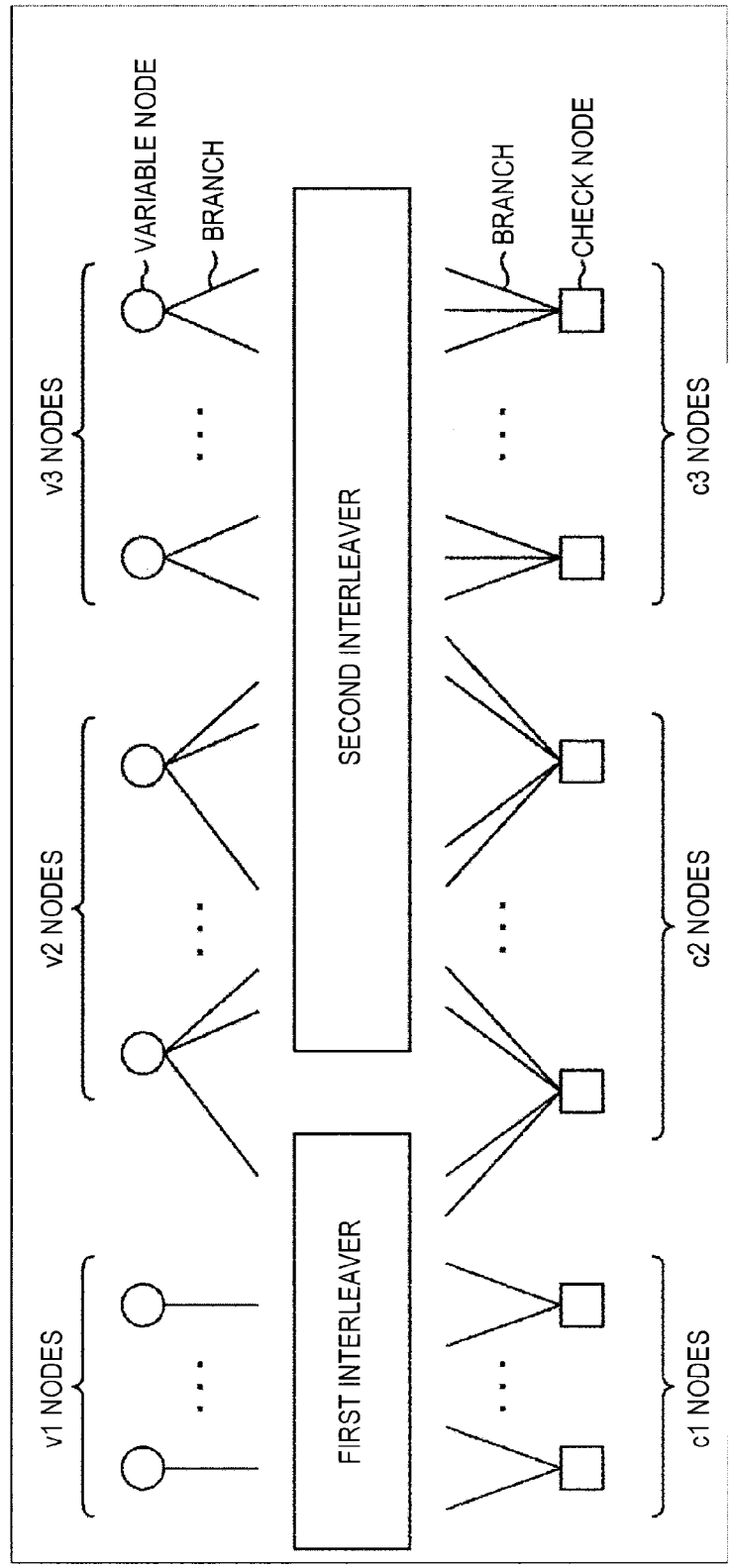
FIG. 42 is an illustration of an example of a Tanner graph of an ensemble of the multi-edge type.

FIG. 41 and FIG. 42 are diagrams to describe the density evolution that can obtain an analytical result as a predetermined condition to be satisfied by the appropriate parity check matrix H.

The density evolution is a code analysis method that calculates the expectation value of the error probability of the entire LDPC code (ensemble) with a code length N of ∞ characterized by a degree sequence described later.

For example, when the dispersion value of noise is gradually increased from 0 on the AWGN channel, the expectation value of the error probability of a certain ensemble is 0 first, but, when the dispersion value of noise becomes equal to or greater than a certain threshold, it is not 0.

According to the density evolution, by comparison of the threshold of the dispersion value of noise (which may also be called a performance threshold) in which the expectation value of the error probability is not 0, it is possible to decide the quality of ensemble performance (appropriateness of the parity check matrix).

Here, as for a specific LDPC code, when an ensemble to which the LDPC code belongs is decided and density evolution is performed for the ensemble, rough performance of the LDPC code can be expected.

Therefore, if an ensemble of good performance is found, an LDPC code of good performance can be found from LDPC codes belonging to the ensemble.

Here, the above-mentioned degree sequence shows at what percentage a variable node or check node having the weight of each value exists with respect to the code length N of an LDPC code.

For example, a regular (3,6) LDPC code with an encoding rate of 1/2 belongs to an ensemble characterized by a degree sequence in which the weight (column weight) of all variable nodes is 3 and the weight (row weight) of all check nodes is 6.

FIG. 41 illustrates a Tanner graph of such an ensemble.

In the Tanner graph of FIG. 41, there are variable nodes shown by circles (sign O) in the diagram only by N pieces equal to the code length N, and there are check nodes shown by quadrangles (sign □) only by N/2 pieces equal to a multiplication value multiplying encoding rate 1/2 by the code length N.

Three branches (edge) equal to the column weight are connected with each variable node, and therefore there are totally 3N branches connected with N variable nodes.

Moreover, six branches (edge) equal to the row weight are connected with each check node, and therefore there are totally 3N branches connected with N/2 check nodes.

In addition, there is one interleaver in the Tanner graph in FIG. 41.

The interleaver randomly rearranges 3N branches connected with N variable nodes and connects each rearranged branch with any of 3N branches connected with N/2 check nodes.

There are $(3N)!(=(3N) \times (3N-1) \times \ldots \times 1)$ rearrangement patterns to rearrange 3N branches connected with N variable nodes in the interleaver. Therefore, an ensemble characterized by the degree sequence in which the weight of all variable nodes is 3 and the weight of all check nodes is 6, becomes aggregation of (3N)!LDPC codes.

In simulation to find an LDPC code of good performance (appropriate parity check matrix), an ensemble of a multi-edge type is used in the density evolution.

In the multi edge type, an interleaver through which the branches connected with the variable nodes and the branches connected with the check nodes pass, is divided into plural (multi edge), and, by this means, the ensemble is characterized more strictly.

FIG. 42 illustrates an example of a Tanner graph of an ensemble of the multi-edge type.

In the Tanner graph of FIG. 42, there are two interleavers of the first interleaver and the second interleaver.

Moreover, in the Tanner graph chart of FIG. 42, v1 variable nodes with one branch connected with the first interleaver and no branch connected with the second interleaver exist, v2 variable nodes with one branch connected with the first interleaver and two branches connected with the second interleaver exist, and v3 variable nodes with no branch connected with the first interleaver and two branches connected with the second interleaver exist, respectively.

Furthermore, in the Tanner graph chart of FIG. 42, c1 check nodes with two branches connected with the first interleaver and no branch connected with the second interleaver exist, c2 check nodes with two branches connected with the first interleaver and two branches connected with the second interleaver exist, and c3 check nodes with no branch connected with the first interleaver and three branches connected with the second interleaver exist, respectively.

Here, for example, the density evolution and the mounting thereof are described in "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In simulation to find (a parity check matrix initial value table of) a 16 k code for Sx, by the density evaluation of the multi-edge type, an ensemble in which a performance threshold that is $E_b/N_0$ (signal-to-noise power ratio per bit) with deteriorating (decreasing) BER is equal to or less than a predetermined value is found, and an LDPC code that decreases BER in using one or more orthogonal modulations such as QPSK is selected from LDPC codes belonging to the ensemble as an LDPC code of good performance.

The above-mentioned parity check matrix initial value table of the 16 k code for Sx is a parity check matrix initial value table of respective LDPC codes with a code length N of 16 k bits and the encoding rate r of 7/15 or 8/15 found from the above-mentioned simulation.

Thus, according to the 16 k for Sx obtained from the parity check matrix initial value table, it is possible to ensure good communication quality in data transmission.

FIG. 43 is an illustration of a minimum cycle length and a performance threshold of the parity check matrix H obtained from the parity check matrix initial value table of the 16 k code for Sx of r=7/15 and 8/15 in FIGS. 39 and 40.

Here, the minimum cycle length (girth) means the minimum value of the length of a loop (loop length) formed with elements of 1 in the parity check matrix H.

In the parity check matrix H found from the parity check matrix initial value table of the 16 k code for Sx, cycle 4 (a loop of elements of 1 with a loop length of 4) does not exist.

Moreover, since the redundancy of an LDPC code becomes larger as the encoding rate r becomes smaller, the performance threshold tends to improve (decrease) as the encoding rate r decreases.

Figure 44:
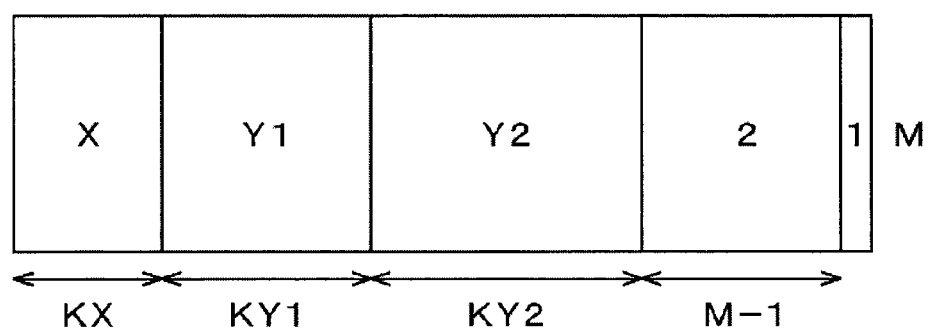
FIG. 44 is an illustration of a parity check matrix of a 16 k code for Sx.

FIG. 44 is a diagram illustrating the parity check matrix H (which may be called a 16 k code for Sx parity check matrix H) of FIG. 39 and FIG. 40 (which is found from a parity check matrix initial value table).

The column weight is X for the KX column from the first column of the 16 k code for Sx parity check matrix H, the column weight is $y_1$ for the subsequent KY1 column, the column weight is $y_2$ for the subsequent KY2 column, the column weight is 2 for the subsequent M-1 column, and the column weight is 1 for the last column.

Here, KX+KY1+KY2+M-1+1 is equal to a code length of N=16200 bits.

FIG. 45 is a diagram illustrating column numbers KX, KY1, KY2 and M and column weights X, Y1 and Y2 in FIG. 44, for each encoding rate r of a 16 k code for Sx.

As for the parity check matrix H of the respective 16 k codes for Sx of r of 7/15 or 8/15, similar to the parity check matrix described in FIG. 12 and FIG. 13, the column weight tends to be larger in a column closer to the head side (left side), and therefore a code bit closer to the head of the 16 k codes for Sx tends to be more tolerant to errors (have resistance to errors).

<Interchange Processing of 16 k Code for Sx of r=7/15 and 8/15>

In order to ensure better communication quality in the data transmission using the 16 k code for Sx, it is desirable to take measures to improve tolerance against an error.

Examples of the measures to improve the tolerance against an error include a method of adopting a modulation scheme in which the number of signal points is relatively small, such as 8PSK or 16APSK, and interchange processing performed with the demultiplexer 25 (FIG. 9).

In the interchange processing, examples of an interchange method of interchanging code bits of the LDPC code defined in a standard such as DVB-T.2 include the above-described first to fourth interchange methods, an interchange method defined in DVB-T.2 or the like.

In data transmission using the 16 k code for Sx, however, interchange processing proper to the 16 k code for Sx is preferably adopted.

That is, in the 16 k code for Sx, it is desirable to adopt interchange processing of an interchange method dedicated to the 16 k code for Sx (also referred to as an interchange method for Sx) in which tolerance against an error of the 16 k code for Sx is further improved.

Hereinafter, before interchange processing according to the interchange method for Sx, interchange processing in accordance with the already proposed interchange method (hereinafter also referred to as a current method) will be described.

The interchange processing when the interchange processing is performed on the LDPC code (hereinafter also referred to as a regulation code) regulated in DVB-T2 according to the current method by the demultiplexer 25 will be described with reference to FIGS. 46 and 47.

Figure 46:
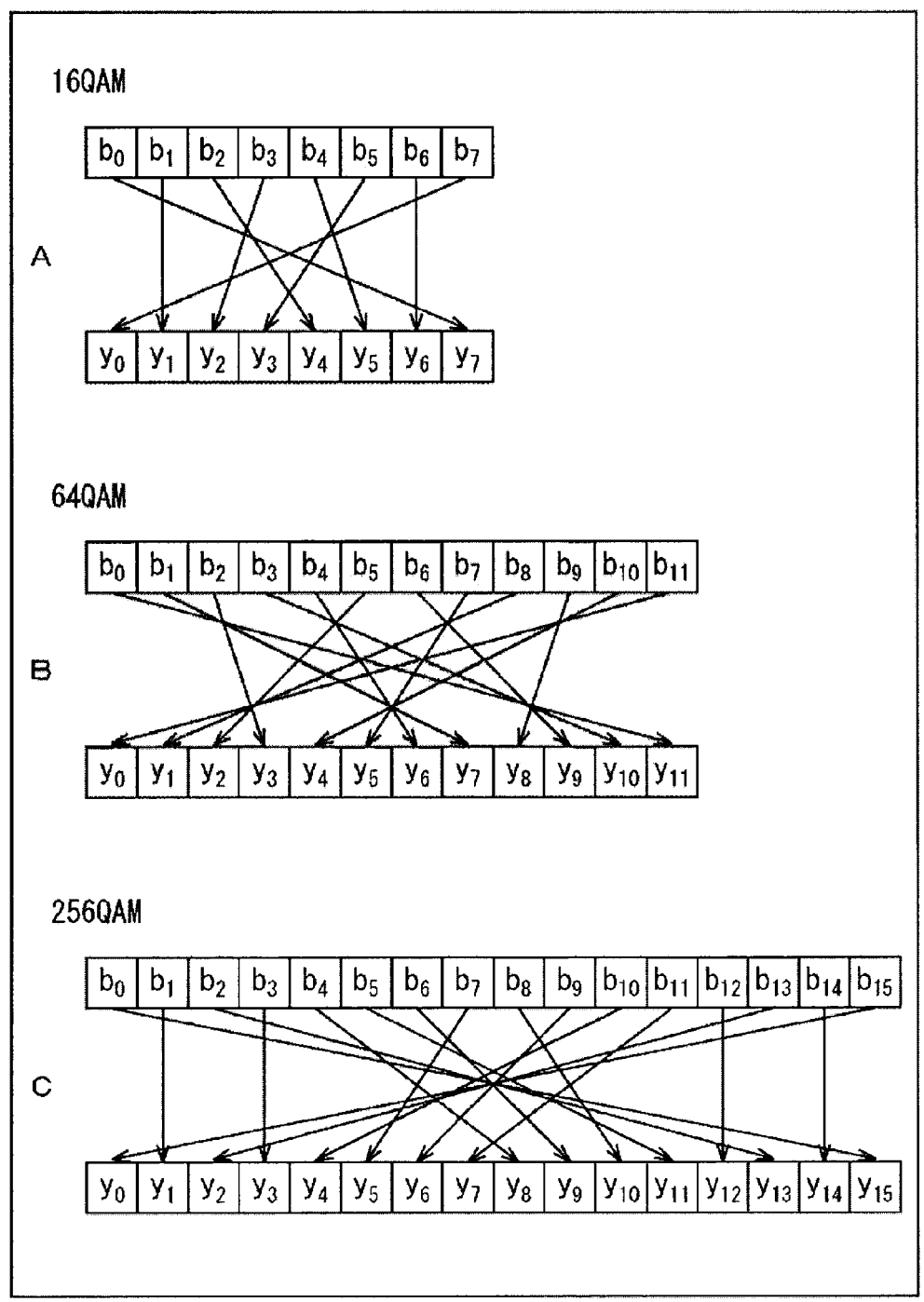
FIG. 46 is an illustration of interchange processing according to a current method.

FIG. 46 illustrates an example of the interchange processing according to the current scheme when the LDPC code is as regulated in DVB-T.2 at the code length N of 64800 bits and the encoding rate of 3/5.

That is, A of FIG. 46 shows an example of the interchange processing according to the current method when the LPDC code is a regulation code in which the code length N is 64800 bits, the encoding rate is 3/5, a modulation method is 16QAM and the multiple b is 2.

When the modulation method is 16QAM, the 4 (=m) code bits are mapped to certain points among 16 signal points decided in 16QAM as one symbol.

When the code length N is 64800 bits and the multiple b is 2, the memory 31 (FIGS. 22 and 23) of the demultiplexer 25 has 8 columns storing 4×2 (=mb) bits in the row direction and 64800/(4×2) bits in the column direction.

In the demultiplexer 25, when the code bits of the LDPC code are written in the column direction of the memory 31 and the writing of the 64800 code bits (1 codeword) ends, the code bits written on the memory 31 are read in units of 4×2 (=mb) bits in the row direction and are supplied to the interchanging unit 32 (FIGS. 22 and 23).

The interchanging unit 32 interchanges 4×2 (=mb) code bits $b_0$ to $b_7$ so that the 4×2 (=mb) code bits $b_0$, $b_1$, $b_2$, $b_3$, $b_4$, $b_5$, $b_6$, and $b_7$ read from the memory 31 are allocated to, for example, 4×2 (=mb) symbol bits $y_0$, $y_1$, $y_2$, $y_3$, $y_4$, $y_5$, $y_6$, and $y_7$ of 2 (=b) consecutive symbols, as shown in A of FIG. 46.

That is, the interchanging unit 32 performs the interchanging so that the code bits are allocated to the symbol bits as follows:

code bit $b_0$ to symbol bit $y_7$,
code bit $b_1$ to symbol bit $y_1$,
code bit $b_2$ to symbol bit $y_4$,
code bit $b_3$ to symbol bit $y_2$,
code bit $b_4$ to symbol bit $y_5$,
code bit $b_5$ to symbol bit $y_3$,
code bit $b_6$ to symbol bit $y_6$, and
code bit $b_7$ to symbol bit $y_0$.

B of FIG. 46 shows an example of the interchange processing according to the current method when the LPDC code is a regulation code in which the code length N is 64800 bits, the encoding rate is 3/5, a modulation method is 64QAM and the multiple b is 2.

When the modulation method is 64QAM, the 6 (=m) code bits are mapped to certain points among 64 signal points decided in 64QAM as one symbol.

When the code length N is 64800 bits and the multiple b is 2, the memory 31 (FIGS. 22 and 23) of the demultiplexer 25 has 12 columns storing 6×2 (=mb) bits in the row direction and 64800/(6×2) bits in the column direction.

In the demultiplexer 25, when the code bits of the LDPC code are written in the column direction of the memory 31 and the writing of the 64800 code bits (1 codeword) ends, the code bits written on the memory 31 are read in units of 6×2 (=mb) bits in the row direction and are supplied to the interchanging unit 32 (FIGS. 22 and 23).

The interchanging unit 32 interchanges 6×2 (=mb) code bits $b_0$ to $b_{11}$ so that the 6×2 (=mb) code bits $b_0$, $b_1$, $b_2$, $b_3$, $b_4$, $b_5$, $b_6$, $b_7$, $b_8$, $b_9$, $b_{10}$, and $b_{11}$ read from the memory 31 are allocated to, for example, 6×2 (=mb) symbol bits $y_0$, $y_1$, $y_2$, $y_3$, $y_4$, $y_5$, $y_6$, $y_7$, $y_8$, $y_9$, $y_{10}$, and $y_{11}$ of 2 (=b) consecutive symbols, as shown in B of FIG. 46.

That is, the interchanging unit 32 performs the interchanging so that the code bits are allocated to the symbol bits as follows:

code bit $b_0$ to symbol bit $y_{11}$,
code bit $b_1$ to symbol bit $y_7$,
code bit $b_2$ to symbol bit $y_3$,
code bit $b_3$ to symbol bit $y_{10}$,
code bit $b_4$ to symbol bit $y_6$,
code bit $b_5$ to symbol bit $y_2$,
code bit $b_6$ to symbol bit $y_9$,
code bit $b_7$ to symbol bit $y_5$,
code bit $b_8$ to symbol bit $y_1$,
code bit $b_9$ to symbol bit $y_8$,
code bit $b_{10}$ to symbol bit $y_4$, and
code bit $b_{11}$ to symbol bit $y_0$.

C of FIG. 46 shows an example of the interchange processing according to the current method when the LPDC code is a regulation code in which the code length N is 64800 bits, the encoding rate is 3/5, a modulation method is 256QAM and the multiple b is 2.

When the modulation method is 256QAM, the 8 (=m) code bits are mapped to certain points among 256 signal points decided in 256QAM as one symbol.

When the code length N is 64800 bits and the multiple b is 2, the memory 31 (FIGS. 22 and 23) of the demultiplexer 25 has 16 columns storing 8×2 (=mb) bits in the row direction and 64800/(8×2) bits in the column direction.

In the demultiplexer 25, when the code bits of the LDPC code are written in the column direction of the memory 31 and the writing of the 64800 code bits (1 codeword) ends, the code bits written on the memory 31 are read in units of 8×2 (=mb) bits in the row direction and are supplied to the interchanging unit 32 (FIGS. 22 and 23).

The interchanging unit 32 interchanges 8×2 (=mb) code bits $b_0$ to $b_{15}$ so that the 8×2 (=mb) code bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ read from the memory 31 are allocated to, for example, 8×2 (=mb) symbol bits $y_0$, $y_1$, $y_2$, $y_3$, $y_4$, $y_5$, $y_6$, $y_7$, $y_8$, $y_9$, $y_{10}$, $y_{11}$, $y_{12}$, $y_{13}$, $y_{14}$, and $y_{15}$ of 2 (=b) consecutive symbols, as shown in B of FIG. 46.

That is, the interchanging unit 32 performs the interchanging so that the code bits are allocated to the symbol bits as follows:

code bit $b_0$ to symbol bit $y_{15}$,
code bit $b_1$ to symbol bit $y_1$,
code bit $b_2$ to symbol bit $y_{13}$,
code bit $b_3$ to symbol bit $y_3$,
code bit $b_4$ to symbol bit $y_5$,
code bit $b_5$ to symbol bit $y_{11}$,
code bit $b_6$ to symbol bit $y_9$,
code bit $b_7$ to symbol bit $y_5$,
code bit $b_8$ to symbol bit $y_{10}$,
code bit $b_9$ to symbol bit $y_6$,
code bit $b_{10}$ to symbol bit $y_4$,
code bit $b_{11}$ to symbol bit $y_7$,
code bit $b_{12}$ to symbol bit $y_{12}$,
code bit $b_{13}$ to symbol bit $y_2$,
code bit $b_{14}$ to symbol bit $y_{14}$, and
code bit $b_{15}$ to symbol bit $y_0$.

Figure 47:
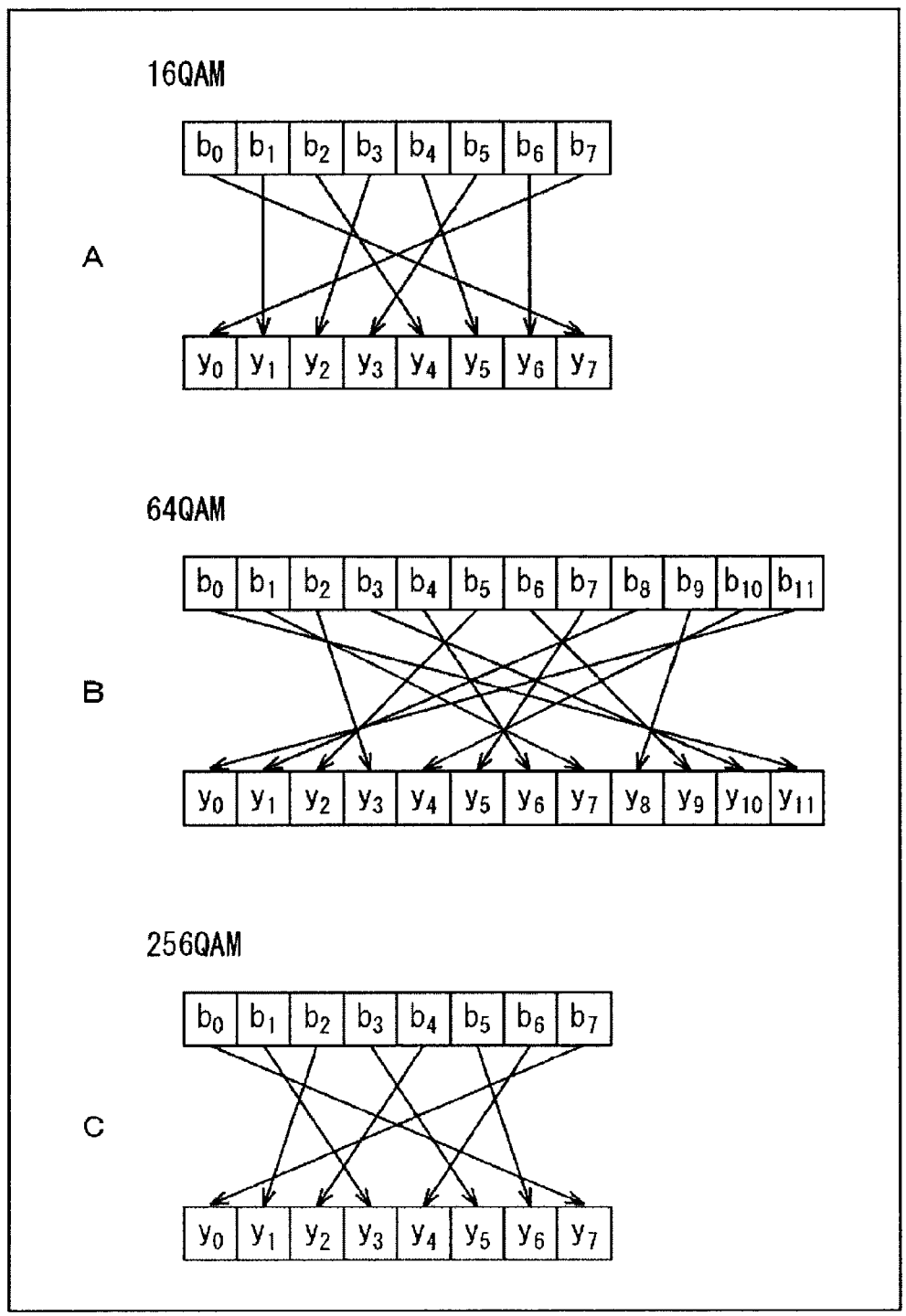
FIG. 47 is an illustration of interchange processing according to a current method.

FIG. 47 illustrates an example of the interchange processing according to the current scheme when the regulation code is as regulated in DVB-T.2 at the code length N of 16200 bits and the encoding rate of 3/5.

That is, A of FIG. 47 shows an example of the interchange processing according to the current method when the LPDC code is an LPDC code in which the code length N is 16200 bits, the encoding rate is 3/5, a modulation method is 16QAM and the multiple b is 2.

When the modulation method is 16QAM, the 4 (=m) code bits are mapped to certain points among 16 signal points decided in 16QAM as one symbol.

When the code length N is 16200 bits and the multiple b is 2, the memory 31 (FIGS. 22 and 23) of the demultiplexer 25 has 8 columns storing 4×2 (=mb) bits in the row direction and 16200/(4×2) bits in the column direction.

In the demultiplexer 25, when the code bits of the LDPC code are written in the column direction of the memory 31 and the writing of the 16200 code bits (1 codeword) ends, the code bits written on the memory 31 are read in units of 4×2 (=mb) bits in the row direction and are supplied to the interchanging unit 32 (FIGS. 22 and 23).

The interchanging unit 32 interchanges 4×2 (=mb) code bits $b_0$ to $b_7$ so that the 4×2 (=mb) code bits $b_0$, $b_1$, $b_2$, $b_3$, $b_4$, $b_5$, $b_6$, and $b_7$ read from the memory 31 are allocated to, for example, 4×2 (=mb) symbol bits $y_0$, $y_1$, $y_2$, $y_3$, $y_4$, $y_5$, $y_6$, and $y_7$ of 2 (=b) consecutive symbols, as shown in A of FIG. 47.

That is, the interchanging unit 32 performs the interchanging so that code bits $b_0$ to $b_7$ are allocated to symbol bits $y_0$ to $y_7$, as in the above-described case of A of FIG. 46.

B of FIG. 47 shows an example of the interchange processing according to the current method when the LPDC code is a regulation code in which the code length N is 16200 bits, the encoding rate is 3/5, a modulation method is 64QAM and the multiple b is 2.

When the modulation method is 64QAM, the 6 (=m) code bits are mapped to certain points among 64 signal points decided in 64QAM as one symbol.

When the code length N is 16200 bits and the multiple b is 2, the memory 31 (FIGS. 22 and 23) of the demultiplexer 25 has 12 columns storing 6×2 (=mb) bits in the row direction and 16200/(6×2) bits in the column direction.

In the demultiplexer 25, when the code bits of the LDPC code are written in the column direction of the memory 31 and the writing of the 16200 code bits (1 codeword) ends, the code bits written on the memory 31 are read in units of 6×2 (=mb) bits in the row direction and are supplied to the interchanging unit 32 (FIGS. 22 and 23).

The interchanging unit 32 interchanges 6×2 (=mb) code bits $b_0$ to $b_{11}$ so that the 6×2 (=mb) code bits $b_0$, $b_1$, $b_2$, $b_3$, $b_4$, $b_5$, $b_6$, $b_7$, $b_8$, $b_9$, $b_{10}$, and $b_{11}$ read from the memory 31 are allocated to, for example, 6×2 (=mb) symbol bits $y_0$, $y_1$, $y_2$, $y_3$, $y_4$, $y_5$, $y_6$, $y_7$, $y_8$, $y_9$, $y_{10}$, and $y_{11}$ of 2 (=b) consecutive symbols, as shown in B of FIG. 47.

That is, the interchanging unit 32 performs the interchanging so that code bits $b_0$ to $b_{11}$ are allocated to symbol bits $y_0$ to $y_{11}$, as in the above-described case of B of FIG. 46.

C of FIG. 47 shows an example of the interchange processing according to the current method when the LPDC code is a regulation code in which the code length N is 16200 bits, the encoding rate is 3/5, a modulation method is 256QAM and the multiple b is 1.

When the modulation method is 256QAM, the 8 (=m) code bits are mapped to certain points among 256 signal points decided in 256QAM as one symbol.

When the code length N is 16200 bits and the multiple b is 1, the memory 31 (FIGS. 22 and 23) of the demultiplexer 25 has 8 columns storing 8×1 (=mb) bits in the row direction and 16200/(8×1) bits in the column direction.

In the demultiplexer 25, when the code bits of the LDPC code are written in the column direction of the memory 31 and the writing of the 16200 code bits (1 codeword) ends, the code bits written on the memory 31 are read in units of 8×1 (=mb) bits in the row direction and are supplied to the interchanging unit 32 (FIGS. 22 and 23).

The interchanging unit 32 interchanges 8×1 (=mb) code bits $b_0$ to $b_7$ so that the 8×1 (=mb) code bits $b_0$, $b_1$, $b_2$, $b_3$, $b_4$, $b_5$, $b_6$, and $b_7$ read from the memory 31 are allocated to, for example, 8×1 (=mb) symbol bits $y_0$, $y_1$, $y_2$, $y_3$, $y_4$, $y_5$, $y_6$, and $y_7$ of 1 (=b) consecutive symbols, as shown in C of FIG. 47.

That is, the interchanging unit 32 performs the interchanging so that the code bits are allocated to the symbol bits as follows:

code bit $b_0$ to symbol bit $y_7$,
code bit $b_1$ to symbol bit $y_3$,
code bit $b_2$ to symbol bit $y_1$,
code bit $b_3$ to symbol bit $y_5$,
code bit $b_4$ to symbol bit $y_2$,
code bit $b_5$ to symbol bit $y_6$,
code bit $b_6$ to symbol bit $y_4$, and
code bit $b_7$ to symbol bit $y_0$.

Next, interchange processing according to the interchange method for Sx will be described.

Hereinafter, a (#i+1)-th bit from the most significant bit of the mb code bits read in the row direction from the memory 31 is also expressed as bit b#i, and a bit of a (#i+1)-th bit from the most significant bit of the mb symbol bits of b consecutive symbols is also expressed as bit y#i.

Figure 48:
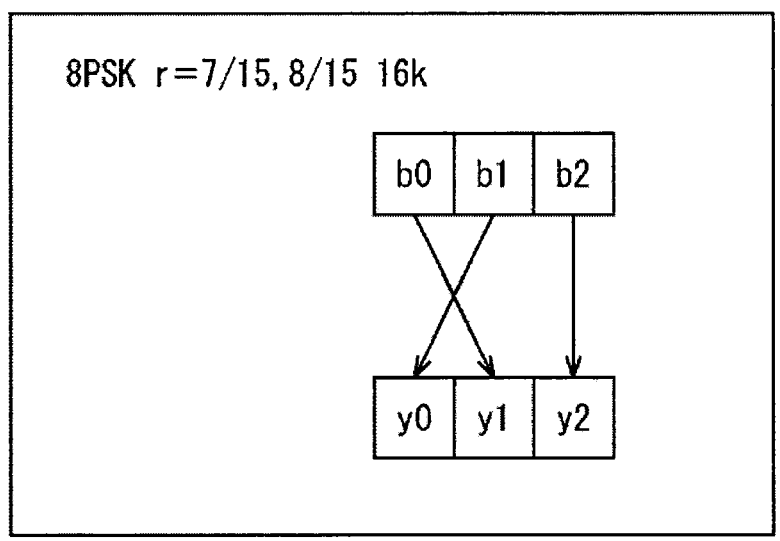
FIG. 48 is an illustration of a first example of the interchange processing according to an interchange method for Sx when a modulation method is 8PSK and a multiple b is 1 in data transmission using the 16 k code for Sx.

FIG. 48 is an illustration of a first example of the interchange processing according to the interchange method for Sx when the modulation method is 8PSK and the multiple b is 1 in data transmission using the 16 k code for Sx of r=7/15 or 8/15.

When the modulation method is 8PSK and the multiple b is 1 in the data transmission using the 16 k code for Sx of r=7/15 or 8/15, the (16200/(3×1))×(3×1) code bits written on the memory 31 in the column direction×the row direction are read in units of 3×1 (=mb) bits in the row direction in the demultiplexer 25 and are supplied to the interchanging unit 32 (FIGS. 22 and 23).

The interchanging unit 32 interchanges 3×1 (=mb) code bits $b_0$ to $b_2$ so that 3×1 (=mb) code bits $b_0$ to $b_2$ read from the memory 31 are allocated to, for example, 3×1 (=mb) symbol bits $y_0$ to $y_2$ of 1 (=b) symbol, as shown in FIG. 48.

That is, the interchanging unit 32 performs the interchanging so that the code bits are allocated to the symbol bits as follows:

code bit $b_0$ to symbol bit $y_1$,
code bit $b_1$ to symbol bit $y_0$, and
code bit $b_2$ to symbol bit $y_2$.

Figure 49:
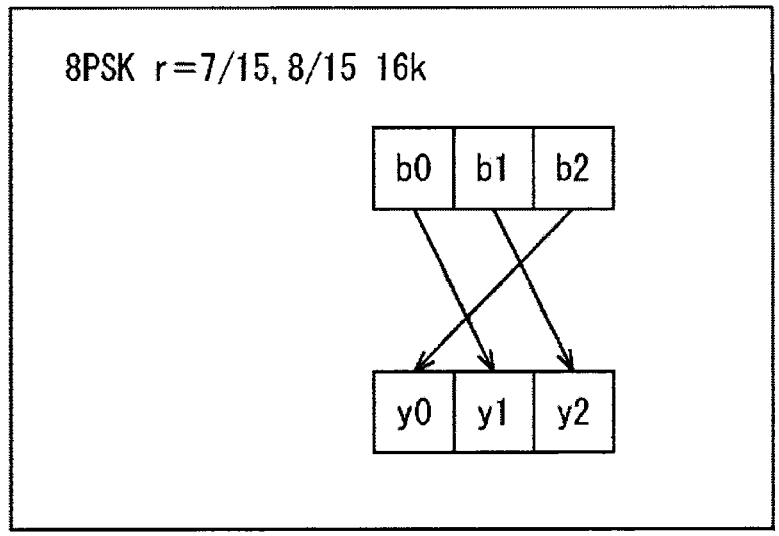
FIG. 49 is an illustration of a second example of the interchange processing according to the interchange method for Sx when the modulation method is 8PSK and the multiple b is 1 in data transmission using the 16 k code for Sx.

FIG. 49 is an illustration of a second example of the interchange processing according to the interchange method for Sx when the modulation method is 8PSK and the multiple b is 1 in data transmission using the 16 k code for Sx of r=7/15 or 8/15.

In this case, as described with reference to FIG. 48, the (16200/(3×1))×(3×1) code bits written on the memory 31 in the column direction×the row direction are read in units of 3×1 (=mb) bits in the row direction in the demultiplexer 25 and are supplied to the interchanging unit 32 (FIGS. 22 and 23).

The interchanging unit 32 interchanges 3×1 (=mb) code bits $b_0$ to $b_2$ so that 3×1 (=mb) code bits $b_0$ to $b_2$ read from the memory 31 are allocated to, for example, 3×1 (=mb) symbol bits $y_0$ to $y_2$ of 1 (=b) symbol, as shown in FIG. 49.

That is, the interchanging unit 32 performs the interchanging so that the code bits are allocated to the symbol bits as follows:

code bit $b_0$ to symbol bit $y_1$,
code bit $b_1$ to symbol bit $y_2$, and
code bit $b_2$ to symbol bit $y_0$.

Here, as an interchange method for the code bits of the LDPC code in the interchange processing by the interchanging unit 32, that is, an allocation pattern between the code bits of the LDPC code and the symbol bits indicating a symbol (hereinafter also referred to as a bit allocation pattern), a dedicated bit allocation pattern can be adopted in each 16 k code for Sx of the encoding rates r=7/15 and 8/15.

Here, when a dedicated bit allocation pattern is adopted for each 16 k code for Sx of the encoding rates r=7/15 and 8/15, it is necessary to mount each bit allocation pattern on the transmitting device 11. Further, for the 16 k code for Sx in which the encoding rate r differs, it is necessary to change (replace) the bit allocation pattern.

Accordingly, when the modulation method is 8PSK and the multiple b is 1 in each 16 k code for Sx of the encoding rates r=7/15 and 8/15, only one of the interchange methods described with reference to FIGS. 48 and 49 can be mounted on the transmitting device 11. The same also applies when the modulation method is 16APSK and the multiple b is 1, as will be described below.

Figure 50:
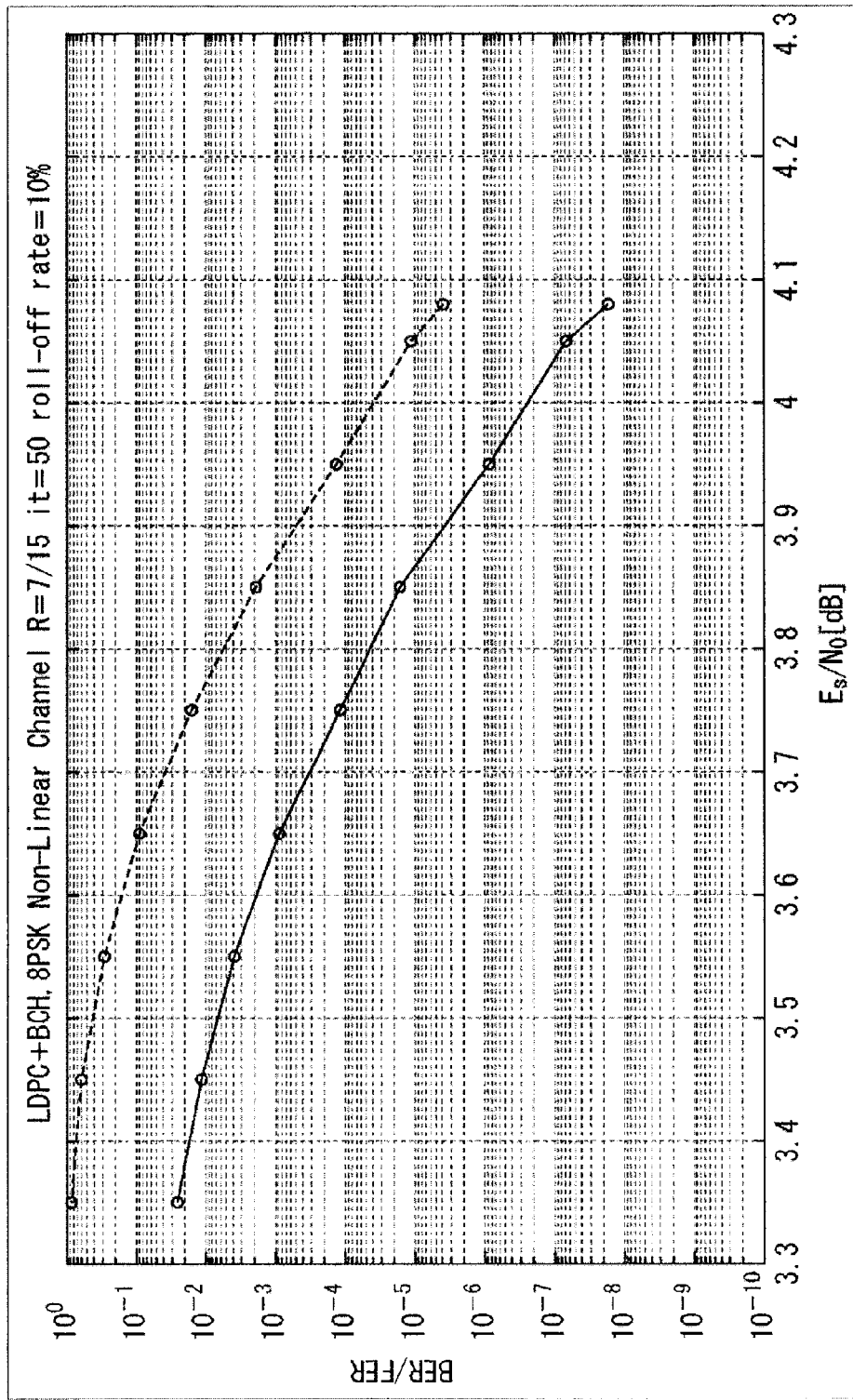
FIG. 50 is an illustration of a simulation result of a simulation measuring BER/FER.

FIG. 50 is an illustration of a simulation result of a simulation measuring BER/FER by adopting the first example of the interchange method for Sx in FIG. 48 as the interchange method and adopting 8PSK as the modulation method and in the 16 k code for Sx of the encoding rate r=7/15.

Figure 51:
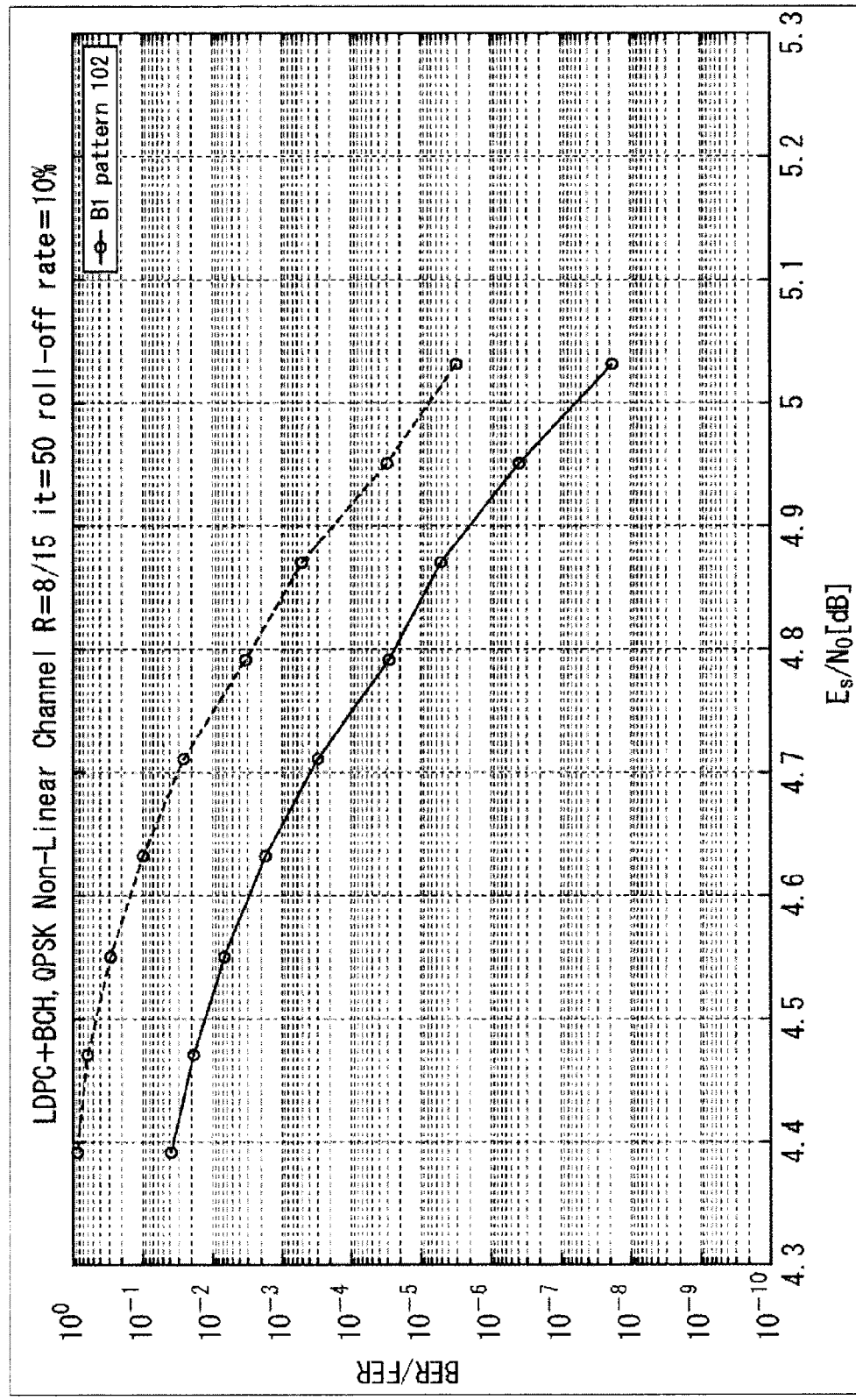
FIG. 51 is an illustration of a simulation result of a simulation measuring BER/FER.

FIG. 51 is an illustration of a simulation result of a simulation measuring BER/FER by adopting the first example of the interchange method for Sx in FIG. 48 as the interchange method and adopting 8PSK as the modulation method and in the 16 k code for Sx of the encoding rate r=8/15.

In FIG. 50 and FIG. 51, the horizontal axis shows $E_s/N_0$ and the vertical axis shows BER/FER. Here, the solid line shows BER and the dotted line shows FER.

From FIGS. 50 and 51, it can be confirmed that good BER/FER is obtained for each 16 k code for Sx of the encoding rate r=7/15 and 8/15, and thus good communication quality is ensured in the data transmission using the 16 k code for Sx.

In the simulation, the BER/FER which is substantially the same as that when the first example of the interchange method for Sx in FIG. 48 is adopted is measured even when the second example of the interchange method for Sx in FIG. 49 is adopted.

Here, in the simulation, by adopting 50 times as the repetition decoding number of times C (it) at the time of decoding of the 16 k code for Sx and assuming that an NL (Non-Linear) channel is the communication path 13 (FIG. 7), BER/FER is measured for various bit allocation patterns in which 3 bits of code bits are allocated to 3 bits of symbol bits.

A bit allocation pattern for which good BER/FER is obtained is adopted as the interchange method for Sx.

Thus, the interchange methods for Sx in FIGS. 48 and 49 can be said to be optimum interchange methods when data transmission in 8PSK using the 16 k code for Sx is performed via the NL channel.

In a simulation in which 8PSK is adopted as the modulation method, for example, a constellation (FIG. 19) adopted with 8PSK of DVB-S.2 is adopted as a constellation of the 8PSK.

For the interchange methods for Sx in FIGS. 48 and 49, good communication quality can be ensured not only during use with the NL channel but also during use with, for example, a linear channel or an AWGN channel in which AWGN is added to a linear channel other than the NL channel.

Figure 52:
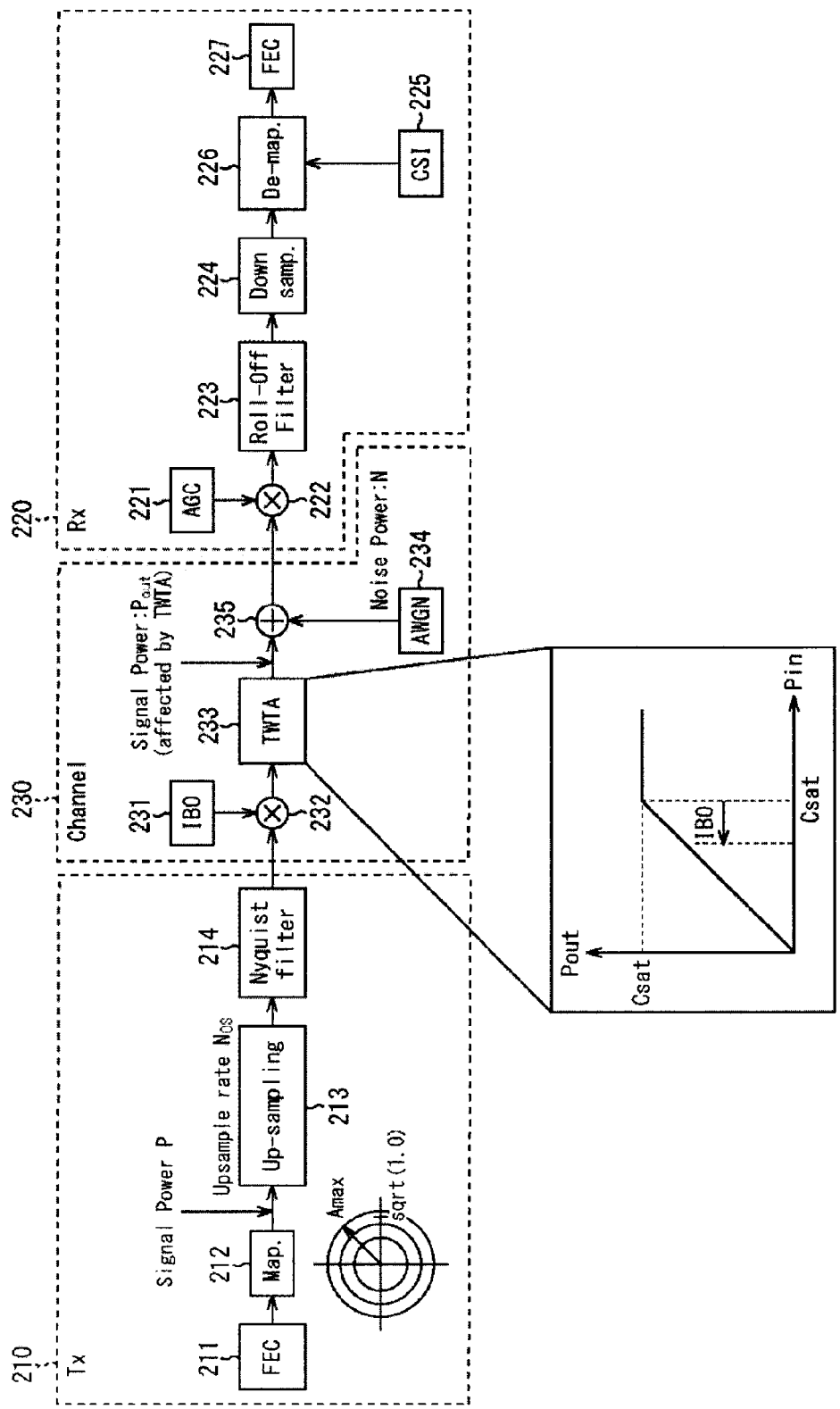
FIG. 52 is a block diagram illustrating a transmission system model of a transmission system using a simulation.

FIG. 52 is a block diagram illustrating a model of a transmission system using a simulation (transmission system model)

The transmission system module includes a Tx unit 210, an Rx unit 220, and a channel unit 230.

The Tx unit 210 is a transmission side model and includes an FEC (Forward Error Correction) unit 211, a mapping unit (Map.) 212, an up-sampling unit (Up-sampling) 213, and a Nyquist filter unit (Nyquist filter) 214.

The FEC unit 211 performs error correction encoding by, for example, the BCH code and the LDPC code and supplies the LDPC code obtained through the error correction encoding to the mapping unit 212.

The mapping unit 212 performs quadrature modulation by mapping a symbol to the signal points decided in a modulation method of predetermined quadrature modulation such as 8PSK or 16APSK using the predetermined number of bits of the LDCP code from the FEC unit 211 as the symbol, and then supplies data after the quadrature modulation to the up-sampling unit 213.

The up-sampling unit 213 up-samples the data from the mapping unit 212 and supplies data obtained as the result to the Nyquist filter unit 214.

The Nyquist filter unit 214 filters the data from the up-sampling unit 213 and outputs a transmission signal obtained as the result to the channel unit 230.

The Rx unit 220 is a reception side model and includes an AGC (automatic gain control) unit 221, a multiplier 222, a roll-off filter unit (Roll-Off Filter) 223, a down-sampling unit (Down samp.) 224, a CSI (Channel State Information) unit 225, a demapping unit (De-Map.) 226, and an FEC unit 227.

The AGC unit 221 sets an AGC parameter for amplifying the transmission signal from the channel unit 230 and supplies the AGC parameter to the multiplier 222.

The multiplier 222 is supplied not only with the AGC parameter from the AGC unit 221 but also with the transmission signal output by the channel unit 230.

The multiplier 222 amplifies the transmission signal from the channel unit 230 according to the AGC parameter from the AGC unit 221 and supplies the transmission signal to the roll-off filter unit 223.

The roll-off filter unit 223 filters the transmission signal from the multiplier 222 and supplies the transmission signal to the down-sampling unit 224.

The down-sampling unit 224 down-samples the transmission signal from the roll-off filter unit 223 and supplies data (data after mapping) obtained as the result to the demapping unit 226.

The CSI unit 225 sets channel information indicating a channel (the channel unit 230) state and supplies the channel information to the demapping unit 226.

The demapping unit 226 performs quadrature demodulation by demapping (signal point arrangement decoding) the data from the down-sampling unit 224 using the channel information from the CSI unit 225 and supplies data (likelihood of the LDPC code) obtained as the result to the FEC unit 227.

The FEC unit 227 performs error correction decoding on the data from the demapping unit 226 to decode the error correction code, that is, for example, decoding of the LDPC code and decoding of the BCH code.

The channel unit 230 is a model of the NL channel and includes an IBO (Input Back-Off) unit 231, a multiplier 232, a TWTA (Travelling Wave Tube Amplifier) unit 233, an AWGN unit 234, and an adder 235.

The IBO unit 231 sets an IBO parameter to adjust the power of the transmission signal output from the Tx unit 210 and supplies the IBO parameter to the multiplier 232.

The multiplier 232 is supplied with not only the IBO parameter from the IBO unit 231 but also the transmission signal output by the Tx unit 210.

The multiplier 232 amplifies the transmission signal from the Tx unit 210 according to the IBO parameter from the IBO unit 231 and supplies the transmission signal to the TWTA unit 233.

The TWTA unit 233 is configured to include, for example, a non-linear amplifier, and outputs the transmission signal having power less than a predetermined value without change and outputs the transmission signal having power equal to or greater than the predetermined value by clipping the power to a predetermined value among the transmission signals from the multiplier 232.

The AWGN unit 234 generates and outputs AWGN.

The adder 235 is supplied with the transmission signal output by the TWTA unit 233 and the AWGN output by the AWGN unit 234.

The adder 235 adds the AWGN from the AWGN unit 234 to the transmission signal from the TWTA unit 233 and outputs the transmission signal as an output of the channel unit 230.

In the transmission system model configured in this way, the FEC unit 211 performs error correction encoding and supplies the LDPC code obtained through the error correction encoding to the mapping unit 212 in the Tx unit 210.

The mapping unit 212 performs quadrature modulation by mapping the LDCP code from the FEC unit 211 to the signal points decided in a modulation method of predetermined quadrature modulation. The data obtained by the mapping unit 212 is supplied as the transmission signal output by the Tx unit 210 to the channel unit 230 via the up-sampling unit 213 and the Nyquist filter unit 214.

In the channel unit 230, the transmission signal from the Tx unit 210 is transmitted via the multiplier 232 and the TWTA unit 233 to be non-linearly distorted and is supplied to the adder 235.

In the adder 235, the AWGN from the AWGN unit 234 is added to the transmission signal supplied via the multiplier 232 and the TWTA unit 233, and the transmission signal is supplied to the Rx unit 220.

In the Rx unit 220, the transmission signal from the channel unit 230 is supplied to the demapping unit 226 via the multiplier 222, the roll-off filter unit 223, and the down-sampling unit 224.

In the demapping unit 226, the data supplied via the multiplier 222, the roll-off filter unit 223, and the down-sampling unit 224 is demapped to be subjected to quadrature demodulation using the channel information from the CSI unit 225, and the data obtained as the result is supplied to the FEC unit 227.

In the FEC unit 227, the data from the demapping unit 226 is subjected to error correction decoding such as LDPC decoding. In the simulation, BER/FER is measured (calculated) using the result of the error correction decoding.

The channel unit 230 in FIG. 52 is also configured to include only the AWGN unit 234 and the adder 235 without including the IBO unit 231, the multiplier 232, and the TWTA unit 233, so that the channel unit 230 serves as a model of the AWGN channel.

Figure 53:
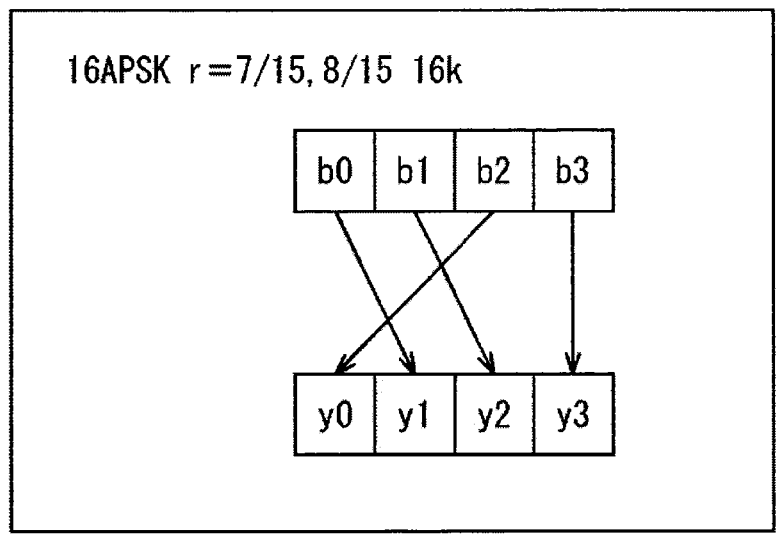
FIG. 53 is an illustration of a first example of the interchange processing according to an interchange method for Sx when a modulation method is 16APSK and the multiple b is 1 in data transmission using the 16 k code for Sx.

FIG. 53 is an illustration of a first example of the interchange processing according to the interchange method for Sx when the modulation method is 16PSK and the multiple b is 1 in data transmission using the 16 k code for Sx of r=7/15 or 8/15.

When the modulation method is 16PSK and the multiple b is 1 in the data transmission using the 16 k code for Sx of r=7/15 or 8/15, the $(16200/(4 \times 1)) \times (4 \times 1)$ code bits written on the memory 31 in the column direction×the row direction are read in units of $4 \times 1$ (=mb) bits in the row direction in the demultiplexer 25 and are supplied to the interchanging unit 32 (FIGS. 22 and 23).

The interchanging unit 32 interchanges $4 \times 1$ (=mb) code bits $b_0$ to $b_3$ so that $4 \times 1$ (=mb) code bits $b_0$ to $b_3$ read from the memory 31 are allocated to, for example, $4 \times 1$ (=mb) symbol bits $y_0$ to $y_3$ of 1 (=b) symbol, as shown in FIG. 53.

That is, the interchanging unit 32 performs the interchanging so that the code bits are allocated to the symbol bits as follows:

code bit $b_0$ to symbol bit $y_1$,
code bit $b_1$ to symbol bit $y_2$,
code bit $b_2$ to symbol bit $y_0$, and
code bit $b_3$ to symbol bit $y_3$.

Figure 54:
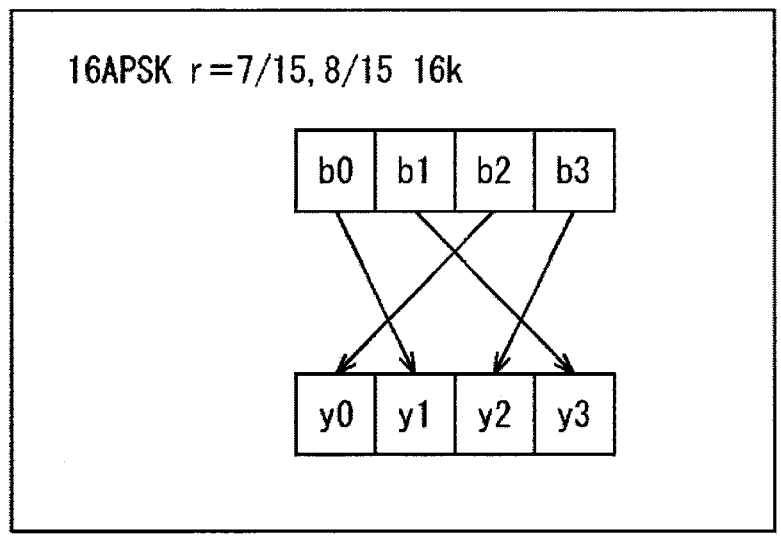
FIG. 54 is an illustration of a second example of the interchange processing according to the interchange method for Sx when the modulation method is 16APSK and the multiple b is 1 in data transmission using the 16 k code for Sx.

FIG. 54 is an illustration of a second example of the interchange processing according to the interchange method for Sx when the modulation method is 16PSK and the multiple b is 1 in data transmission using the 16 k code for Sx of r=7/15 or 8/15.

In this case, as described with reference to FIG. 53, the $(16200/(4 \times 1)) \times (4 \times 1)$ code bits written on the memory 31 in the column direction×the row direction are read in units of $4 \times 1$ (=mb) bits in the row direction in the demultiplexer 25 and are supplied to the interchanging unit 32 (FIGS. 22 and 23).

The interchanging unit 32 interchanges $4 \times 1$ (=mb) code bits $b_0$ to $b_3$ so that $4 \times 1$ (=mb) code bits $b_0$ to $b_3$ read from the memory 31 are allocated to, for example, $4 \times 1$ (=mb) symbol bits $y_0$ to $y_3$ of 1 (=b) symbol, as shown in FIG. 54.

That is, the interchanging unit 32 performs the interchanging so that the code bits are allocated to the symbol bits as follows:

code bit $b_0$ to symbol bit $y_1$,
code bit $b_1$ to symbol bit $y_3$,
code bit $b_2$ to symbol bit $y_0$, and
code bit $b_3$ to symbol bit $y_2$.

Figure 55:
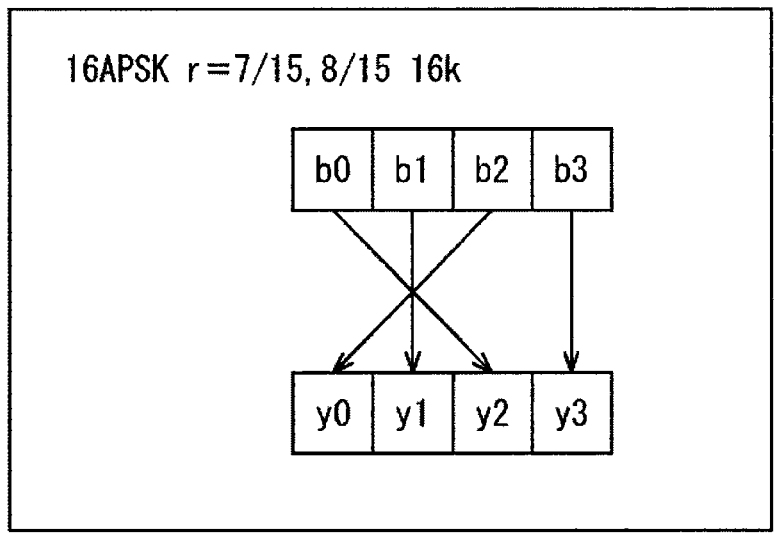
FIG. 55 is an illustration of a third example of the interchange processing according to the interchange method for Sx when the modulation method is 16APSK and the multiple b is 1 in data transmission using the 16 k code for Sx.

FIG. 55 is an illustration of a third example of the interchange processing according to the interchange method for Sx when the modulation method is 16PSK and the multiple b is 1 in data transmission using the 16 k code for Sx of r=7/15 or 8/15.

In this case, as described with reference to FIG. 53, the $(16200/(4 \times 1)) \times (4 \times 1)$ code bits written on the memory 31 in the column direction×the row direction are read in units of $4 \times 1$ (=mb) bits in the row direction in the demultiplexer 25 and are supplied to the interchanging unit 32 (FIGS. 22 and 23).

The interchanging unit 32 interchanges $4 \times 1$ (=mb) code bits $b_0$ to $b_3$ so that $4 \times 1$ (=mb) code bits $b_0$ to $b_3$ read from the memory 31 are allocated to, for example, $4 \times 1$ (=mb) symbol bits $y_0$ to $y_3$ of 1 (=b) symbol, as shown in FIG. 55.

That is, the interchanging unit 32 performs the interchanging so that the code bits are allocated to the symbol bits as follows:
  code bit $b_0$ to symbol bit $y_2$,
  code bit $b_l$ to symbol bit $y_1$,
  code bit $b_2$ to symbol bit $y_0$, and
  code bit $b_3$ to symbol bit $y_3$.

Figure 56:
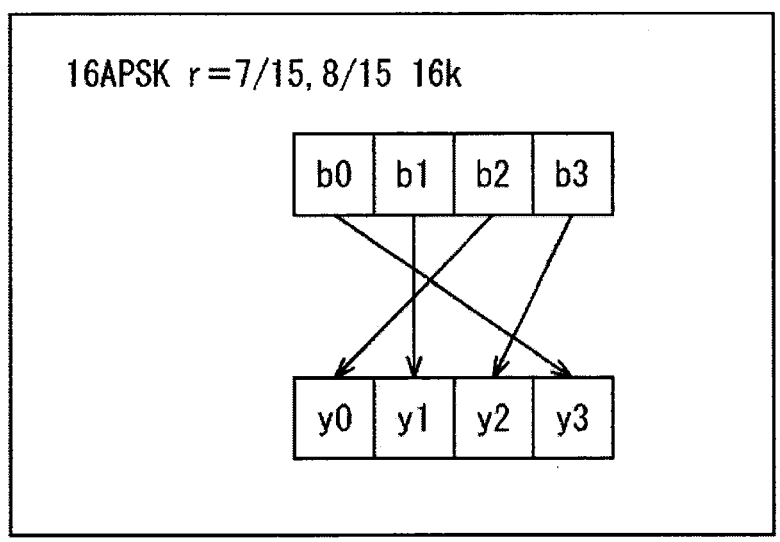
FIG. 56 is an illustration of a fourth example of the interchange processing according to the interchange method for Sx when the modulation method is 16APSK and the multiple b is 1 in data transmission using the 16 k code for Sx.

FIG. 56 is an illustration of a fourth example of the interchange processing according to the interchange method for Sx when the modulation method is 16PSK and the multiple b is 1 in data transmission using the 16 k code for Sx of r=7/15 or 8/15.

In this case, as described with reference to FIG. 53, the $(16200/(4\times1))\times(4\times1)$ code bits written on the memory 31 in the column direction×the row direction are read in units of $4\times1$ (=mb) bits in the row direction in the demultiplexer 25 and are supplied to the interchanging unit 32 (FIGS. 22 and 23).

The interchanging unit 32 interchanges $4\times1$ (=mb) code bits $b_0$ to $b_3$ so that $4\times1$ (=mb) code bits $b_0$ to $b_3$ read from the memory 31 are allocated to, for example, $4\times1$ (=mb) symbol bits $y_0$ to $y_3$ of 1 (=b) symbol, as shown in FIG. 56.

That is, the interchanging unit 32 performs the interchanging so that the code bits are allocated to the symbol bits as follows:
  code bit $b_0$ to symbol bit $y_3$,
  code bit $b_1$ to symbol bit $y_1$,
  code bit $b_2$ to symbol bit $y_0$, and
  code bit $b_3$ to symbol bit $y_2$.

Figure 57:
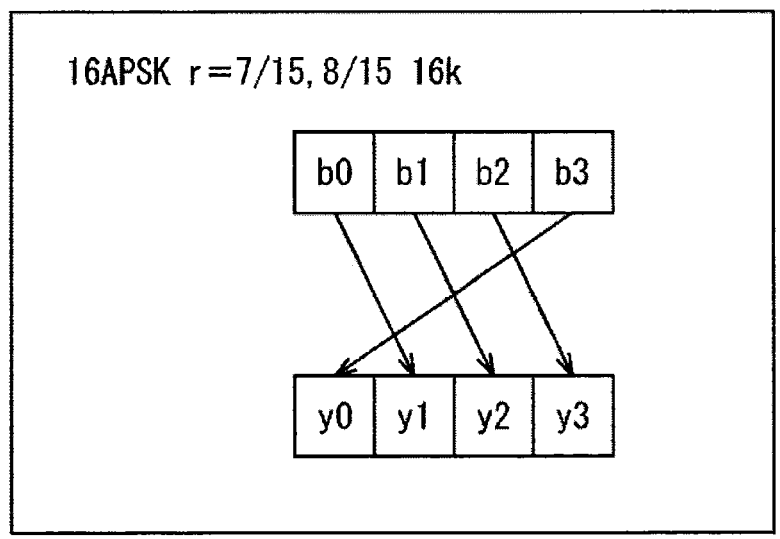
FIG. 57 is an illustration of a fifth example of the interchange processing according to the interchange method for Sx when the modulation method is 16APSK and the multiple b is 1 in data transmission using the 16 k code for Sx.

FIG. 57 is an illustration of a fifth example of the interchange processing according to the interchange method for Sx when the modulation method is 16PSK and the multiple b is 1 in data transmission using the 16 k code for Sx of r=7/15 or 8/15.

In this case, as described with reference to FIG. 53, the $(16200/(4\times1))\times(4\times1)$ code bits written on the memory 31 in the column direction×the row direction are read in units of $4\times1$ (=mb) bits in the row direction in the demultiplexer 25 and are supplied to the interchanging unit 32 (FIGS. 22 and 23).

The interchanging unit 32 interchanges $4\times1$ (=mb) code bits $b_0$ to $b_3$ so that $4\times1$ (=mb) code bits $b_0$ to $b_3$ read from the memory 31 are allocated to, for example, $4\times1$ (=mb) symbol bits $y_0$ to $y_3$ of 1 (=b) symbol, as shown in FIG. 57.

That is, the interchanging unit 32 performs the interchanging so that the code bits are allocated to the symbol bits as follows:
  code bit $b_0$ to symbol bit $y_1$,
  code bit $b_1$ to symbol bit $y_2$,
  code bit $b_2$ to symbol bit $y_3$, and
  code bit $b_3$ to symbol bit $y_0$.

Figure 58:
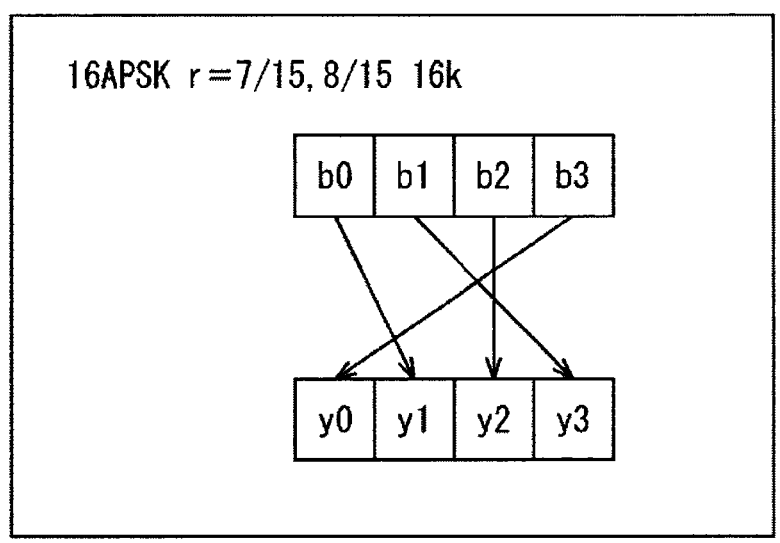
FIG. 58 is an illustration of a sixth example of the interchange processing according to the interchange method for Sx when the modulation method is 16APSK and the multiple b is 1 in data transmission using the 16 k code for Sx.

FIG. 58 is an illustration of a sixth example of the interchange processing according to the interchange method for Sx when the modulation method is 16PSK and the multiple b is 1 in data transmission using the 16 k code for Sx of r=7/15 or 8/15.

In this case, as described with reference to FIG. 53, the $(16200/(4\times1))\times(4\times1)$ code bits written on the memory 31 in the column direction×the row direction are read in units of $4\times1$ (=mb) bits in the row direction in the demultiplexer 25 and are supplied to the interchanging unit 32 (FIGS. 22 and 23).

The interchanging unit 32 interchanges $4\times1$ (=mb) code bits $b_0$ to $b_3$ so that $4\times1$ (=mb) code bits $b_0$ to $b_3$ read from the memory 31 are allocated to, for example, $4\times1$ (=mb) symbol bits $y_0$ to $y_3$ of 1 (=b) symbol, as shown in FIG. 58.

That is, the interchanging unit 32 performs the interchanging so that the code bits are allocated to the symbol bits as follows:
  code bit $b_0$ to symbol bit $y_1$,
  code bit $b_1$ to symbol bit $y_3$,
  code bit $b_2$ to symbol bit $y_2$, and
  code bit $b_3$ to symbol bit $y_0$.

Figure 59:
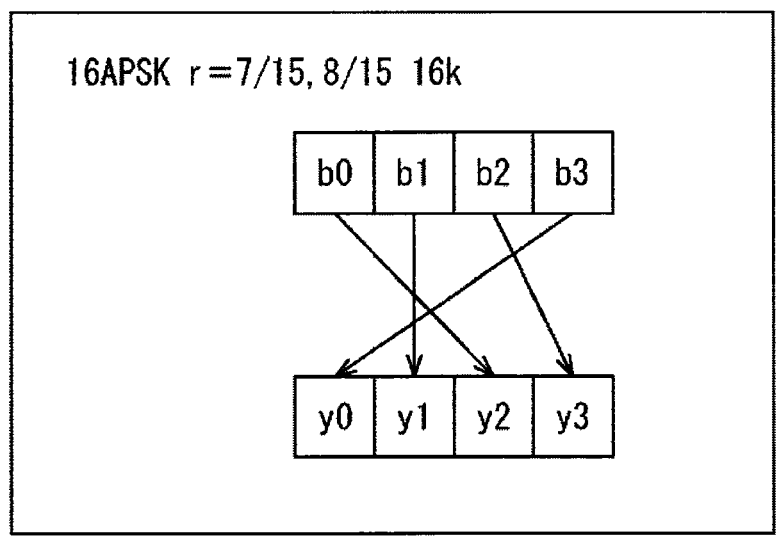
FIG. 59 is an illustration of a seventh example of the interchange processing according to the interchange method for Sx when the modulation method is 16APSK and the multiple b is 1 in data transmission using the 16 k code for Sx.

FIG. 59 is an illustration of a seventh example of the interchange processing according to the interchange method for Sx when the modulation method is 16PSK and the multiple b is 1 in data transmission using the 16 k code for Sx of r=7/15 or 8/15.

In this case, as described with reference to FIG. 53, the $(16200/(4\times1))\times(4\times1)$ code bits written on the memory 31 in the column direction×the row direction are read in units of $4\times1$ (=mb) bits in the row direction in the demultiplexer 25 and are supplied to the interchanging unit 32 (FIGS. 22 and 23).

The interchanging unit 32 interchanges $4\times1$ (=mb) code bits $b_0$ to $b_3$ so that $4\times1$ (=mb) code bits $b_0$ to $b_3$ read from the memory 31 are allocated to, for example, $4\times1$ (=mb) symbol bits $y_0$ to $y_3$ of 1 (=b) symbol, as shown in FIG. 59.

That is, the interchanging unit 32 performs the interchanging so that the code bits are allocated to the symbol bits as follows:
  code bit $b_0$ to symbol bit $y_2$,
  code bit $b_1$ to symbol bit $y_1$,
  code bit $b_2$ to symbol bit $y_3$, and
  code bit $b_3$ to symbol bit $y_0$.

Figure 60:
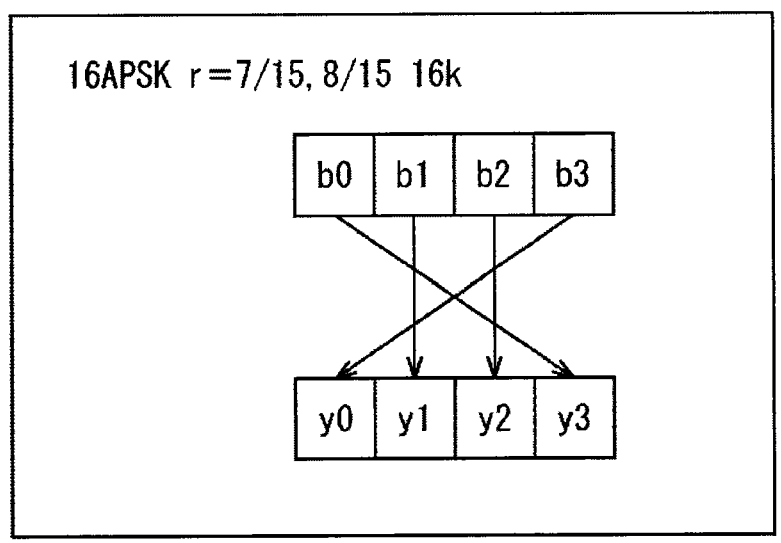
FIG. 60 is an illustration of an eighth example of the interchange processing according to the interchange method for Sx when the modulation method is 16APSK and the multiple b is 1 in data transmission using the 16 k code for Sx.

FIG. 60 is an illustration of an eighth example of the interchange processing according to the interchange method for Sx when the modulation method is 16PSK and the multiple b is 1 in data transmission using the 16 k code for Sx of r=7/15 or 8/15.

In this case, as described with reference to FIG. 53, the $(16200/(4\times1))\times(4\times1)$ code bits written on the memory 31 in the column direction×the row direction are read in units of $4\times1$ (=mb) bits in the row direction in the demultiplexer 25 and are supplied to the interchanging unit 32 (FIGS. 22 and 23).

The interchanging unit 32 interchanges $4\times1$ (=mb) code bits $b_0$ to $b_3$ so that $4\times1$ (=mb) code bits $b_0$ to $b_3$ read from the memory 31 are allocated to, for example, $4\times1$ (=mb) symbol bits $y_0$ to $y_3$ of 1 (=b) symbol, as shown in FIG. 60.

That is, the interchanging unit 32 performs the interchanging so that the code bits are allocated to the symbol bits as follows:
  code bit $b_0$ to symbol bit $y_3$,
  code bit $b_1$ to symbol bit $y_1$,
  code bit $b_2$ to symbol bit $y_3$, and
  code bit $b_3$ to symbol bit $y_0$.

Figure 61:
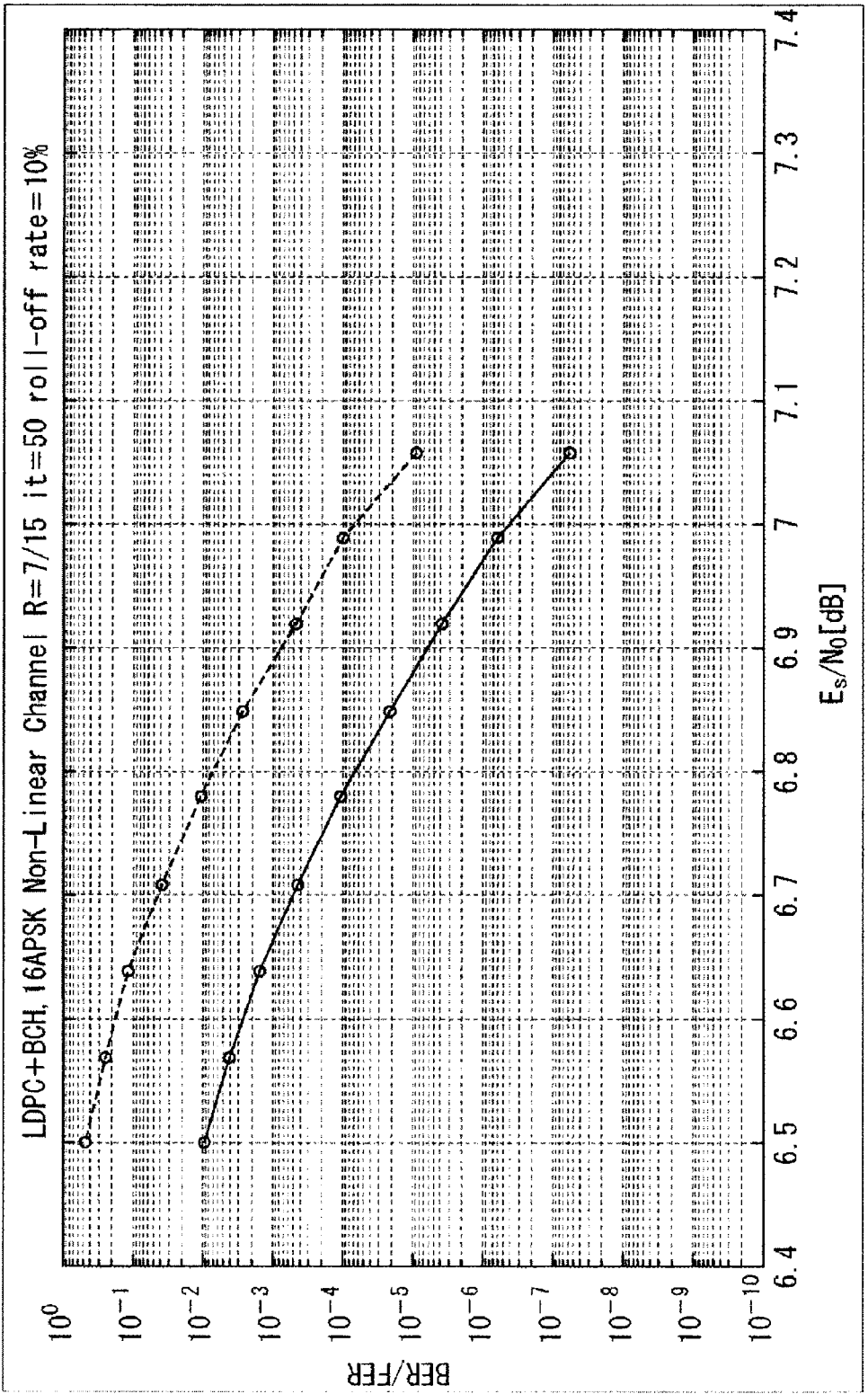
FIG. 61 is an illustration of a simulation result of a simulation measuring BER/FER.

FIG. 61 is an illustration of a simulation result of a simulation measuring BER/FER by adopting the third example of the interchange method for Sx in FIG. 55 as the interchange method and adopting 16APSK as the modulation method and in the 16 k code for Sx of the encoding rate r=7/15.

Figure 62:
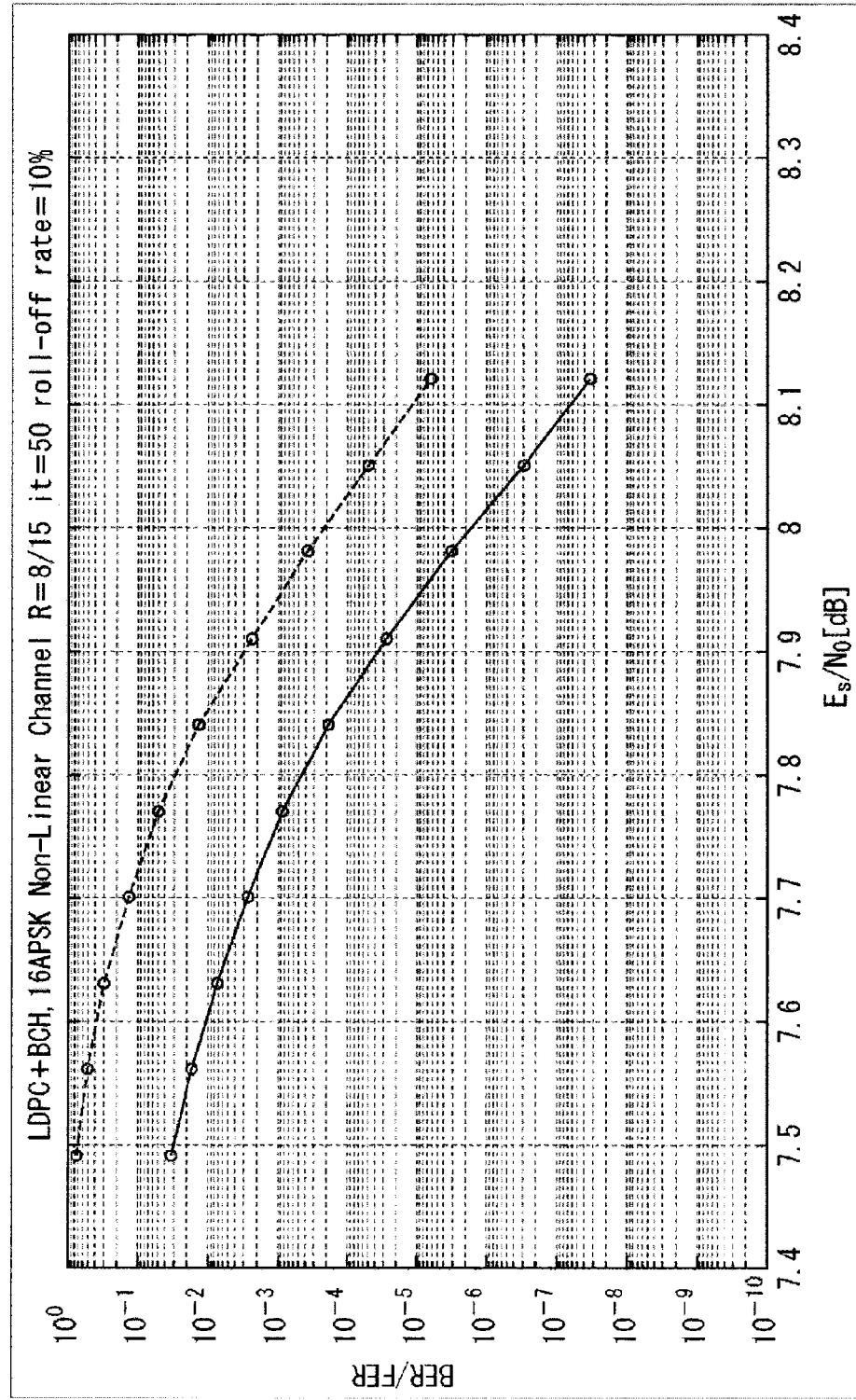
FIG. 62 is an illustration of a simulation result of a simulation measuring BER/FER.

FIG. 62 is an illustration of a simulation result of a simulation measuring BER/FER by adopting the third example of the interchange method for Sx in FIG. 55 as the interchange method and adopting 16APSK as the modulation method and in the 16 k code for Sx of the encoding rate r=8/15.

In FIG. 61 and FIG. 62, the horizontal axis shows $E_s/N_0$ and the vertical axis shows BER/FER. Here, the solid line shows BER and the dotted line shows FER.

From FIGS. 61 and 62, it can be confirmed that good BER/FER is obtained for each 16 k code for Sx of the encoding rate r=7/15 and 8/15, and thus good communication quality is ensured in the data transmission using the 16 k code for Sx.

In the simulation, the BER/FER which is substantially the same as that when the first example of the interchange method for Sx in FIG. 53, the second example of the interchange method for Sx in FIG. 54, the fourth example of the interchange method for Sx in FIG. 56, or the eighth example of the interchange method for Sx in FIG. 55 is adopted is measured even when the third example of the interchange method for Sx in FIG. 55 is adopted.

Here, in a simulation in which 16APSK is adopted as a modulation method, by adopting 50 times as the repetition decoding number of times C at the time of decoding of the 16 k code for Sx and assuming that an NL (Non-Linear) channel is the communication path 13 (FIG. 7), as in the case of the simulation (FIGS. 50 and 51) in which 8PSK is used as the modulation method, BER/FER is measured for various bit allocation patterns in which 4 bits of code bits are allocated to 4 bits of symbol bits.

The bit allocation pattern in which good BER/FER is obtained is adopted as the interchange method for Sx.

Accordingly, the interchange method for Sx in FIGS. 53 to 60 can be said to be an optimum interchange method when the data transmission in 16APSK using the 16 k code for Sx is performed via the NL channel.

In the simulation in which 16APSK is adopted as the modulation method, a constellation in which the radius ratio γ is optimized is adopted as the constellation of 16APSK in regard to the constellation (FIG. 20) adopted with 16APSK of DVB-S.2.

That is, in the simulation in which 16APSK is adopted as the modulation method, a constellation in which 4 signal points on the circumference of a circle (inner circle) having a radius $R_1$ in which the origin of the IQ plane is a center and 12 signal points on the circumference of a circle (outer circle) having a radius $R_2$ (>$R_1$), that is, a total of 16 signal points are arranged, is adopted as in the constellation illustrated in FIG. 20.

In the simulation in which 16APSK is adopted as the modulation method, a value for which FER is the minimum is adopted as the radius ratio γ=$R_2$/$R_1$ in the data transmission performed via the NL channel.

Specifically, for the 16 k code for Sx of the encoding rate r=7/15, 5.25 is adopted as the radius ratio γ in the simulation in which 16APSK is adopted as the modulation method. For the 16 k code for Sx of the encoding rate r=7/15, 4.85 is adopted as the radius ratio γ in the simulation in which 16APSK is adopted as the modulation method.

In the interchange method for Sx in FIGS. 53 to 60, good communication quality can be ensured not only during use with the NL channel but also during use with, for example, a linear channel or an AWGN channel in which AWGN is added to the linear channel rather than the NL channel.

In the simulation in which BER/FER in FIGS. 61 and 62 is measured (also in the simulation in which BER/FER in FIGS. 50 and 51 is measured as described above), 10% is adopted as a roll-off rate. The roll-off rate is a parameter related to the Nyquist filter unit 214 and the roll-off filter unit 223 of the transmission system model in FIG. 52.

<Mapping>

Figure 63:
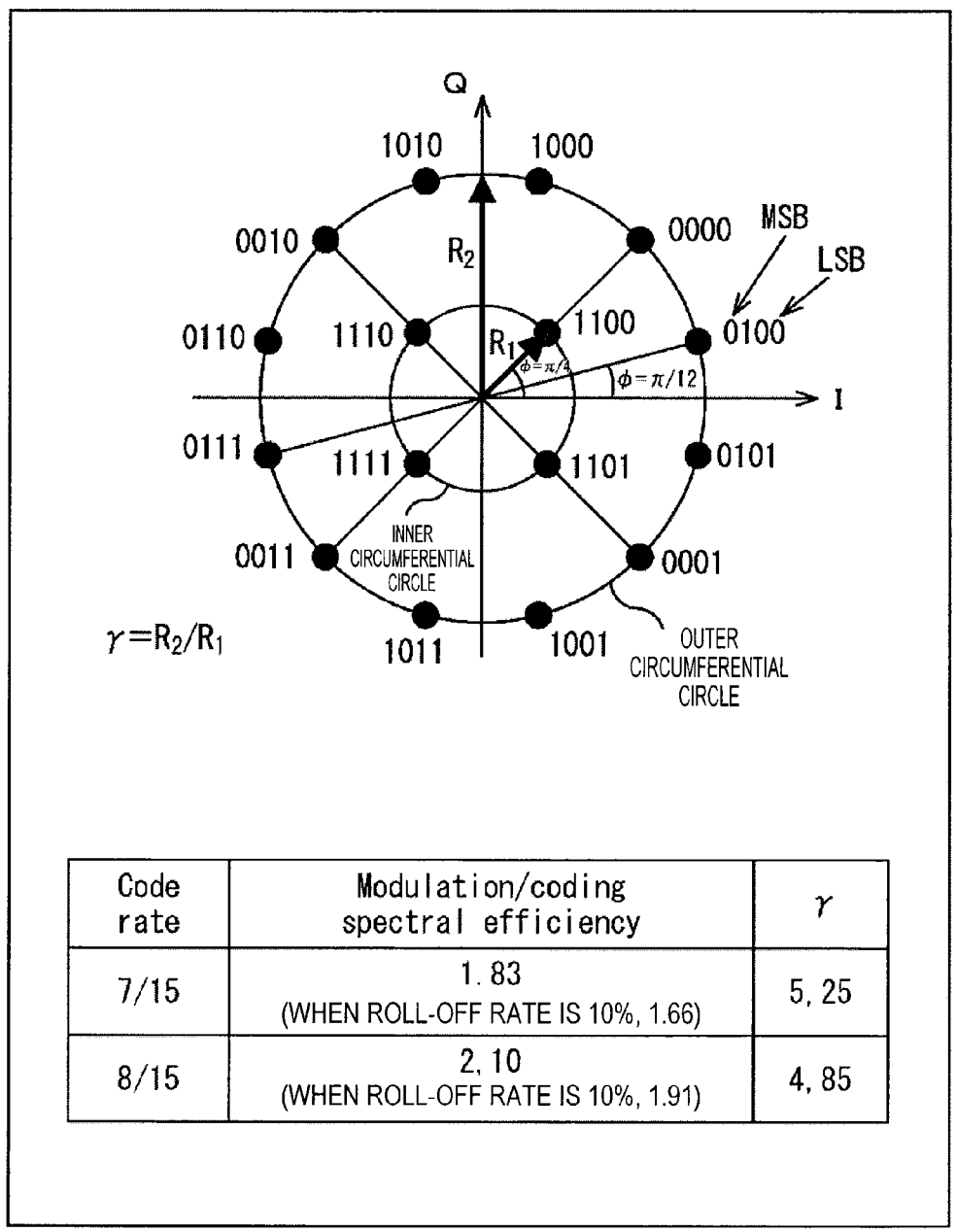
FIG. 63 is an illustration of an example of arrangement of signal points of 16APSK and a radius ratio γ when 16APSK is adopted as a modulation method.
Figure 64:
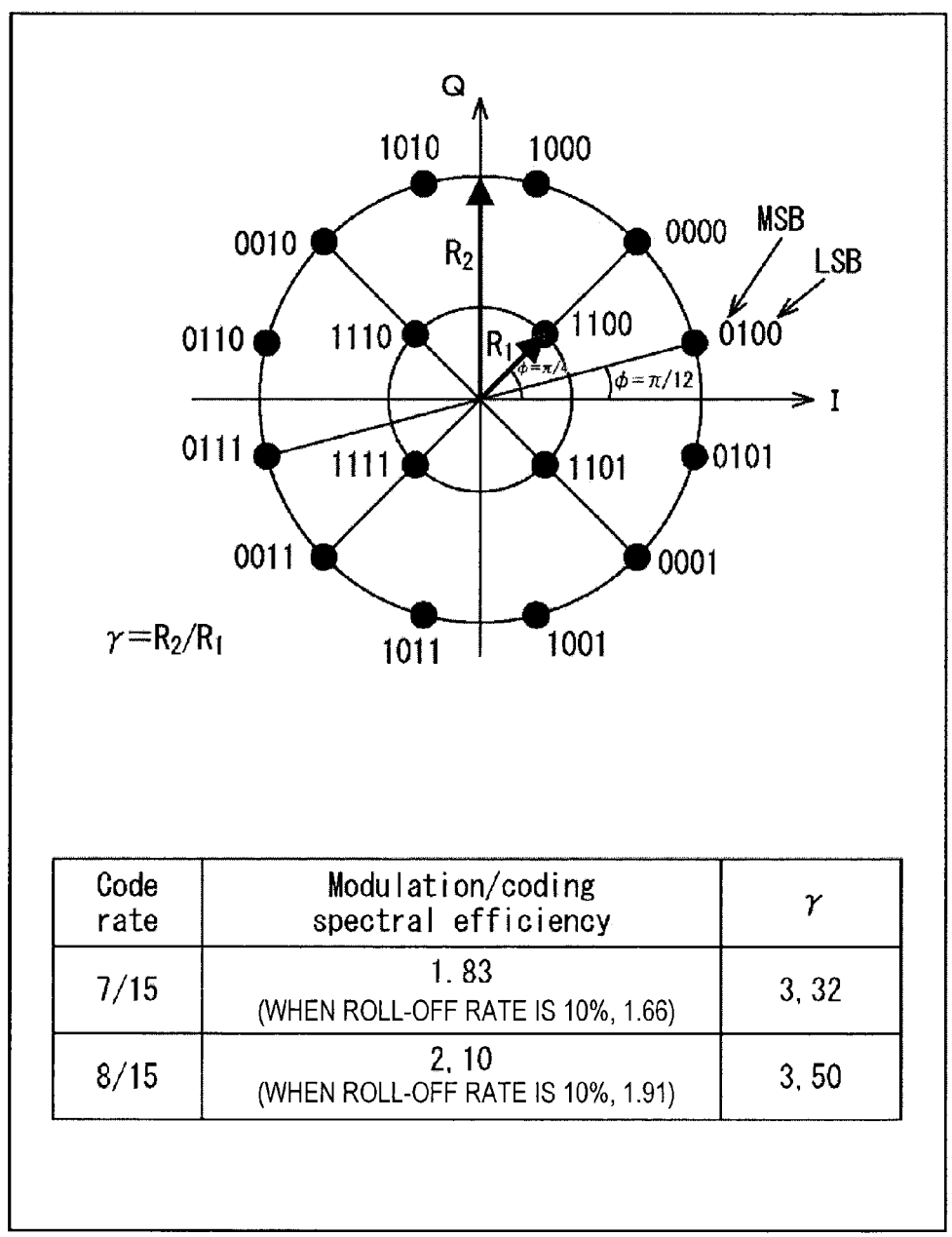
FIG. 64 is an illustration of an example of the arrangement of the signal points of 16APSK and a radius ratio γ when 16APSK is adopted as a modulation method.

FIGS. 63 and 64 are illustrations of examples of the signal points of 16APSK and a radius ratio γ when 16APSK is adopted as a modulation method in data transmission using the 16 k code for Sx.

In FIGS. 63 and 64, 16 signal points of 16APSK are arranged on an inner circumferential circle having a radius of $R_1$ and an outer circumferential circle having a radius of $R_2$ larger than $R_1$.

Specifically, 4 signal points are arranged at the same angle on the inner circumferential circle having the radius of $R_1$ and 12 signal points are arranged at the same angle on the outer circumferential circle having the radius of $R_2$.

In the constellation of 16APSK (16 signal points), a radius ratio (a value indicating a factor by which the radius $R_2$ of the outer circumferential circle is larger than the radius $R_1$ of the inner circumferential circle) γ=$R_2$/$R_1$ which is a ratio of radius $R_2$ of the outer circumferential circle to the radius $R_1$ of the inner circumferential circle is decided as an optimum value for each encoding rate r of the 16 k code for Sx of a target mapped to the signal points.

As the optimum radius ratio γ, a value (radius ratio) which is better than a predetermined evaluation value is obtained by first and second simulations.

FIG. 63 illustrates the radius ratio γ obtained by the first simulation and FIG. 64 illustrates the radius ratio γ obtained by the second simulation.

In the first simulation, as illustrated in FIG. 63, γ=5.25 is obtained as the optimum radius ratio in regard to the 16 k code for Sx of r=7/15 and γ=4.85 is obtained as the optimum radius ratio in regard to the 16 k code for Sx of r=8/15.

In the second simulation, as illustrated in FIG. 64, γ=3.32 is obtained as the optimum radius ratio in regard to the 16 k code for Sx of r=7/15 and γ=3.50 is obtained as the optimum radius ratio in regard to the 16 k code for Sx of r=8/15.

Here, in the first simulation, the NL channel is assumed as the communication path 13 (FIG. 7), FER is set as a value in the range of $10^{-1}$ to $10^{-2}$, a value of an SNR (Signal to Noise Ratio) of a transmission signal is specified, and the radius ratio at which the FER is the minimum is in the transmission signal of the SNR of the value obtained as the optimum radius ratio γ.

Accordingly, the radius ratio γ obtained by the first simulation can be said to be an optimum radius ratio when the data transmission is performed via the NL channel.

In the second simulation, on the other hand, the AWGN channel is assumed as the communication path 13, a radius ratio in which a ICM capacity (Bit Interleave Coded Modulation capacity) which is an upper bound (channel capacity) of a transmission capacity decided by the arrangement of the signal points on the constellation and the SNR of the transmission signal is the maximum is obtained as the optimum radius ratio γ.

Accordingly, the radius ratio γ obtained by the second simulation can be said to be an optimum radius ratio when data transmission is performed via the AWGN channel.

For the 16 k code for Sx of r=7/15, BER/FER when 16APSK is adopted as the modulation method and the radius ratio γ=5.25 optimum for the NL channel is adopted has been described above with reference to FIG. 61.

For the 16 k code for Sx of r=8/15, BER/FER when 16APSK is adopted as the modulation method and the radius ratio γ=4.85 optimum for the NL channel is adopted has been described above with reference to FIG. 62.

Thus by adopting the radius ratio γ=5.25 for the 16 k code for Sx of r=7/15, as illustrated in FIG. 61, good BER/FER can be obtained, and thus good communication quality can be ensured.

Similarly, by adopting the radius ratio γ=4.85 for the 16 k code for Sx of r=8/15, as illustrated in FIG. 62, good BER/FER can be obtained, and thus good communication quality can be ensured.

In the constellation of 16APSK of the radius ratio γ obtained by the first simulation, good communication quality can be ensured not only during use with the NL channel but also during use with the AWGN channel or other channels from the viewpoint that BER/FER is good.

In the constellation of 16APSK of the radius ratio γ obtained by the second simulation, good communication quality can be ensured irrespective of the channel from the viewpoint that the BICM capacity is good.

<Configuration Example of Receiving Device 12>

Figure 65:
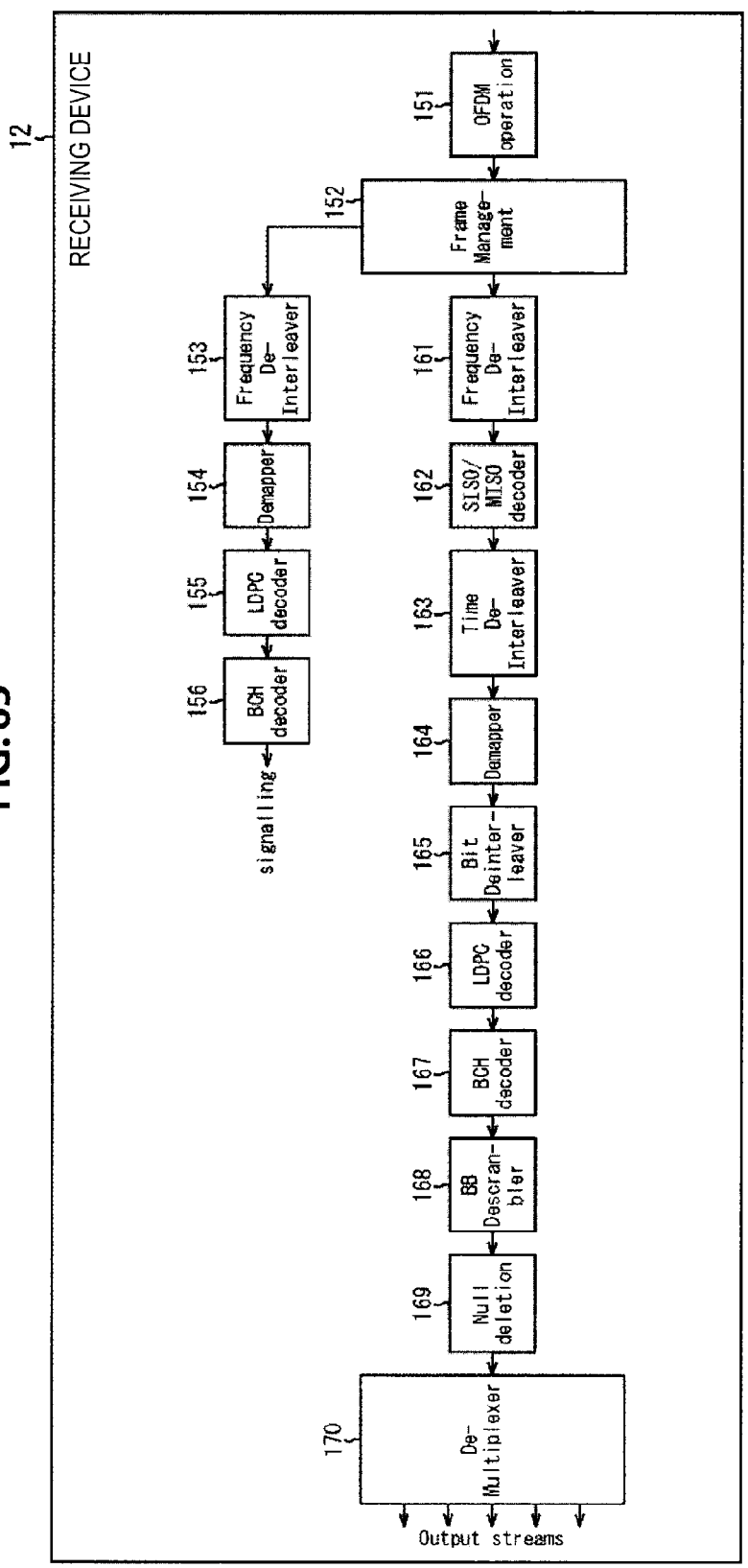
FIG. 65 is a block diagram illustrating a configuration example of the receiving device 12 in FIG. 7.

FIG. 65 is a block diagram illustrating a configuration example of the receiving device 12 in FIG. 7.

An OFDM operating unit 151 receives an OFDM signal from the transmitting device 11 (FIG. 7) and executes signal processing of the OFDM signal. Data that is obtained by executing the signal processing by the OFDM operating unit 151 is supplied to a frame managing unit 152.

The frame managing unit 152 executes processing (frame interpretation) of a frame configured by the data supplied from the OFDM operating unit 151 and supplies a signal of target data obtained as a result and a signal of signaling to frequency deinterleavers 161 and 153.

The frequency deinterleaver 153 performs frequency deinterleave in a unit of symbol, with respect to the data supplied from the frame managing unit 152, and supplies the symbol to a Demapper 154.

The demapper 154 performs quadrature demodulation by demapping (performing signal point arrangement decoding on) the data (the data on the constellation) from the frequency deinterleaver 153 based on the arrangement (constellation) of the signal points decided in the quadrature modulation performed on the side of the transmitting device 11 and supplies data (the LDPC code (LDPC code likelihood)) obtained as the result to the LDPC decoder 155.

The LDPC decoder 155 performs LDPC decoding of the LDPC code supplied from the Demapper 154 and supplies LDPC target data (in this case, a BCH code) obtained as a result to a BCH decoder 156.

The BCH decoder 156 performs BCH decoding of the LDPC target data supplied from the LDPC decoder 155 and outputs control data (signaling) obtained as a result.

Meanwhile, the frequency deinterleaver 161 performs frequency deinterleave in a unit of symbol, with respect to the data supplied from the frame managing unit 152, and supplies the symbol to a SISO/MISO decoder 162.

The SISO/MISO decoder 162 performs spatiotemporal decoding of the data supplied from the frequency deinterleaver 161 and supplies the data to a time deinterleaver 163.

The time deinterleaver 163 performs time deinterleave in a unit of symbol, with respect to the data supplied from the SISO/MISO decoder 162, and supplies the data to a Demapper 164.

The demapper 164 performs quadrature demodulation by demapping (performing signal point arrangement decoding on) the data (the data on the constellation) from the time deinterleaver 163 based on the arrangement (constellation) of the signal points decided in the quadrature modulation performed on the side of the transmitting device 11 and supplies data obtained as the result to the bit deinterleaver 165.

The bit deinterleaver 165 performs bit deinterleave on the data from the demapper 164 and supplies the LDPC code (the LDPC likelihood) which is data after the bit deinterleave to the LDPC decoder 166.

The LDPC decoder 166 performs LDPC decoding of the LDPC code supplied from the bit deinterleaver 165 and supplies LDPC target data (in this case, a BCH code) obtained as a result to a BCH decoder 167.

The BCH decoder 167 performs BCH decoding of the LDPC target data supplied from the LDPC decoder 155 and supplies data obtained as a result to a BB descrambler 168.

The BB descrambler 168 executes BB descramble with respect to the data supplied from the BCH decoder 167 and supplies data obtained as a result to a null deletion unit 169.

The null deletion unit 169 deletes null inserted by the padder 112 of FIG. 8, from the data supplied from the BB descrambler 168, and supplies the data to a demultiplexer 170.

The demultiplexer 170 individually separates one or more streams (target data) multiplexed with the data supplied from the null deletion unit 169, performs necessary processing to output the streams as output streams.

Here, the receiving device 12 can be configured without including part of the blocks illustrated in FIG. 65. That is, for example, in a case where the transmitting device 11 (FIG. 8) is configured without including the time interleaver 118, the SISO/MISO encoder 119, the frequency interleaver 120 and the frequency interleaver 124, the receiving device 12 can be configured without including the time deinterleaver 163, the SISO/MISO decoder 162, the frequency deinterleaver 161 and the frequency deinterleaver 153 which are blocks respectively corresponding to the time interleaver 118, the SISO/MISO encoder 119, the frequency interleaver 120 and the frequency interleaver 124 of the transmitting device 11.

Figure 66:
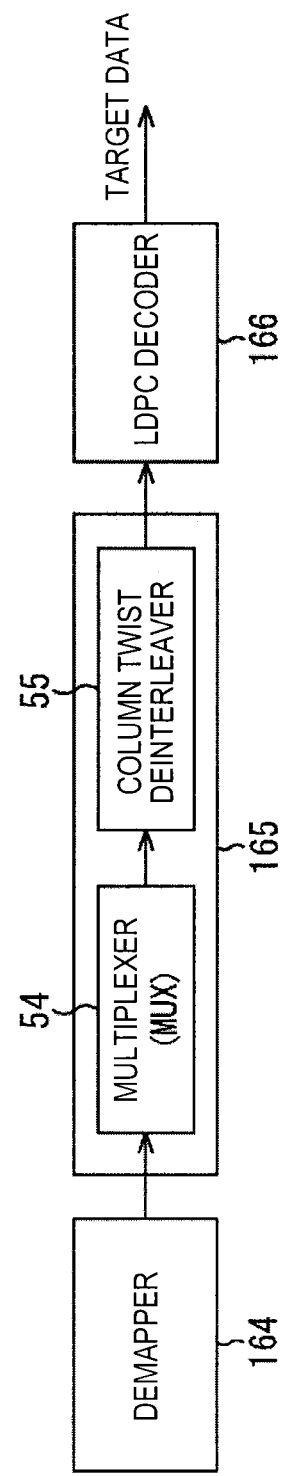
FIG. 66 is a block diagram illustrating a configuration example of a bit deinterleaver 165

FIG. 66 is a block diagram illustrating a configuration example of the bit deinterleaver 165 of FIG. 65.

The bit deinterleaver 165 includes a multiplexer (MUX) 54 and a column twist deinterleaver 55 and performs (bit) deinterleave of symbol bits of the symbol that is data supplied from the Demapper 164 (FIG. 65).

That is, the multiplexer 54 executes reverse interchange processing (reverse processing of the interchange processing) corresponding to the interchange processing executed by the demultiplexer 25 of FIG. 9, that is, reverse interchange processing for returning positions of the code bits (likelihood of the code bits) of the LDPC codes interchanged by the interchange processing to original positions, with respect to the symbol bits of the symbol supplied from the Demapper 164, and supplies an LDPC code obtained as a result to the column twist deinterleaver 55.

The column twist deinterleaver 55 performs the column twist deinterleave (reverse processing of the column twist interleave) corresponding to the column twist interleave as the rearrangement processing executed by the column twist interleaver 24 of FIG. 9, that is, the column twist deinterleave as the reverse rearrangement processing for returning the code bits of the LDPC codes of which an arrangement is changed by the column twist interleave as the rearrangement processing to the original arrangement, with respect to the LDPC code supplied from the multiplexer 54.

Specifically, the column twist deinterleaver 55 writes the code bits of the LDPC code to a memory for deinterleave having the same configuration as the memory 31 illustrated in FIG. 28, reads the code bits, and performs the column twist deinterleave.

However, in the column twist deinterleaver 55, writing of the code bits is performed in a row direction of the memory for the deinterleave, using read addresses when the code bits are read from the memory 31 as write addresses. In addition, reading of the code bits is performed in a column direction of the memory for the deinterleave, using write addresses when the code bits are written to the memory 31 as read addresses.

The LDPC code that is obtained as a result of the column twist deinterleave is supplied from the column twist deinterleaver 55 to the LDPC decoder 166.

Here, in a case where the parity interleave, the column twist interleave and the interchange processing are performed on an LDPC code supplied from the Demapper 164 to the bit deinterleaver 165, all of parity deinterleave (processing opposite to the parity interleave, that is, parity deinterleave that returns the code bits of an LDPC code in which the arrangement is changed by the parity interleave to the original arrangement) corresponding to the parity interleave, reverse interchange processing corresponding to the interchange processing and column twist deinterleave corresponding to the column twist interleave can be performed in the bit deinterleaver 165.

However, the bit deinterleaver 165 in FIG. 66 includes the multiplexer 54 that performs the reverse interchange processing corresponding to the interchange processing and the column twist deinterleaver 55 that performs the column twist deinterleave corresponding to the column twist interleave, but does not include a block that performs the parity deinterleave corresponding to the parity interleave, and the parity deinterleave is not performed.

Therefore, the LDPC code in which the reverse interchange processing and the column twist deinterleave are performed and the parity deinterleave is not performed is supplied from (the column twist deinterleaver 55 of) the bit deinterleaver 165 to the LDPC decoder 166.

The LDPC decoder 166 performs the LDPC decoding of the LDPC code supplied from the bit deinterleaver 165, using a transformed parity check matrix obtained by performing at least column replacement corresponding to the parity interleave with respect to the parity check matrix H used by the LDPC encoder 115 of FIG. 8 to perform the LDPC encoding, and outputs data obtained as a result to a decoding result of LDPC target data.

Figure 67:
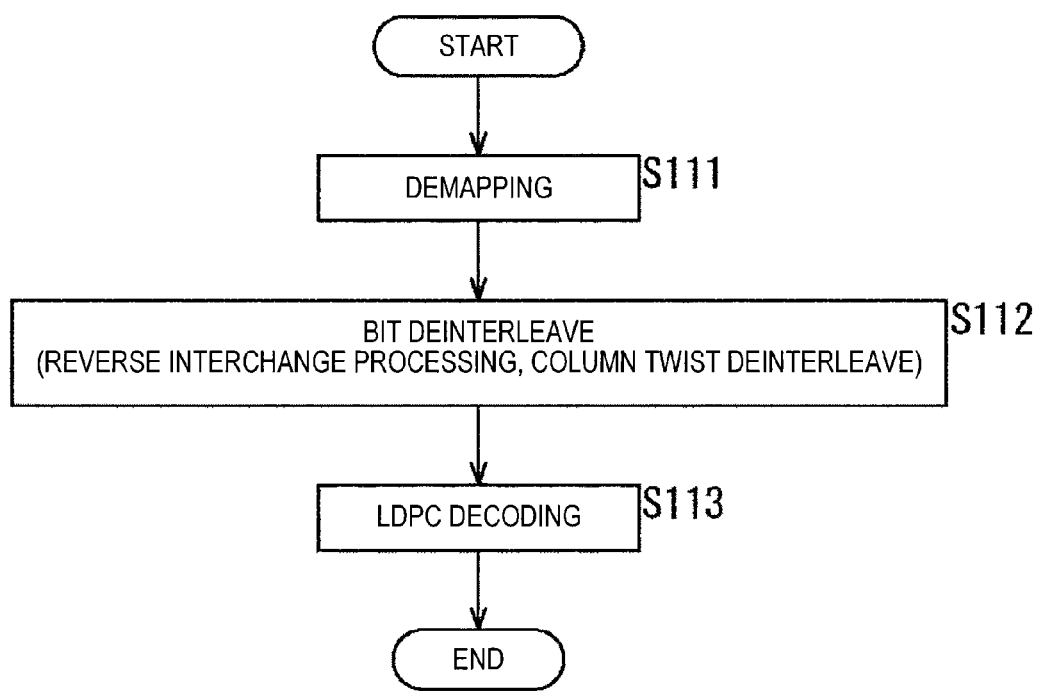
FIG. 67 is a flowchart illustrating processing that is executed by a demapper 164, the bit deinterleaver 165, and an LDPC decoder 166.

FIG. 67 is a flowchart illustrating processing that is executed by the Demapper 164, the bit deinterleaver 165, and the LDPC decoder 166 of FIG. 66.

In step S111, the Demapper 164 demaps the data (data on constellation mapped to a signal point) supplied from the time deinterleaver 163, performs orthogonal modulation, and supplies the symbol to the bit deinterleaver 165, and the processing proceeds to step S112.

In step S112, the bit deinterleaver 165 performs deinterleave (bit deinterleave) of the data supplied from the Demapper 164 and the processing proceeds to step S113.

That is, in step S112, in the bit deinterleaver 165, the multiplexer 54 executes reverse interchange processing with respect to the data (corresponding to the symbol bits of the symbol) supplied from the Demapper 164 and supplies code bits of an LDPC code obtained as a result to the column twist deinterleaver 55.

The column twist deinterleaver 55 performs the column twist deinterleave with respect to the LDPC code supplied from the multiplexer 54 and supplies an LDPC code (likelihood of the LDPC code) obtained as a result to the LDPC decoder 166.

In step S113, the LDPC decoder 166 performs the LDPC decoding of the LDPC code supplied from the column twist deinterleaver 55, using a transformed parity check matrix obtained by performing at least column replacement corresponding to the parity interleave with respect to the parity check matrix H used by the LDPC encoder 115 of FIG. 8 to perform the LDPC encoding, and outputs data obtained as a result, as a decoding result of LDPC target data, to the BCH decoder 167.

In FIG. 66, for the convenience of explanation, the multiplexer 54 that executes the reverse interchange processing and the column twist deinterleaver 55 that performs the column twist deinterleave are individually configured, similar to the case of FIG. 9. However, the multiplexer 54 and the column twist deinterleaver 55 can be integrally configured.

In the bit interleaver 116 of FIG. 9, when the column twist interleave is not performed, it is not necessary to provide the column twist deinterleaver 55 in the bit deinterleaver 165 of FIG. 66.

Next, the LDPC decoding that is performed by the LDPC decoder 166 of FIG. 65 will be further described.

In the LDPC decoder 166 of FIG. 65, as described above, the LDPC decoding of the LDPC code from the column twist deinterleaver 55, in which the reverse interchange processing and the column twist deinterleave are performed and the parity deinterleave is not performed, is performed using a transformed parity check matrix obtained by performing at least column replacement corresponding to the parity interleave with respect to the parity check matrix H used by the LDPC encoder 115 of FIG. 8 to perform the LDPC encoding.

In this case, LDPC decoding that can suppress an operation frequency at a sufficiently realizable range while suppressing a circuit scale, by performing the LDPC decoding using the transformed parity check matrix, is previously suggested (for example, refer to JP 4224777B).

Therefore, first, the previously suggested LDPC decoding using the transformed parity check matrix will be described with reference to FIGS. 68 to 71.

Figure 68:
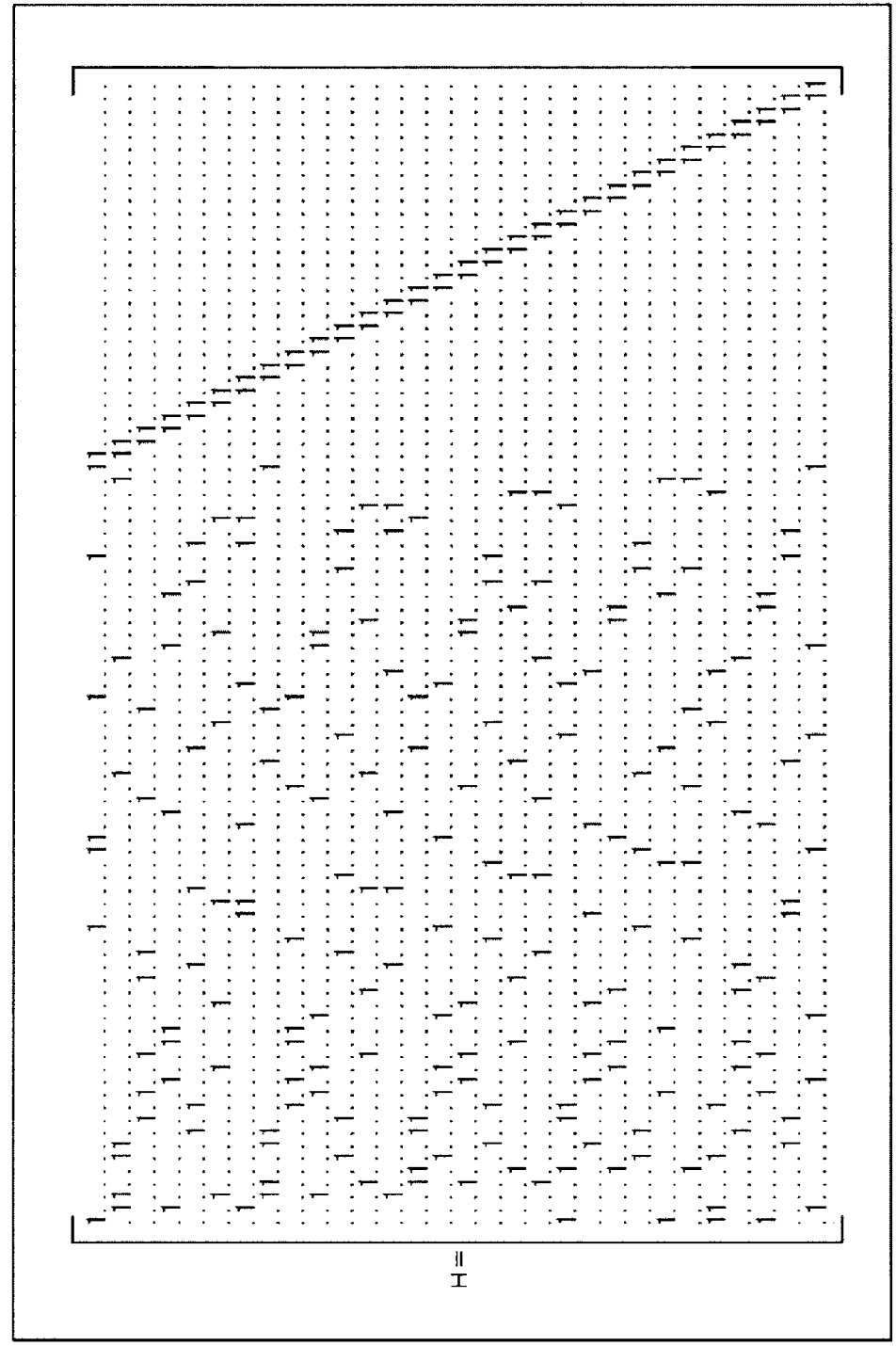
FIG. 68 is an illustration of an example of a parity check matrix of an LDPC code.

FIG. 68 illustrates an example of a parity check matrix H of an LDPC code in which a code length N is 90 and an encoding rate is 2/3.

In FIG. 68 (same as FIG. 69 and FIG. 70 to be described later), 0 is represented by a period (.).

In the parity check matrix H of FIG. 68, the parity matrix becomes a staircase structure.

Figure 69:
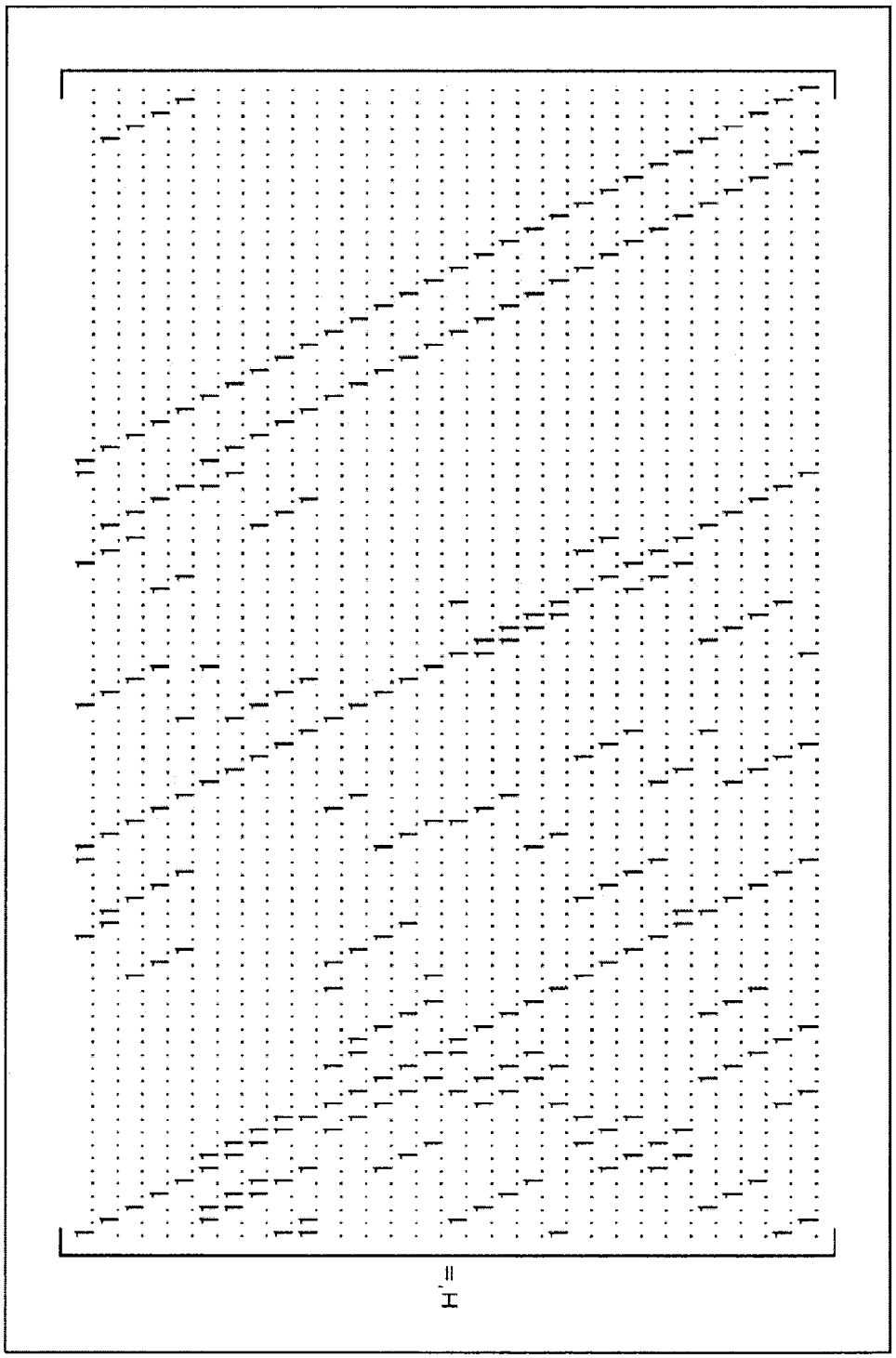
FIG. 69 is an illustration of a matrix (parity check matrix) that is obtained by executing row replacement and column replacement with respect to the parity check matrix.

FIG. 69 illustrates a parity check matrix H' that is obtained by executing row replacement of an expression (11) and column replacement of an expression (12) with respect to the parity check matrix H of FIG. 68.

$$\text{Row Replacement: } (6s+t+1)\text{-th row} \rightarrow (5t+s+1)\text{-th row} \quad (11)$$

$$\text{Column Replacement: } (6x+y+61)\text{-th column} \rightarrow (5y+x+61)\text{-th column} \quad (12)$$

In the expressions (11) and (12), s, t, x, and y are integers in ranges of $0 \leq s < 5$, $0 \leq t \leq 6$, $0 \leq x < 5$, and $0 \leq t < 6$, respectively.

According to the row replacement of the expression (11), replacement is performed such that the 1st, 7th, 13rd, 19th, and 25th rows having remainders of 1 when being divided by 6 are replaced with the 1st, 2nd, 3rd, 4th, and 5th rows, and the 2nd, 8th, 14th, 20th, and 26th rows having remainders of 2 when being divided by 6 are replaced with the 6th, 7th, 8th, 9th, and 10th rows, respectively.

According to the column replacement of the expression (12), replacement is performed such that the 61st, 67th, 73rd, 79th, and 85th columns having remainders of 1 when being divided by 6 are replaced with the 61st, 62nd, 63rd, 64th, and 65th columns, respectively, and the 62nd, 68th, 74th, 80th, and 86th columns having remainders of 2 when being divided by 6 are replaced with the 66th, 67th, 68th, 69th, and 70th columns, respectively, with respect to the 61st and following columns (parity matrix).

In this way, a matrix that is obtained by performing the replacements of the rows and the columns with respect to the parity check matrix H of FIG. 68 is a parity check matrix H' of FIG. 69.

In this case, even when the row replacement of the parity check matrix H is performed, the arrangement of the code bits of the LDPC code is not influenced.

The column replacement of the expression (12) corresponds to parity interleave to interleave the (K+qx+y+1)-th code bit into the position of the (K+Py+x+1)-th code bit, when the information length K is 60, the column number P of the unit of the cyclic structure is 5, and the divisor q (=M/P) of the parity length M (in this case, 30) is 6.

Therefore, the parity check matrix H' in FIG. 69 is a transformed parity check matrix obtained by performing at least column replacement that replaces the K+qx+y+1-th column of the parity check matrix H in FIG. 68 (which may be arbitrarily called an original parity check matrix below) with the K+Py+x+1-th column.

If the parity check matrix H' of FIG. 69 is multiplied with a result obtained by performing the same replacement as the expression (12) with respect to the LDPC code of the parity check matrix H of FIG. 68, a zero vector is output. That is, if a row vector obtained by performing the column replacement of the expression (12) with respect to a row vector c as the LDPC code (one code word) of the original parity check matrix H is represented as c', HcT becomes the zero vector from the property of the parity check matrix. Therefore, H'c'T naturally becomes the zero vector.

Thereby, the transformed parity check matrix H' of FIG. 69 becomes a parity check matrix of an LDPC code c' that is obtained by performing the column replacement of the expression (12) with respect to the LDPC code c of the original parity check matrix H.

Therefore, the column replacement of the expression (12) is performed with respect to the LDPC code of the original parity check matrix H, the LDPC code c' after the column replacement is decoded (LDPC decoding) using the transformed parity check matrix H' of FIG. 69, reverse replacement of the column replacement of the expression (12) is performed with respect to a decoding result, and the same decoding result as the case in which the LDPC code of the original parity check matrix H is decoded using the parity check matrix H can be obtained.

Figure 70:
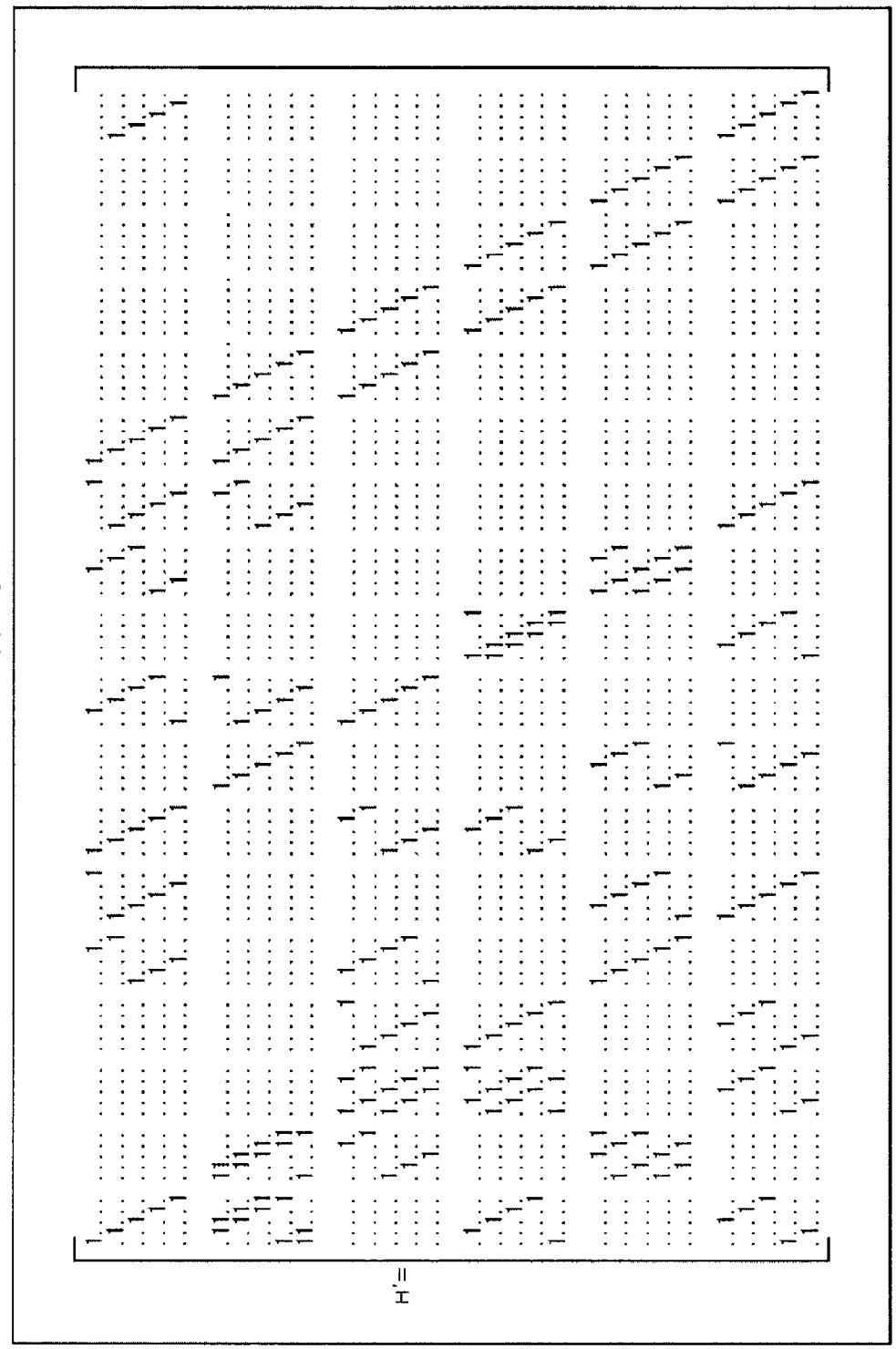
FIG. 70 is an illustration of the parity check matrix spaced in units of 5×5 matrixes.

FIG. 70 illustrates the transformed parity check matrix H' of FIG. 69 with being spaced in units of 5×5 matrixes.

In FIG. 70, the transformed parity check matrix H' is represented by a combination of a 5×5 (=p×p) unit matrix, a matrix (hereinafter, appropriately referred to as a quasi unit matrix) obtained by setting one or more 1 of the unit matrix to zero, a matrix (hereinafter, appropriately referred to as a shifted matrix) obtained by cyclically shifting the unit matrix or the quasi unit matrix, a sum (hereinafter, appropriately referred to as a sum matrix) of two or more matrixes of the unit matrix, the quasi unit matrix, and the shifted matrix, and a 5×5 zero matrix.

The transformed parity check matrix H' of FIG. 70 can be configured using the 5×5 unit matrix, the quasi unit matrix, the shifted matrix, the sum matrix, and the zero matrix. Therefore, the 5×5 matrixes (the unit matrix, the quasi unit matrix, the shifted matrix, the sum matrix, and the zero matrix) that constitute the transformed parity check matrix H' are appropriately referred to as constitutive matrixes hereinafter.

When the LDPC code represented by the parity check matrix represented by the P×P constitutive matrixes is decoded, an architecture in which P check node operations and variable node operations are simultaneously performed can be used.

Figure 71:
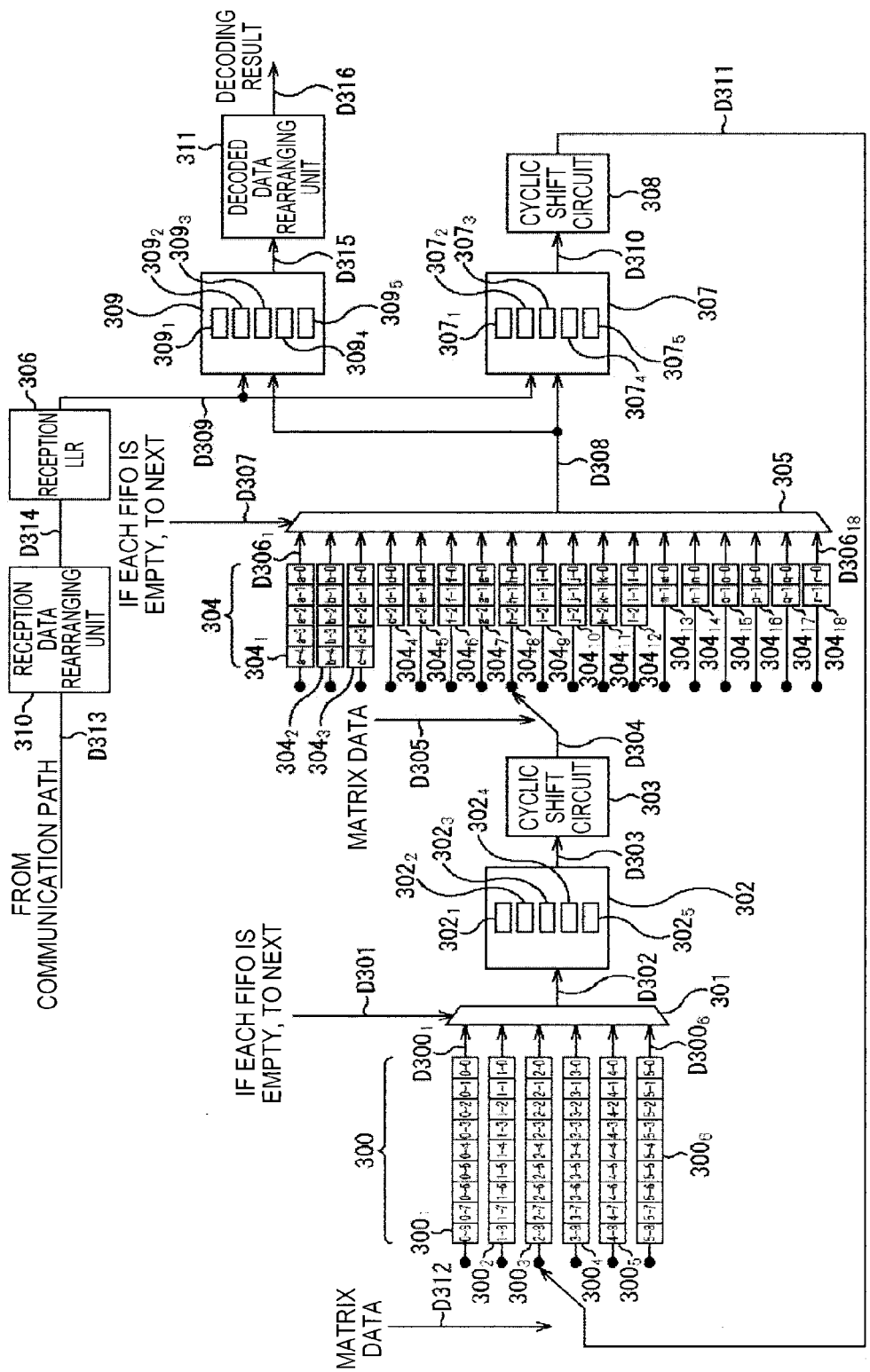
FIG. 71 is a block diagram illustrating a configuration example of a decoding device that performs a node operation together by P.

FIG. 71 is a block diagram illustrating a configuration example of a decoding device that performs the decoding.

That is, FIG. 71 illustrates the configuration example of the decoding device that performs decoding of the LDPC code, using the transformed parity check matrix H' of FIG. 68 obtained by performing at least the column replacement of the expression (12) with respect to the original parity check matrix H of FIG. 70.

The decoding device of FIG. 71 includes a branch data storing memory 300 that includes 6 FIFOs $300_1$ to $300_6$, a selector 301 that selects the FIFOs $300_1$ to $300_6$, a check node calculating unit 302, two cyclic shift circuits 303 and 308, a branch data storing memory 304 that includes 18 FIFOs $304_1$ to $304_{18}$, a selector 305 that selects the FIFOs $304_1$ to $304_{18}$, a reception data memory 306 that stores reception data, a variable node calculating unit 307, a decoding word calculating unit 309, a reception data rearranging unit 310, and a decoded data rearranging unit 311.

First, a method of storing data in the branch data storing memories 300 and 304 will be described.

The branch data storing memory 300 includes the 6 FIFOs $300_1$ to $300_6$ that correspond to a number obtained by dividing a row number 30 of the transformed parity check matrix H' of FIG. 70 by a row number 5 of the constitutive matrix (the column number P of the unit of the cyclic structure). The FIFO $300_y$ (y=1, 2, . . . , and 6) includes a plurality of steps of storage regions. In the storage region of each step, messages corresponding to five branches to be a row number and a column number of the constitutive matrix (the column number P of the unit of the cyclic structure) can be simultaneously read or written. The number of steps of the storage regions of the FIFO $300_y$ becomes 9 to be a maximum number of the number (Hamming weight) of 1 of a row direction of the transformed parity check matrix of FIG. 70.

In the FIFO $300_1$, data (messages $v_1$ from variable nodes) corresponding to positions of 1 in the first to fifth rows of the transformed parity check matrix H' of FIG. 70 is stored in a form filling each row in a transverse direction (a form in which 0 is ignored). That is, if a j-th row and an i-th column are represented as (j, i), data corresponding to positions of 1 of a 5×5 unit matrix of (1, 1) to (5, 5) of the transformed parity check matrix H' is stored in the storage region of the first step of the FIFO $300_1$. In the storage region of the second step, data corresponding to positions of 1 of a shifted matrix (shifted matrix obtained by cyclically shifting the 5×5 unit matrix to the right side by 3) of (1, 21) to (5, 25) of the transformed parity check matrix H' is stored. Similar to the above case, in the storage regions of the third to eighth steps, data is stored in association with the transformed parity check matrix H'. In the storage region of the ninth step, data corresponding to positions of 1 of a shifted matrix (shifted matrix obtained by replacing I of the first row of the 5×5 unit matrix with 0 and cyclically shifting the unit matrix to the left side by 1) of (1, 86) to (5, 90) of the transformed parity check matrix H' is stored.

In the FIFO $300_2$, data corresponding to positions of 1 in the sixth to tenth rows of the transformed parity check matrix H' of FIG. 70 is stored. That is, in the storage region of the first step of the FIFO $300_2$, data corresponding to positions of 1 of the first shifted matrix constituting a sum matrix (sum matrix to be a sum of the first shifted matrix obtained by cyclically shifting the 5×5 unit matrix to the right side by 1 and the second shifted matrix obtained by cyclically shifting the 5×5 unit matrix to the right side by 2) of (6, 1) to (10, 5) of the transformed parity check matrix H' is stored. In addition, in the storage region of the second step, data corresponding to positions of 1 of the second shifted matrix constituting the sum matrix of (6, 1) to (10, 5) of the transformed parity check matrix H' is stored.

That is, with respect to a constitutive matrix of which the weight is two or more, when the constitutive matrix is represented by a sum of multiple parts of a P×P unit matrix of which the weight is 1, a quasi unit matrix in which one or more elements of 1 in the unit matrix become 0, or a shifted matrix obtained by cyclically shifting the unit matrix or the quasi unit matrix, data (messages corresponding to branches belonging to the unit matrix, the quasi unit matrix, or the shifted matrix) corresponding to the positions of 1 in the unit matrix of the weight of 1, the quasi unit matrix, or the shifted matrix is stored at the same address (the same FIFO among the FIFOs $300_1$ to $300_6$).

Subsequently, in the storage regions of the third to ninth steps, data is stored in association with the transformed parity check matrix H', similar to the above case.

In the FIFOs $300_3$ to $300_6$, data is stored in association with the transformed parity check matrix H', similar to the above case.

The branch data storing memory 304 includes 18 FIFOs $304_1$ to $304_{18}$ that correspond to a number obtained by dividing a column number 90 of the transformed parity check matrix H' by 5 to be a column number of a constitutive matrix (the column number P of the unit of the cyclic structure). The FIFO $304_x$ (x=1, 2, . . . , and 18) includes a plurality of steps of storage regions. In the storage region of each step, messages corresponding to five branches corresponding to a row number and a column number of the constitutive matrix (the column number P of the unit of the cyclic structure) can be simultaneously read or written.

In the FIFO $304_1$, data (messages $u_j$ from check nodes) corresponding to positions of 1 in the first to fifth columns of the transformed parity check matrix H' of FIG. 70 is stored in a form filling each column in a longitudinal direction (a form in which 0 is ignored). That is, if a j-th row and an i-th column are represented as (j, i), data corresponding to positions of 1 of a 5×5 unit matrix of (1, 1) to (5, 5) of the transformed parity check matrix H' is stored in the storage region of the first step of the FIFO $304_1$. In the storage region of the second step, data corresponding to positions of 1 of the first shifted matrix constituting a sum matrix (sum matrix to be a sum of the first shifted matrix obtained by cyclically shifting the 5×5 unit matrix to the right side by 1 and the second shifted matrix obtained by cyclically shifting the 5×5 unit matrix to the right side by 2) of (6, 1) to (10, 5) of the transformed parity check matrix H' is stored. In addition, in the storage region of the third step, data corresponding to positions of 1 of the second shifted matrix constituting the sum matrix of (6, 1) to (10, 5) of the transformed parity check matrix H' is stored.

That is, with respect to a constitutive matrix of which the weight is two or more, when the constitutive matrix is represented by a sum of multiple parts of a P×P unit matrix of which the weight is 1, a quasi unit matrix in which one or more elements of 1 in the unit matrix become 0, or a shifted matrix obtained by cyclically shifting the unit matrix or the quasi unit matrix, data (messages corresponding to branches belonging to the unit matrix, the quasi unit matrix, or the shifted matrix) corresponding to the positions of 1 in the unit matrix of the weight of 1, the quasi unit matrix, or the shifted matrix is stored at the same address (the same FIFO among the FIFOs $304_1$ to $304_{18}$).

Subsequently, in the storage regions of the fourth and fifth steps, data is stored in association with the transformed parity check matrix H', similar to the above case. The number of steps of the storage regions of the FIFO $304_1$ becomes 5 to be a maximum number of the number (Hamming weight) of 1 of a row direction in the first to fifth columns of the transformed parity check matrix H'.

In the FIFOs $304_2$ and $304_3$, data is stored in association with the transformed parity check matrix H', similar to the above case, and each length (the number of steps) is 5. In the FIFOs $304_4$ to $304_{12}$, data is stored in association with the transformed parity check matrix H', similar to the above case, and each length is 3. In the FIFOs $304_{13}$ to $304_{18}$, data is stored in association with the transformed parity check matrix H', similar to the above case, and each length is 2.

Next, an operation of the decoding device of FIG. 71 will be described.

The branch data storing memory 300 includes the 6 FIFOs $300_1$ to $300_6$. According to information (matrix data) D312 on which row of the transformed parity check matrix H' in FIG. 70 five messages D311 supplied from a cyclic shift circuit 308 of a previous step belongs to, the FIFO storing data is selected from the FIFOs $300_1$ to $300_6$ and the five messages D311 are collectively stored sequentially in the selected FIFO. When the data is read, the branch data storing memory 300 sequentially reads the five messages $D300_1$ from the FIFO $300_1$ and supplies the messages to the selector 301 of a next step. After reading of the messages from the FIFO $300_1$ ends, the branch data storing memory 300 reads the messages sequentially from the FIFOs $300_2$ to $300_6$ and supplies the messages to the selector 301.

The selector 301 selects the five messages from the FIFO from which data is currently read, among the FIFOs $300_1$ to $300_6$, according to a select signal D301, and supplies the selected messages as messages D302 to the check node calculating unit 302.

The check node calculating unit 302 includes five check node calculators $302_1$ to $302_5$. The check node calculating unit 302 performs a check node operation according to the expression (7), using the messages D302 ($D302_1$ to $D302_5$) (messages $v_i$ of the expression 7) supplied through the selector 301, and supplies five messages D303 ($D303_1$ to $D303_5$) (messages $u_j$ of the expression (7)) obtained as a result of the check node operation to a cyclic shift circuit 303.

The cyclic shift circuit 303 cyclically shifts the five messages $D303_1$ to $D303_5$ calculated by the check node calculating unit 302, on the basis of information (matrix data) D305 on how many the unit matrixes (or the quasi unit matrix) becoming the origin in the transformed parity check matrix H' are cyclically shifted to obtain the corresponding branches, and supplies a result as messages D304 to the branch data storing memory 304.

The branch data storing memory 304 includes the eighteen FIFOs $304_1$ to $304_{18}$. According to information D305 on which row of the transformed parity check matrix H' five messages D304 supplied from a cyclic shift circuit 303 of a previous step belongs to, the FIFO storing data is selected from the FIFOs $304_1$ to $304_{18}$ and the five messages D304 are collectively stored sequentially in the selected FIFO. When the data is read, the branch data storing memory 304 sequentially reads the five messages $D304_1$ from the FIFO $304_1$ and supplies the messages to the selector 305 of a next step. After reading of the messages from the FIFO $304_1$ ends, the branch data storing memory 304 reads the messages sequentially from the FIFOs $304_2$ to $304_{18}$ and supplies the messages to the selector 305.

The selector 305 selects the five messages from the FIFO from which data is currently read, among the FIFOs $304_1$ to $304_{18}$, according to a select signal D307, and supplies the selected messages as messages D308 to the variable node calculating unit 307 and the decoding word calculating unit 309.

Meanwhile, the reception data rearranging unit 310 rearranges the LDPC code D313, that is corresponding to the parity check matrix H in FIG. 68, received through the communication path 13 by performing the column replacement of the expression (12) and supplies the LDPC code as reception data D314 to the reception data memory 306. The reception data memory 306 calculates a reception LLR (Log Likelihood Ratio) from the reception data D314 supplied from the reception data rearranging unit 310, stores the reception LLR, collects five reception LLRs, and supplies the reception LLRs as reception values D309 to the variable node calculating unit 307 and the decoding word calculating unit 309.

The variable node calculating unit 307 includes five variable node calculators $307_1$ to $307_5$. The variable node calculating unit 307 performs the variable node operation according to the expression (1), using the messages D308 ($D308_1$ to $D308_5$) (messages $u_j$ of the expression (1)) supplied through the selector 305 and the five reception values D309 (reception values $u_{0i}$ of the expression (1)) supplied from the reception data memory 306, and supplies messages D310 ($D310_1$ to $D310_5$) (message $v_i$ of the expression (1)) obtained as an operation result to the cyclic shift circuit 308.

The cyclic shift circuit 308 cyclically shifts the messages $D310_1$ to $D310_5$ calculated by the variable node calculating unit 307, on the basis of information on how many the unit matrixes (or the quasi unit matrix) becoming the origin in the transformed parity check matrix H' are cyclically shifted to obtain the corresponding branches, and supplies a result as messages D311 to the branch data storing memory 300.

By circulating the above operation in one cycle, decoding (variable node operation and check node operation) of the LDPC code can be performed once. After decoding the LDPC code by the predetermined number of times, the decoding device of FIG. 71 calculates a final decoding result and outputs the final decoding result, in the decoding word calculating unit 309 and the decoded data rearranging unit 311.

That is, the decoding word calculating unit 309 includes five decoding word calculators $309_1$ to $309_5$. The decoding word calculating unit 309 calculates a decoding result (decoding word) on the basis of the expression (5), as a final step of multiple decoding, using the five messages D308 ($D308_1$ to $D308_5$) (messages $u_j$ of the expression) output by the selector 305 and the five reception values D309 (reception values $u_{0i}$ of the expression (5)) supplied from the reception data memory 306, and supplies decoded data D315 obtained as a result to the decoded data rearranging unit 311.

The decoded data rearranging unit 311 performs the reverse replacement of the column replacement of the expression (12) with respect to the decoded data D315 supplied from the decoding word calculating unit 309, rearranges the order thereof, and outputs the decoded data as a final decoding result D316.

As mentioned above, by performing one or both of row replacement and column replacement on the parity check matrix (original parity check matrix) and converting it into a parity check matrix (transformed parity check matrix) that can be shown by the combination of a p×p unit matrix, a quasi unit matrix in which one or more elements of 1 thereof become 0, a shifted matrix that cyclically shifts the unit matrix or the quasi unit matrix, a sum matrix that is the sum of two or more of the unit matrix, the quasi unit matrix and the shifted matrix, and a p×p 0 matrix, that is, the combination of constitutive matrixes, as for LDPC code decoding, it becomes possible to adopt architecture that simultaneously performs check node calculation and variable node calculation by P which is the number less than the row number and column number of the parity check matrix. In the case of adopting the architecture that simultaneously performs node calculation (check node calculation and variable node calculation) by P which is the number less than the row number and column number of the parity check matrix, as compared with a case where the node calculation is simultaneously performed by the number equal to the row number and column number of the parity check matrix, it is possible to suppress the operation frequency within a feasible range and perform many items of iterative decoding.

The LDPC decoder 166 that constitutes the receiving device 12 of FIG. 65 performs the LDPC decoding by simultaneously performing P check node operations and variable node operations, similar to the decoding device of FIG. 71.

That is, for the simplification of explanation, if the parity check matrix of the LDPC code output by the LDPC encoder 115 constituting the transmitting device 11 of FIG. 8 is regarded as the parity check matrix H illustrated in FIG. 68 in which the parity matrix becomes a staircase structure, in the parity interleaver 23 of the transmitting device 11, the parity interleave to interleave the (K+qx+y+1)-th code bit into the position of the (K+Py+x+1)-th code bit is performed in a state in which the information K is set to 60, the column number P of the unit of the cyclic structure is set to 5, and the divisor q (=M/P) of the parity length M is set to 6.

Because the parity interleave corresponds to the column replacement of the expression (12) as described above, it is not necessary to perform the column replacement of the expression (12) in the LDPC decoder 166.

For this reason, in the receiving device 12 of FIG. 65, as described above, the LDPC code in which the parity deinterleave is not performed, that is, the LDPC code in a state in which the column replacement of the expression (12) is performed is supplied from the column twist deinterleaver 55 to the LDPC decoder 166. In the LDPC decoder 166, the same processing as the decoding device of FIG. 71, except that the column replacement of the expression (12) is not performed, is executed.

Figure 72:
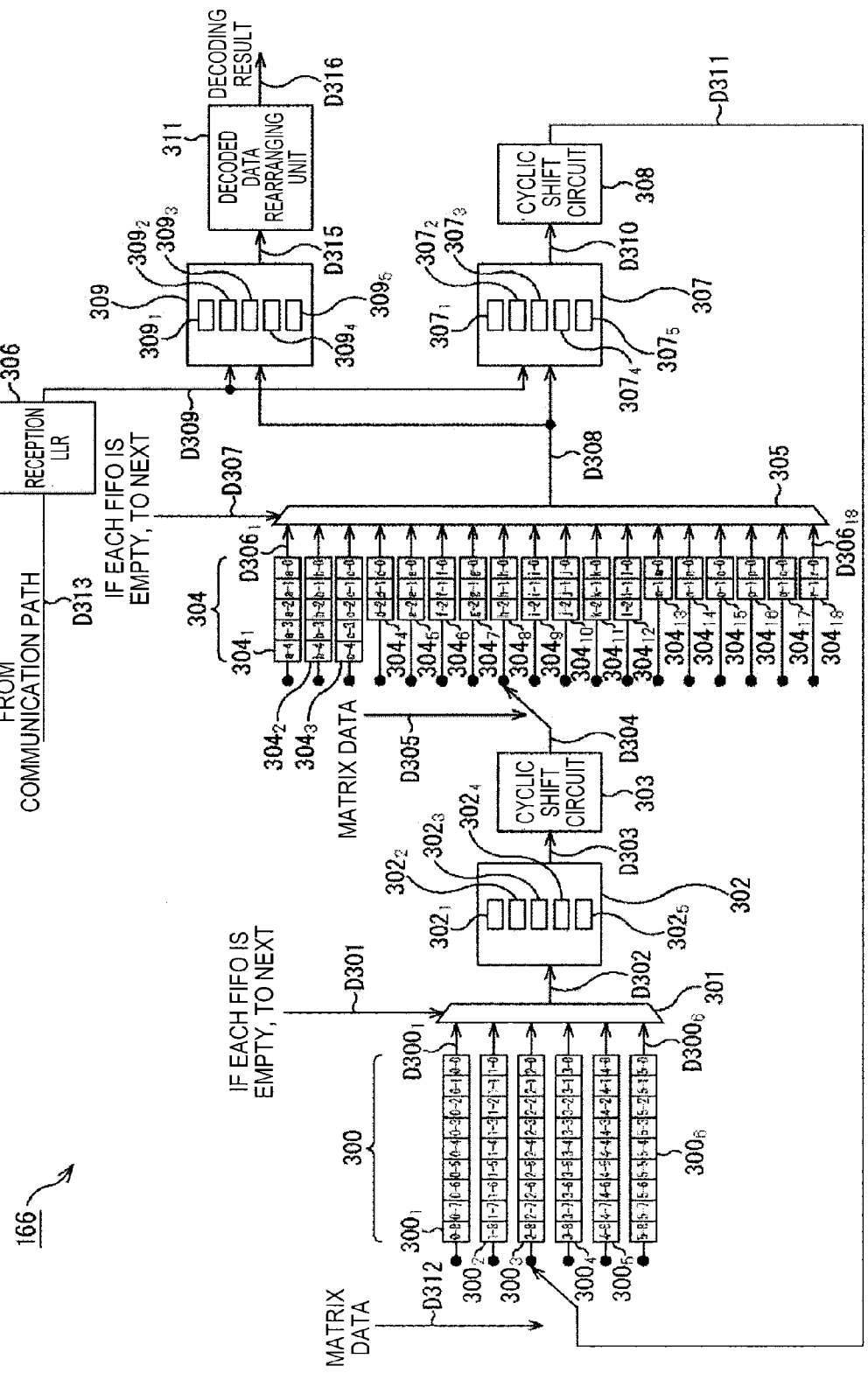
FIG. 72 is a block diagram illustrating a configuration example of the LDPC decoder 166.

That is, FIG. 72 illustrates a configuration example of the LDPC decoder 166 of FIG. 65.

In FIG. 72, the LDPC decoder 166 has the same configuration as the decoding device of FIG. 71, except that the reception data rearranging unit 310 of FIG. 71 is not provided, and executes the same processing as the decoding device of FIG. 71, except that the column replacement of the expression (12) is not performed. Therefore, explanation of the LDPC decoder is omitted.

As described above, because the LDPC decoder 166 can be configured without providing the reception data rearranging unit 310, a scale can be decreased as compared with the decoding device of FIG. 71.

In FIGS. 68 to 72, for the simplification of explanation, the code length N of the LDPC code is set to 90, the information length K is set to 60, the column number (the row number and the column number of the constitutive matrix) P of the unit of the cyclic structure is set to 5, and the divisor q (=M/P) of the parity length M is set to 6. However, the code length N, the information length K, the column number P of the unit of the cyclic structure, and the divisor q (=M/P) are not limited to the above values.

That is, in the transmitting device 11 of FIG. 8, the LDPC encoder 115 outputs the LDPC code in which the code length N is set to 64800 or 16200, the information length K is set to N−Pq (=N−M), the column number P of the unit of the cyclic structure is set to 360, and the divisor q is set to M/P. However, the LDPC decoder 166 of FIG. 72 can be applied to the case in which P check node operation and variable node operations are simultaneously performed with respect to the LDPC code and the LDPC decoding is performed.

Figure 73:
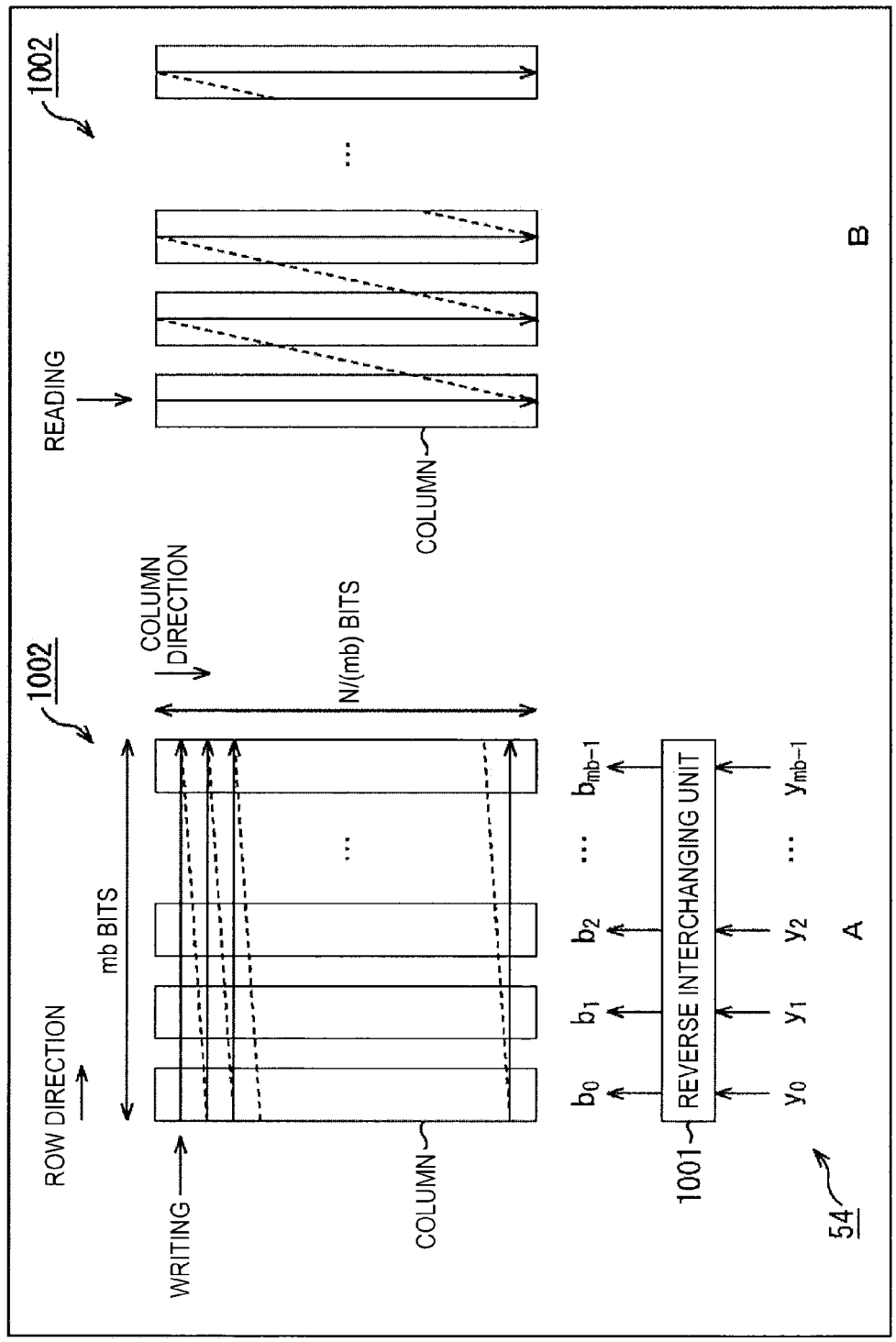
FIG. 73 is an illustration of processing of a multiplexer 54 constituting the bit deinterleaver 165.

FIG. 73 is an illustration of processing of the multiplexer 54 constituting the bit deinterleaver 165 of FIG. 66.

That is, A of FIG. 73 illustrates a functional configuration example of the multiplexer 54.

The multiplexer 54 includes a reverse interchanging unit 1001 and a memory 1002.

The multiplexer 54 executes reverse interchange processing (reverse processing of the interchange processing) corresponding to the interchange processing executed by the demultiplexer 25 of the transmitting device 11, that is, reverse interchange processing for returning positions of the code bits (symbol bits) of the LDPC codes interchanged by the interchange processing to original positions, with respect to the symbol bits of the symbol supplied from the Demapper 164 of the previous step, and supplies an LDPC code obtained as a result to the column twist deinterleaver 55 of the following step.

That is, in the multiplexer 54, symbol bits $y_0, y_1, \ldots,$ and $y_{mb-1}$ of mb bits of b symbols are supplied to the reverse interchanging unit 1001 in a unit of the b (consecutive) symbols.

The reverse interchanging unit 1001 performs reverse interchanging for returning the symbol bits $y_0, y_1, \ldots,$ and $y_{mb-1}$ of the mb bits to an arrangement of code bits $b_0, b_1, \ldots,$ and $b_{mb-1}$ of original mb bits (arrangement of the code bits $b_0$ to $b_{mb-1}$ before interchanging is performed in the interchanging unit 32 constituting the demultiplexer 25 of the side of the transmitting device 11) and outputs the code bits $b_0$ to $b_{mb-1}$ of the mb bits obtained as a result.

The memory 1002 has a storage capacity to store the mb bits in a row (transverse) direction and store N/(mb) bits in a column (longitudinal) direction, similar to the memory 31 constituting the demultiplexer 25 of the side of the transmitting device 11. That is, the memory 1002 includes mb columns that store N/(mb) bits.

However, in the memory 1002, writing of the code bits of the LDPC code output by the reverse interchanging unit 1001 is performed in a direction in which reading of the code bits from the memory 31 of the demultiplexer 25 of the transmitting device 11 is performed and reading of the code bits written to the memory 1002 is performed in a direction in which writing of the code bits to the memory 31 is performed.

That is, in the multiplexer 54 of the receiving device 12, as illustrated by A of FIG. 73, writing of the code bits of the LDPC code output by the reverse interchanging unit 1001 in the row direction in a unit of the mb bits is sequentially performed toward the lower rows from the first row of the memory 1002.

If writing of the code bits corresponding to one code length ends, the multiplexer 54 reads the code bits from the memory 1002 in the column direction and supplies the code bits to the column twist deinterleaver 55 of a following step.

In this case, B of FIG. 73 is an illustration of reading of the code bits from the memory 1002.

In the multiplexer 54, reading of the code bits of the LDPC code in the downward direction (column direction) from the upper side of the columns constituting the memory 1002 is performed toward the columns of the rightward direction from the left side.

Figure 74:
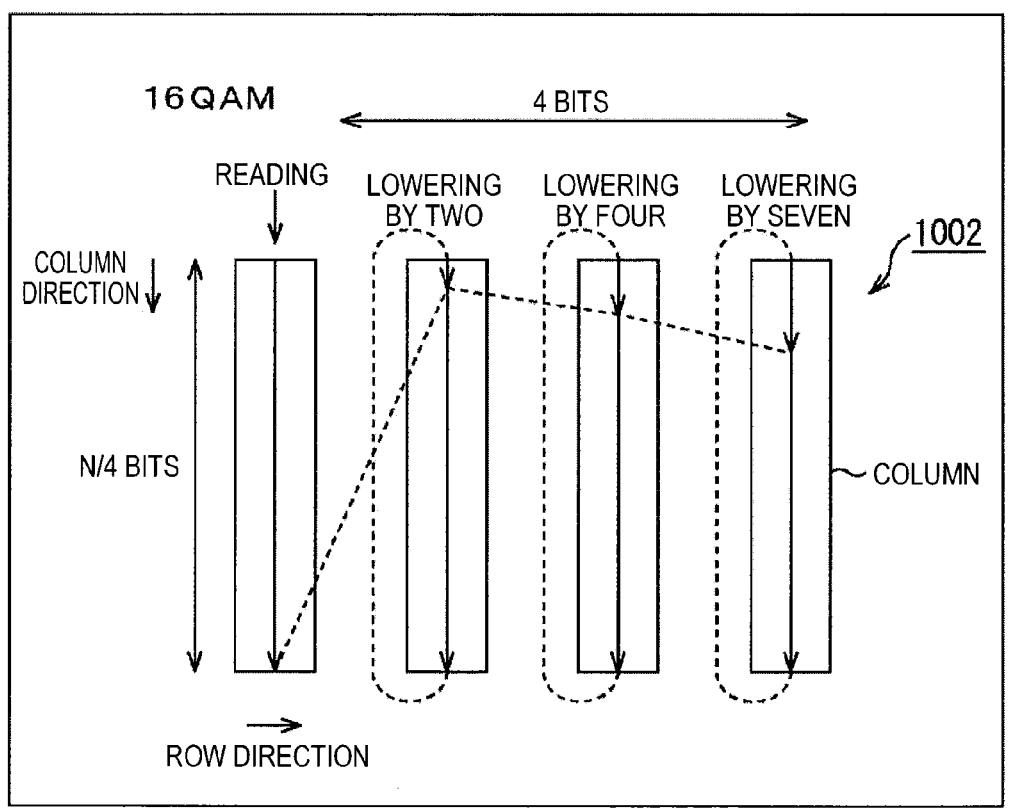
FIG. 74 is an illustration of processing of the column twist deinterleaver 55.

FIG. 74 is an illustration of processing of the column twist deinterleaver 55 constituting the bit deinterleaver 165 of FIG. 66.

That is, FIG. 74 illustrates a configuration example of the memory 1002 of the multiplexer 54.

The memory 1002 has a storage capacity to store the mb bits in the column (longitudinal) direction and store the N/(mb) bits in the row (transverse) direction and includes mb columns.

The column twist deinterleaver 55 writes the code bits of the LDPC code to the memory 1002 in the row direction, controls a read start position when the code bits are read in the column direction, and performs the column twist deinterleave.

That is, in the column twist deinterleaver 55, a read start position to start reading of the code bits is appropriately changed with respect to each of the plurality of columns and the reverse rearrangement processing for returning the arrangement of the code bits rearranged by the column twist interleave to the original arrangement is executed.

In this case, FIG. 74 illustrates a configuration example of the memory 1002 when the modulation method is the 16APSK, the 16QAM or the like and the multiple b is 1, described in FIG. 28. In this case, a bit number m of one symbol is 4 bits and the memory 1002 includes four (=mb) columns.

The column twist deinterleaver 55, (instead of the multiplexer 54), sequentially performs writing of the code bits of the LDPC code output by the reverse interchanging unit 1001 in the row direction, toward the lower rows from the first row of the memory 1002.

If writing of the code bits corresponding to one code length ends, the column twist deinterleaver 55 performs reading of the code bits in the downward direction (column direction) from the upper side of the memory 1002, toward the columns of the rightward direction from the left side.

However, the column twist deinterleaver 55 performs reading of the code bits from the memory 1002, using the write start position to write the code bits by the column twist interleaver 24 of the side of the transmitting device 11 as the read start position of the code bits.

That is, if an address of a position of a head (top) of each column is set to 0 and an address of each position of the column direction is represented by an integer of ascending order, when the modulation method is the 16APSK or the 16QAM and the multiple b is 1, in the column twist deinterleaver 55, a read start position is set as a position of which an address is 0, with respect the leftmost column. With respect the second column (from the left side), a read start position is set as a position of which an address is 2. With respect the third column, a read start position is set as a position of which an address is 4. With respect the fourth column, a read start position is set as a position of which an address is 7.

With respect to the columns in which the read start positions are the positions other than the position of which the address is 0, after reading of the code bits is performed to the lowermost position, the position returns to the head (position of which the address is 0), and reading to the position immediately before the read start position is performed. Then, reading from a next (right) column is performed.

By performing the column twist deinterleave described above, the arrangement of the code bits that are rearranged by the column twist interleave returns to the original arrangement.

Figure 75:
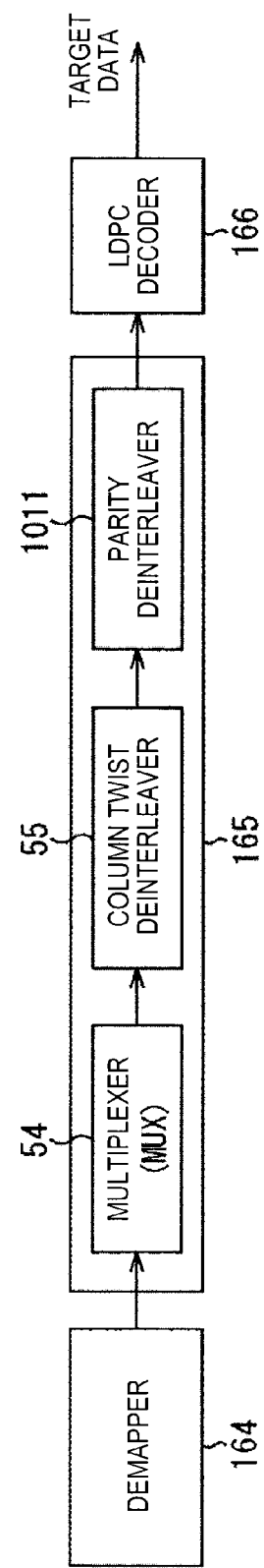
FIG. 75 is a block diagram illustrating another configuration example of the bit deinterleaver 165.

FIG. 75 is a block diagram illustrating another configuration example of the bit deinterleaver 165 of FIG. 65.

In the drawings, portions that correspond to the case of FIG. 66 are denoted with the same reference numerals and explanation thereof is appropriately omitted hereinafter.

That is, the bit deinterleaver 165 of FIG. 75 has the same configuration as the case of FIG. 66, except that a parity deinterleaver 1011 is newly provided.

In FIG. 75, the bit deinterleaver 165 includes a multiplexer (MUX) 54, a column twist deinterleaver 55, and a parity deinterleaver 1011 and performs bit deinterleave of code bits of the LDPC code supplied from the Demapper 164.

That is, the multiplexer 54 executes the reverse interchange processing (reverse processing of the interchange processing) corresponding to the interchange processing executed by the demultiplexer 25 of the transmitting device 11, that is, the reverse interchange processing for returning the positions of the code bits interchanged by the interchange processing to the original positions, with respect to the LDPC code supplied from the Demapper 164, and supplies an LDPC code obtained as a result to the column twist deinterleaver 55.

The column twist deinterleaver 55 performs the column twist deinterleave corresponding to the column twist interleave as the rearranging processing executed by the column twist interleaver 24 of the transmitting device 11, with respect to the LDPC code supplied from the multiplexer 54.

The LDPC code that is obtained as a result of the column twist deinterleave is supplied from the column twist deinterleaver 55 to the parity deinterleaver 1011.

The parity deinterleaver 1011 performs the parity deinterleave (reverse processing of the parity interleave) corresponding to the parity interleave performed by the parity interleaver 23 of the transmitting device 11, that is, the parity deinterleave to return the arrangement of the code bits of the LDPC code of which an arrangement is changed by the parity interleave to the original arrangement, with respect to the code bits after the column twist deinterleave in the column twist deinterleaver 55.

The LDPC code that is obtained as a result of the parity deinterleave is supplied from the parity deinterleaver 1011 to the LDPC decoder 166.

Therefore, in the bit deinterleaver 165 of FIG. 75, the LDPC code in which the reverse interchange processing, the column twist deinterleave, and the parity deinterleave are performed, that is, the LDPC code that is obtained by the LDPC encoding according to the parity check matrix H is supplied to the LDPC decoder 166.

The LDPC decoder 166 performs LDPC decoding of an LDPC code from the bit deinterleaver 165 by the use of the parity check matrix H used for LDPC encoding by the LDPC encoder 115 of the transmitting device 11. That is, the LDPC decoder 166 performs LDPC decoding of the LDPC code from the bit deinterleaver 165 by the use of the parity check matrix H itself used for LDPC encoding by the LDPC encoder 115 of the transmitting device 11 or by the use of a transformed parity check matrix obtained by performing at least column replacement corresponding to parity interleave with respect to the parity check matrix H.

In FIG. 75, the LDPC code that is obtained by the LDPC encoding according to the parity check matrix H is supplied from (the parity deinterleaver 1011 of) the bit deinterleaver 165 to the LDPC decoder 166. For this reason, when the LDPC decoding of the LDPC code is performed using the parity check matrix H used by the LDPC encoder 115 of the transmitting device 11 to perform the LDPC encoding, the LDPC decoder 166 can be configured by a decoding device performing the LDPC decoding according to a full serial decoding method to sequentially perform operations of messages (a check node message and a variable node message) for each node or a decoding device performing the LDPC decoding according to a full parallel decoding method to simultaneously (in parallel) perform operations of messages for all nodes.

In the LDPC decoder 166, when the LDPC decoding of the LDPC code is performed using the transformed parity check matrix obtained by performing at least the column replacement corresponding to the parity interleave with respect to the parity check matrix H used by the LDPC encoder 115 of the transmitting device 11 to perform the LDPC encoding, the LDPC decoder 166 can be configured by a decoding device (FIG. 71) that is a decoding device of an architecture simultaneously performing P (or divisor of P other than 1) check node operations and variable node operations and has the reception data rearranging unit 310 to perform the same column replacement as the column replacement to obtain the transformed parity check matrix with respect to the LDPC code and rearrange the code bits of the LDPC code.

In FIG. 75, for the convenience of explanation, the multiplexer 54 executing the reverse interchange processing, the column twist deinterleaver 55 performing the column twist deinterleave, and the parity deinterleaver 1011 performing the parity deinterleave are individually configured. However, two or more elements of the multiplexer 54, the column twist deinterleaver 55, and the parity deinterleaver 1011 can be integrally configured, similar to the parity interleaver 23, the column twist interleaver 24, and the demultiplexer 25 of the transmitting device 11.

Moreover, in a case where the bit interleaver 116 (FIG. 8) of the transmitting device 11 is configured without including the parity interleaver 23 and the column twist interleaver 24, in FIG. 75, the bit deinterleaver 165 can be configured without including the column twist deinterleaver 55 and the parity deinterleaver 1011.

Even in this case, the LDPC decoder 166 can be configured with a decoding device of a full serial decoding method to perform LDPC decoding by the use of the parity check matrix H itself, a decoding device of a full parallel decoding method to perform LDPC decoding by the use of the parity check matrix H itself, and a decoding device (FIG. 71) having the reception data rearranging unit 310 that performs LDPC decoding by P simultaneous check node calculations and variable node calculations by the use of the transformed parity check matrix H'.

<Configuration Example of Reception System>

Figure 76:
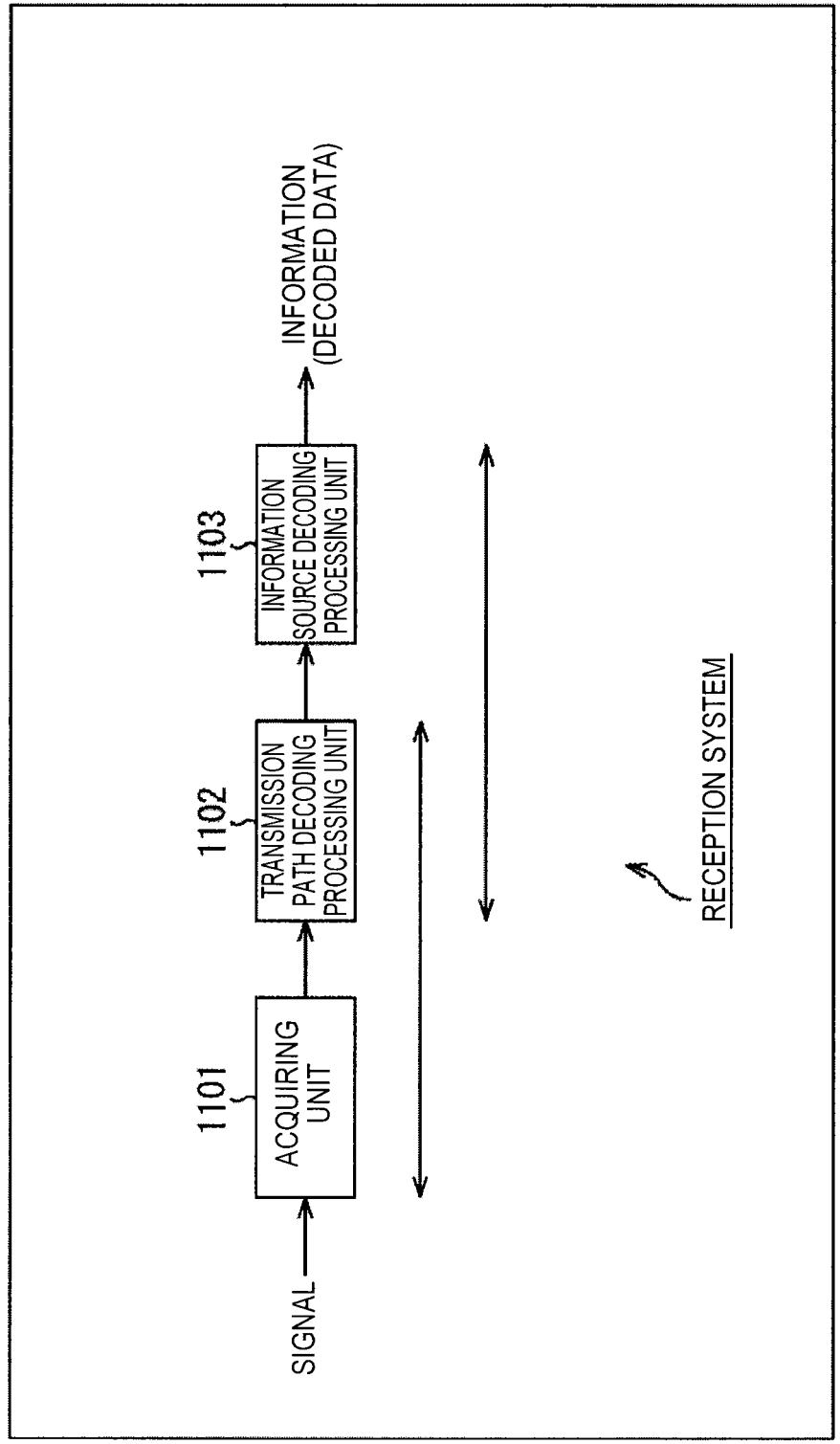
FIG. 76 is a block diagram illustrating a first configuration example of a reception system that can be applied to the receiving device 12.

FIG. 76 is a block diagram illustrating a first configuration example of a reception system that can be applied to the receiving device 12.

In FIG. 76, the reception system includes an acquiring unit 1101, a transmission path decoding processing unit 1102, and an information source decoding processing unit 1103.

The acquiring unit 1101 acquires a signal including an LDPC code obtained by performing at least LDPC encoding with respect to LDPC target data such as image data or sound data of a program, through a transmission path (communication path) not illustrated in the drawings, such as terrestrial digital broadcasting, satellite digital broadcasting, a CATV network, the Internet, or other networks, and supplies the signal to the transmission path decoding processing unit 1102.

In this case, when the signal acquired by the acquiring unit 1101 is broadcast from a broadcasting station through a ground wave, a satellite wave, or a CATV (Cable Television) network, the acquiring unit 1101 is configured using a tuner and an STB (Set Top Box). When the signal acquired by the acquiring unit 1101 is transmitted from a web server by multicasting like an IPTV (Internet Protocol Television), the acquiring unit 1101 is configured using a network I/F (Interface) such as an NIC (Network Interface Card).

The transmission path decoding processing unit 1102 corresponds to the receiving device 12. The transmission path decoding processing unit 1102 executes transmission path decoding processing including at least processing for correcting error generated in a transmission path, with respect to the signal acquired by the acquiring unit 1101 through the transmission path, and supplies a signal obtained as a result to the information source decoding processing unit 1103.

That is, the signal that is acquired by the acquiring unit 1101 through the transmission path is a signal that is obtained by performing at least error correction encoding to correct the error generated in the transmission path. The transmission path decoding processing unit 1102 executes transmission path decoding processing such as error correction processing, with respect to the signal.

As the error correction encoding, for example, LDPC encoding or BCH encoding exists. In this case, as the error correction encoding, at least the LDPC encoding is performed.

The transmission path decoding processing includes demodulation of a modulation signal.

The information source decoding processing unit 1103 executes information source decoding processing including at least processing for extending compressed information to original information, with respect to the signal on which the transmission path decoding processing is executed.

That is, compression encoding that compresses information may be performed with respect to the signal acquired by the acquiring unit 1101 through the transmission path to decrease a data amount of an image or a sound corresponding to information. In this case, the information source decoding processing unit 1103 executes the information source decoding processing such as the processing (extension processing) for extending the compressed information to the original information, with respect to the signal on which the transmission path decoding processing is executed.

When the compression encoding is not performed with respect to the signal acquired by the acquiring unit 1101 through the transmission path, the processing for extending the compressed information to the original information is not executed in the information source decoding processing unit 1103.

In this case, as the extension processing, for example, MPEG decoding exists. In the transmission path decoding processing, in addition to the extension processing, descramble may be included.

In the reception system that is configured as described above, in the acquiring unit 1101, a signal in which the compression encoding such as the MPEG encoding and the error correction encoding such as the LDPC encoding are performed with respect to data such as an image or a sound is acquired through the transmission path and is supplied to the transmission path decoding processing unit 1102.

In the transmission path decoding processing unit 1102, the same processing as the receiving device 12 executes as the transmission path decoding processing with respect to the signal supplied from the acquiring unit 1101 and a signal obtained as a result is supplied to the information source decoding processing unit 1103.

In the information source decoding processing unit 1103, the information source decoding processing such as the MPEG decoding is executed with respect to the signal supplied from the transmission path decoding processing unit 1102 and an image or a sound obtained as a result is output.

The reception system of FIG. 76 described above can be applied to a television tuner to receive television broadcasting corresponding to digital broadcasting.

Each of the acquiring unit 1101, the transmission path decoding processing unit 1102, and the information source decoding processing unit 1103 can be configured as one independent device (hardware (IC (Integrated Circuit) and the like) or software module).

With respect to the acquiring unit 1101, the transmission path decoding processing unit 1102, and the information source decoding processing unit 1103, each of a set of the acquiring unit 1101 and the transmission path decoding processing unit 1102, a set of the transmission path decoding processing unit 1102 and the information source decoding processing unit 1103, and a set of the acquiring unit 1101, the transmission path decoding processing unit 1102, and the information source decoding processing unit 1103 can be configured as one independent device.

Figure 77:
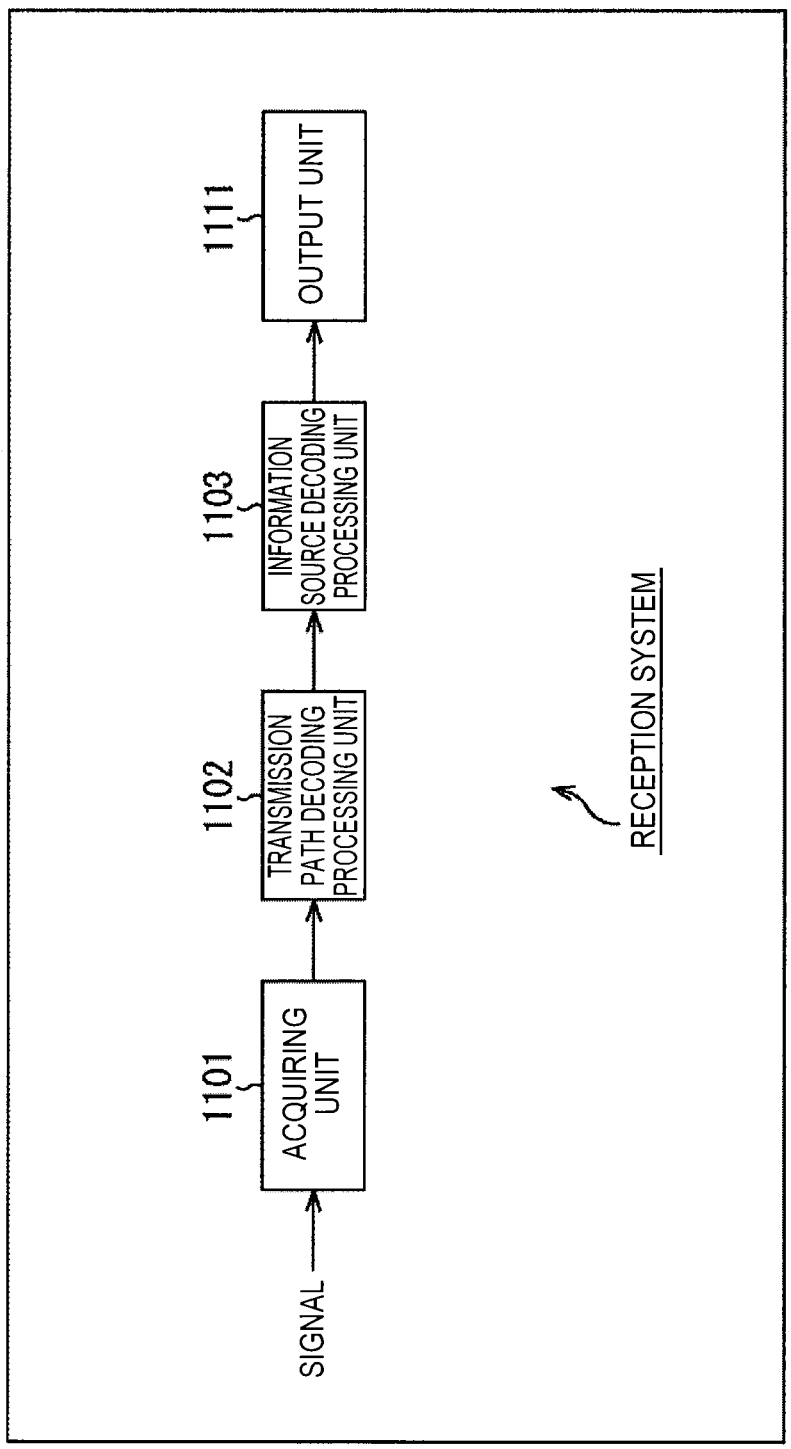
FIG. 77 is a block diagram illustrating a second configuration example of a reception system that can be applied to the receiving device 12.

FIG. 77 is a block diagram illustrating a second configuration example of the reception system that can be applied to the receiving device 12.

In the drawings, portions that correspond to the case of FIG. 76 are denoted with the same reference numerals and explanation thereof is appropriately omitted hereinafter.

The reception system of FIG. 77 is common to the case of FIG. 76 in that the acquiring unit 1101, the transmission path decoding processing unit 1102, and the information source decoding processing unit 1103 are provided and is different from the case of FIG. 76 in that an output unit 1111 is newly provided.

The output unit 1111 is a display device to display an image or a speaker to output a sound and outputs an image or a sound corresponding to a signal output from the information source decoding processing unit 1103. That is, the output unit 1111 displays the image or outputs the sound.

The reception system of FIG. 77 described above can be applied to a TV (television receiver) receiving television broadcasting corresponding to digital broadcasting or a radio receiver receiving radio broadcasting.

When the compression encoding is not performed with respect to the signal acquired in the acquiring unit 1101, the signal that is output by the transmission path decoding processing unit 1102 is supplied to the output unit 1111.

Figure 78:
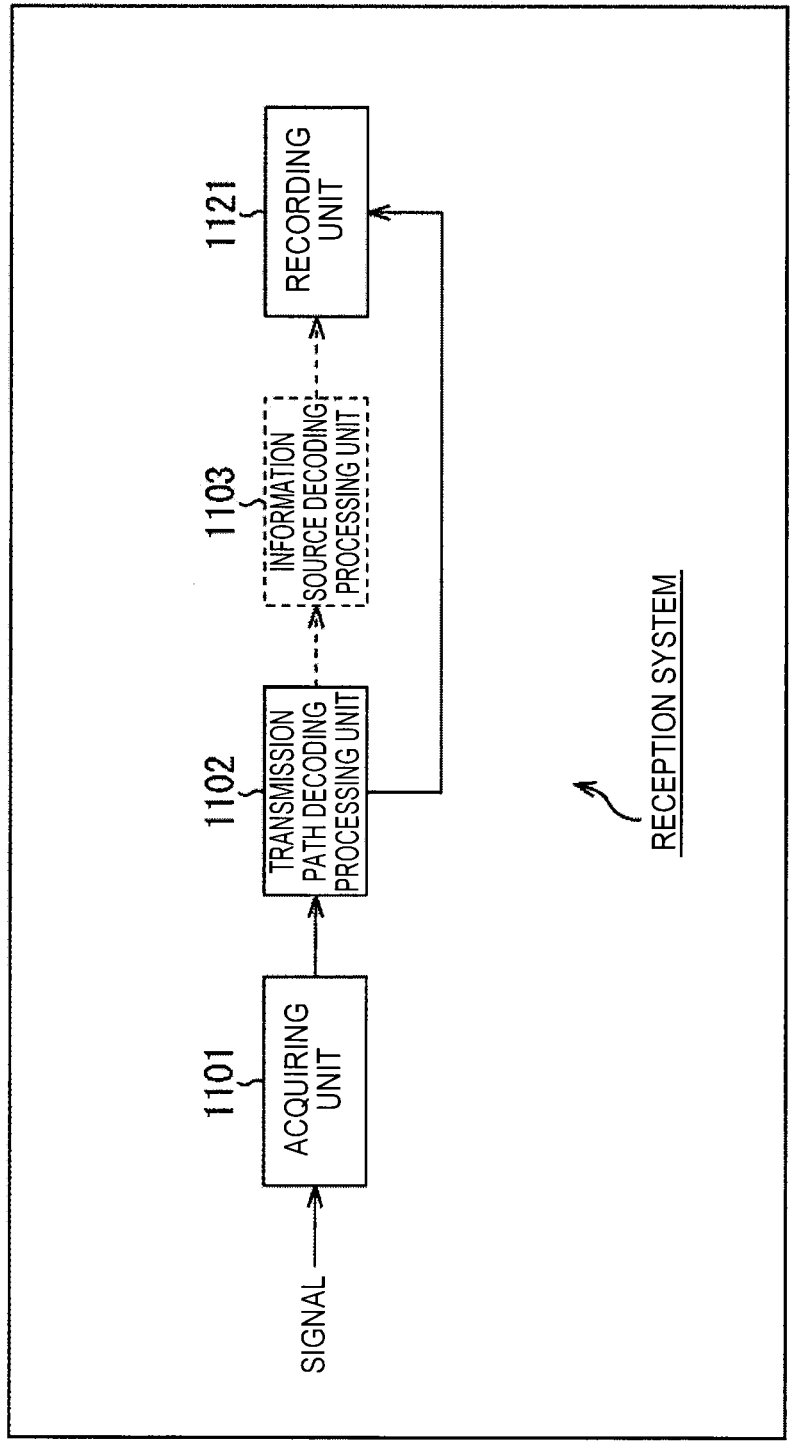
FIG. 78 is a block diagram illustrating a third configuration example of a reception system that can be applied to the receiving device 12.
Figure 79:
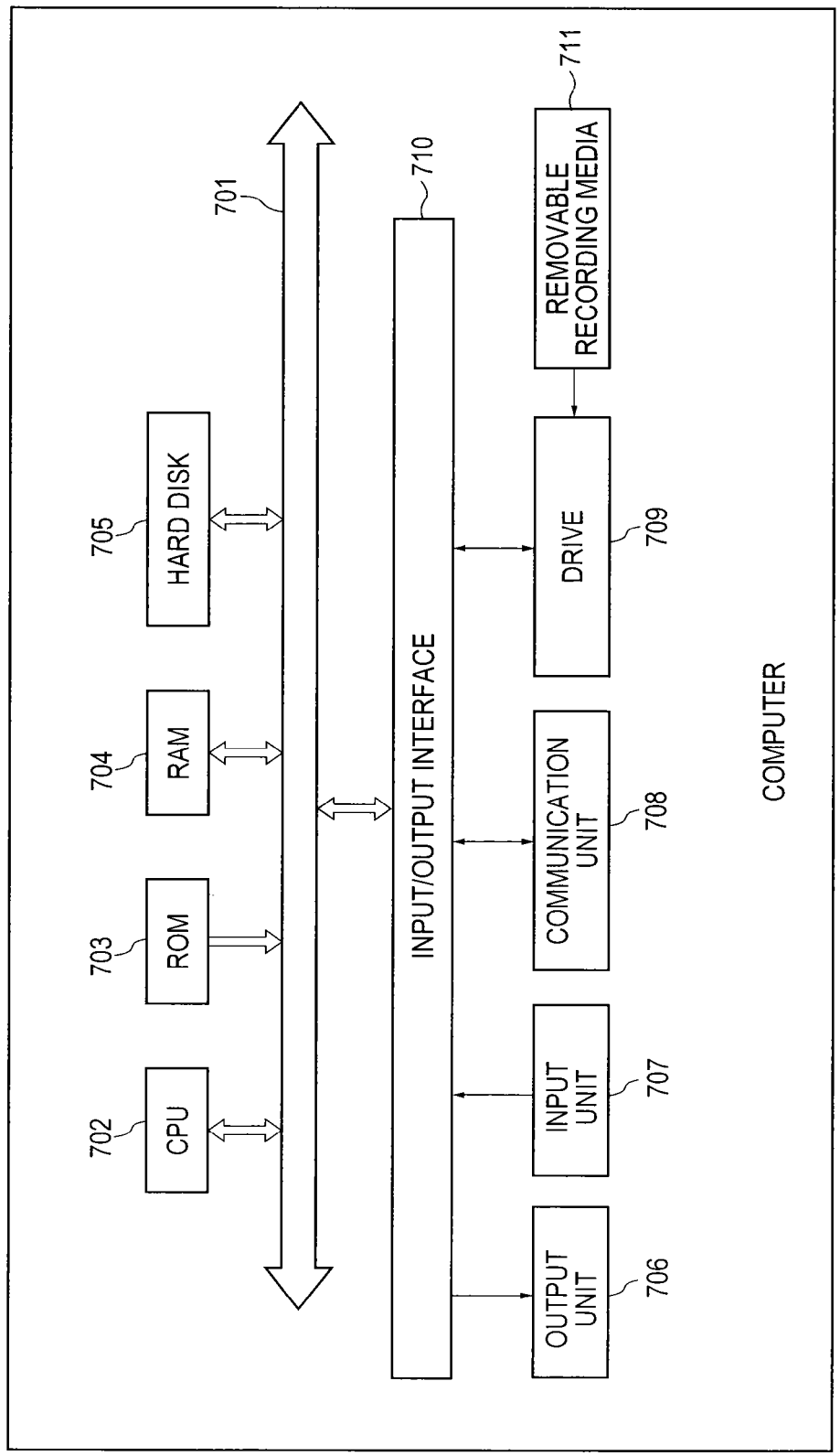
FIG. 79 is a block diagram illustrating a configuration example of an embodiment of a computer to which the present technology is applied.

FIG. 78 is a block diagram illustrating a third configuration example of the reception system that can be applied to the receiving device 12.

In the drawings, portions that correspond to the case of FIG. 76 are denoted with the same reference numerals and explanation thereof is appropriately omitted hereinafter.

The reception system of FIG. 78 is common to the case of FIG. 76 in that the acquiring unit 1101 and the transmission path decoding processing unit 1102 are provided.

However, the reception system of FIG. 78 is different from the case of FIG. 76 in that the information source decoding processing unit 1103 is not provided and a recording unit 1121 is newly provided.

The recording unit 1121 records (stores) a signal (for example, TS packets of TS of MPEG) output by the transmission path decoding processing unit 1102 on recording (storage) media such as an optical disk, a hard disk (magnetic disk), and a flash memory.

The reception system of FIG. 78 described above can be applied to a recorder that records television broadcasting.

In FIG. 78, the reception system is configured by providing the information source decoding processing unit 1103 and can record the signal obtained by executing the information source decoding processing by the information source decoding processing unit 1103, that is, the image or the sound obtained by decoding, by the recording unit 1121.

<Embodiment of Computer>

Next, the series of processing described above can be executed by hardware or can be executed by software. In the case in which the series of processing is executed by the software, a program configuring the software is installed in a general-purpose computer.

Therefore, FIG. 130 illustrates a configuration example of an embodiment of the computer in which a program executing the series of processing is installed.

The program can be previously recorded on a hard disk 705 and a ROM 703 corresponding to recording media embedded in the computer.

Alternatively, the program can be temporarily or permanently stored (recorded) on removable recording media 711 such as a flexible disk, a CD-ROM (Compact Disc Read Only Memory), an MO (Magneto Optical) disk, a DVD (Digital Versatile Disc), a magnetic disk, and a semiconductor memory. The removable recording media 711 can be provided as so-called package software.

The program is installed from the removable recording media 711 to the computer. In addition, the program can be transmitted from a download site to the computer by wireless through an artificial satellite for digital satellite broadcasting or can be transmitted to the computer by wire through a network such as a LAN (Local Area Network) or the Internet. The computer can receive the program transmitted as described above by a communication unit 708 and install the program in the embedded hard disk 705.

The computer includes a CPU (Central Processing Unit) 702 embedded therein. An input/output interface 710 is connected to the CPU 702 through a bus 701. If a user operates an input unit 707 configured using a keyboard, a mouse, and a microphone and a command is input through the input/output interface 710, the CPU 702 executes the program stored in the ROM (Read Only Memory) 703, according to the command. Alternatively, the CPU 702 loads the program stored in the hard disk 705, the program transmitted from a satellite or a network, received by the communication unit 708, and installed in the hard disk 705, or the program read from the removable recording media 711 mounted to a drive 709 and installed in the hard disk 705 to the RAM (Random Access Memory) 704 and executes the program. Thereby, the CPU 702 executes the processing according to the flowcharts described above or the processing executed by the configurations of the block diagrams described above. In addition, the CPU 702 outputs the processing result from the output unit 706 configured using an LCD (Liquid Crystal Display) or a speaker, transmits the processing result from the communication unit 708, and records the processing result on the hard disk 705, through the input/output interface 710, according to necessity.

In the present specification, it is not necessary to process the processing steps describing the program for causing the computer to execute the various processing in time series according to the order described as the flowcharts and processing executed in parallel or individually (for example, parallel processing or processing using an object) is also included.

The program may be processed by one computer or may be processed by a plurality of computers in a distributed manner. The program may be transmitted to a remote computer and may be executed.

An embodiment of the disclosure is not limited to the embodiments described above, and various changes and modifications may be made without departing from the scope of the disclosure.

That is, for example, (the parity check matrix initial value table of) the above-described 16 k code for Sx can be used even if the communication path 13 (FIG. 7) is any of a satellite circuit, a ground wave, a cable (wire circuit) and others. In addition, the 16 k code for Sx can also be used for data transmission other than digital broadcasting.

REFERENCE SIGNS LIST 11 transmitting device
12 receiving device
23 parity interleaver
24 column twist interleaver
25 demultiplexer
31 memory
32 interchanging unit
54 multiplexer
55 column twist deinterleaver
111 mode adaptation/multiplexer
112 padder
113 BB scrambler
114 BCH encoder
115 LDPC encoder
116 bit interleaver
117 Mapper
118 time interleaver
119 SISO/MISO encoder
120 frequency interleaver
121 BCH encoder
122 LDPC encoder
123 Mapper
124 frequency interleaver
131 frame builder/resource allocation unit
132 OFDM generating unit
151 OFDM operating unit
152 frame managing unit
153 frequency deinterleaver
154 Demapper
155 LDPC decoder
156 BCH decoder
161 frequency deinterleaver
162 SISO/MISO decoder
163 time deinterleaver
164 Demapper
165 bit deinterleaver 166 LDPC decoder
167 BCH decoder
168 BB descrambler
169 null deletion unit
170 demultiplexer
210 Tx unit
211 FEC unit
212 mapping unit
213 up-sampling unit
214 Nyquist filter unit
220 Rx unit
221 AGC unit
222 multiplier
223 roll-off filter unit
224 down-sampling unit
225 CSI unit
226 demapping unit
227 FEC unit
230 channel unit
231 IBO unit
232 multiplier
233 TWTA unit
234 AWGN unit
235 adder
300 branch data storing memory
301 selector
302 check node calculating unit
303 cyclic shift circuit
304 branch data storing memory
305 selector
306 reception data memory
307 variable node calculating unit
308 cyclic shift circuit
309 decoding word calculating unit
310 reception data rearranging unit
311 decoded data rearranging unit
601 encoding processing unit
602 storage unit
611 encoding rate setting unit
612 initial value table reading unit
613 parity check matrix generating unit
614 information bit reading unit
615 encoding parity operation unit
616 control unit
701 bus
702 CPU
703 ROM
704 RAM
705 hard disk
706 output unit
707 input unit
708 communication unit
709 drive
710 input/output interface
711 removable recording media
1001 reverse interchanging unit
1002 memory
1011 parity deinterleaver
1101 acquiring unit
1101 transmission path decoding processing unit
1103 information source decoding processing unit
1111 output unit
1121 recording unit

The invention claimed is:
1. A data processing device comprising:
circuitry that
performs LDPC encoding to encode data to be broadcast based on a parity check matrix of an LDPC code in which a code length is 16200 bits and an encoding rate is 7/15; and
interchanges code bits of the LDPC code in which the code length is 16200 bits and the encoding rate is 7/15 with symbol bits of a symbol corresponding to any of 8 signal points defined by 8-level phase-shift keying (8PSK);
maps the interchanged code bits of the LDPC code to a signal point determined by a modulation method to be performed on the interchanged code bits of the LDPC code;
modulates the mapped interchanged code bits of the LDPC code to generate a transmission frame; and
transmits the generated transmission frame to a receiving device,
wherein, when 3 bits of code bits stored in three units of storages having a storage capacity of 16200/3 bits and read bit by bit from the units of storages are allocated to one symbol, a (#i +1)-th bit from a most significant bit of the 3 bits of code bits is set to a bit b#i, a (#i +1)-th bit from a most significant bit of 3 bits of the symbol bits of the one symbol is set to a bit y#i, and the circuitry interchanges
a bit b0 with a bit y1,
a bit b1 with a bit y0, and
a bit b2 with a bit y2,
wherein the LDPC code includes information bits and parity bits,
wherein the parity check matrix includes an information matrix part corresponding to the information bits and a parity matrix part corresponding to the parity bits,
wherein the information matrix part is shown by a parity check matrix initial value table, and
wherein the parity check matrix initial value table is a table showing positions of elements of 1 of the information matrix part for every 360 columns and is expressed as follows
3 137 314 327 983 1597 2028 3043 3217 4109 6020 6178 6535 6560 7146
7180 7408 7790 7893 8123 8313 8526 8616 8638
356 1197 1208 1839 1903 2712 3088 3537 4091 4301 4919 5068 6025 6195
6324 6378 6686 6829 7558 7745 8042 8382 8587 8602
18 187 1115 1417 1463 2300 2328 3502 3805 4677 4827 5551 5968 6394 6
412 6753 7169 7524 7695 7976 8069 8118 8522 8582
714 2713 2726 2964 3055 3220 3334 3459 5557 5765 5841 6290 6419 6573
6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283

598 5393 8624
906 7249 7542
1223 2148 8195
976 2001 5005.

2. The data processing device according to claim 1, wherein the circuitry interchanges the code bits of 3 ×1 bits of the LDPC code that is written in a column direction and read in a row direction of a storage unit including three columns that store 3 ×1 bits in the row direction and that store 16200/(3 ×1) bits in the column direction.

3. A data processing method comprising:
performing, by circuitry of a data processing device, LDPC encoding to encode data to be broadcast based on a parity check matrix of an LDPC code in which a code length is 16200 bits and an encoding rate is 7/15; and
interchanging, by the circuitry, code bits of the LDPC code in which the code length is 16200 bits and the encoding rate is 7/15 with symbol bits of a symbol corresponding to any of 8 signal points defined by 8-level phase-shift keying (8PSK);
mapping the interchanged code bits of the LDPC code to a signal point determined by a modulation method to be performed on the interchanged code bits of the LDPC code;
modulating the mapped interchanged code bits of the LDPC code to generate a transmission frame; and
transmitting the generated transmission frame on a transmission channel to a receiving device,
wherein, in the interchanging, when 3 bits of code bits stored in three units of storages having a storage capacity of 16200/3 bits and read bit by bit from the units of storages are allocated to one symbol, a (#i +1)-th bit from a most significant bit of the 3 bits of code bits is set to a bit b#i, a (#i +1)-th bit from a most significant bit of 3 bits of the symbol bits of the one symbol is set to a bit y#i,
a bit b0 is interchanged with a bit y1,
a bit b1 is interchanged with a bit y0, and
a bit b2 is interchanged with a bit y2,
wherein the LDPC code includes information bits and parity bits,
wherein the parity check matrix includes an information matrix part corresponding to the information bits and a parity matrix part corresponding to the parity bits,
wherein the information matrix part is shown by a parity check matrix initial value table, and
wherein the parity check matrix initial value table is a table showing positions of elements of 1 of the information matrix part for every 360 columns and is expressed as follows 3 137 314 327 983 1597 2028 3043 3217 4109 6020 6178 6535 6560 7146
7180 7408 7790 7893 8123 8313 8526 8616 8638
356 1197 1208 1839 1903 2712 3088 3537 4091 4301 4919 5068 6025 6195
6324 6378 6686 6829 7558 7745 8042 8382 8587 8602
18 187 1115 1417 1463 2300 2328 3502 3805 4677 4827 5551 5968 6394 6
412 6753 7169 7524 7695 7976 8069 8118 8522 8582
714 2713 2726 2964 3055 3220 3334 3459 5557 5765 5841 6290 6419 6573
6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

4. A data processing device comprising:
circuitry that
performs LDPC encoding to encode data to be broadcast based on a parity check matrix of an LDPC code in which a code length is 16200 bits and an encoding rate is 7/15; and
interchanges code bits of the LDPC code in which the code length is 16200 bits and the encoding rate is 7/15 with symbol bits of a symbol corresponding to any of 16 signal points defined by 16-ary Amplitude and Phase Shift Keying (16APSK);
maps the interchanged code bits of the LDPC code to a signal point determined by a modulation method to be performed on the interchanged code bits of the LDPC code;
modulates the mapped interchanged code bits of the LDPC code to generate a transmission frame; and
transmits the generated transmission frame to a receiving device,
wherein, when 4 bits of code bits stored in four units of storages having a storage capacity of 16200/4 bits and read bit by bit from the units of storages are allocated to one symbol, a (#i +1)-th bit from a most significant bit of the 4 bits of code bits is set to a bit b#i, a (#i +1)-th bit from a most significant bit of 4 bits of the symbol bits of the one symbol is set to a bit y#i, and the circuitry interchanges
a bit b0 with a bit y2,
a bit b1 with a bit y1,
a bit b2 with a bit y0, and
a bit b3 with a bit y3,
wherein the LDPC code includes information bits and parity bits,
wherein the parity check matrix includes an information matrix part corresponding to the information bits and a parity matrix part corresponding to the parity bits,
wherein the information matrix part is shown by a parity check matrix initial value table, and
wherein the parity check matrix initial value table is a table showing positions of elements of 1 of the information matrix part for every 360 columns and is expressed as follows 3 137 314 327 983 1597 2028 3043 3217 4109 6020 6178 6535 6560 7146
7180 7408 7790 7893 8123 8313 8526 8616 8638
356 1197 1208 1839 1903 2712 3088 3537 4091 4301 4919 5068 6025 6195
6324 6378 6686 6829 7558 7745 8042 8382 8587 8602
18 187 1115 1417 1463 2300 2328 3502 3805 4677 4827 5551 5968 6394 6
412 6753 7169 7524 7695 7976 8069 8118 8522 8582
714 2713 2726 2964 3055 3220 3334 3459 5557 5765 5841 6290 6419 6573

6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

5. The data processing device according to claim 4, wherein the circuitry interchanges the code bits of 4 ×1 bits of the LDPC code that is written in a column direction and read in a row direction of a storage unit including four columns that store 4 ×1 bits in the row direction and that store 16200/(4 ×1) bits in the column direction.

6. A data processing method comprising:
performing, by circuitry of a data processing device, LDPC encoding to encode data to be broadcast based on a parity check matrix of an LDPC code in which a code length is 16200 bits and an encoding rate is 7/15; and
interchanging, by the circuitry, code bits of the LDPC code in which the code length is 16200 bits and the encoding rate is 7/15 with symbol bits of a symbol corresponding to any of 16 signal points defined by 16-ary Amplitude and Phase Shift Keying (16APSK);
mapping the interchanged code bits of the LDPC code to a signal point determined by a modulation method to be performed on the interchanged code bits of the LDPC code;
modulating the mapped interchanged code bits of the LDPC code to generate a transmission frame; and
transmitting the generated transmission frame on a transmission channel to a receiving device,
wherein, in the interchanging, when 4 bits of code bits stored in four units of storages having a storage capacity of 16200/4 bits and read bit by bit from the units of storages are allocated to one symbol, a (#i +1)-th bit from a most significant bit of the 4 bits of the code bits is set to a bit b#i, a (#i +1)-th bit from a most significant bit of 4 bits of symbol bits of the one symbol is set to a bit y#i,
a bit b0 is interchanged with a bit y2,
a bit b1 is interchanged with a bit y1,
a bit b2 is interchanged with a bit y0, and
a bit b3 is interchanged with a bit y3,
wherein the LDPC code includes information bits and parity bits
wherein the parity check matrix includes an information matrix part corresponding to the information bits and a parity matrix part corresponding to the parity bits,
wherein the information matrix part is shown by a parity check matrix initial value table, and
wherein the parity check matrix initial value table is a table showing positions of elements of 1 of the information matrix part for every 360 columns and is expressed as follows 3 137 314 327 983 1597 2028 3043 3217 4109 6020 6178 6535 6560 7146
7180 7408 7790 7893 8123 8313 8526 8616 8638
356 1197 1208 1839 1903 2712 3088 3537 4091 4301 4919 5068 6025 6195
6324 6378 6686 6829 7558 7745 8042 8382 8587 8602
18 187 1115 1417 1463 2300 2328 3502 3805 4677 4827 5551 5968 6394 6
412 6753 7169 7524 7695 7976 8069 8118 8522 8582
714 2713 2726 2964 3055 3220 3334 3459 5557 5765 5841 6290 6419 6573
6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

* * * * *